United States Patent
Nakahata et al.

[11] Patent Number: 6,025,636
[45] Date of Patent: Feb. 15, 2000

[54] SURFACE ACOUSTIC WAVE DEVICE INCORPORATING SINGLE CRYSTAL LINBO$_3$

[75] Inventors: Hideaki Nakahata, Itami; Masashi Narita, Osaka; Kenjiro Higaki, Itami; Satoshi Fujii, Itami; Hiroyuki Kitabayashi, Itami; Shin-ichi Shikata, Itami, all of Japan

[73] Assignee: Sumitomo Electric Industries Ltd., Osaka, Japan

[21] Appl. No.: 08/951,615

[22] Filed: Oct. 16, 1997

Related U.S. Application Data

[63] Continuation-in-part of application No. 08/790,524, Jan. 29, 1997, abandoned.

[30] Foreign Application Priority Data

Feb. 9, 1996 [JP] Japan ................................ 8-155024

[51] Int. Cl.$^7$ .................................................. H01L 29/82
[52] U.S. Cl. ........................ 257/416; 257/415; 310/313 A
[58] Field of Search ................................ 257/43, 77, 415, 257/416; 310/313 A, 313 R, 313 B

[56] References Cited

U.S. PATENT DOCUMENTS 5,565,725 10/1996 Nakahata et al. .................... 310/313 A
5,838,090 11/1998 Nakahata et al. .................... 310/313 A

FOREIGN PATENT DOCUMENTS 9-219632 of 1997 Japan .

OTHER PUBLICATIONS

The Transactions of The INstitute of Electronics and Communication Engineers, '86/10 vol. J69–C No. 10, 1986.

*Primary Examiner*—Minh Loan Tran
*Attorney, Agent, or Firm*—Beyer & Weaver, LLP

[57] ABSTRACT

A surface acoustic wave device includes at least diamond, a single crystal LiNbO$_3$ layer formed on the diamond, and an interdigital transducer formed in contact with the LiNbO$_3$ layer and uses a surface acoustic wave (wavelength: $\lambda_n$ $\mu$m) in an nth-order mode (n=1 or 2). When the thickness of the LiNbO$_3$ layer is $t_1$ ($\mu$m), $kh_1 = 2\pi(t_1/\lambda_n)$ and the cut orientation ($\theta$, $\Phi$, and $\psi$ represented by an Eulerian angle representation) with respect to the crystallographic fundamental coordinate system of the LiNbO$_3$ layer are selected from values within specific ranges. Consequently, a surface acoustic wave device which increases the propagation velocity (V) of a surface acoustic wave and improves the electromechanical coupling coefficient (K$^2$) is realized.

14 Claims, 137 Drawing Sheets

ELECTRODE INTERSECTION WIDTH : W
ELECTRODE WIDTH : d

SURFACE ACOUSTIC WAVE DEVICE INCORPORATING SINGLE CRYSTAL LINBO₃

RELATED APPLICATIONS

This is a Continuation-In-Part application of application Ser. No. 08/790,524 filed on Jan. 29, 1997, now abandoned.

BACKGROUND OF THE INVENTION

1. Field of the Invention

The present invention relates to a surface acoustic wave device which improves the propagation velocity (V) and the electromechanical coupling coefficient ($K^2$) of a surface acoustic wave.

2. Related Background Art

Surface acoustic wave devices using a surface acoustic wave (to be referred to as an "SAW" hereinafter) propagating on a solid surface have the following characteristic features which are common to electromechanical functional parts.

1) Compact and lightweight.

2) Excellent in vibration resistance and high-impact properties.

3) Highly reliable because of few product variations.

4) Since the circuits need no adjustment, the mounting process can be easily automated and simplified.

In addition to the above characteristic features common to electromechanical functional parts, the SAW devices also have various advantages such as a relatively good temperature stability, a long service life, and excellent phase characteristics. For this reason, the SAW devices can be popularly used as frequency filters, resonators, delay devices, signal processing devices, convolvers, opto-electronic functional devices, and the like.

As is known, for such SAW devices, a multilayer structure with an $LiNbO_3$ layer formed on diamond is used, paying attention to the fact that $LiNbO_3$ is chemically stabler (acid resistance and alkali resistance) than, e.g., ZnO.

For application as a frequency filter, an electromechanical coupling coefficient ($K^2$) used as an index of conversion efficiency from an electrical energy to a mechanical energy is about 0.15% to 0.7% for a narrowband filter, about 0.7% to 3% for an intermediate-band filter, or 3% to 10% for a wideband filter.

In the field of the above-described SAW devices, along with a recent tendency in multichannel or higher-frequency arrangements in the field of communications including satellite communication and mobile communication, the development of devices usable in a higher frequency range (e.g., GHz band) has been desired.

An operating frequency f of an SAW device is generally determined by f=V/λ (V is the propagation velocity of an SAW, and λ is the wavelength of the SAW). The wavelength λ depends on the period of an interdigital transducer, as will be described later. However, the wavelength λ of an SAW to be used for the device can hardly be extremely shortened because of the limitation in micropatterning technique such as photolithography. Therefore, to raise the operating frequency of the SAW device, it is preferable to increase the propagation velocity V of the SAW.

In the above-described field of communications represented by satellite communication and mobile communication, further power saving and size reduction of an entire device are required mainly from the viewpoint of mounting of the SAW device. In addition to the above-described higher frequency, an improvement in the electromechanical coupling coefficient ($K^2$) as the index of conversion efficiency from an electrical energy to a mechanical energy is required.

In recent years, therefore, for SAW devices to be widely used, a strong demand for not only an increase in propagation velocity V of an SAW to be used for the devices (e.g., V≧7,000 m/s) but also an increase in electromechanical coupling coefficient ($K^2$) (e.g., $K^2$≧2%) has arisen.

SUMMARY OF THE INVENTION

It is an object of the present invention to provide an SAW device which increases the propagation velocity V of an SAW and improves the electromechanical coupling coefficient ($K_2$) of the SAW.

As a result of extensive studies, the present inventors found the following fact. In an SAW device having a structure with single crystal $LiNbO_3$ and diamond layers and an interdigital transducer, the above object can be achieved, i.e., an SAW device which increases the propagation velocity V of an SAW and improves the electric-mechanical coupling coefficient ($K^2$) of the SAW can be realized by combining the crystal orientation in the single crystal $LiNbO_3$ layer and a parameter $kh_1 = 2\pi(t_1/\lambda)$ (λ: the wavelength [μm] of an SAW to be used, $t_1$: the thickness [μm] of the $LiNbO_3$ layer) and adjusting this combination.

More specifically, according to the present invention, there is provided a surface acoustic wave device comprising diamond, a single crystal $LiNbO_3$ layer formed on a surface of the diamond, and an interdigital transducer formed on one of a surface of the LiNbO3 layer and an interface between the diamond and the $LiNbO_3$ layer, wherein a crystal orientation of the $LiNbO_3$ layer with respect to an exposed surface of the $LiNbO_3$ layer and a propagation direction of an SAW (cut orientation with respect to the crystallographic fundamental coordinate system of the $LiNbO_3$ layer), and a ratio of a thickness of the $LiNbO_3$ layer to a wavelength of the SAW to be used are selected such that a velocity V of the SAW to be used becomes 8,000 m/s and an electromechanical coupling coefficient $K^2$ becomes 10% or more.

Therefore, an SAW device having characteristics representing a satisfactory propagation velocity V (≧8,000 m/s) and a satisfactory electromechanical coupling coefficient $K^2$ (≧10%) is realized.

In the SAW device of the present invention, preferably, the diamond is a diamond layer formed on a base material, and when a thickness of the diamond layer is $t_2$ [μm], the wavelength of the SAW to be used is λ, and $kh_2 = 2\pi(t_2/\lambda)$, the following relation is satisfied:

$kh_2 \geq 4$

If the diamond layer is thin, the SAW characteristics vary. However, when the thickness $t_2$ [μm] of the diamond layer is set such that $kh_2 \geq 4$ holds, the variation amount poses no practical problem. In addition, according to the finding of the present inventors, $kh_2 \geq 8$ is more preferable. With this arrangement, the variation amount can be further decreased.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 120 is a graph showing the evaluation result of $K^2$ in the seventh embodiment ($kh_1$=1.1, $\Phi$=30°);

FIG. 121 is a graph showing the evaluation result of $K^2$ in the seventh embodiment ($kh_1$=1.6, $\Phi$=0°);

FIG. 122 is a graph showing the evaluation result of $K^2$ in the seventh embodiment ($kh_1$=1.6, $\Phi$=10°);

FIG. 123 is a graph showing the evaluation result of $K^2$ in the seventh embodiment ($kh_1$=1.6, $\Phi$=20°);

FIG. 124 is a graph showing the evaluation result of $K^2$ in the seventh embodiment ($kh_1$=1.6, $\Phi$=30°);

FIG. 125 is a graph showing the evaluation result of $K^2$ in an evaluation example ($kh_1$=0.2, $\Phi$=0°);

FIG. 126 is a graph showing the evaluation result of $K^2$ in the evaluation example ($kh_1$=0.2, $\Phi$=10°);

FIG. 127 is a graph showing the evaluation result of $K^2$ in the evaluation example ($kh_1$=0.2, $\Phi$=20°);

FIG. 128 is a graph showing the evaluation result of $K^2$ in the evaluation example ($kh_1$=0.2, $\Phi$=30°);

FIG. 129 is a graph showing the evaluation result of $K^2$ in the evaluation example ($kh_1$=0.325, $\Phi$=0°);

FIG. 130 is a graph showing the evaluation result of $K^2$ in the evaluation example ($kh_1$=0.325, $\Phi$=10°);

FIG. 131 is a graph showing the evaluation result of $K^2$ in the evaluation example ($kh_1$=0.325, $\Phi$=20°);

Figure 132:
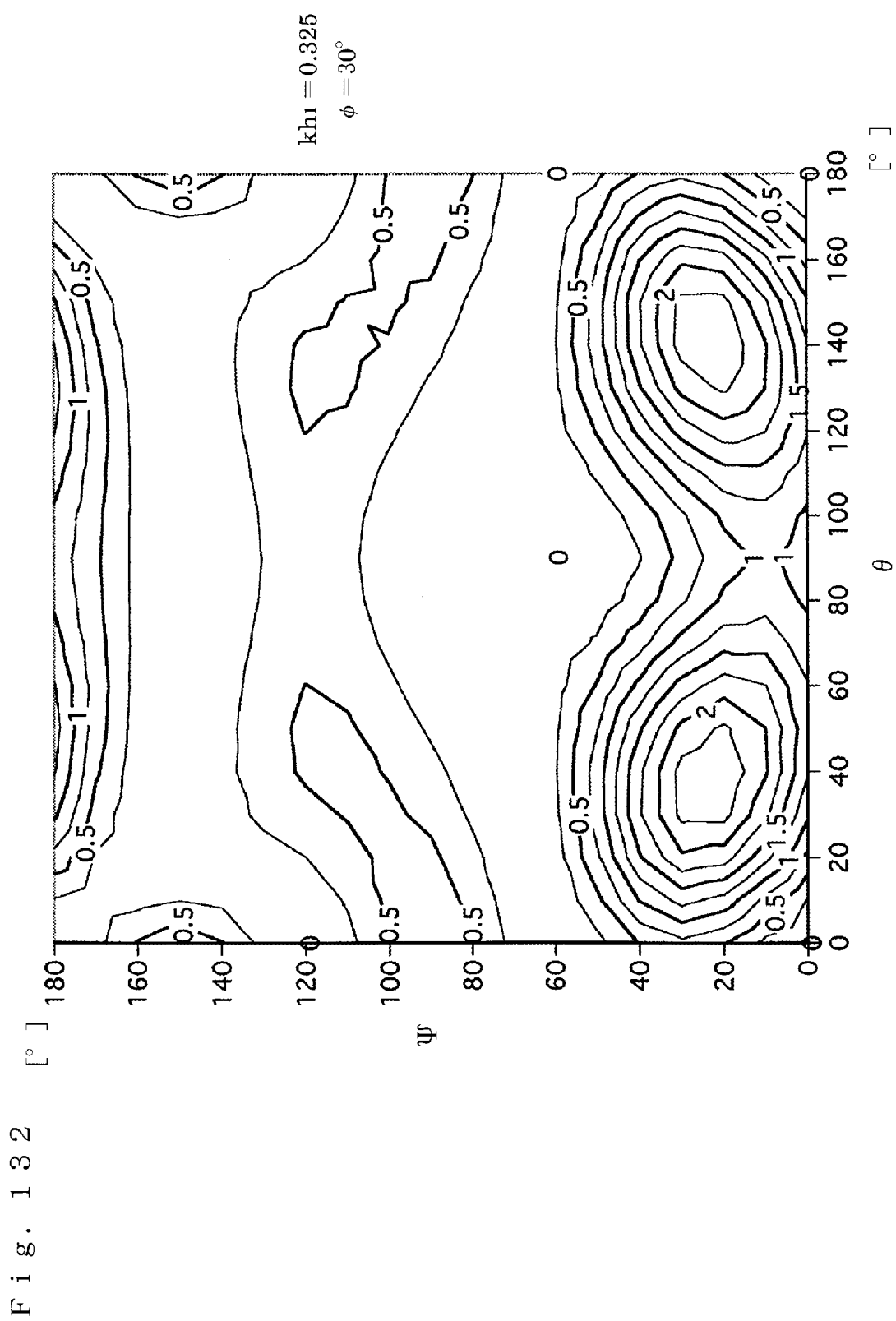
Figure 133:
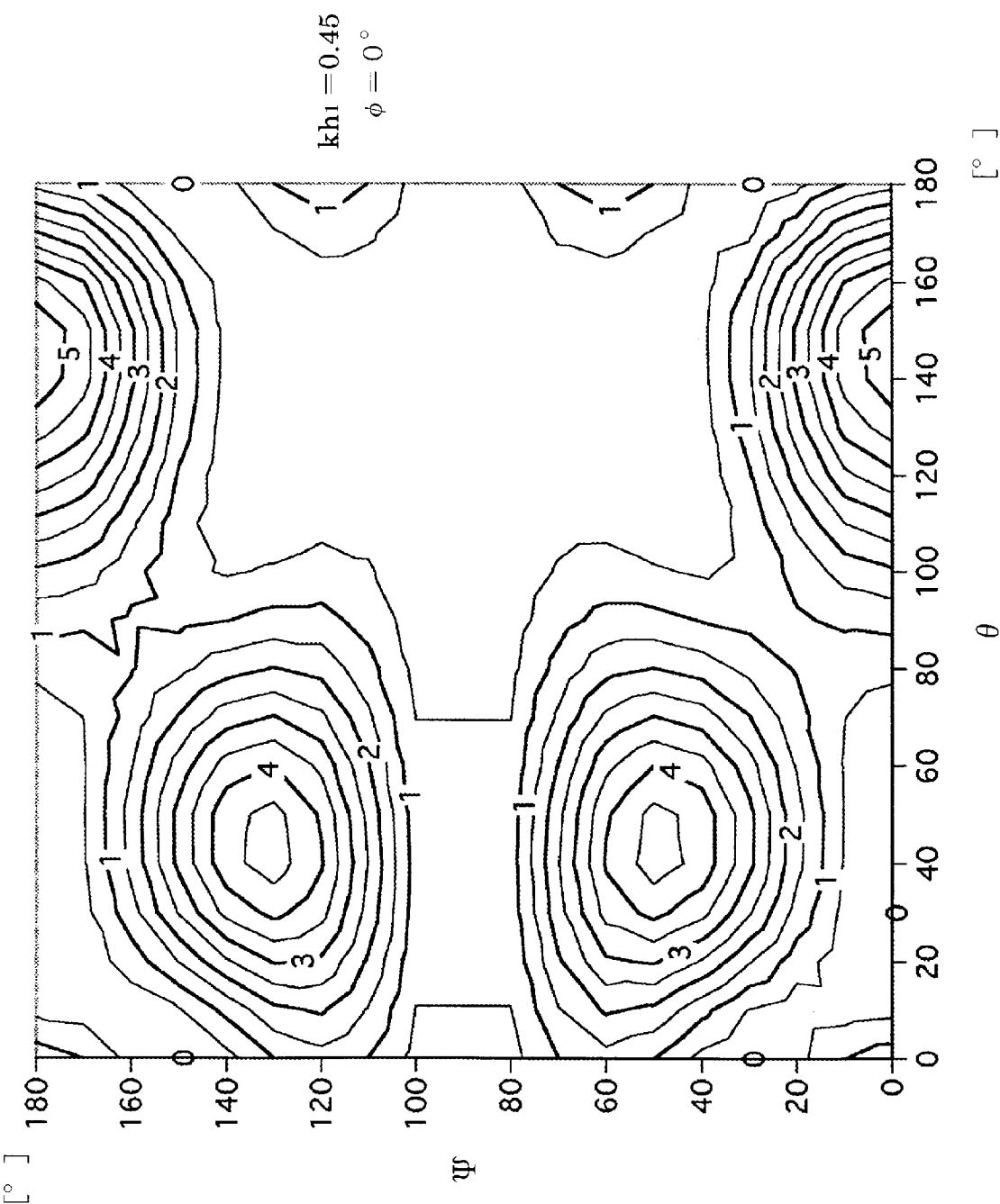
Figure 134:
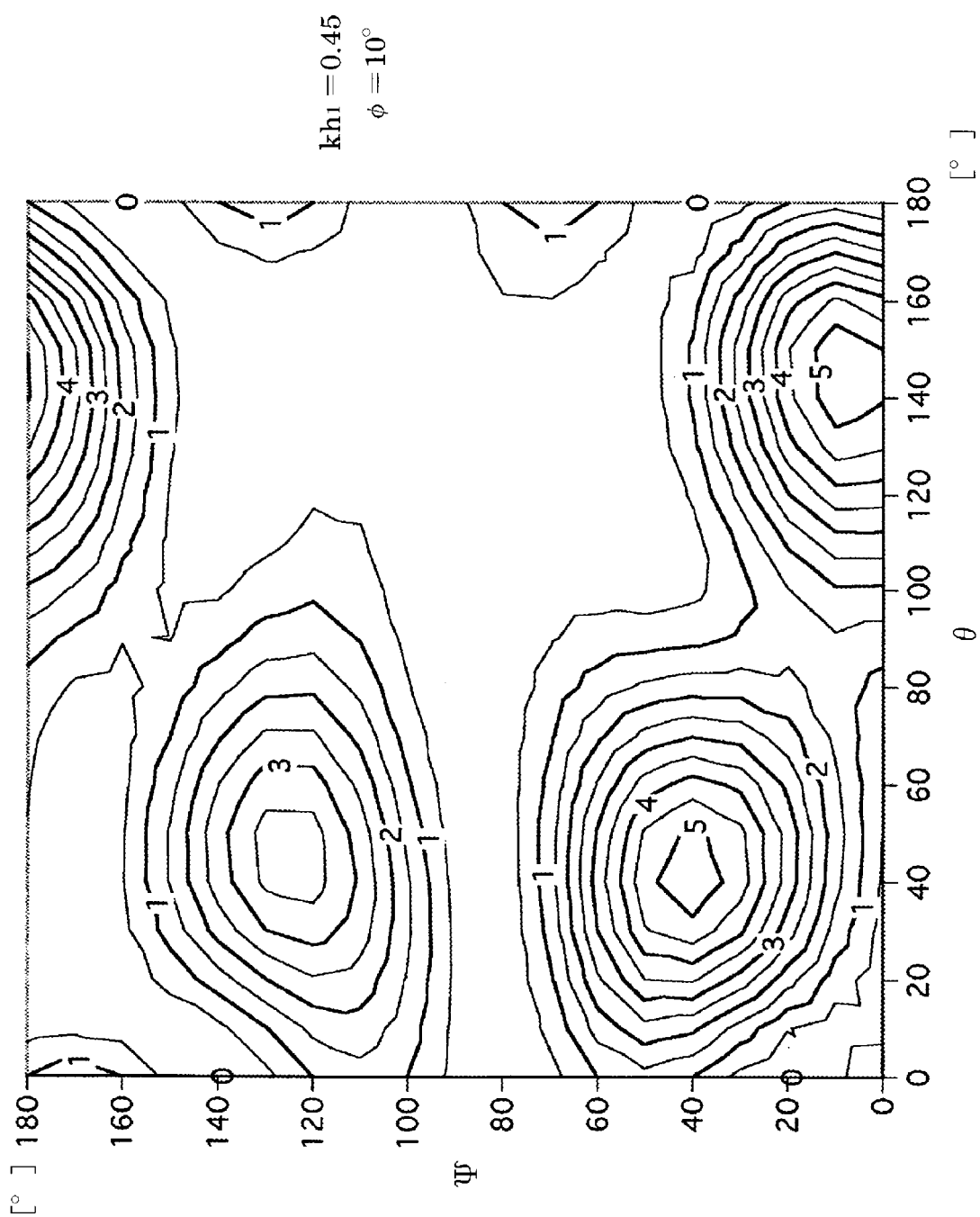
Figure 135:
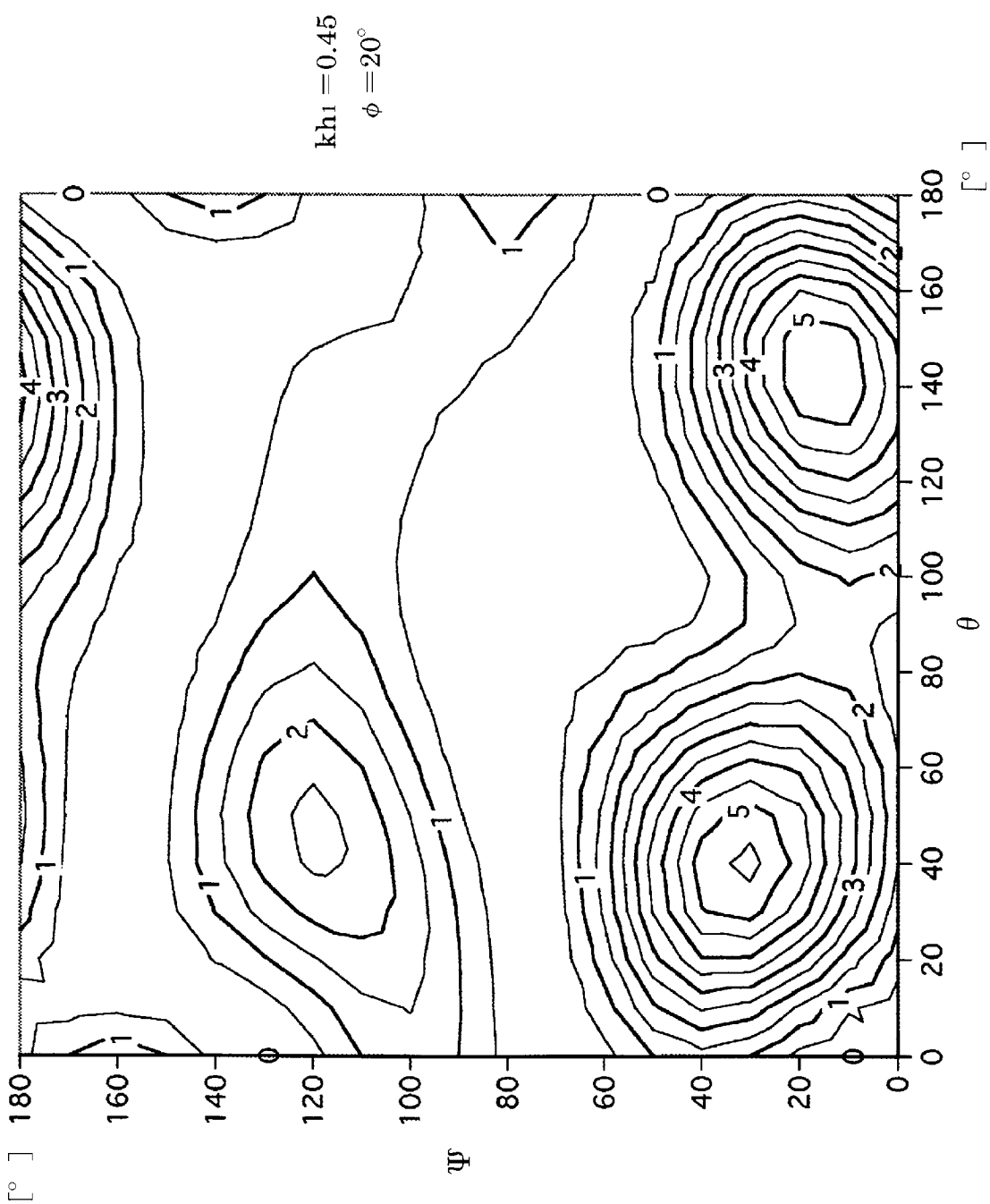
Figure 136:
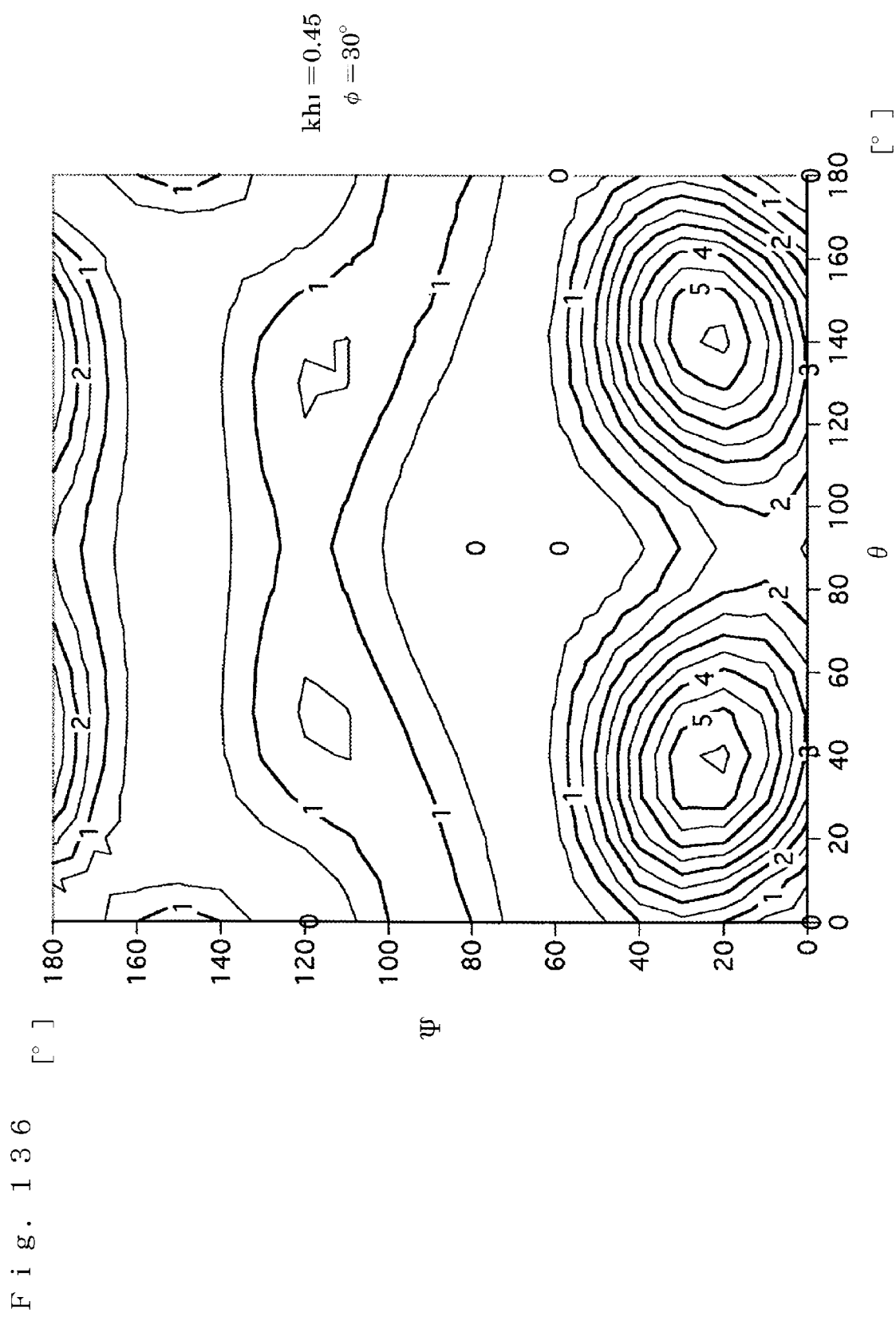
Figure 137:
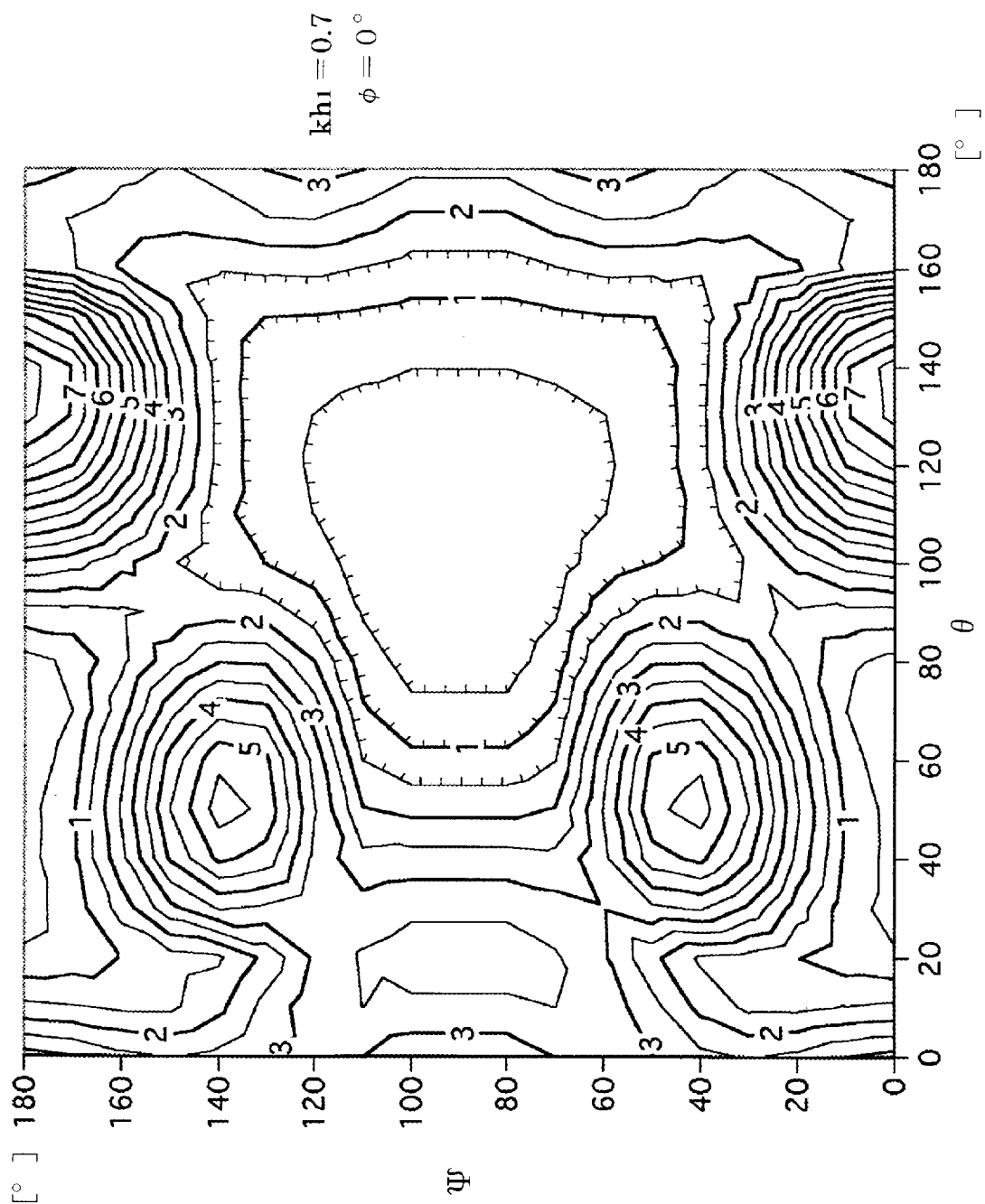
Figure 138:
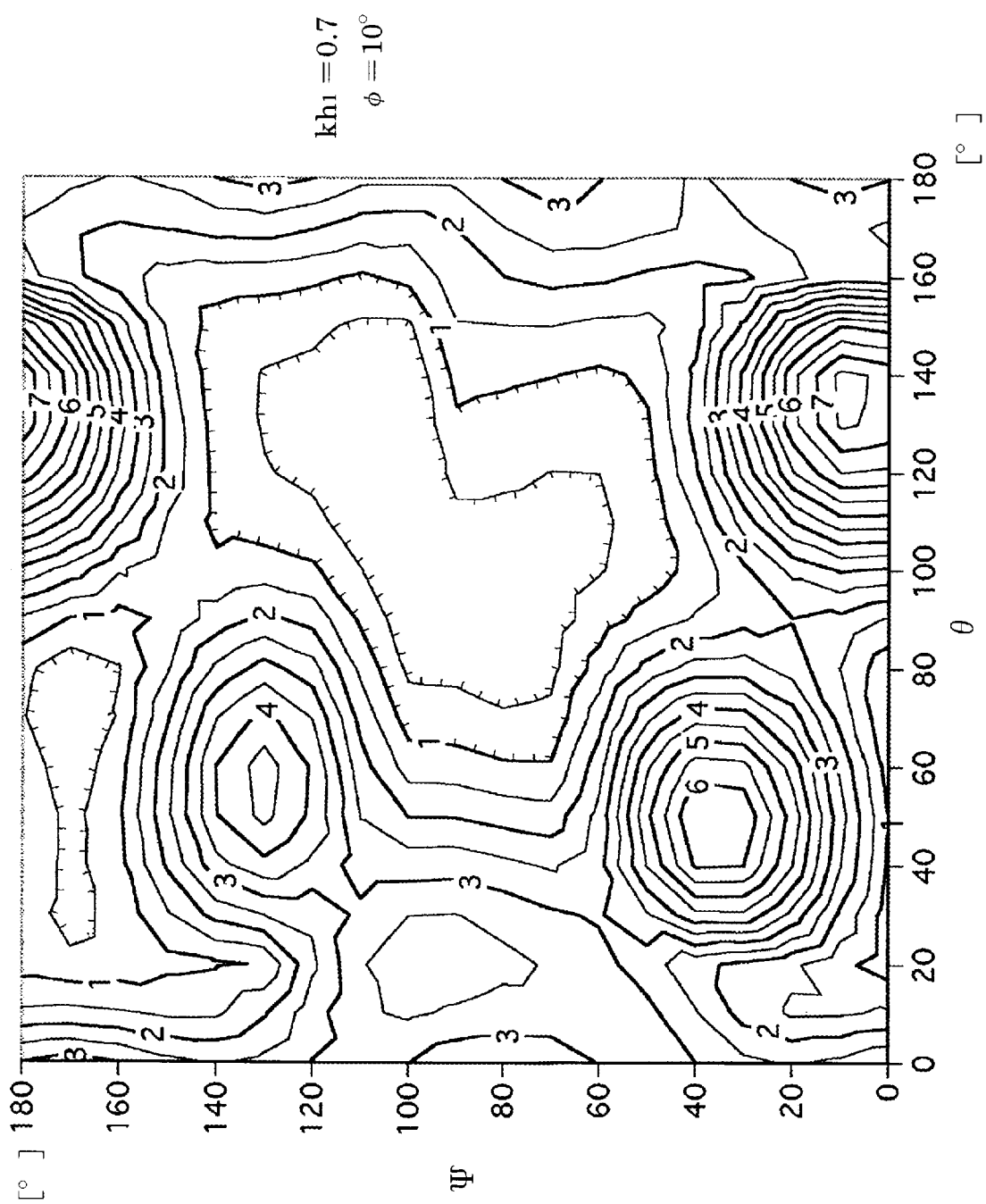
Figure 139:
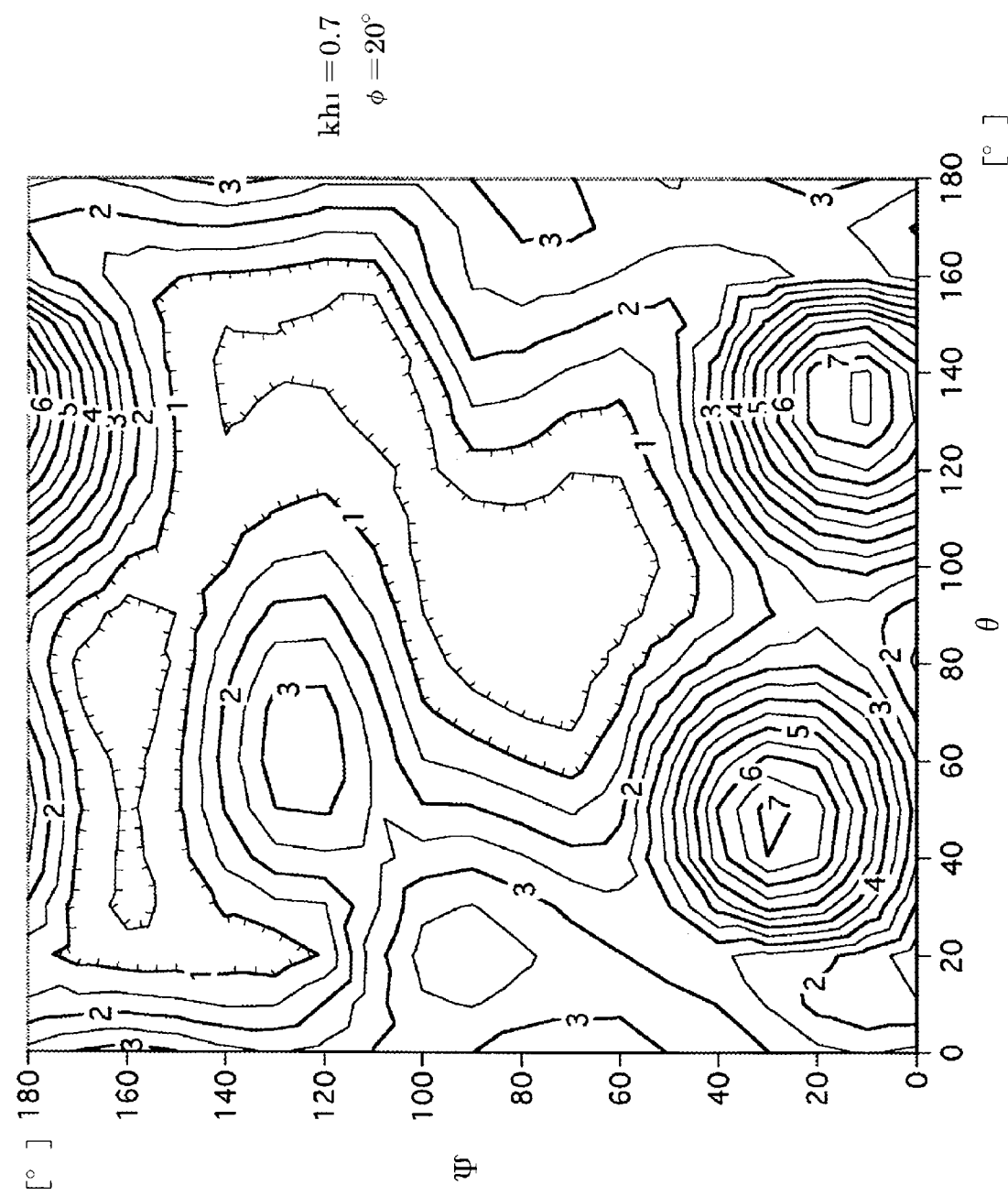
Figure 140:
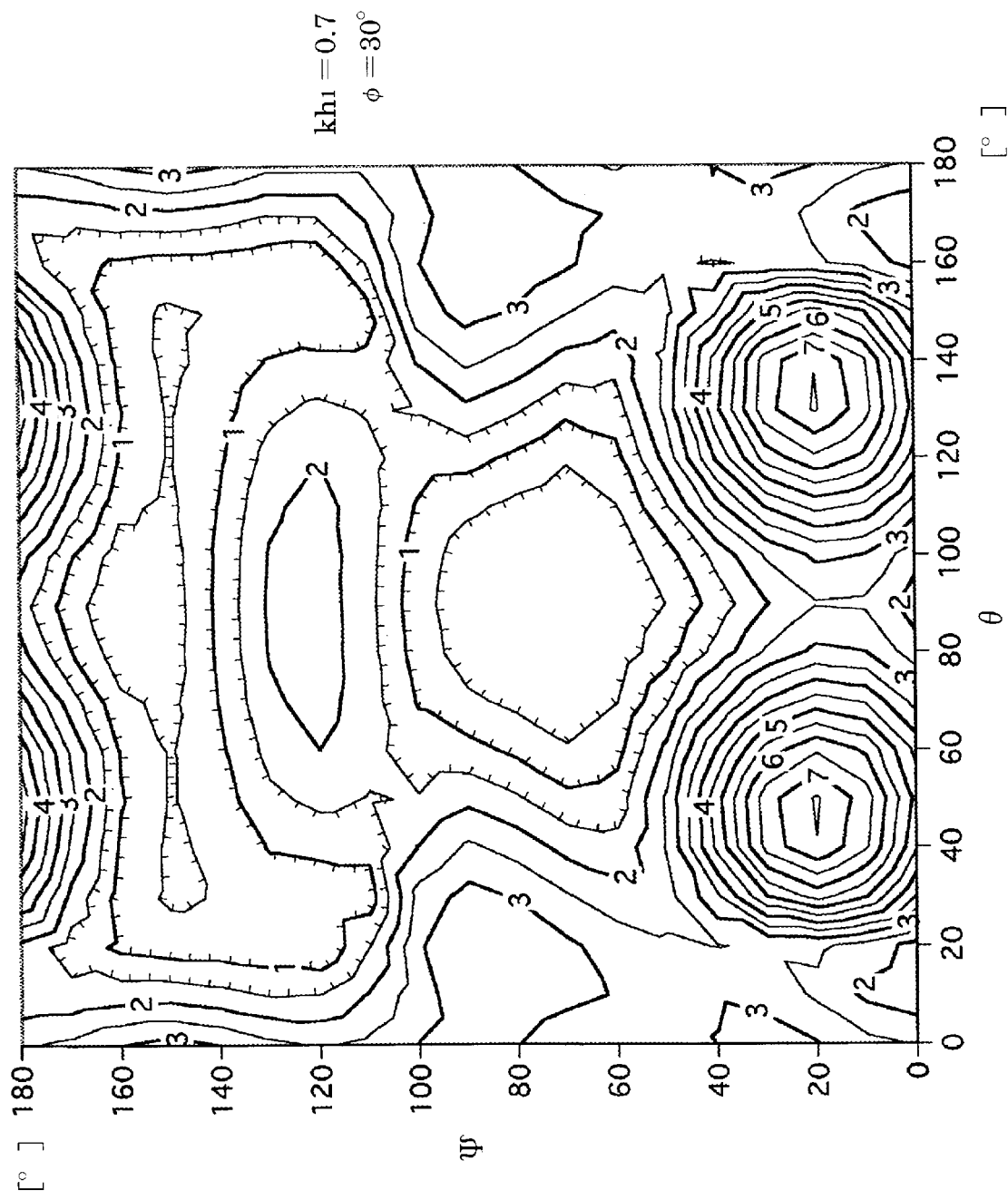

FIG. 132 is a graph showing the evaluation result of $K^2$ in the evaluation example ($kh_1$=0.325, $\Phi$=30°);

FIG. 133 is a graph showing the evaluation result of $K^2$ in the evaluation example ($kh_1$=0.45, $\Phi$=0°);

FIG. 134 is a graph showing the evaluation result of $K^2$ in the evaluation example ($kh_1$=0.45, $\Phi$=10°);

FIG. 135 is a graph showing the evaluation result of $K^2$ in the evaluation example ($kh_1$=0.45, $\Phi$=20°);

FIG. 136 is a graph showing the evaluation result of $K^2$ in the evaluation example ($kh_1$=0.45, $\Phi$=30°);

FIG. 137 is a graph showing the evaluation result of $K^2$ in the evaluation example ($kh_1$=0.7, $\Phi$=0°);

FIG. 138 is a graph showing the evaluation result of $K^2$ in the evaluation example ($kh_1$=0.7, $\Phi$=10°);

FIG. 139 is a graph showing the evaluation result of $K^2$ in the evaluation example ($kh_1$=0.7, $\Phi$=20°); and FIG. 140 is a graph showing the evaluation result of $K^2$ in the evaluation example ($kh_1$=0.7, $\Phi$=30°).

DETAILED DESCRIPTION OF THE PREFERRED EMBODIMENTS

Figure 1:
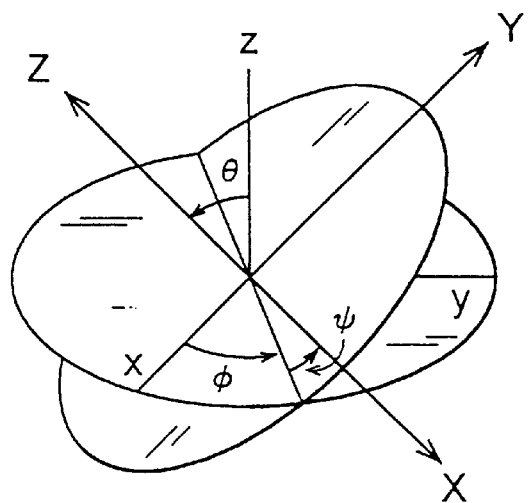
FIG. 1 is an explanatory view of an Eulerian angle representation.

In the present invention, a single crystal $LiNbO_3$ layer is used. As shown in FIG. 1, the crystal orientation of the $LiNbO_3$ layer is represented by an Eulerian angle representation ($\theta,\Phi,\psi$) on an orthogonal coordinate system (X,Y,Z) in which the Z-axis is set along the normal direction of the cut plane, and the X-axis is set along the SAW propagation direction (one direction on the cut plane of the $LiNbO_3$ layer, which is determined by the shape of an interdigital transducer) when viewed from the $LiNbO_3$ crystallographic fundamental coordinate system (x,y,z) of the $LiNbO_3$ layer.

The $LiNbO_3$ crystal has a three-time mirror surface symmetry (3 m). For this reason, (i) the characteristics of the $LiNbO_3$ layer at $\theta$ of 0° to 180° match those at $\theta$ of 180° to 360°, (ii) the characteristics of the $LiNbO_3$ layer at $\psi$ of 0° to 180° match those at $\psi$ of 180° to 360°. In addition, (iii) the characteristics of the $LiNbO_3$ layer at $\Phi$ of 0° to 120° match those at $\Phi$ of 120° to 240° and 240° to 360°. As an additional plus, (iv) the characteristics of the $LiNbO_3$ layer at $\Phi$ of 0° to 30°, $\theta$ of 0° to 180°, and $\psi$ of 0° to 180° match those at $\psi$ of 60° to 30°, $\theta$ of 180° to 0°, and $\psi$ of 180° to 0°, and (v) the characteristics of the $LiNbO_3$ layer at $\Phi$ of 0° to 60°, $\theta$ of 0° to 180°, and $\psi$ of 0° to 180° match those at $\Phi$ of 60° to 120°, $\theta$ of 180° to 0°, and $\psi$ of 180° to 0°. This means the characteristics of the $LiNbO_3$ changes periodically every $\Phi$ of 30°. So the embodiments described as follows are represented only within $0° \leq \Phi \leq 30°$, $0° \leq \theta \leq 180°$, and $0° \leq \psi \leq 180°$. The characteristics in remaining region is determined from that in this region by this symmetiry. Y. Shimizu et. al disclosed this $LiNbO_3$ characteristics in "Characteristics of Leaky Surface Acoustic Waves on $LiNbO_3$ and the New Cut", Japan Telecommunications Society Journal, Vol.J69-C No. 10, October 1986, pp. 1309–1314.

The embodiments of an SAW device of the present invention will be described below with reference to the accompanying drawings. The same reference numerals denote the same elements throughout the drawings, and a detailed description thereof will be omitted.

(First Embodiment)

Figure 2:
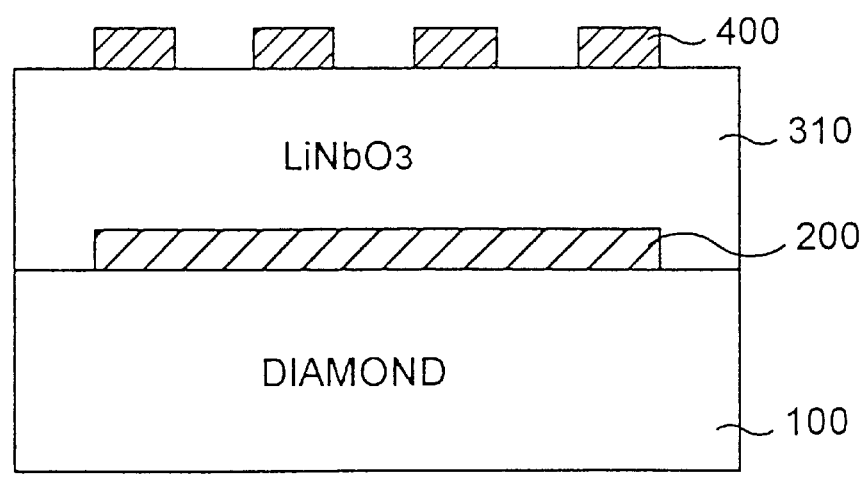
FIG. 2 is a sectional view showing the structure of an SAW device according to the first embodiment of the present invention.

FIG. 2 is a sectional view showing the structure of an SAW device according to the first embodiment of the present invention. As shown in FIG. 2, the SAW device of the first embodiment comprises (a) diamond 100, (b) a short-circuit electrode 200 formed on the diamond 100, (c) a single crystal $LiNbO_3$ layer 310 formed on the short-circuit electrode 200, and (d) an interdigital transducer 400 formed on the $LiNbO_3$ layer 310.

Figure 3:
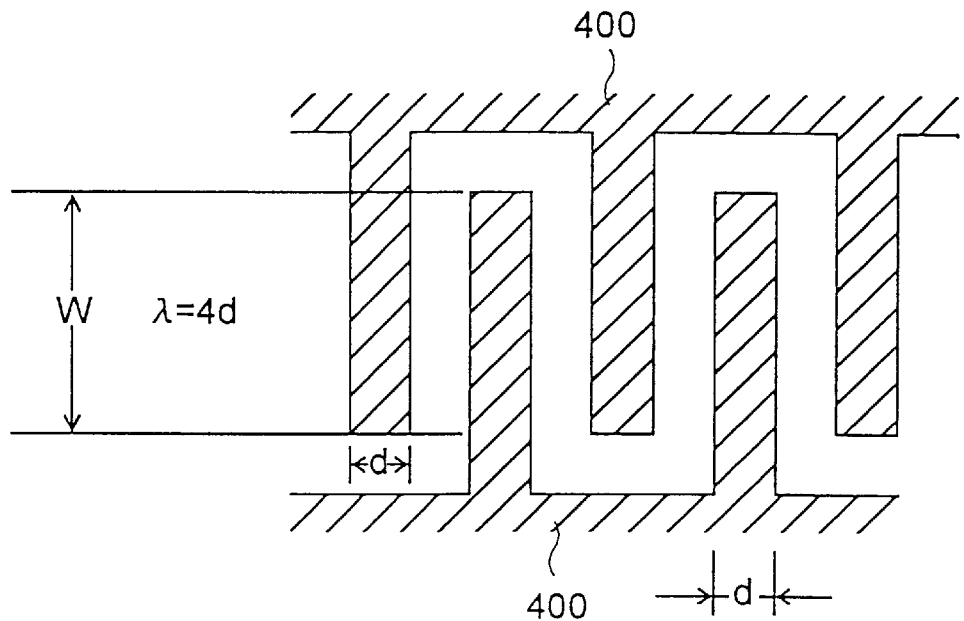
FIG. 3 is an explanatory view of the shape of the first example (single electrode) of an interdigital transducer.
Figure 4:
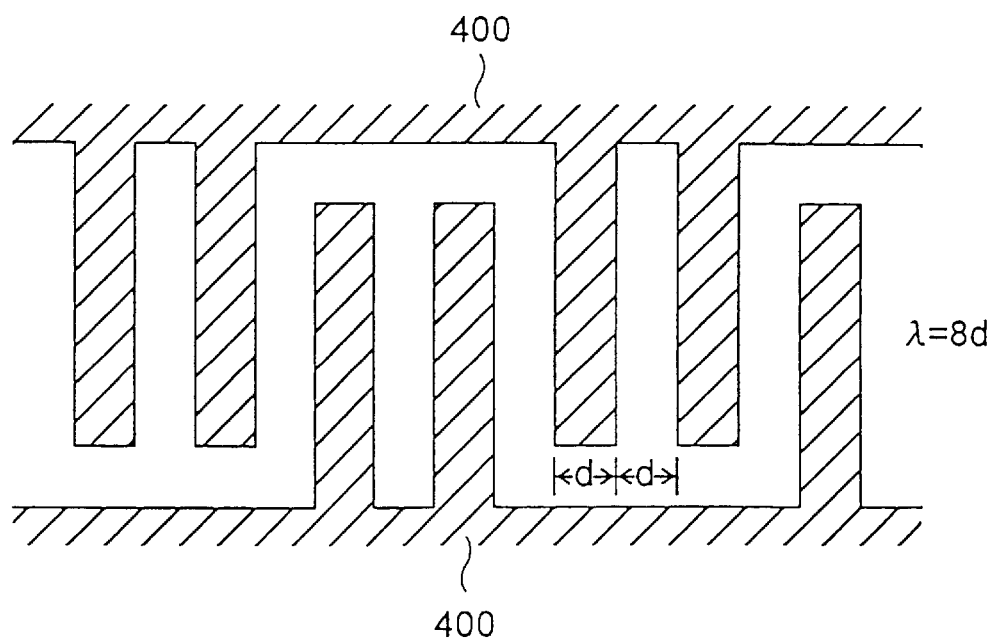
FIG. 4 is an explanatory view of the shape of the second example (double electrode) of the interdigital transducer.

In the SAW device of the first embodiment, when the interdigital transducer 400 is used to excite an SAW, a plurality of SAWs with different propagation velocities V are excited (0th-order mode, 1st-order mode, 2nd-order mode, . . . in ascending order of the propagation velocities V). Therefore, the mode of an SAW used in the SAW device can be determined by measuring the propagation velocity V of the SAW at the operating frequency of the device. This propagation velocity V can be obtained from, e.g., a relation V=f$\lambda$ (f is the center frequency; $\lambda$ is the wavelength based on the electrode width of the interdigital transducer 400). When the interdigital transducer 400 constituting the SAW device is a single electrode finger structure (electrode width d) having a planar shape as shown in FIG. 3, $\lambda$=4d. When the interdigital transducer 400 is a double electrode finger structure (electrode width d) having a planar shape as shown in FIG. 4, $\lambda$=8d.

The SAW device of the first embodiment uses an SAW in the 1st-order mode.

As the diamond 100, single crystal diamond and/or polycrystalline diamond can be used. The method of obtaining the diamond 100 is not particularly limited. More specifically, single crystal diamond may be used as the diamond. In addition, a diamond layer may be formed on any material (substrate) by epitaxial growth to obtain the diamond 100 as a polycrystalline diamond layer or an epitaxial diamond layer.

The base material for forming the diamond layer is not particularly limited and can be appropriately selected depending on the application purpose of the SAW device. In the first embodiment, a semiconductor such as Si, a metal, a glass material, a ceramic, or the like can be used as the material.

When the diamond 100 is a diamond layer, the method of growing the diamond layer is not particularly limited. More specifically, a known technique such as CVD (Chemical Vapor Deposition), microwave plasma CVD, PVD (Physical Vapor Deposition), sputtering, ion plating, a plasma jet method, a flame method, or a hot filament method can be used as the growth method.

The plane orientation of the diamond 100 is not particularly limited. The diamond 100 can have a plane orientation (111), (100), or (110), or can have two or more of them simultaneously.

When the diamond 100 is to be obtained as a layer, the thickness of the diamond 100 is set such that $kh_2 \geq 4$ is satisfied when $t_2$ represents the thickness of the diamond 100, and a relation $kh_2 = 2\pi(t_2/\lambda)$ holds.

If the diamond layer is thin, the SAW characteristics vary. However, when the thickness $t_2$ [μm] of the diamond layer is set such that $kh_2 \geq 4$ holds, the variation amount poses no practical problem. More preferably, $kh_2 \geq 8$. In this case, the variation amount can be further reduced.

The short-circuit electrode 200 is an electrode having a function of setting an equipotential of an electric field to change the SAW characteristics of the device. The short-circuit electrode 200 is preferably formed of a (thin) metal film (e.g., Al, Au, or Al—Cu). Since the short-circuit electrode 200 has a function different from that of the interdigital transducer 400, the material of the short-circuit electrode 200 need not be the same as that of the interdigital transducer 400.

The thickness of the short-circuit electrode 200 is not particularly limited as far as the function as a short-circuit electrode can be obtained. However, it is preferably about 50 to 3,000 Å (more preferably, about 100 to 500 Å). When this thickness is smaller than 50 Å, it is difficult to set an equipotential. On the other hand, a thickness larger than 3,000 Å results in a decrease in velocity of an SAW.

The short-circuit electrode 200 preferably has a planar shape of, e.g., a "solid electrode" having the same area as that of the interdigital transducer 400.

The material of the interdigital transducer 400 is not particularly limited as far as it is a conductive material. From the viewpoint of workability as an interdigital transducer and cost, Al (aluminum) can be particularly preferably used.

The thickness of the interdigital transducer 400 is preferably about 100 to 5,000 Å (more preferably, about 100 to 500 Å) though it is not particularly limited as far as the function as an interdigital transducer can be obtained. When this thickness is smaller than 100 Å, the resistivity increases, resulting in an increase in loss. On the other hand, when the thickness of the electrode exceeds 5,000 Å, the mass addition effect which causes reflection of an SAW due to the thickness and height of the electrode becomes conspicuous, and desired SAW characteristics may be impeded.

The planar shape of the interdigital transducer 400 is not particularly limited as far as the function as an interdigital transducer can be obtained. A so-called single electrode finger structure whose schematic plan view is shown in FIG. 3 or a double electrode finger structure whose schematic plan view is shown in FIG. 4 can be preferably used.

The LiNbO₃ layer 310 is formed by bonding a cut single crystal LiNbO₃ thin plate to the diamond 100 having the short-circuit electrode 200 formed on its polished surface, and then polishing the single crystal LiNbO₃ thin plate.

For the LiNbO₃ layer 310, a thickness $t_1$ [μm] and a crystal orientation (θ[°],Φ[°],ψ[°]) are selected from the following values. Note that $kh_1$ (=$2\pi(t_1/\lambda)$; λ=the wavelength [μm] of an SAW) is used instead of the thickness $t_1$.

An arbitrarily value within the range of $0° \leq \Phi \leq 30°$ is set. The remaining values are set on an orthogonal coordinate system ($kh_1,\theta,\psi$).

(i) On the orthogonal coordinate system ($kh_1,\theta,\psi$), values in the internal region of a hexahedron which has, as its opposing bottom surfaces, a planar rectangular region with its vertexes at points $A_{11}$, $B_{11}$, $C_{11}$ and $D_{11}$, and a planar rectangular region with its vertexes at points $A_{12}$ $B_{12}$ $C_{12}$ and $D_{12}$,
where point $A_{11}$=(0.45, 80, 140)

point $B_{11}$=(0.45, 100, 140)

point $C_{11}$=(0.45, 100, 180)

point $D_{11}$=(0.45, 80, 180)

point $A_{12}$=(0.7, 70, 120)

point $B_{12}$=(0.7, 110, 120)

point $C_{12}$=(0.7, 110, 180)

point $D_{12}$=(0.7, 60, 180).

(ii) On the orthogonal coordinate system ($kh_1,\theta, \psi$), values in the internal region of a hexahedron which has, as its opposing bottom surfaces, a planar rectangular region with its vertexes at points $A_{13}$ $B_{13}$ $C_{13}$ and $D_{13}$, and a planar rectangular region with its vertexes at points $A_{14}$ $B_{14}$ $C_{14}$ and $D_{14}$,
where point $A_{13}$=(0.45, 80, 0)

point $B_{13}$=(0.45, 90, 0)

point $C_{13}$=(0.45, 90, 10)

point $D_{13}$=(0.45, 80, 20)

point $A_{14}$=(0.7, 60, 0)

point $B_{14}$=(0.7, 110, 0)

point $C_{14}$=(0.7, 90, 40)

point $D_{14}$=(0.7, 80, 40).

Figure 5:
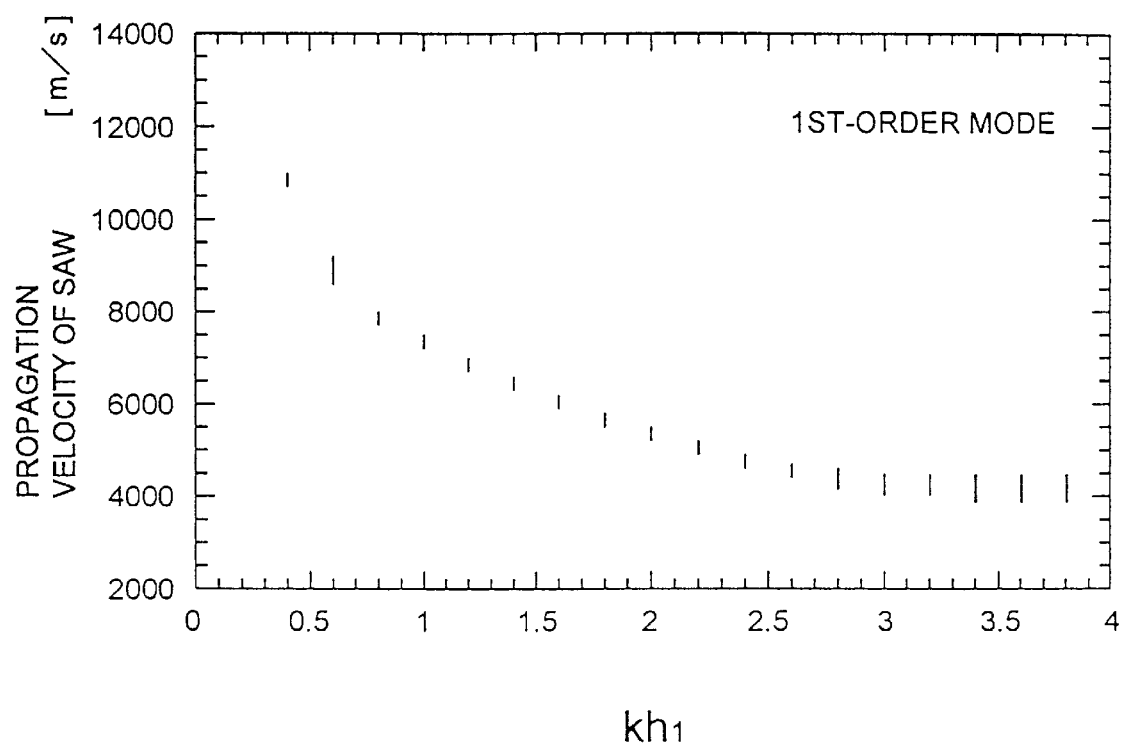
FIG. 5 is a graph showing the relationship between $kh_1$ and a propagation velocity V of an SAW in the 1st-order mode.
Figure 6:
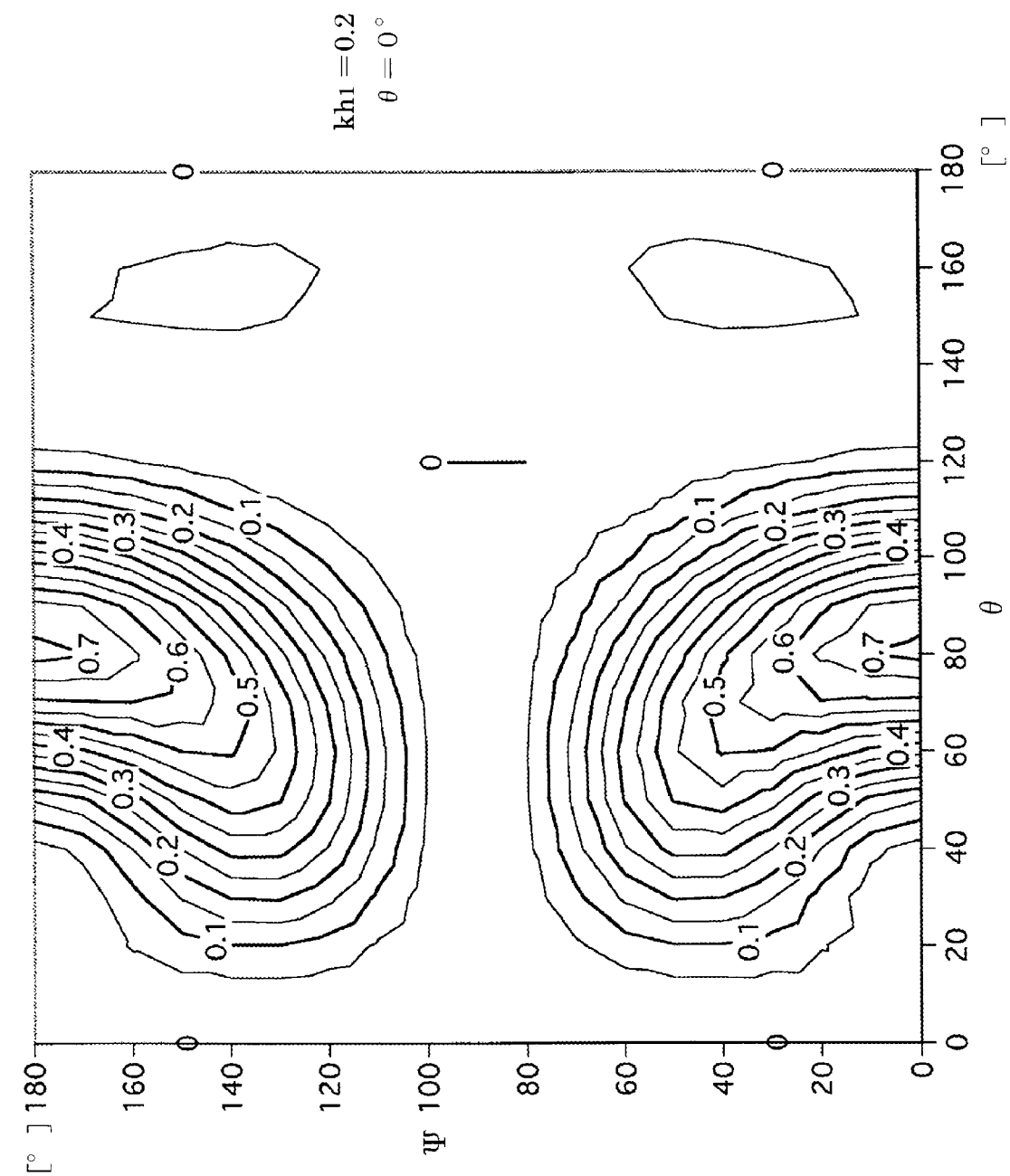
FIG. 6 is a graph showing the evaluation result of $K^2$ in the first embodiment ($kh_1=0.2$, $\Phi=0°$)
Figure 7:
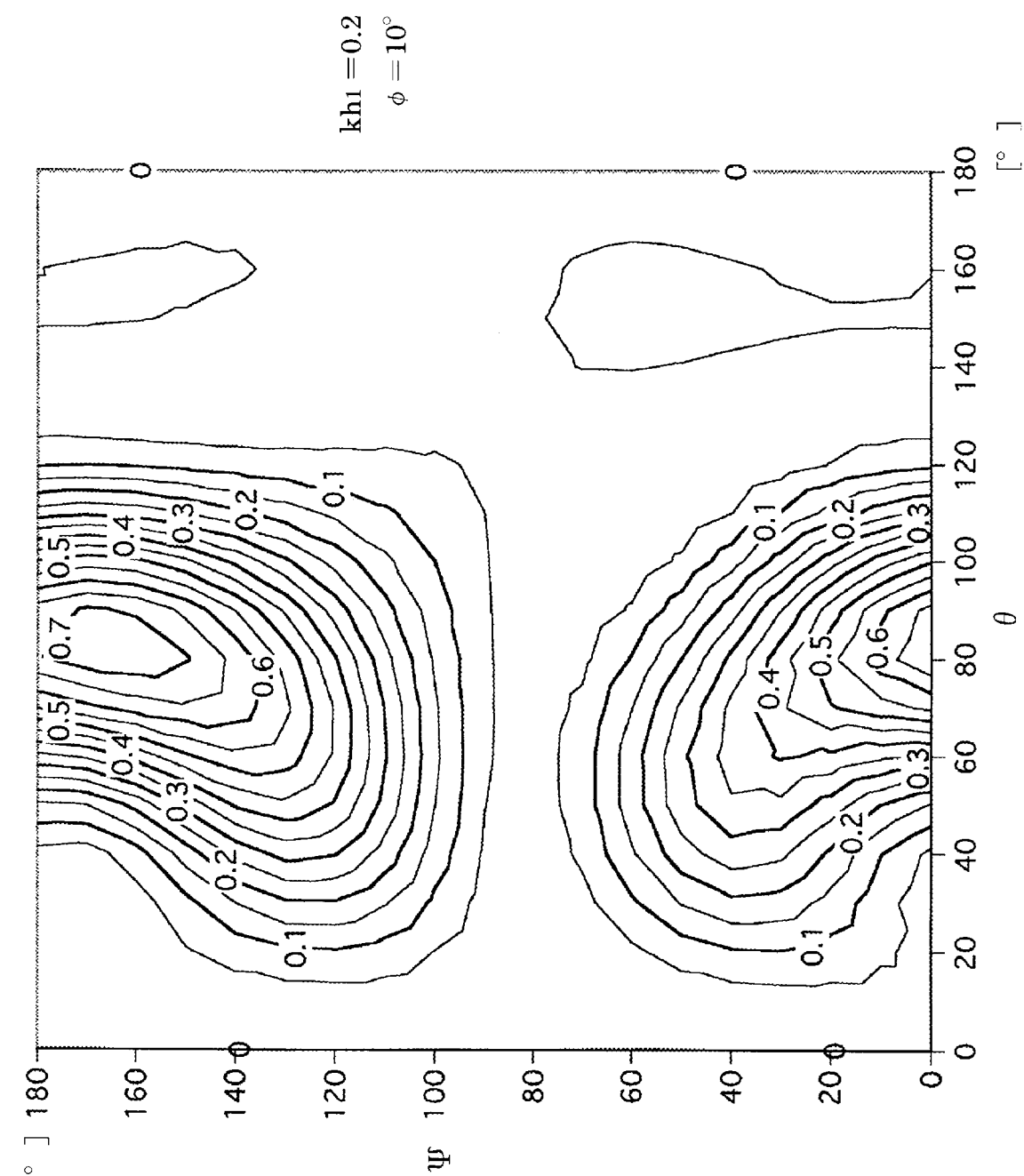
FIG. 7 is a graph showing the evaluation result of $K^2$ in the first embodiment ($kh_1=0.2$, $\Phi=10°$)
Figure 8:
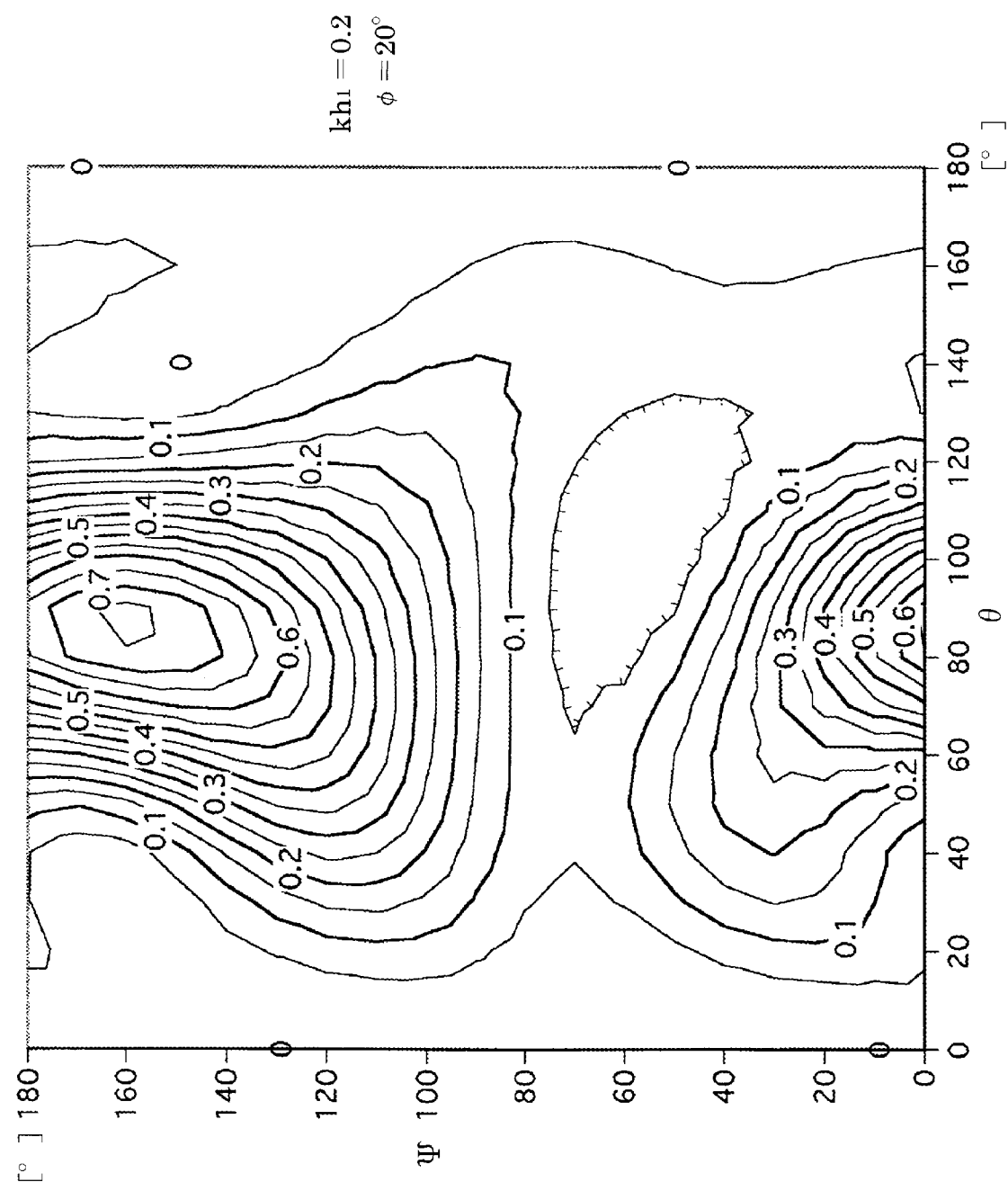
FIG. 8 is a graph showing the evaluation result of $K^2$ in the first embodiment ($kh_1=0.2$, $\Phi=20°$)
Figure 9:
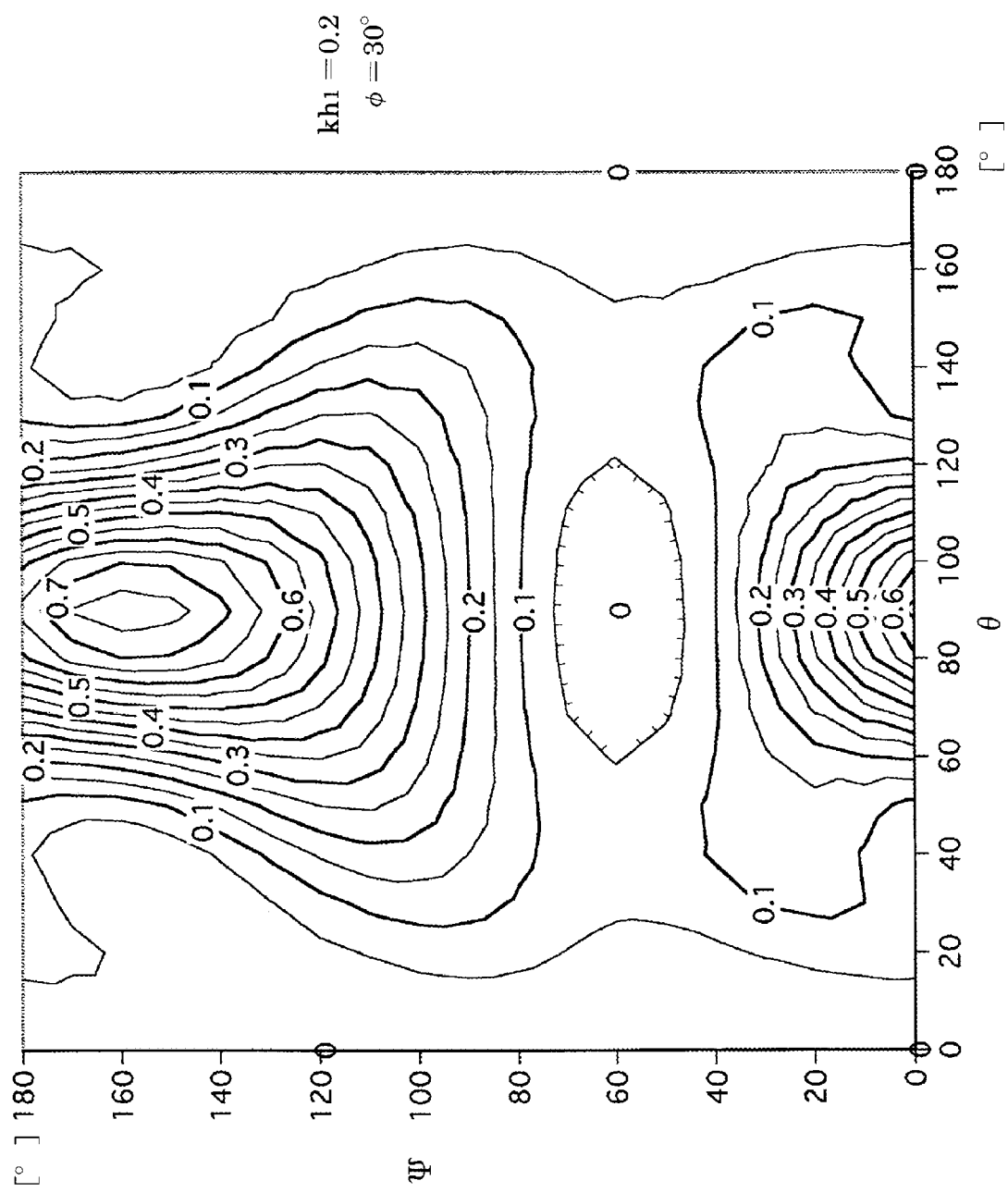
FIG. 9 is a graph showing the evaluation result of $K^2$ in the first embodiment ($kh_1=0.2$, $\Phi=30°$)
Figure 10:
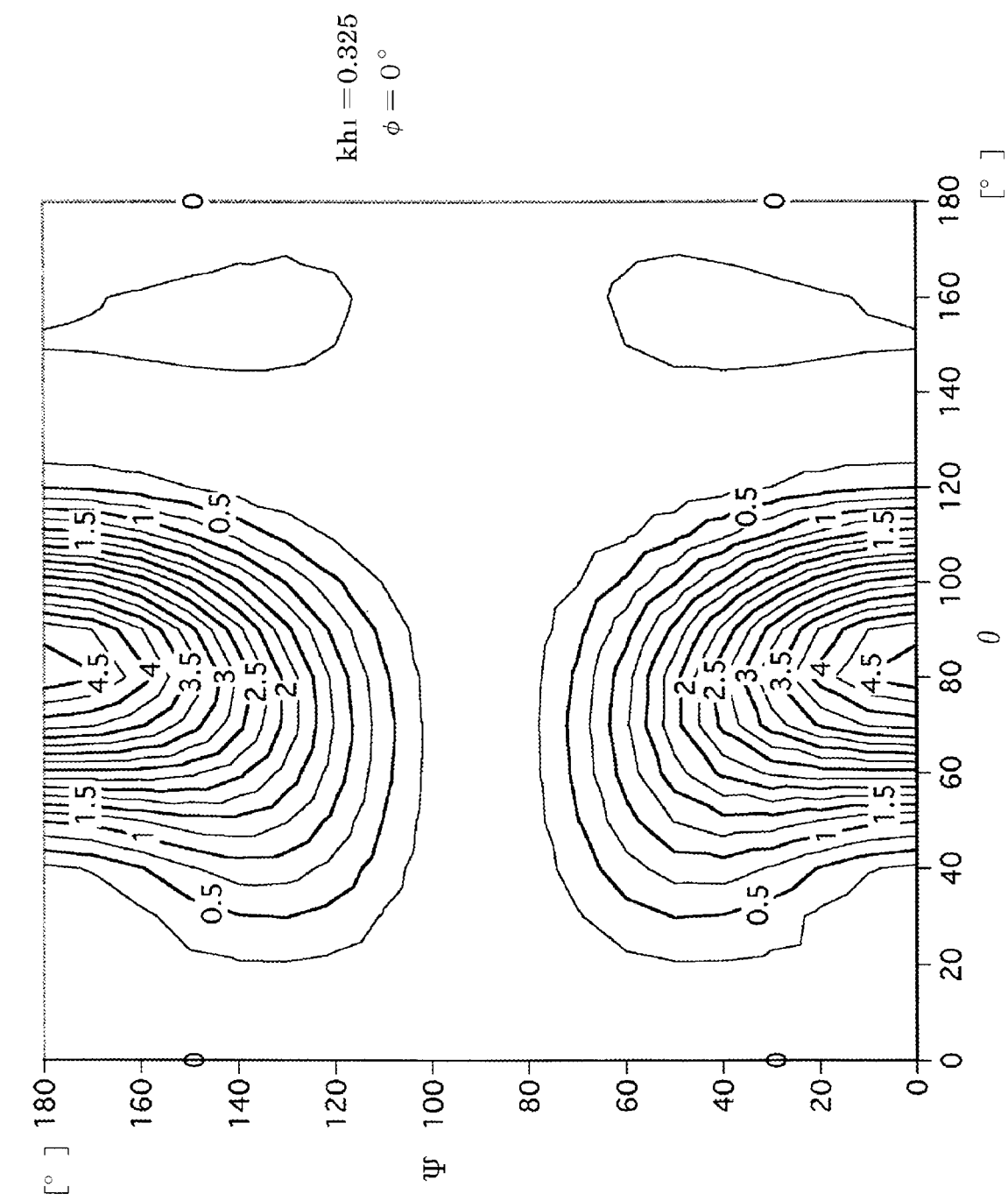
FIG. 10 is a graph showing the evaluation result of $K^2$ in the first embodiment ($kh_1=0.325$, $\Phi=0°$)
Figure 11:
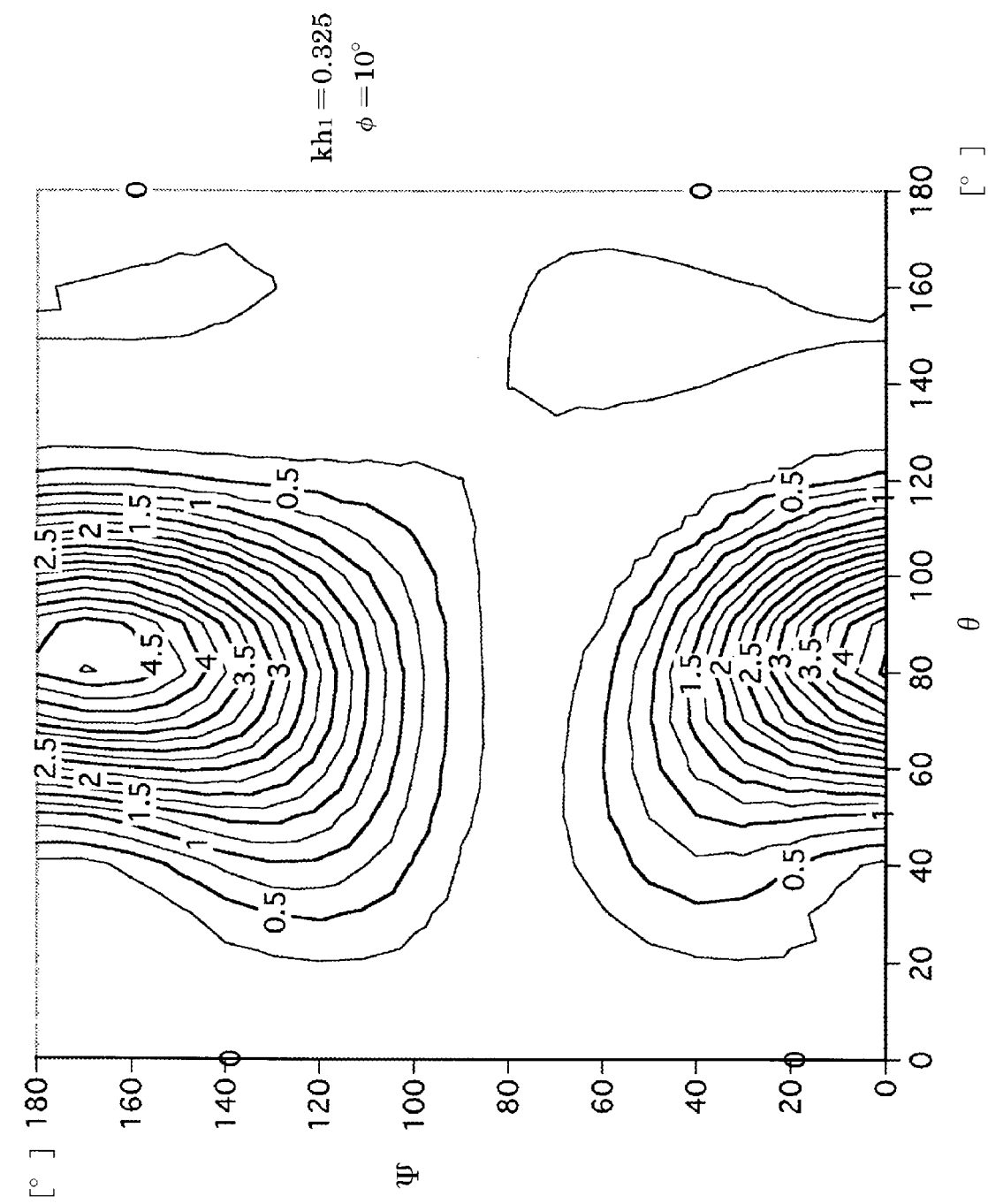
FIG. 11 is a graph showing the evaluation result of $K^2$ in the first embodiment ($kh_1=0.325$, $\Phi=10°$)
Figure 12:
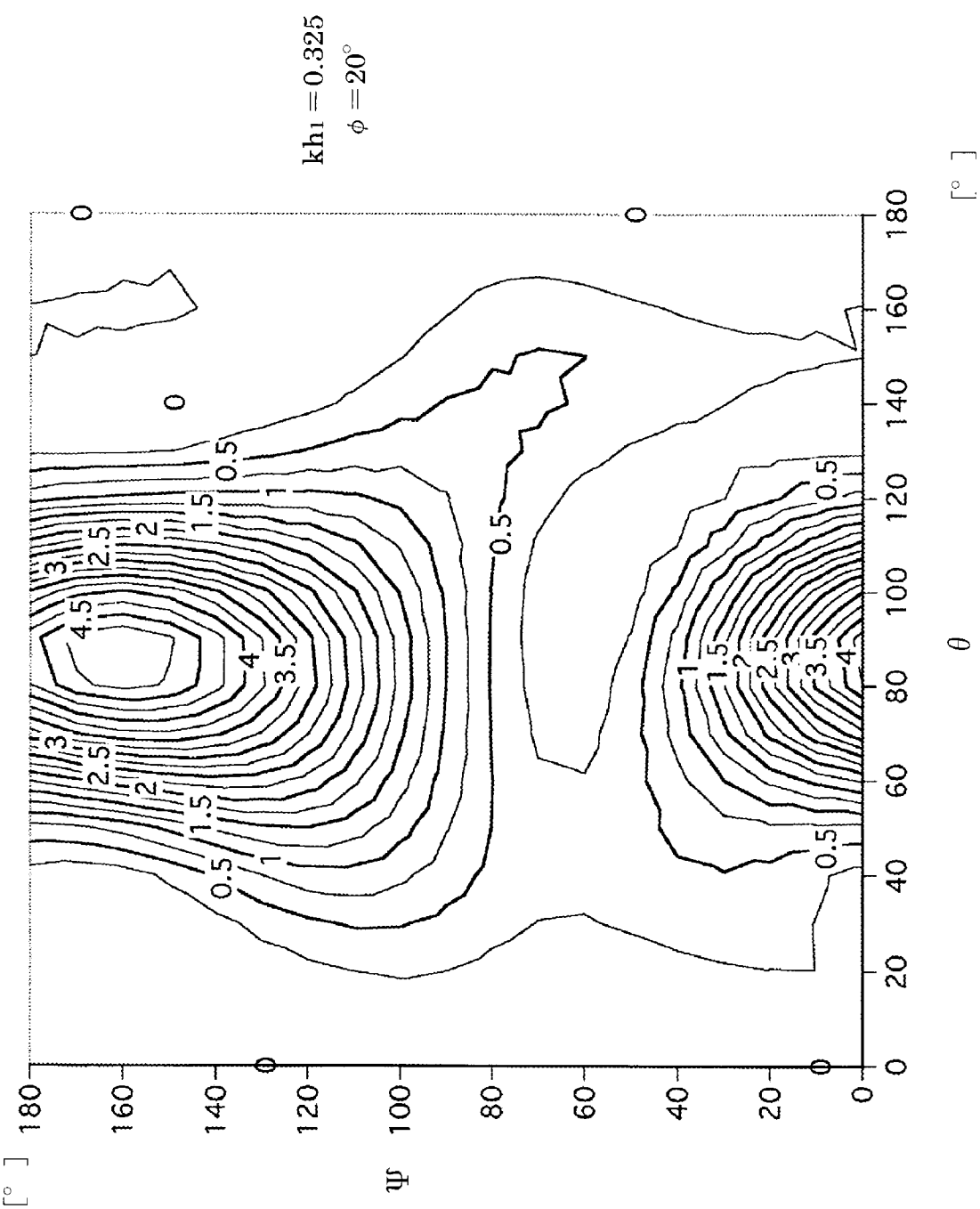
FIG. 12 is a graph showing the evaluation result of $K^2$ in the first embodiment ($kh_1=0.325$, $\Phi=20°$)
Figure 13:
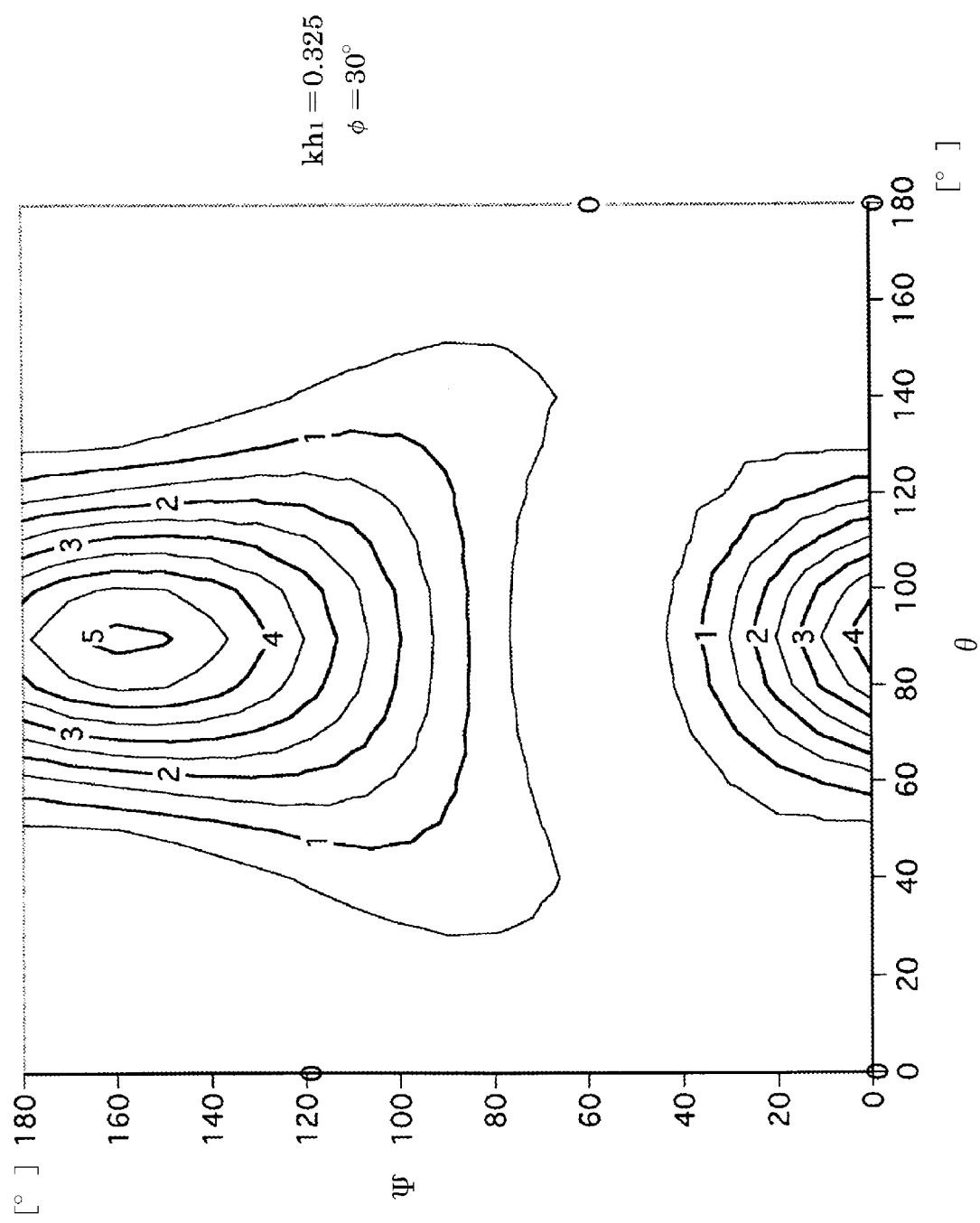
FIG. 13 is a graph showing the evaluation result of $K^2$ in the first embodiment ($kh_1=0.325$, $\Phi=30°$)
Figure 14:
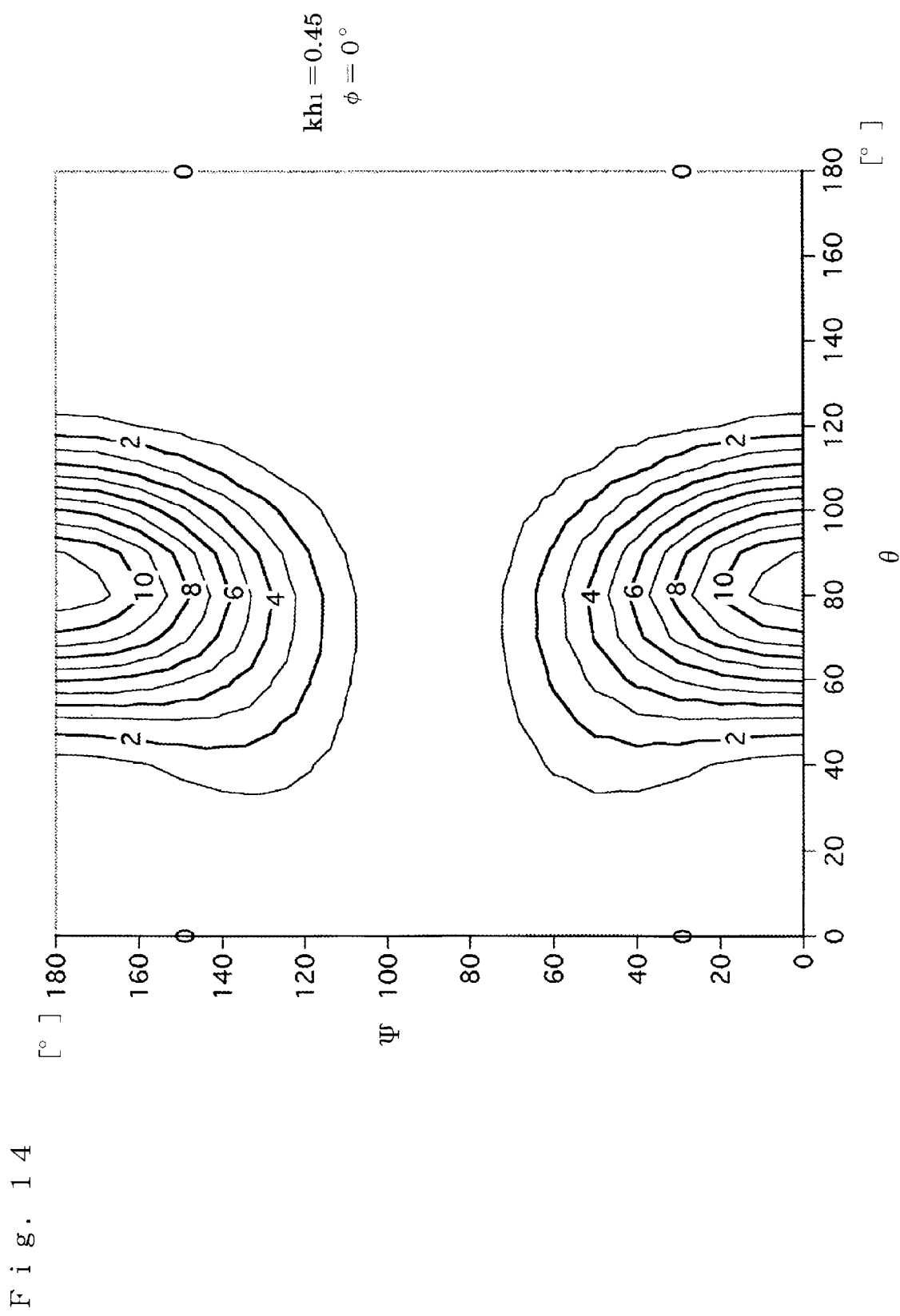
FIG. 14 is a graph showing the evaluation result of $K^2$ in the first embodiment ($kh_1=0.45$, $\Phi=0°$)
Figure 15:
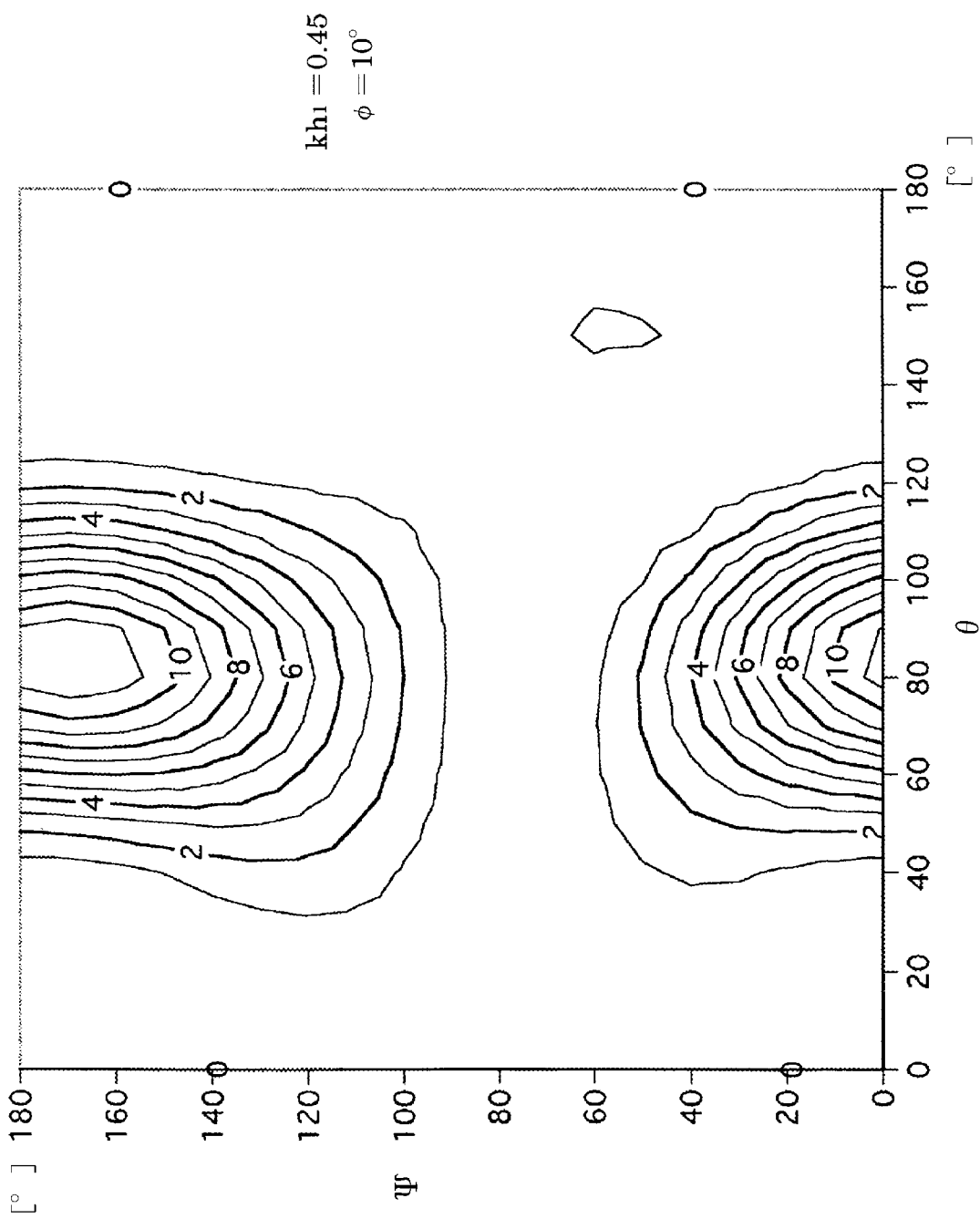
FIG. 15 is a graph showing the evaluation result of $K^2$ in the first embodiment ($kh_1=0.45$, $\Phi=10°$)
Figure 16:
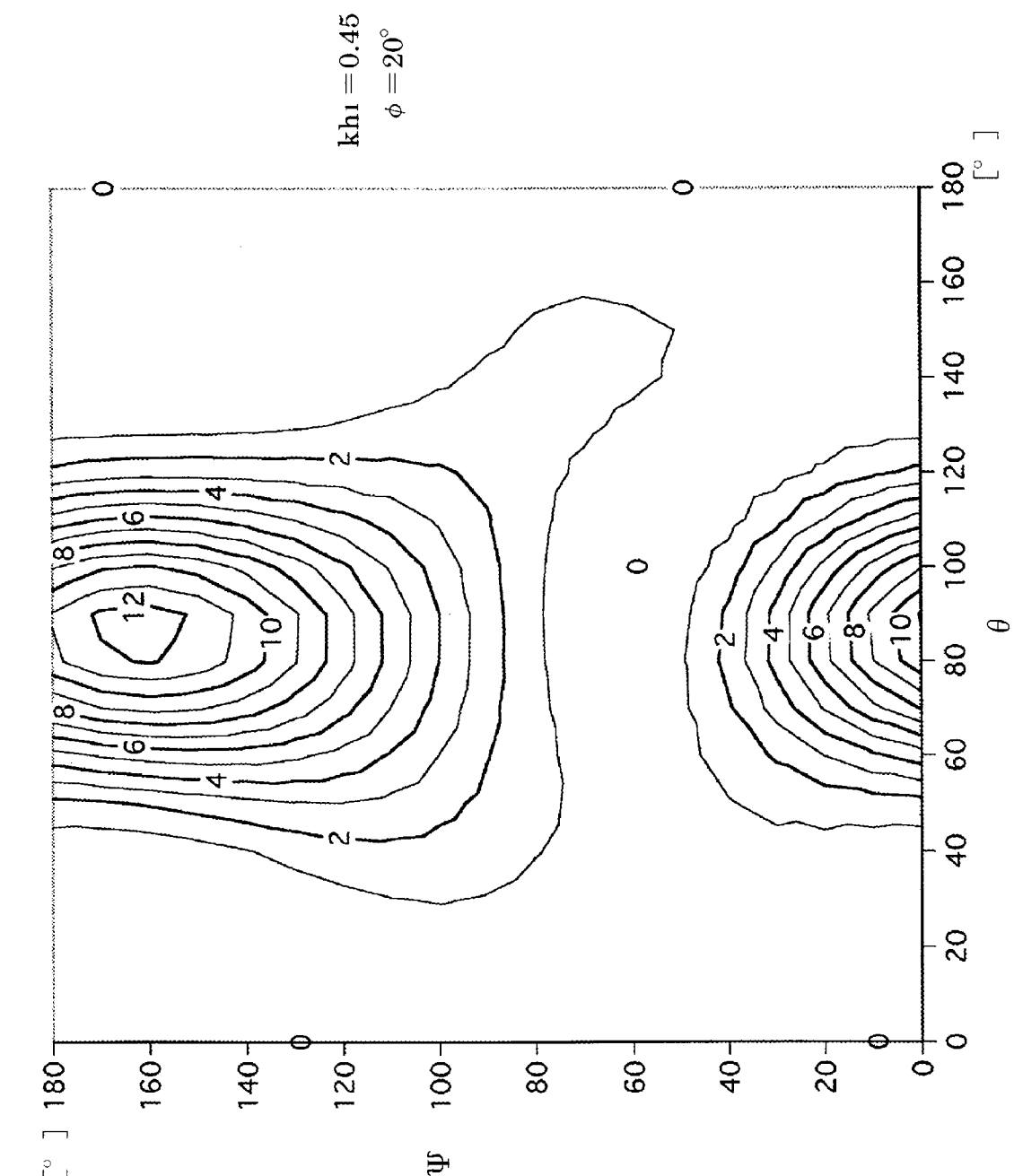
FIG. 16 is a graph showing the evaluation result of $K^2$ in the first embodiment ($kh_1=0.45$, $\Phi=20°$)
Figure 17:
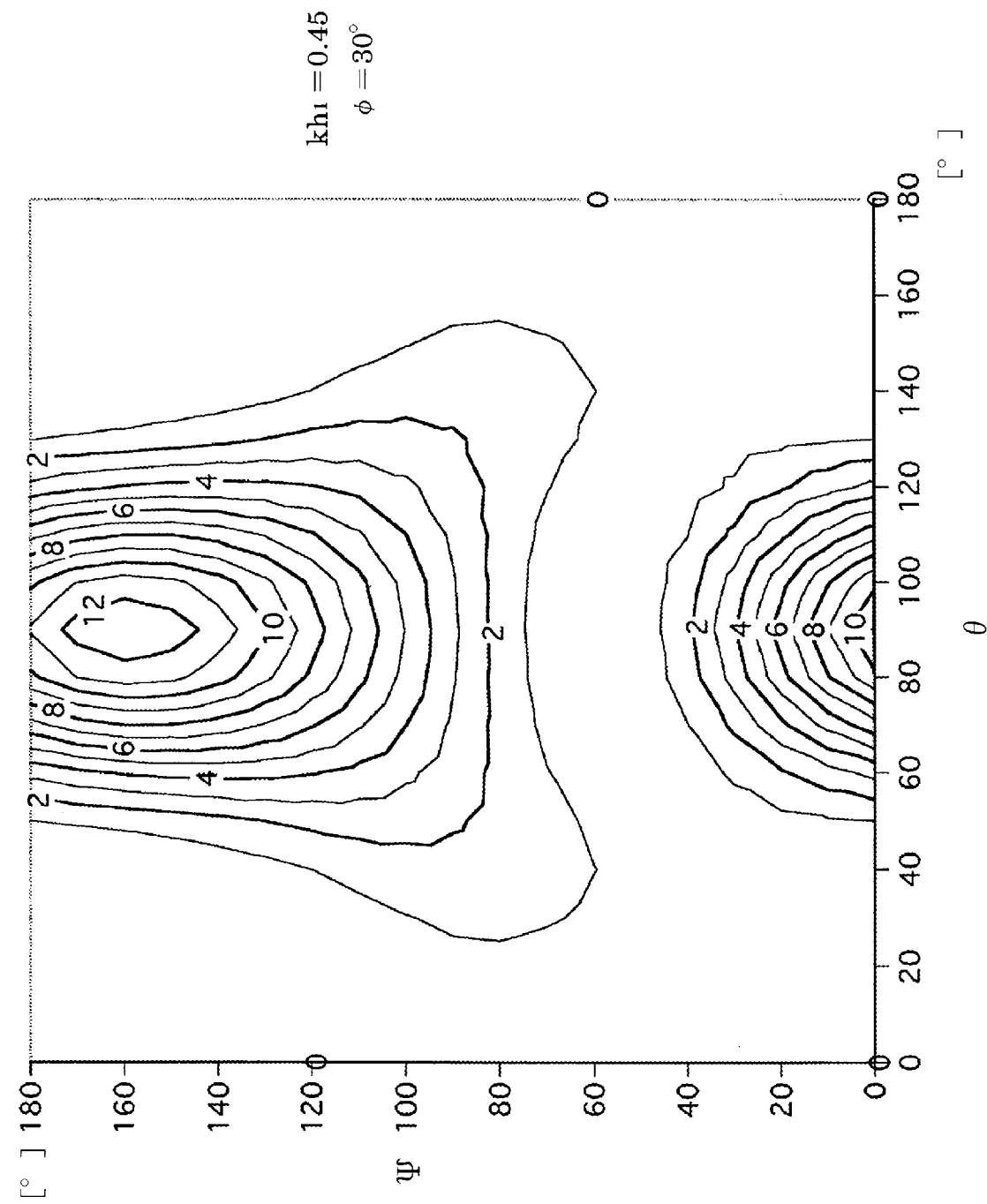
FIG. 17 is a graph showing the evaluation result of $K^2$ in the first embodiment ($kh_1=0.45$, $\Phi=30°$)
Figure 18:
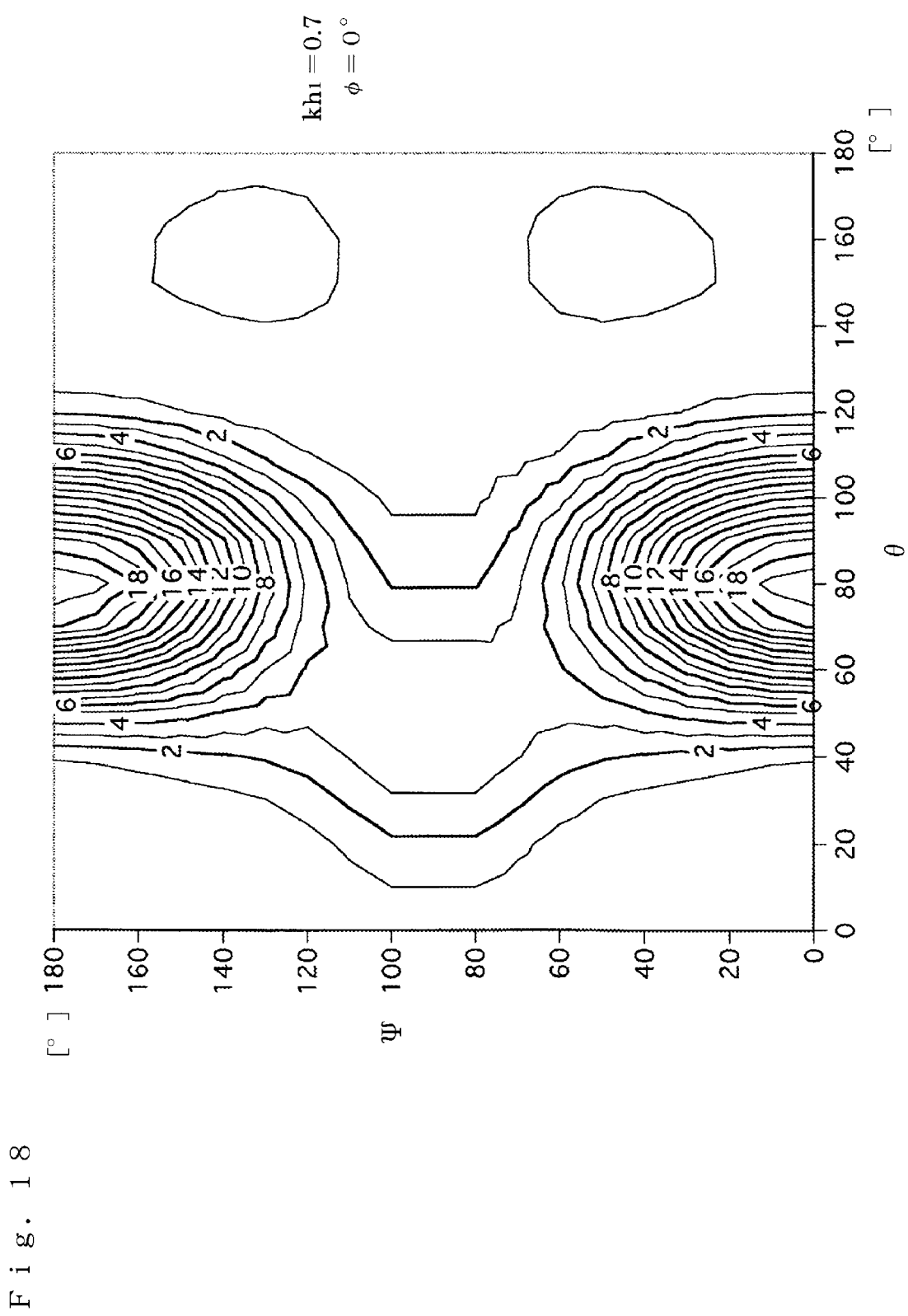
FIG. 18 is a graph showing the evaluation result of $K^2$ in the first embodiment ($kh_1=0.7$, $\Phi=0°$)
Figure 19:
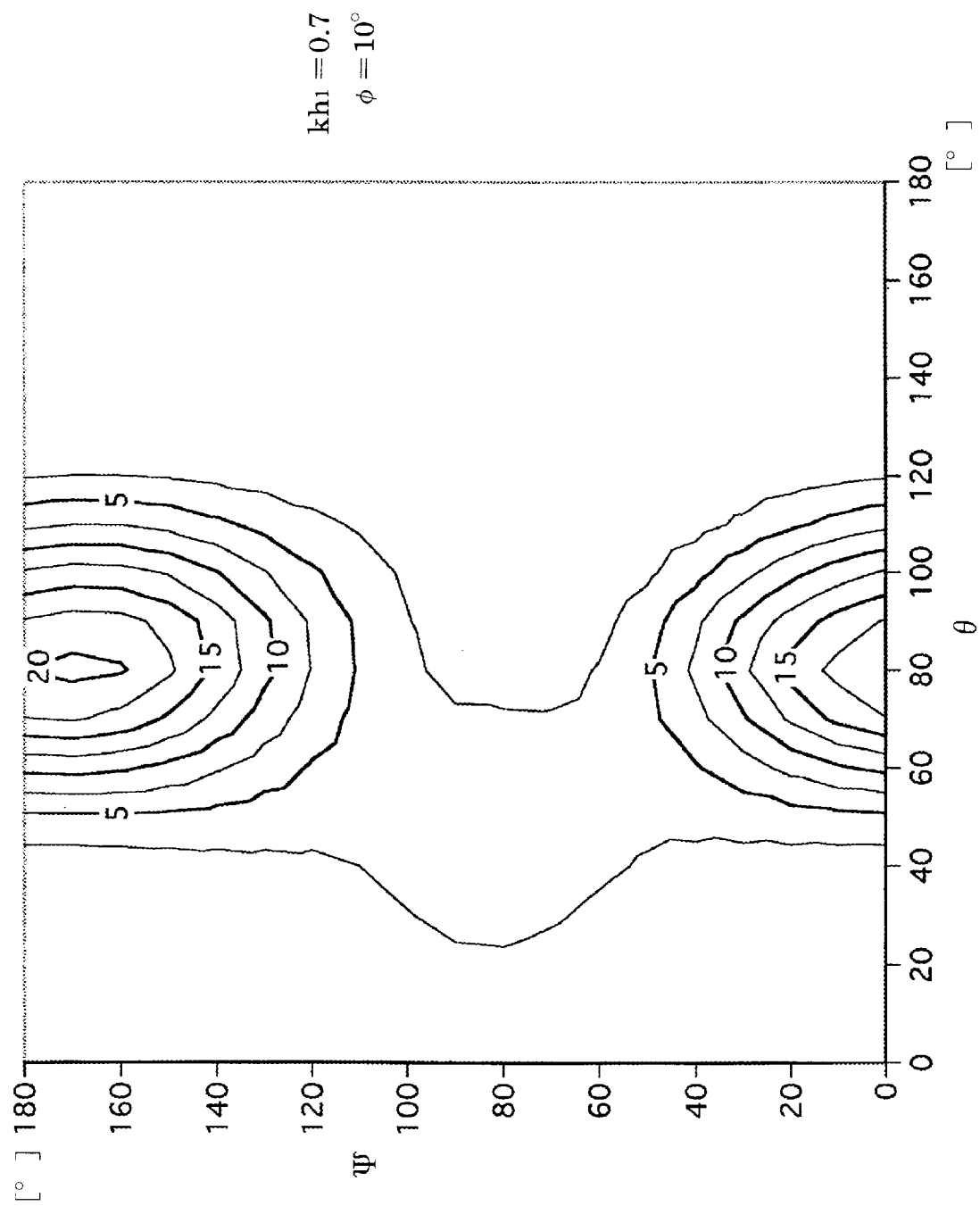
FIG. 19 is a graph showing the evaluation result of $K^2$ in the first embodiment ($kh_1=0.7$, $\Phi=10°$)
Figure 20:
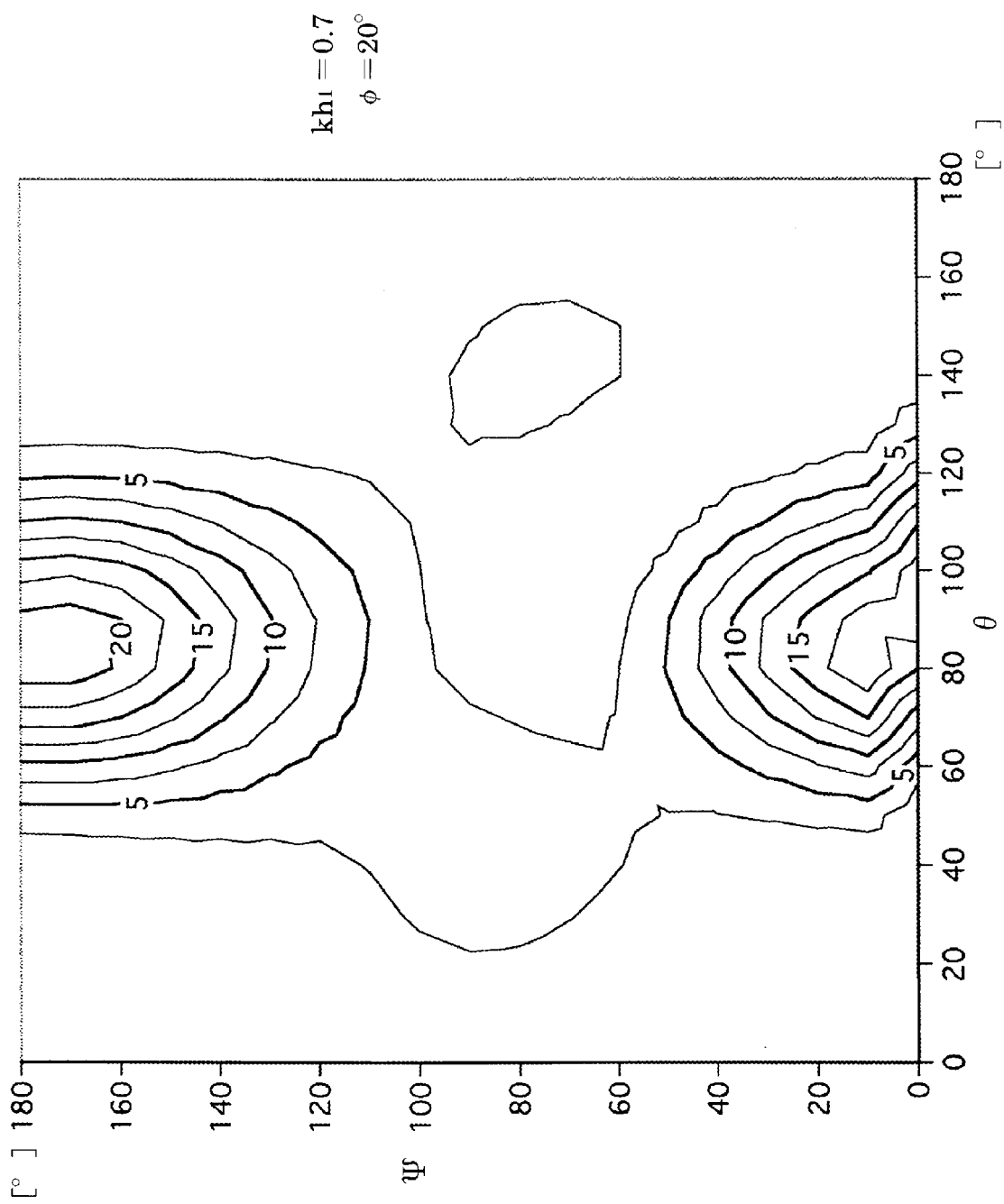
FIG. 20 is a graph showing the evaluation result of $K^2$ in the first embodiment ($kh_1=0.7$, $\Phi=20°$)
Figure 21:
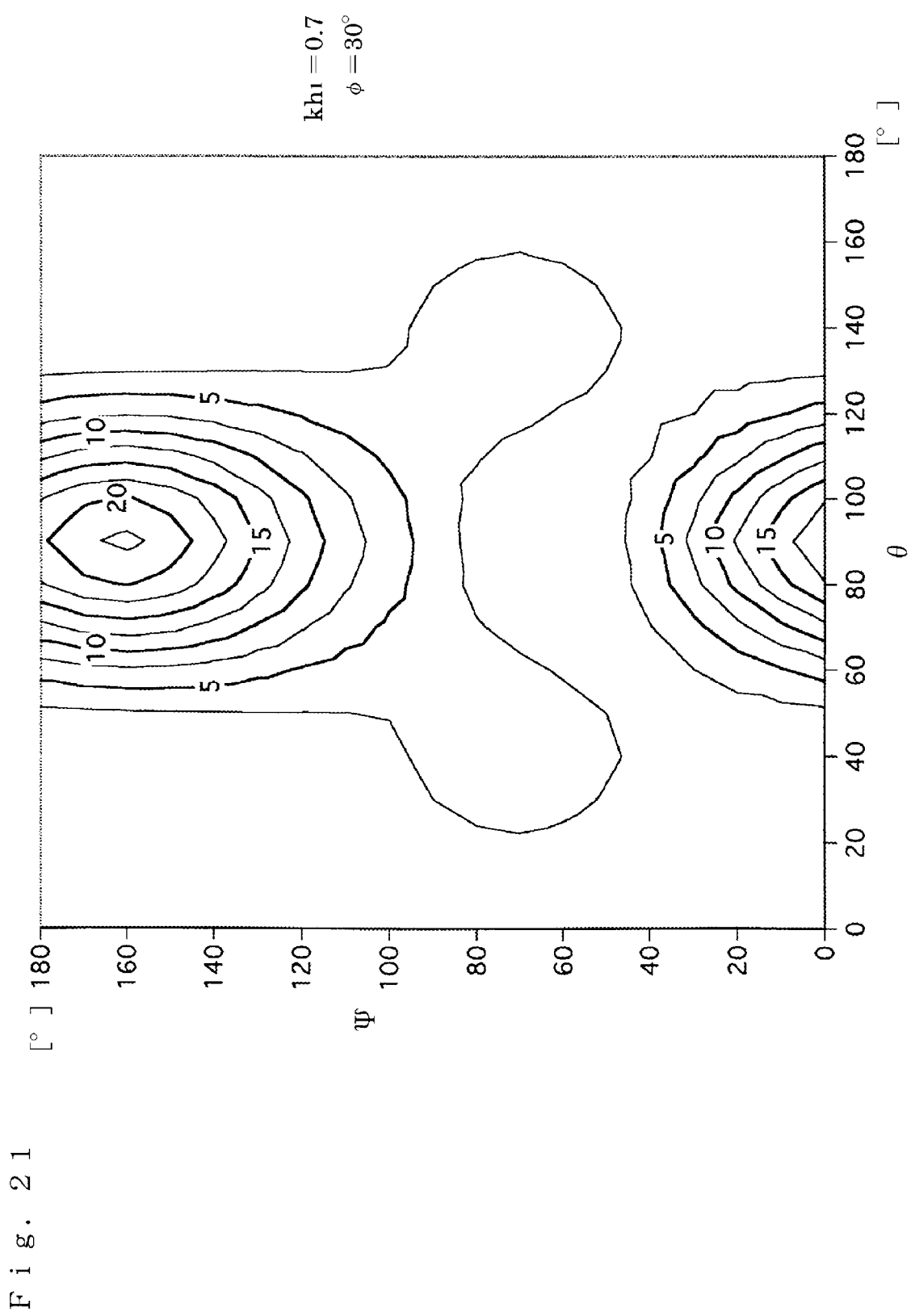
FIG. 21 is a graph showing the evaluation result of $K^2$ in the first embodiment ($kh_1=0.7$, $\Phi=30°$)

In the structure of the SAW device according to the first embodiment, the propagation velocity V is exclusively determined by $kh_1$ of the LiNbO₃ layer 310. FIG. 5 is a graph showing the relationship between $kh_1$ of the LiNbO₃ layer 310 and the propagation velocity V of an SAW in the 1st-order mode in the SAW device of the first embodiment. It is confirmed from FIG. 5 that, when $kh_1$ is equal to or smaller than 0.7, a propagation velocity V equal to or higher than 8,000 m/s is ensured.

The present inventors set the thickness of the diamond 100 at 20 μm, and evaluated an electromechanical coupling coefficient $K^2$ while changing $kh_1$ within the above-described limitation for $kh_1$ and simultaneously changing the values θ, Φ, and ψ.

FIGS. 6 to 21 are graphs showing contour lines obtained upon evaluating the electromechanical coupling coefficient $K^2$ [%] under conditions that $kh_1$=0.20, 0.325, 0.45, and 0.7, Φ=0°, 10°, 20°, and 30°, $0° \leq \theta \leq 180°$, and $0° \leq \psi \leq 180°$. Note that the values θ and ψ are plotted in units of 10° in these graphs.

Regions for satisfying the electromechanical coupling coefficient $K^2$ of 10% or more are obtained from FIGS. 6 to 21. Taking the symmetry of the LiNbO₃ crystal into consideration, it is confirmed that, when the propagation velocity V is 8,000 m/s or more, and the electromechanical coupling coefficient $K^2$ is 10% or more, the value Φ is arbitrarily set within the range of $0° \leq \Phi \leq 360°$, and the remaining parameters $kh_1$, θ, and ψ are set, on the orthogonal coordinate system ($kh_1,\theta,\psi$), in the internal region of the symmetric hexahedron with that represented by (i) or (ii).

(Second Embodiment)

Figure 22:
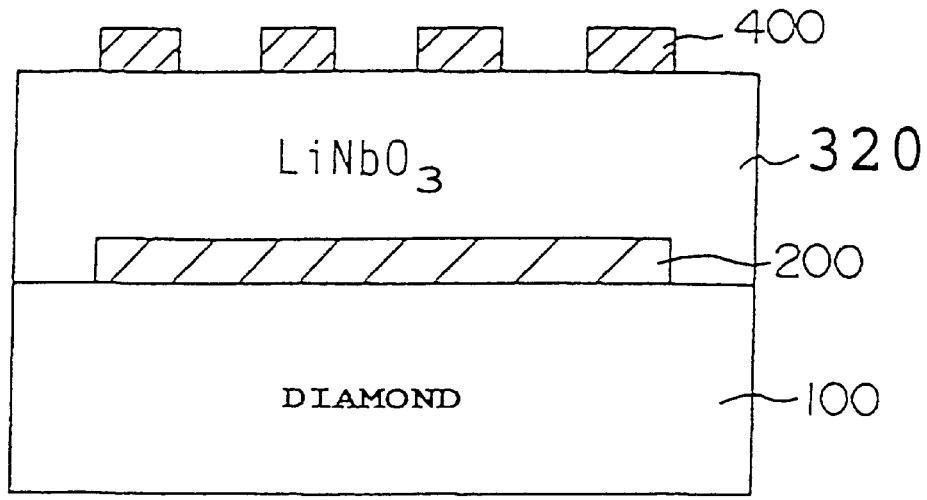
FIG. 22 is a sectional view showing the structure of an SAW device according to the second embodiment of the present invention.

FIG. 22 is a sectional view showing the structure of an SAW device according to the second embodiment of the present invention. As shown in FIG. 22, the SAW device of the second embodiment is different from that of the first embodiment only in that an SAW in the 2nd-order mode is used, and an LiNbO$_3$ layer 320 is formed in place of the LiNbO$_3$ layer 310.

The LiNbO$_3$ layer 320 is formed by bonding a cut single crystal LiNbO$_3$ thin plate to diamond 100 having a short-circuit electrode 200 formed on its polished surface, and then polishing the single crystal LiNbO$_3$ thin plate.

For the LiNbO$_3$ layer 320, a thickness $t_1$ [µm] and a crystal orientation ($\theta$[°],$\Phi$[°],$\psi$[°]) are selected from the following values. Note that kh$_1$ (=$2\pi(t_1/\lambda)$; $\lambda$=the wavelength [µm] of an SAW) is used instead of the thickness $t_1$, as in the first embodiment.

(i) $0 \leq \Phi \leq 15$ on an orthogonal coordinate system (kh$_1$,$\theta$,$\psi$), values in the internal region of a hexahedron which has, as its opposing bottom surfaces, a planar rectangular region with its vertexes at points A$_{21}$ B$_{21}$ C$_{21}$ and D$_{21}$, and a planar rectangular region with its vertexes at points A$_{22}$ B$_{22}$ C$_{22}$ and D$_{22}$,
where point A$_{21}$=(0.6, 60, 40)

point B$_{21}$=(0.6, 110, 40)

point C$_{21}$=(0.6, 110, 120)

point D$_{21}$=(0.6, 60, 120)

point A$_{22}$=(0.85, 50, 70)

point B$_{22}$=(0.85, 130, 0)

point C$_{22}$=(0.85, 130, 180)

point D$_{22}$=(0.85, 50, 100).

(ii) $0 \leq \Phi \leq 15$ on the orthogonal coordinate system (kh$_1$, $\theta$,$\psi$), values in the internal regions of four hexahedrons each of which has, as its opposing bottom surfaces, the planar rectangular region with its vertexes at the points A$_{22}$ B$_{22}$ C$_{22}$ and D$_{22}$, and a planar rectangular region with its vertexes at points A$_{23}$ B$_{23}$ C$_{23}$ and D$_{23}$,
where point A$_{23}$=(1.1, 40, 60)

point B$_{23}$=(1.1, 140, 0)

point C$_{23}$=(1.1, 140, 180)

point D$_{23}$=(1.1, 40, 110).

(iii) $15 \leq \Phi \leq 30$ on the orthogonal coordinate system (kh$_1$,$\theta$,$\psi$), values in the internal region of a hexahedron which has, as its opposing bottom surfaces, a planar rectangular region with its vertexes at points A$_{24}$ B$_{24}$ C$_{24}$ and D$_{24}$, and a planar rectangular region with its vertexes at points A$_{25}$ B$_{25}$ C$_{25}$ and D$_{25}$,
where point A$_{24}$=(0.6, 60, 30)

point B$_{24}$=(0.6, 120, 30)

point C$_{24}$=(0.6, 120, 100)

point D$_{24}$=(0.6, 60, 100)

point A$_{25}$=(0.85, 50, 30)

point B$_{25}$=(0.85, 130, 30)

point C$_{25}$=(0.85, 130, 110)

point D$_{25}$=(0.85, 50, 110).

(iv) $15 \leq \Phi \leq 30$ on the orthogonal coordinate system (kh$_1$,$\theta$,$\psi$), values in the internal region of a hexahedron which has, as its opposing bottom surfaces, the planar rectangular region with its vertexes at the points A$_{25}$ B$_{25}$ C$_{25}$ and D$_{25}$, and a planar rectangular region with its vertexes at points A$_{26}$ B$_{26}$ C$_{26}$ and D$_{26}$.
where point A$_{26}$=(1.1, 40, 30)

point B$_{26}$=(1.1, 140, 30)

point C$_{26}$=(1.1, 140, 120)

point D$_{26}$=(1.1, 40, 120).

Figure 23:
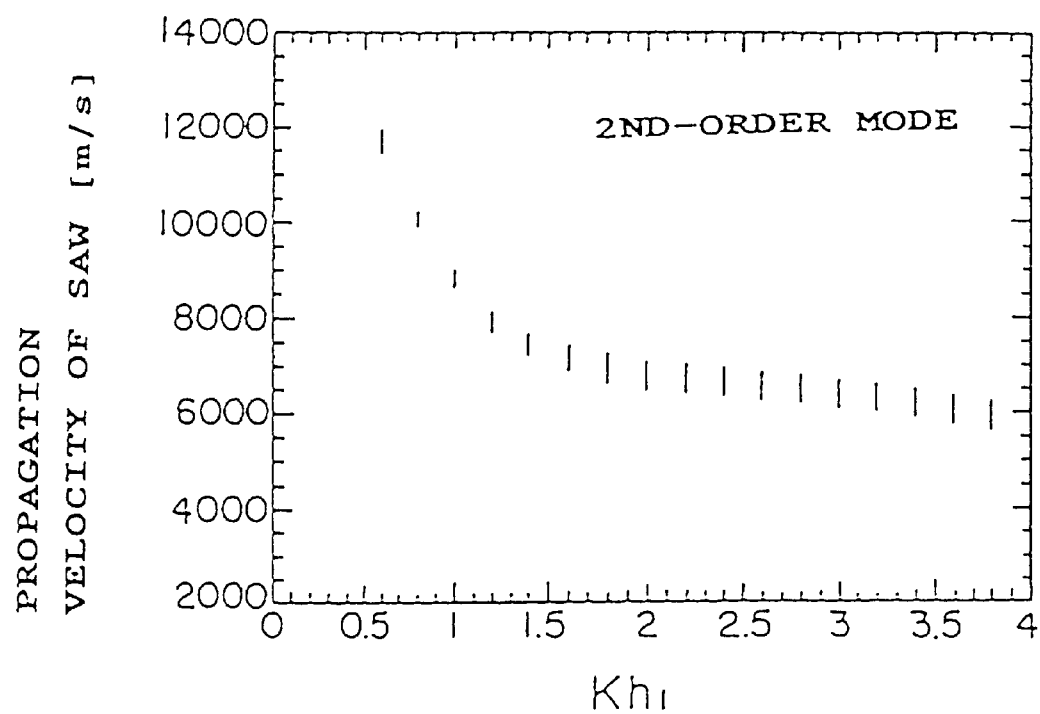
FIG. 23 is a graph showing the relationship between $kh_1$ and a propagation velocity V of an SAW in the 2nd-order mode.
Figure 24:
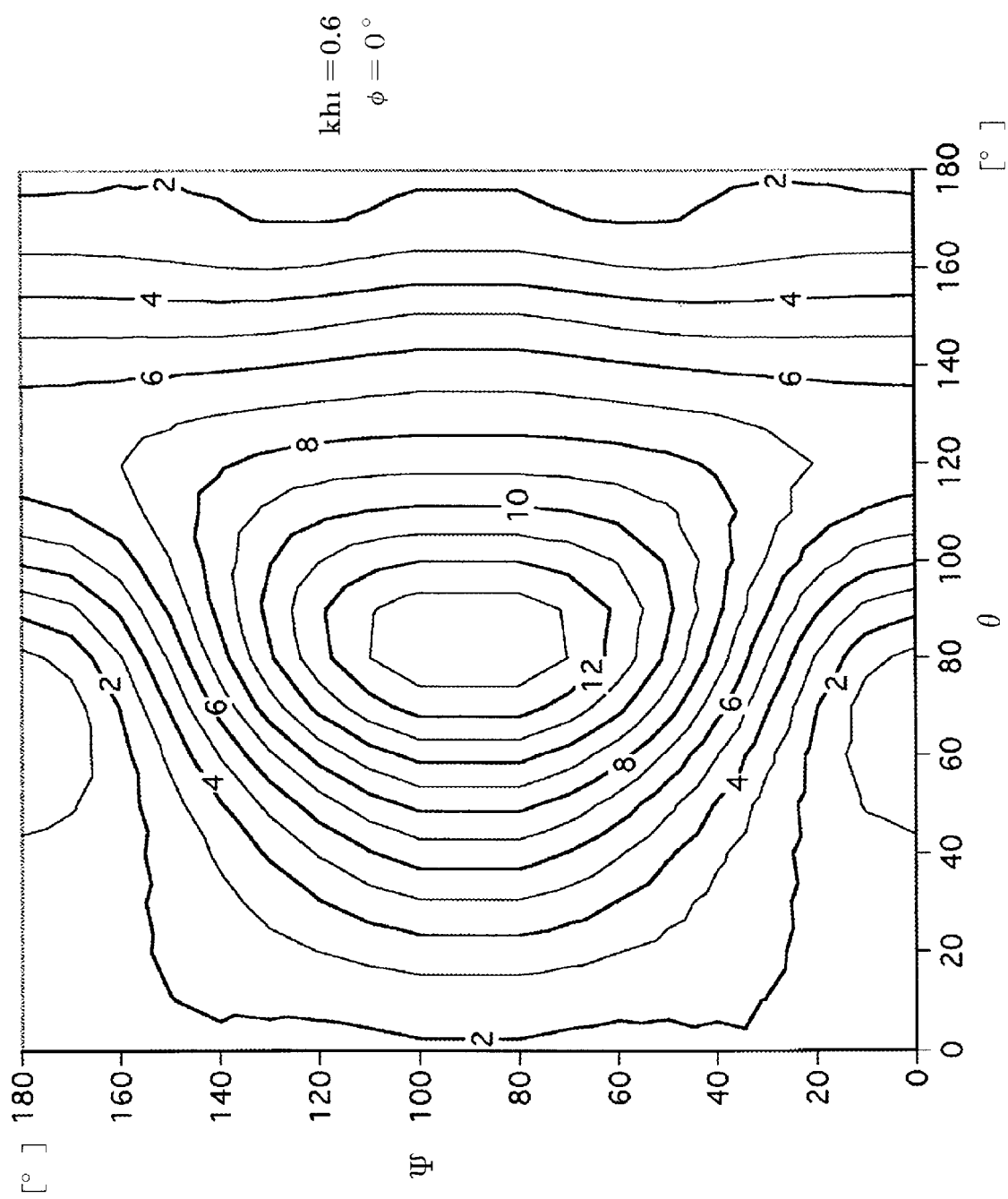
FIG. 24 is a graph showing the evaluation result of $K^2$ in the second embodiment ($kh_1=0.6$, $\Phi=0°$)
Figure 25:
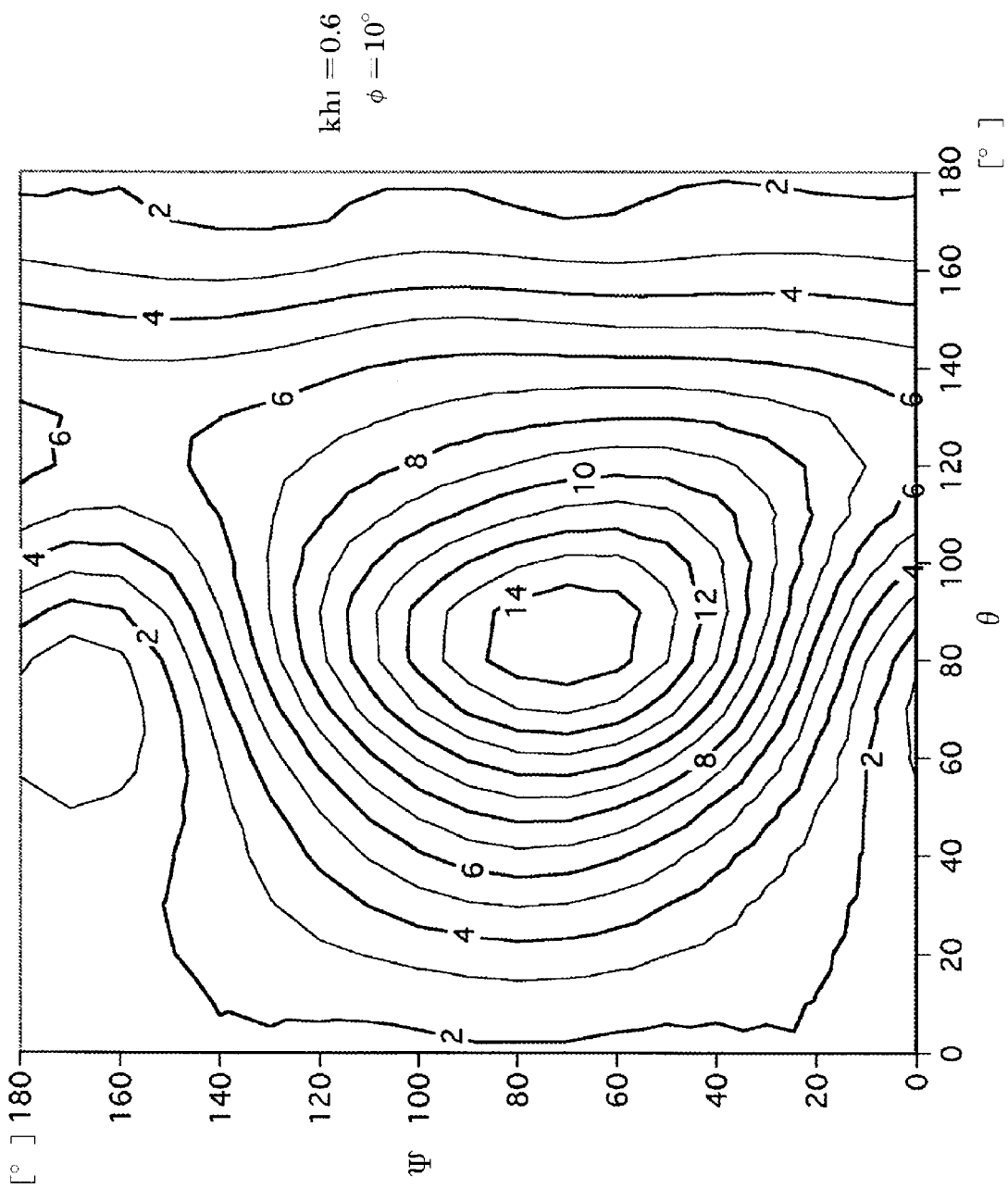
FIG. 25 is a graph showing the evaluation result of $K^2$ in the second embodiment ($kh_1=0.6$, $\Phi=10°$)
Figure 26:
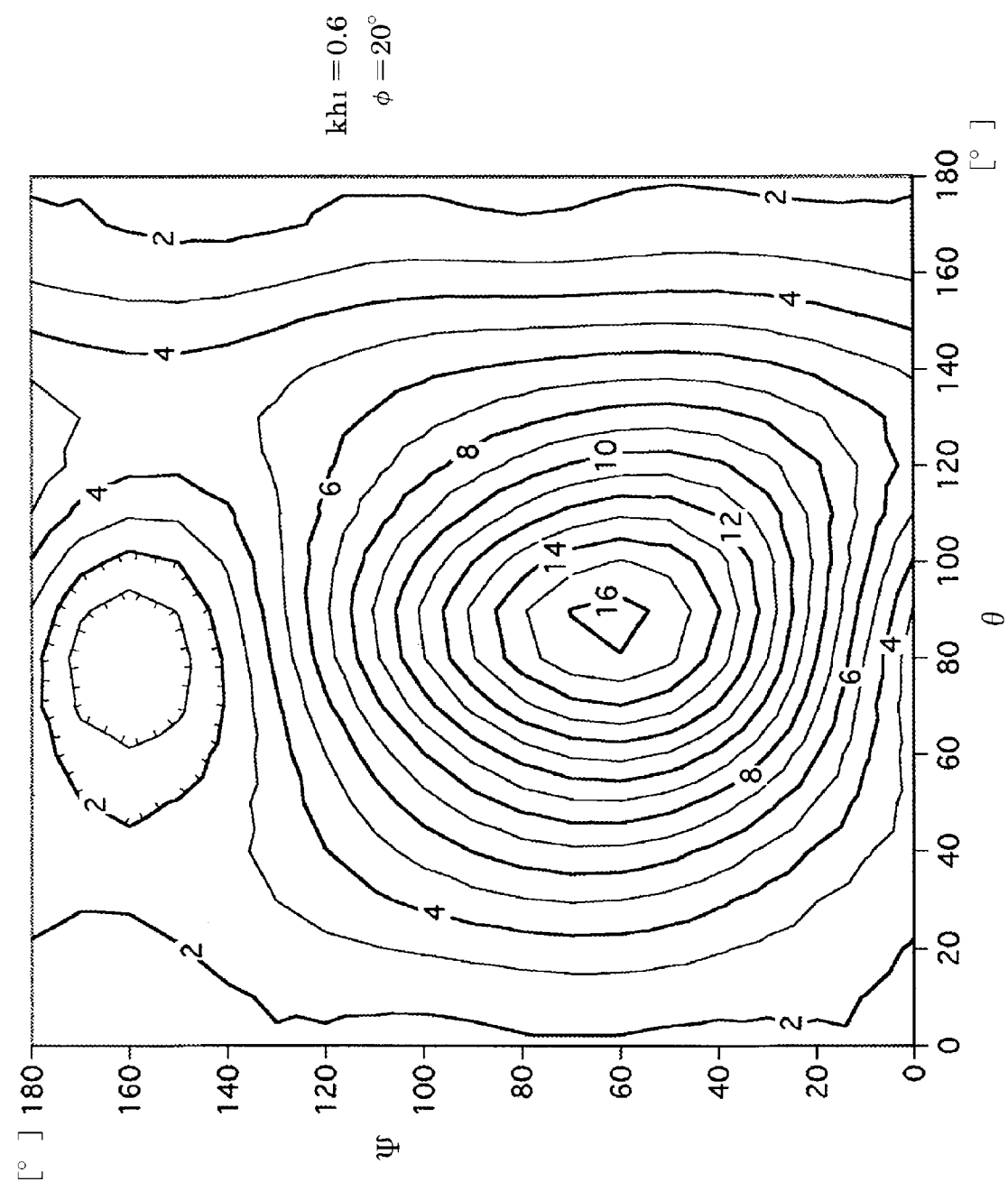
FIG. 26 is a graph showing the evaluation result of $K^2$ in the second embodiment ($kh_1=0.6$, $\Phi=20°$)
Figure 27:
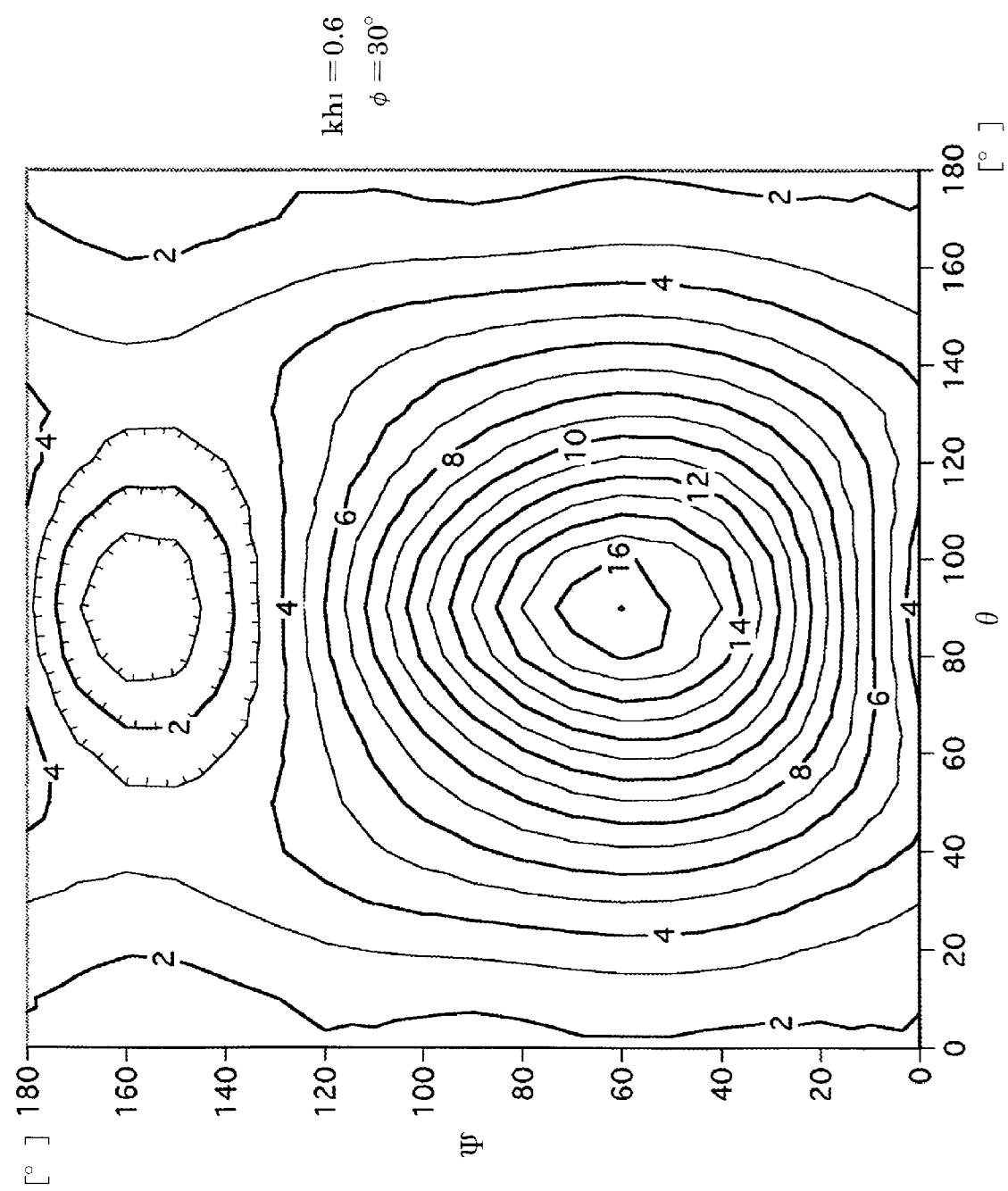
FIG. 27 is a graph showing the evaluation result of $K^2$ in the second embodiment ($kh_1=0.6$, $\Phi=30°$)
Figure 28:
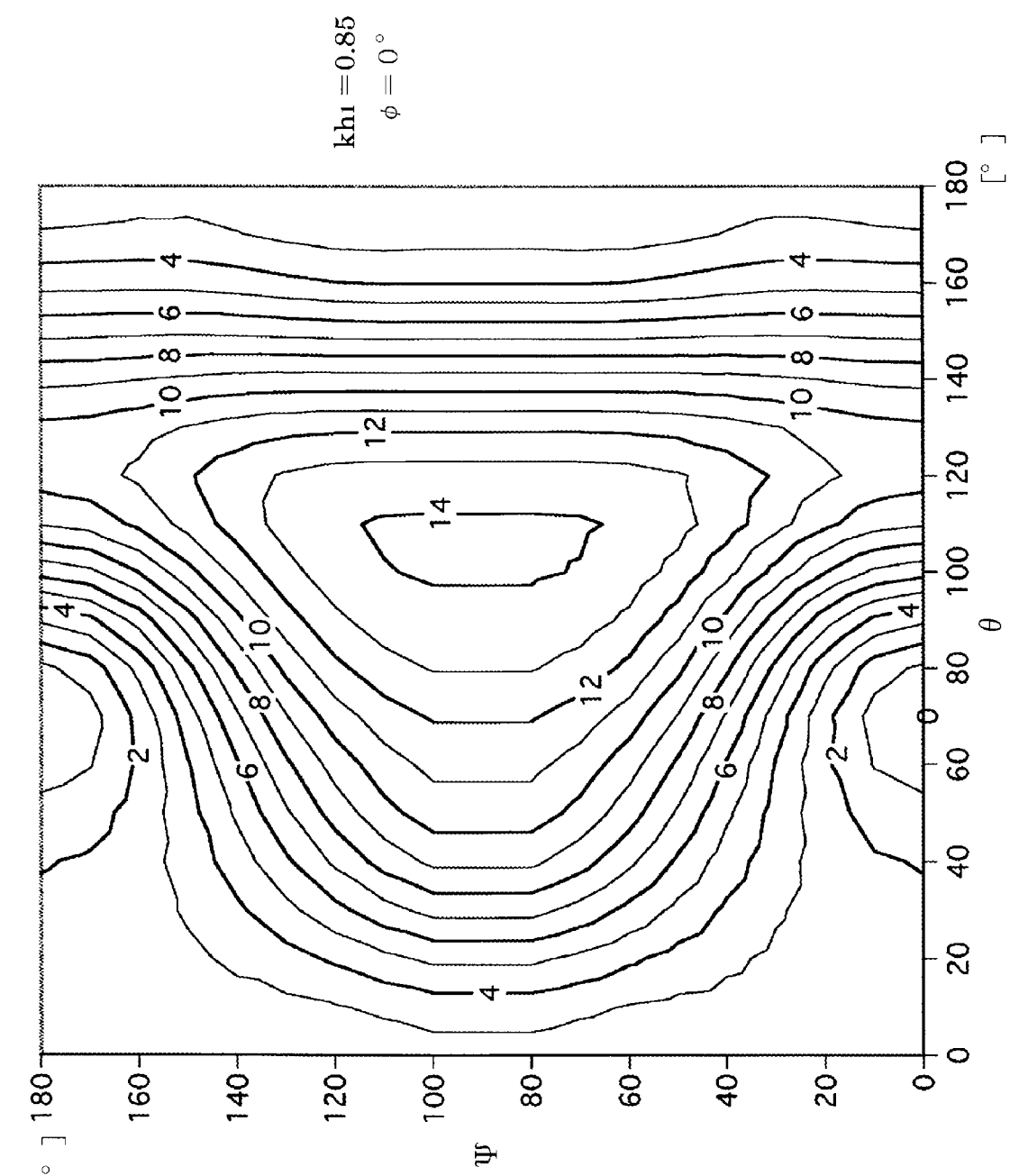
FIG. 28 is a graph showing the evaluation result of $K^2$ in the second embodiment ($kh_1=0.85$, $\Phi=0°$)
Figure 29:
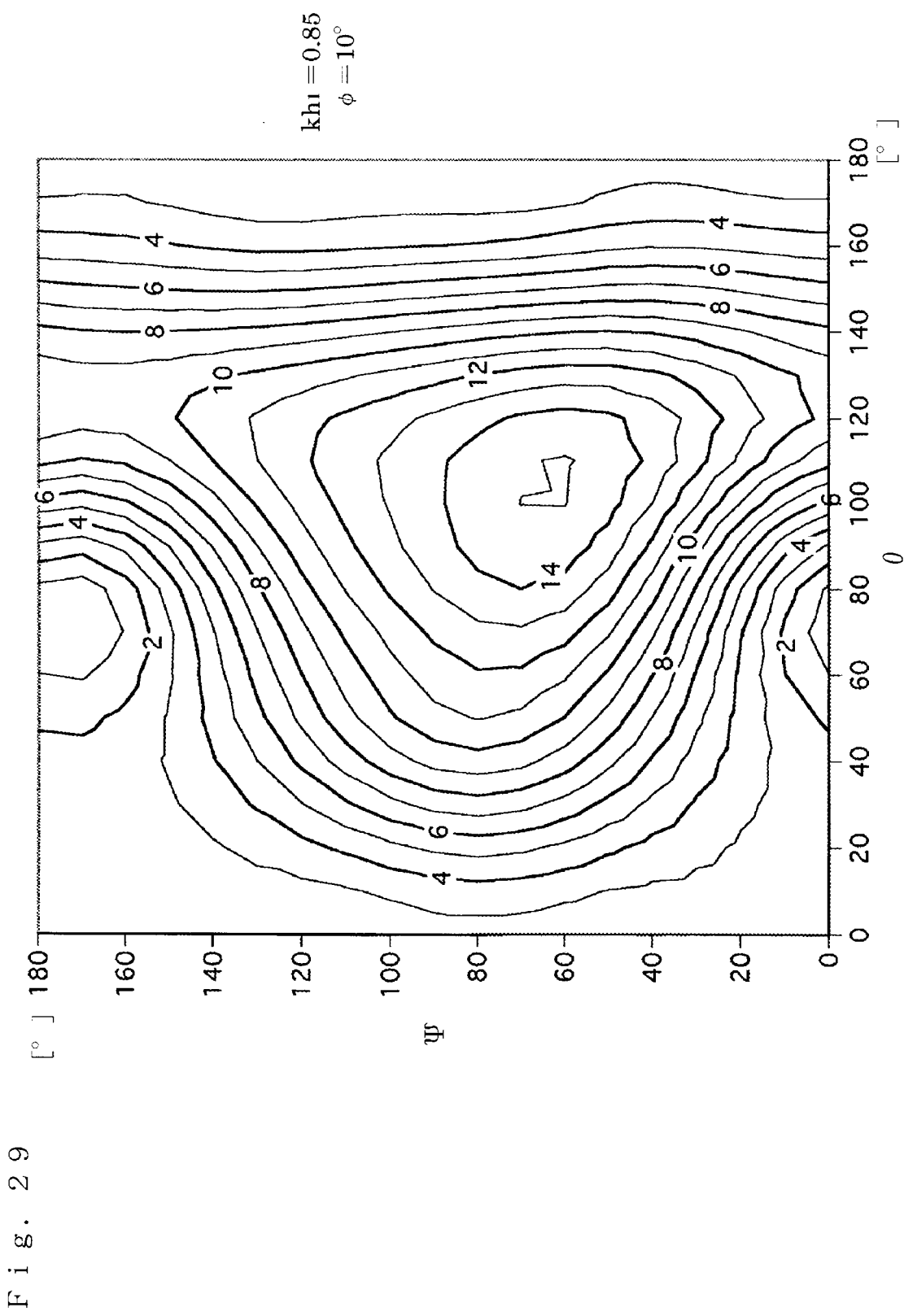
FIG. 29 is a graph showing the evaluation result of $K^2$ in the second embodiment ($kh_1=0.85$, $\Phi=10°$)
Figure 30:
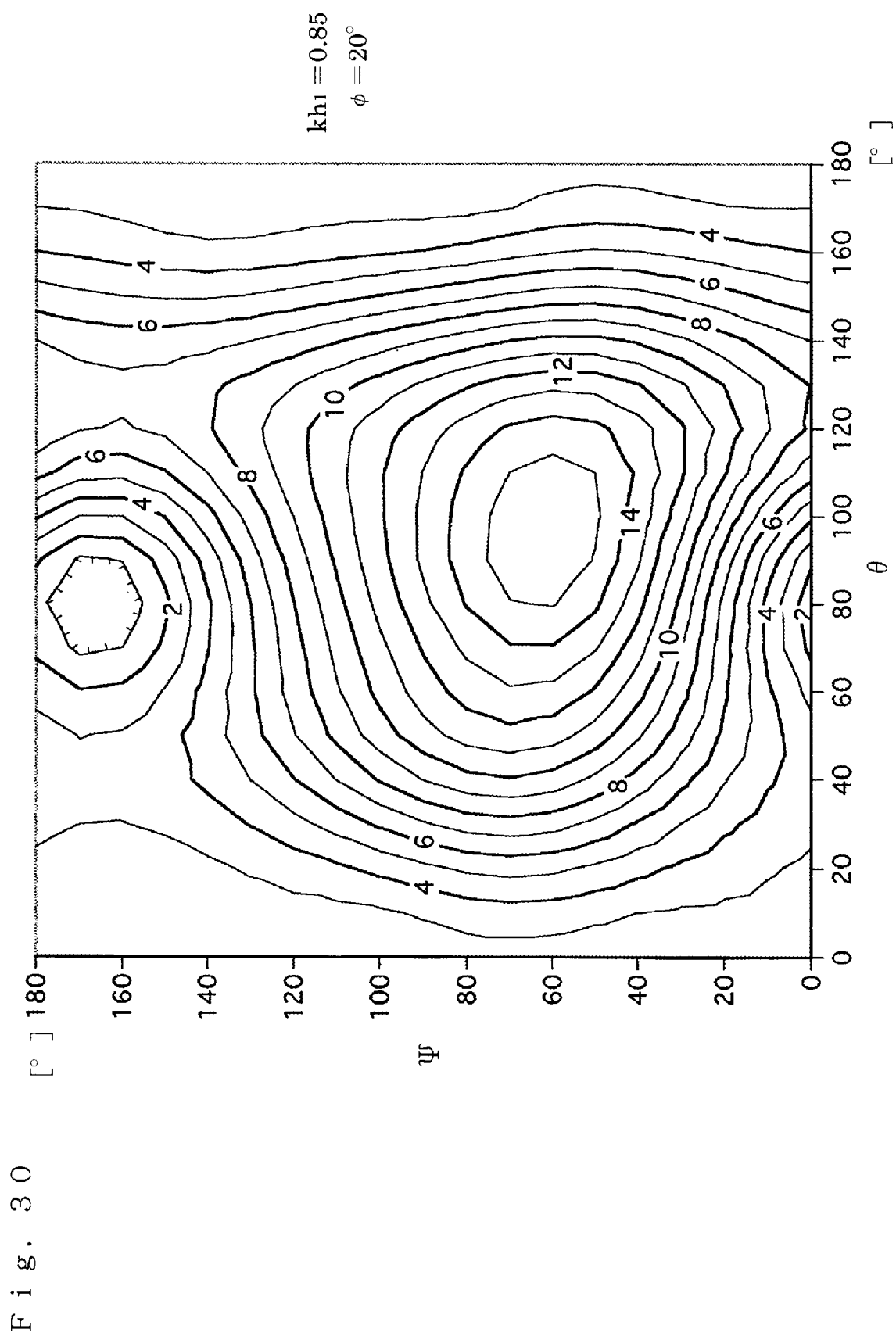
FIG. 30 is a graph showing the evaluation result of $K^2$ in the second embodiment ($kh_1=0.85$, $\Phi=20°$)
Figure 31:
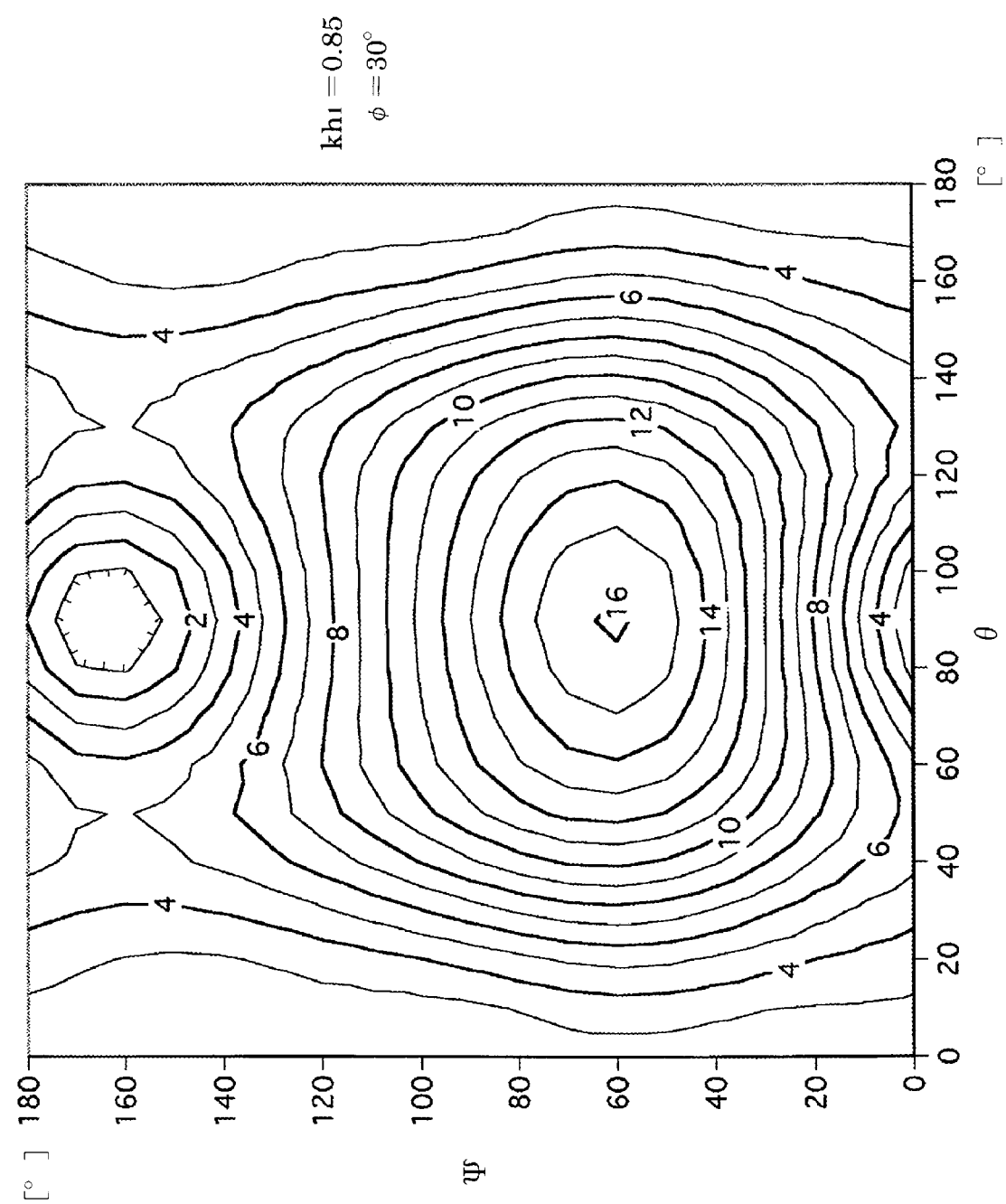
FIG. 31 is a graph showing the evaluation result of $K^2$ in the second embodiment ($kh_1=0.85$, $\Phi=30°$)
Figure 32:
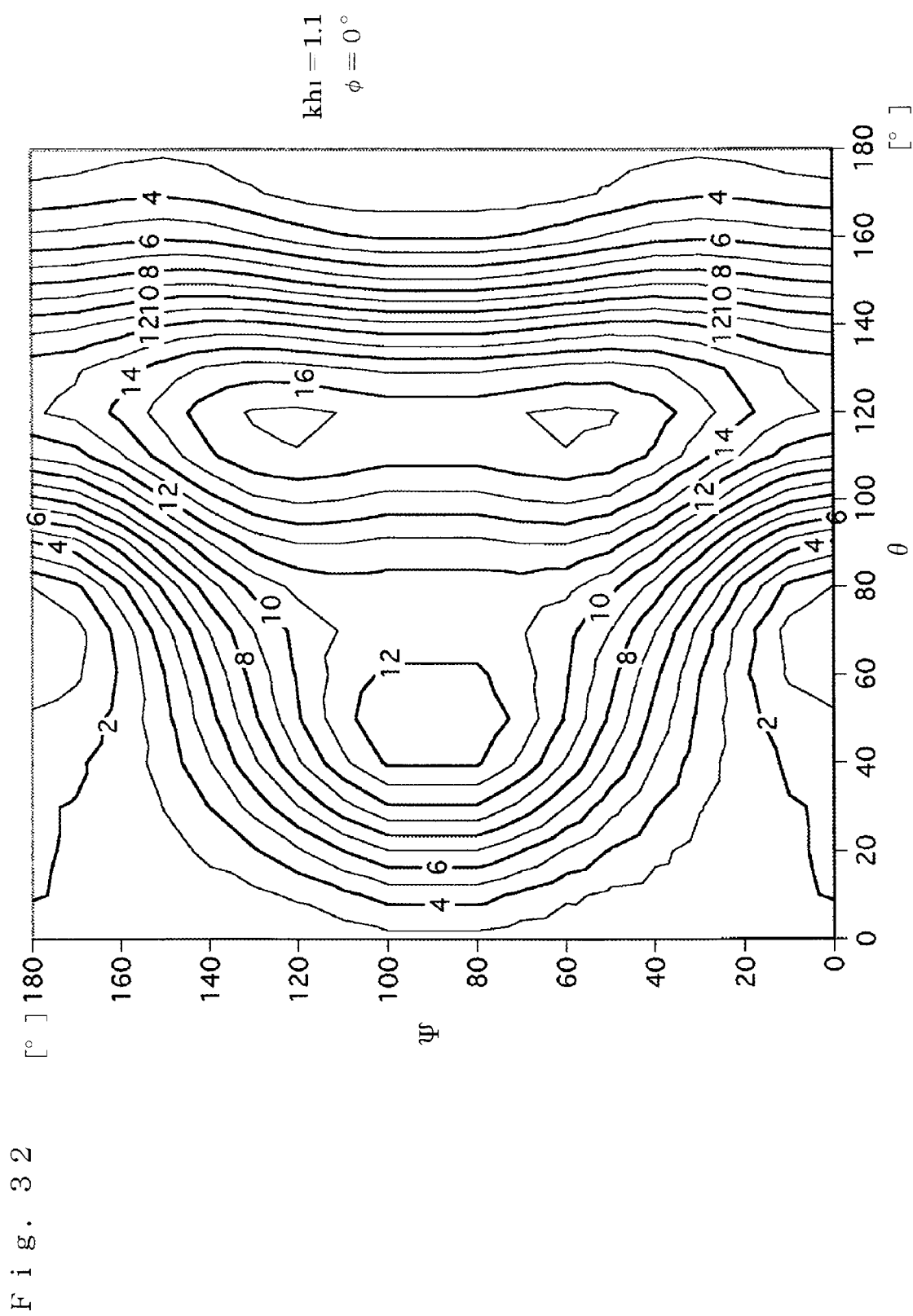
FIG. 32 is a graph showing the evaluation result of $K^2$ in the second embodiment ($kh_1=1.1$, $\Phi=0°$)
Figure 33:
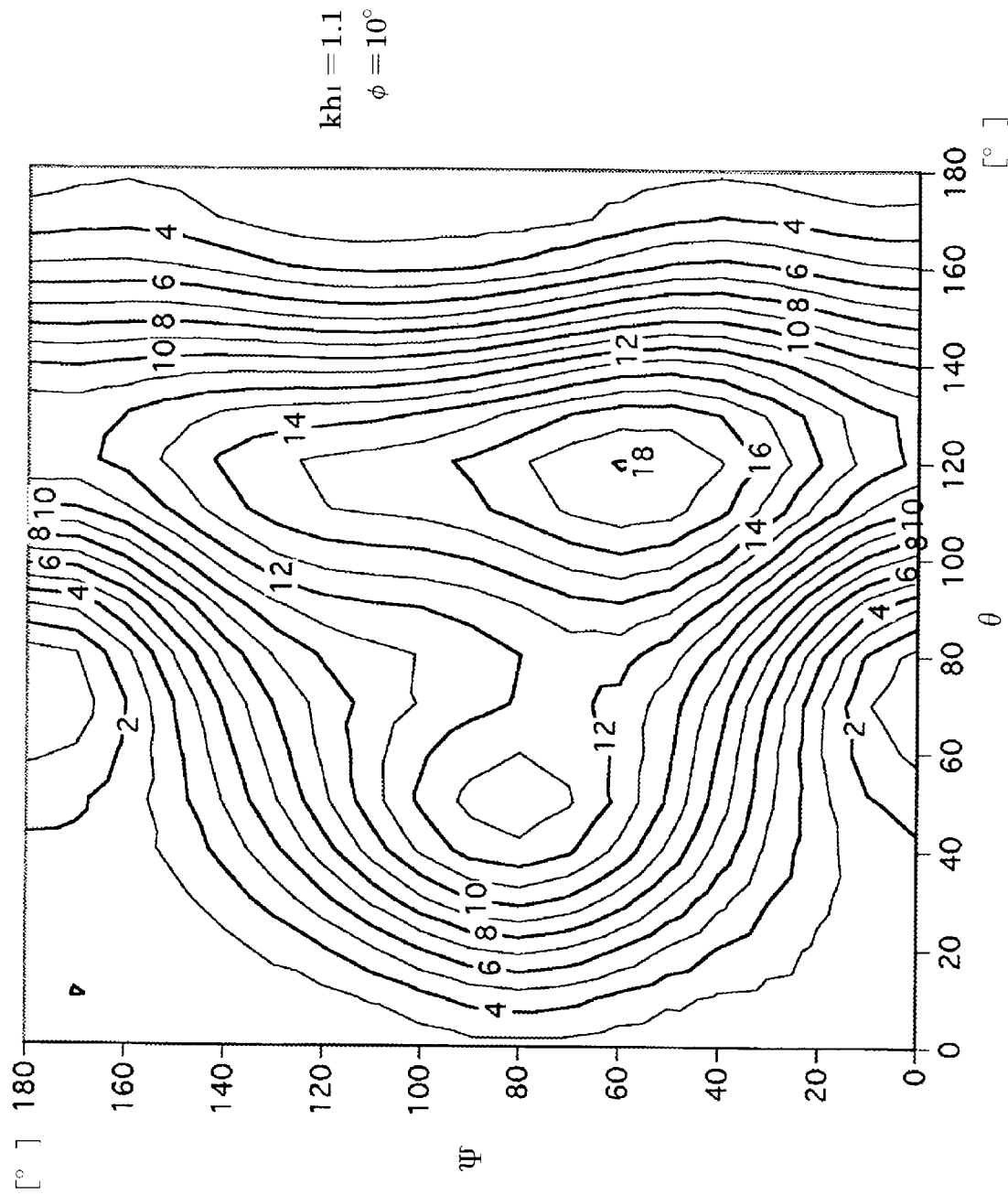
FIG. 33 is a graph showing the evaluation result of $K^2$ in the second embodiment ($kh_1=1.1$, $\Phi=10°$)
Figure 34:
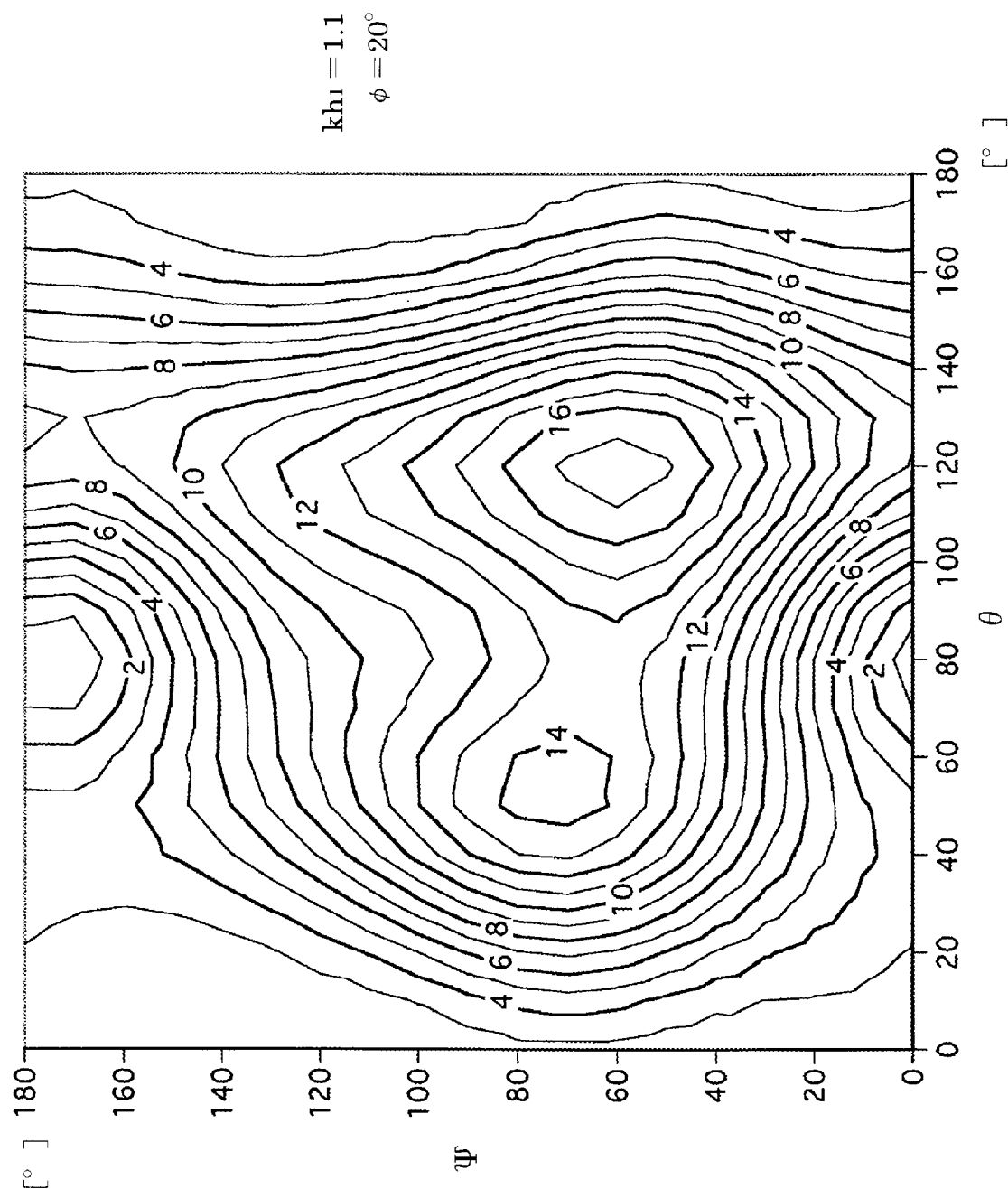
FIG. 34 is a graph showing the evaluation result of $K^2$ in the second embodiment ($kh_1=1.1$, $\Phi=20°$)
Figure 35:
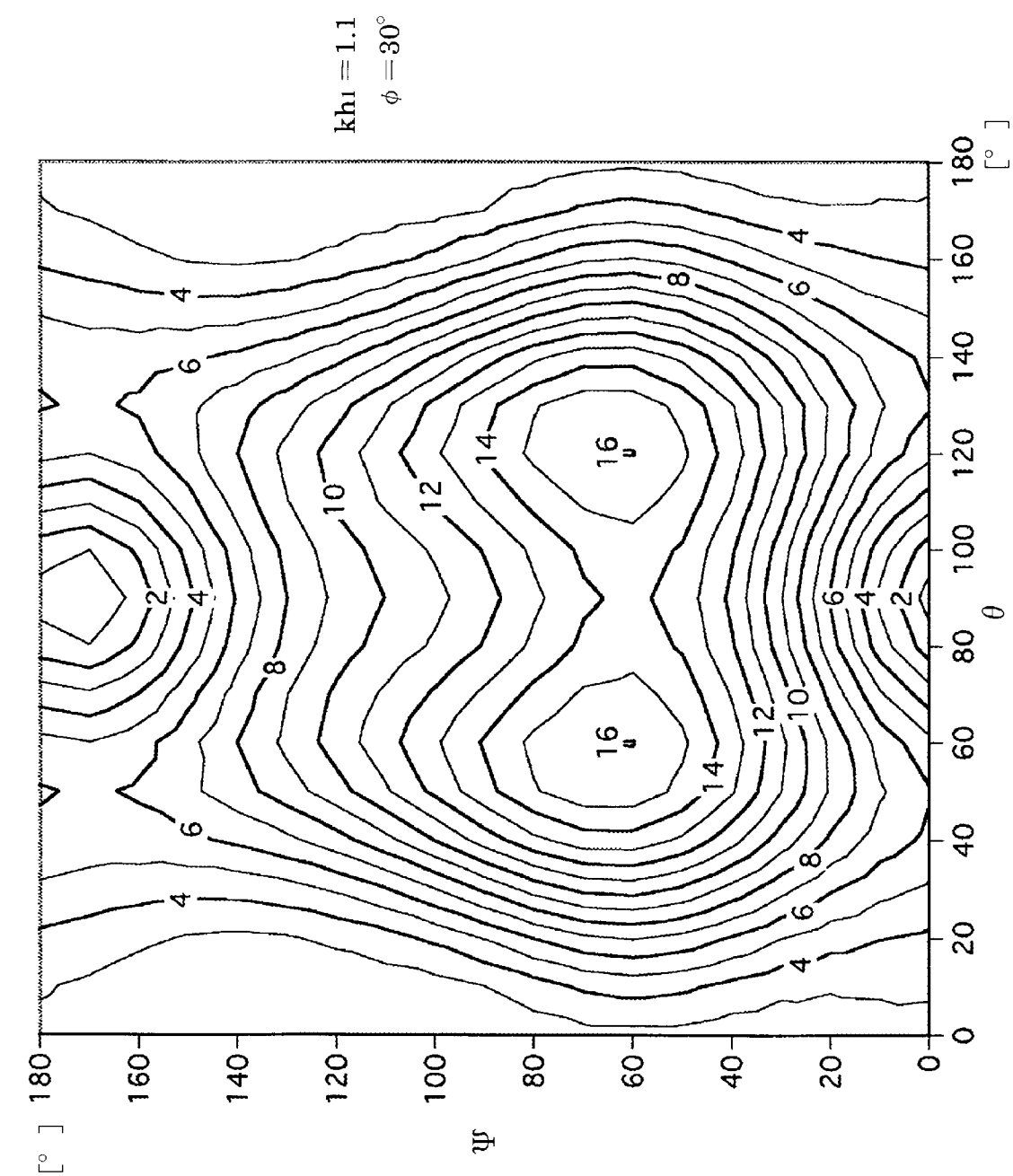
FIG. 35 is a graph showing the evaluation result of $K^2$ in the second embodiment ($kh_1=1.1$, $\Phi=30°$)
Figure 36:
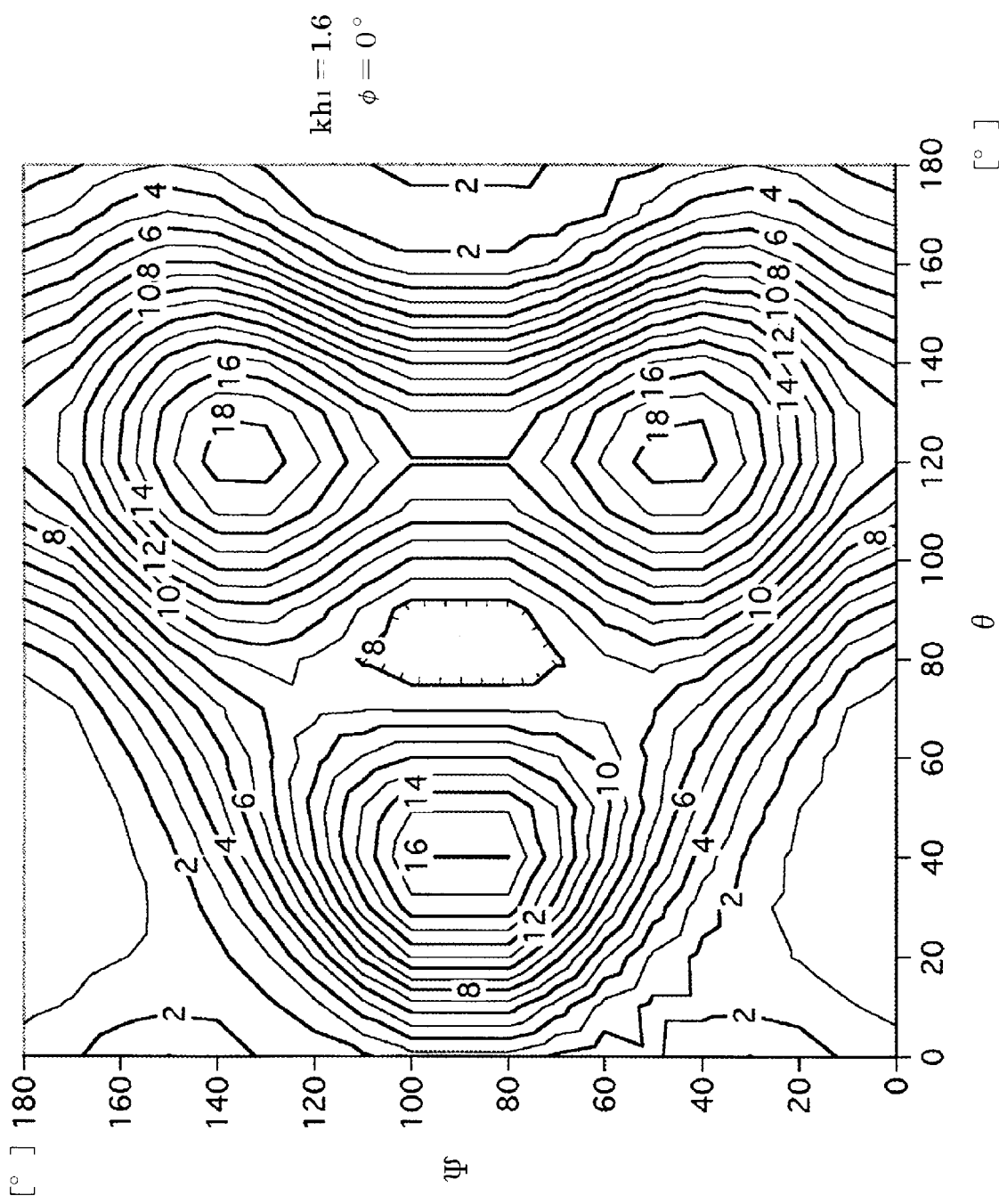
FIG. 36 is a graph showing the evaluation result of $K^2$ in the second embodiment ($kh_1=1.6$, $\Phi=0°$)
Figure 37:
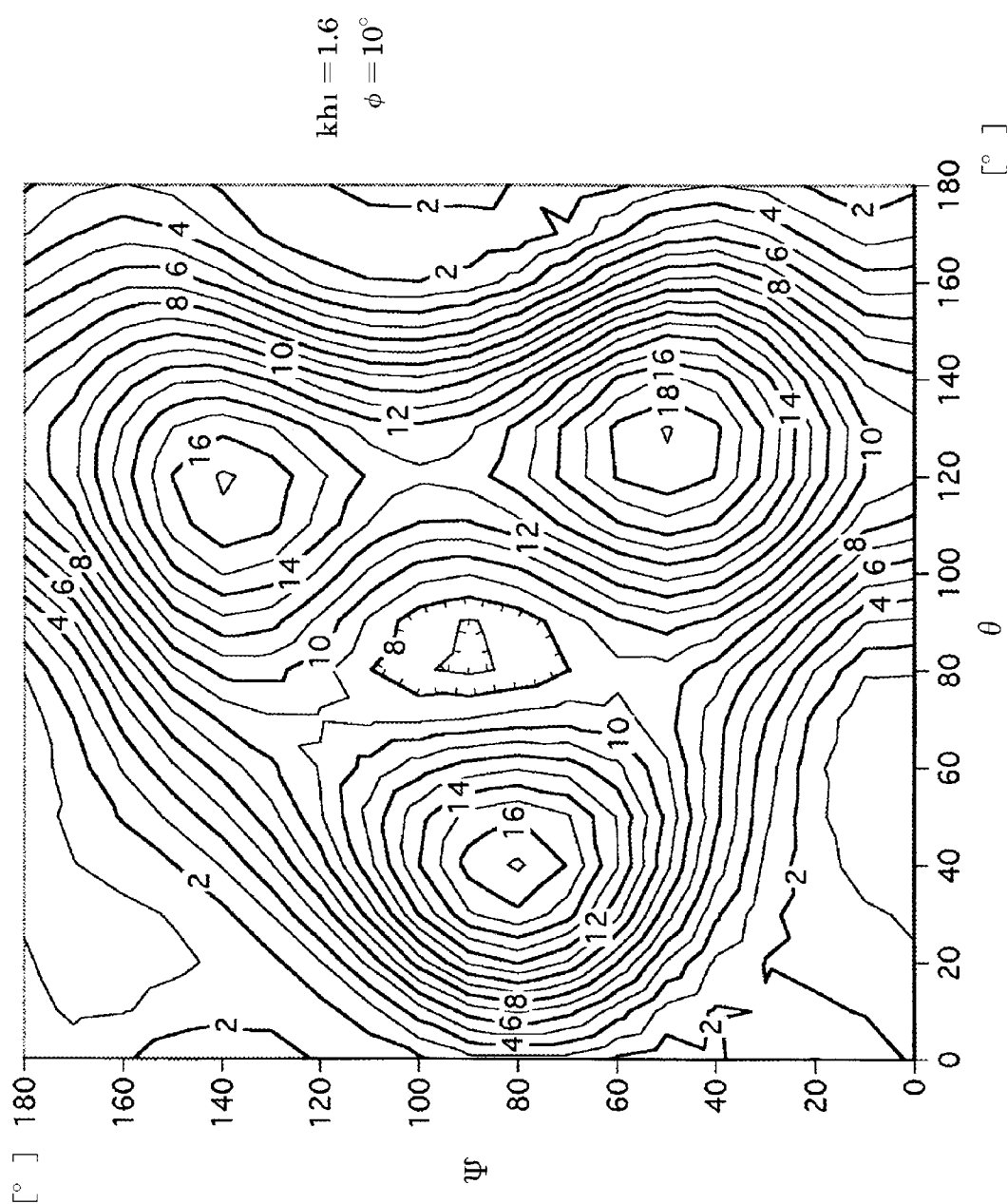
FIG. 37 is a graph showing the evaluation result of $K^2$ in the second embodiment ($kh_1=1.6$, $\Phi=10°$)
Figure 38:
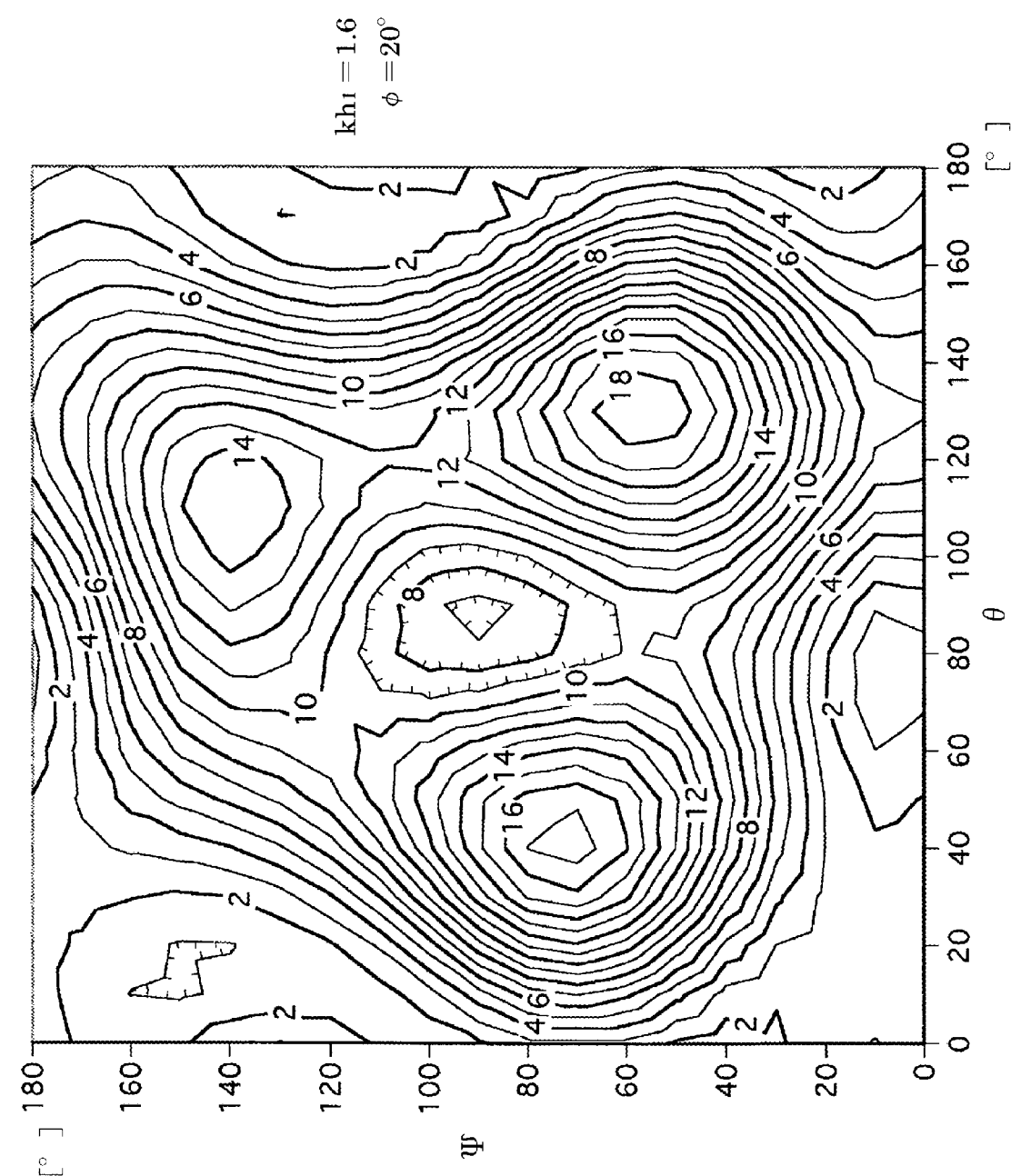
FIG. 38 is a graph showing the evaluation result of $K^2$ in the second embodiment ($kh_1=1.6$, $\Phi=20°$)
Figure 39:
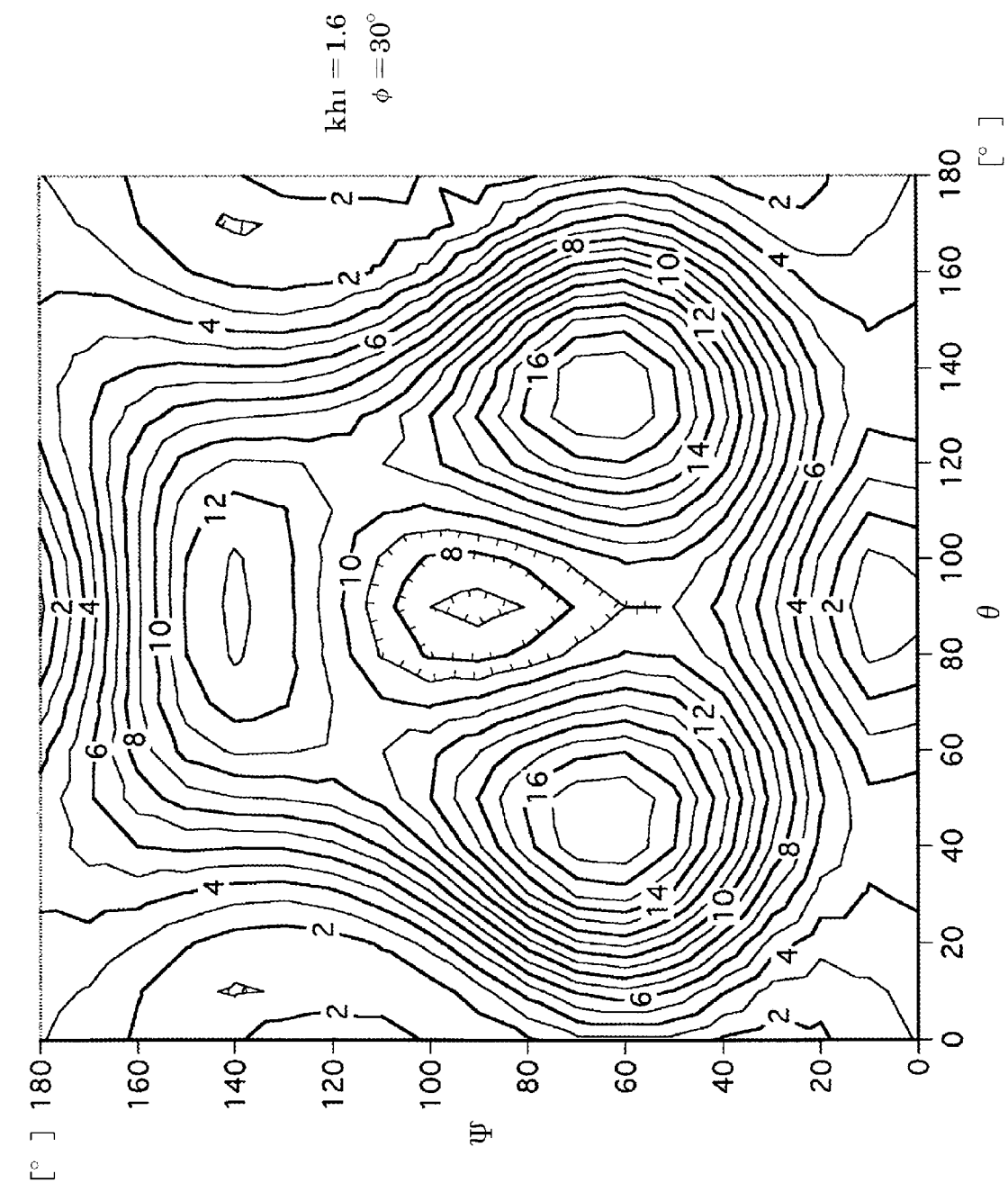
FIG. 39 is a graph showing the evaluation result of $K^2$ in the second embodiment ($kh_1=1.6$, $\Phi=30°$)

In the structure of the SAW device according to the second embodiment, a propagation velocity V is exclusively determined by kh$_1$ of the LiNbO$_3$ layer 320. FIG. 23 is a graph showing the relationship between kh$_1$ of the LiNbO$_3$ layer 320 and the propagation velocity V of an SAW in the 2nd-order mode in the SAW device of the second embodiment. It is confirmed from FIG. 23 that, when kh$_1$ is equal to or smaller than 1.1, a propagation velocity V equal to or higher than 8,000 m/s is ensured.

The present inventors set the thickness of the diamond 100 at 20 µm, and evaluated an electromechanical coupling coefficient K$^2$ while changing kh$_1$ within the above-described limitation for kh$_1$ and simultaneously changing the values $\theta$, $\Phi$, and $\psi$.

FIGS. 24 to 39 are graphs showing contour lines obtained upon evaluating the electromechanical coupling coefficient K$^2$ [%] under conditions that kh$_1$=0.6, 0.85, 1.1, and 1.6, $\Phi$=0°, 10°, 20°, and 30°, $0° \leq \theta \leq 180°$, and $0° \leq \psi \leq 180°$. Note that the values $\theta$ and $\psi$ are plotted in units of 10° in these graphs.

Regions for satisfying the electromechanical coupling coefficient K$^2$ of 10% or more are obtained from FIGS. 24 to 39. Taking the symmetry of the LiNbO$_3$ crystal into consideration, it is confirmed that, when the propagation velocity V is 8,000 m/s or more, and the electromechanical coupling coefficient K$^2$ is 10% or more, the four parameters k$_2$, $\theta$, $\Phi$, and $\psi$ are set in the internal region of one of the hexahedrons which are symmetric with those represented by (i), (ii), (iii), or (iv).

(Third Embodiment)

Figure 40:
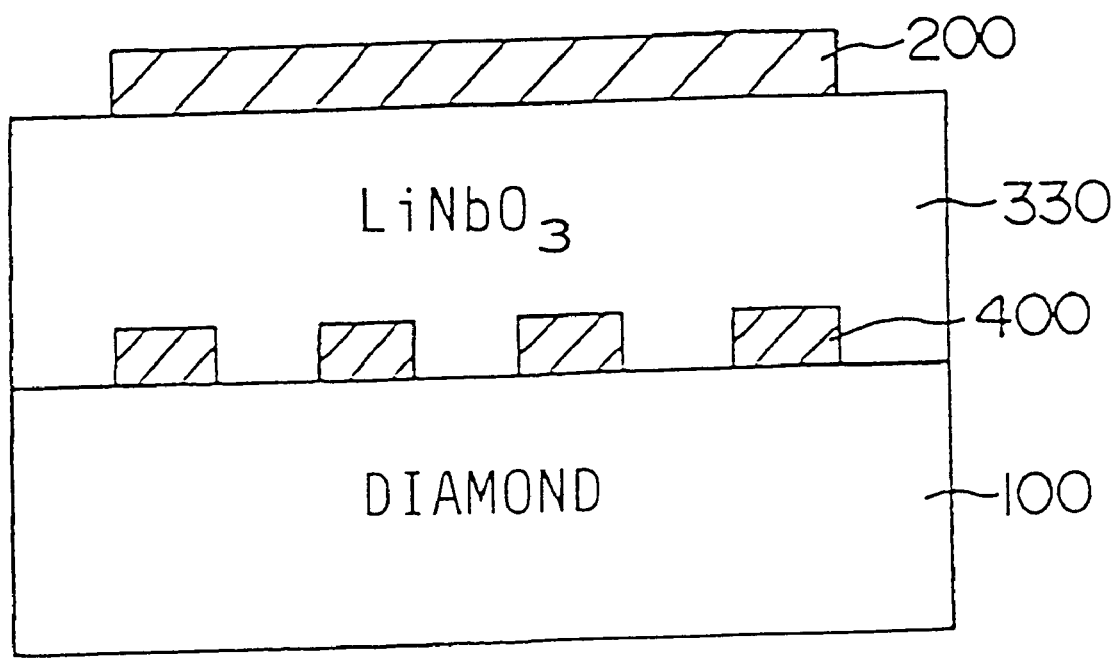
FIG. 40 is a sectional view showing the structure of an SAW device according to the third embodiment of the present invention.

FIG. 40 is a sectional view showing the structure of an SAW device according to the third embodiment of the present invention. As shown in FIG. 40, the SAW device of the third embodiment comprises (a) diamond 100, (b) an interdigital transducer 400 formed on the diamond 100, (c) a single crystal LiNbO$_3$ layer 330 formed on the interdigital transducer 400, and (d) a short-circuit electrode 200 formed on the LiNbO$_3$ layer 330.

The SAW device of the third embodiment uses an SAW in the 1st-order mode.

The LiNbO$_3$ layer 330 is formed by bonding a cut single crystal LiNbO$_3$ thin plate to the diamond 100 having the interdigital transducer 400 formed on its polished surface, and then polishing the single crystal LiNbO$_3$ thin plate. For the interdigital transducer 400, preferably, a recessed portion is formed in the diamond 100 by reactive ion etching, the interdigital transducer 400 is formed with Al or the le in this recessed portion, and the interface to the LiNbO$_3$ layer 330 is entirely flattened.

For the LiNbO$_3$ layer 330, a thickness $t_1$ [µm] and a crystal orientation ($\theta$[°],$\Phi$[°],$\psi$[°]) are selected from the following values. Note that kh$_1$ (=$2\pi(t_1/\lambda)$; $\lambda$=the wavelength [µm] of an SAW) is used instead of the thickness $t_1$, as in the first embodiment.

(i) $0 \leq \Phi \leq 15$ on an orthogonal coordinate system (kh$_1$,$\theta$,$\psi$), values in the internal region of a quadrangular pyramid which has its vertex at a point P$_{31}$ and, as its bottom surface, a planar rectangular region with its vertexes at points A$_{31}$ B$_{31}$ C$_{31}$ and D$_{31}$,
where point P$_{31}$=(0.45, 90, 150)

point A$_{31}$=(0.7, 70, 130)

point B$_{31}$=(0.7, 90, 130)

point $C_{31}=(0.7, 90, 180)$
point $D_{31}=(0.7, 70, 180)$.

(ii) $15 \leq \Phi \leq 30$ on the orthogonal coordinate system ($kh_1$, $\theta, \psi$), values in the internal regions of four hexahedrons each of which has, as its opposing bottom surfaces, a planar rectangular region with its vertexes at points $A_{32}$ $B_{32}$ $C_{32}$ and $D_{32}$ and a planar rectangular region with its vertexes at points $A_{33}$ $B_{33}$ $C_{33}$ and $D_{33}$,
where
point $A_{32}=(0.45, 80, 130)$
point $B_{32}=(0.45, 100, 130)$
point $C_{32}=(0.45, 100, 150)$
point $D_{32}=(0.45, 80, 150)$
point $A_{33}=(0.7, 70, 120)$
point $B_{33}=(0.7, 110, 120)$
point $C_{33}=(0.7, 110, 160)$
point $D_{33}=(0.7, 70, 160)$.

In the structure of the SAW device according to the third embodiment, a propagation velocity V is exclusively determined by $kh_1$ of the LiNbO$_3$ layer 330, as in the first embodiment, as shown in FIG. 5. Therefore, as in the first embodiment, it is confirmed that, when $kh_1$ is equal to or smaller than 1.1, a propagation velocity V equal to or higher than 8,000 m/s is ensured.

The present inventors set the thickness of the diamond 100 at 20 μm, and evaluated an electromechanical coupling coefficient $K^2$ while changing $kh_1$ within the above-described limitation for $kh_1$ and simultaneously changing the values $\theta$, $\Phi$, and $\psi$.

Figure 41:
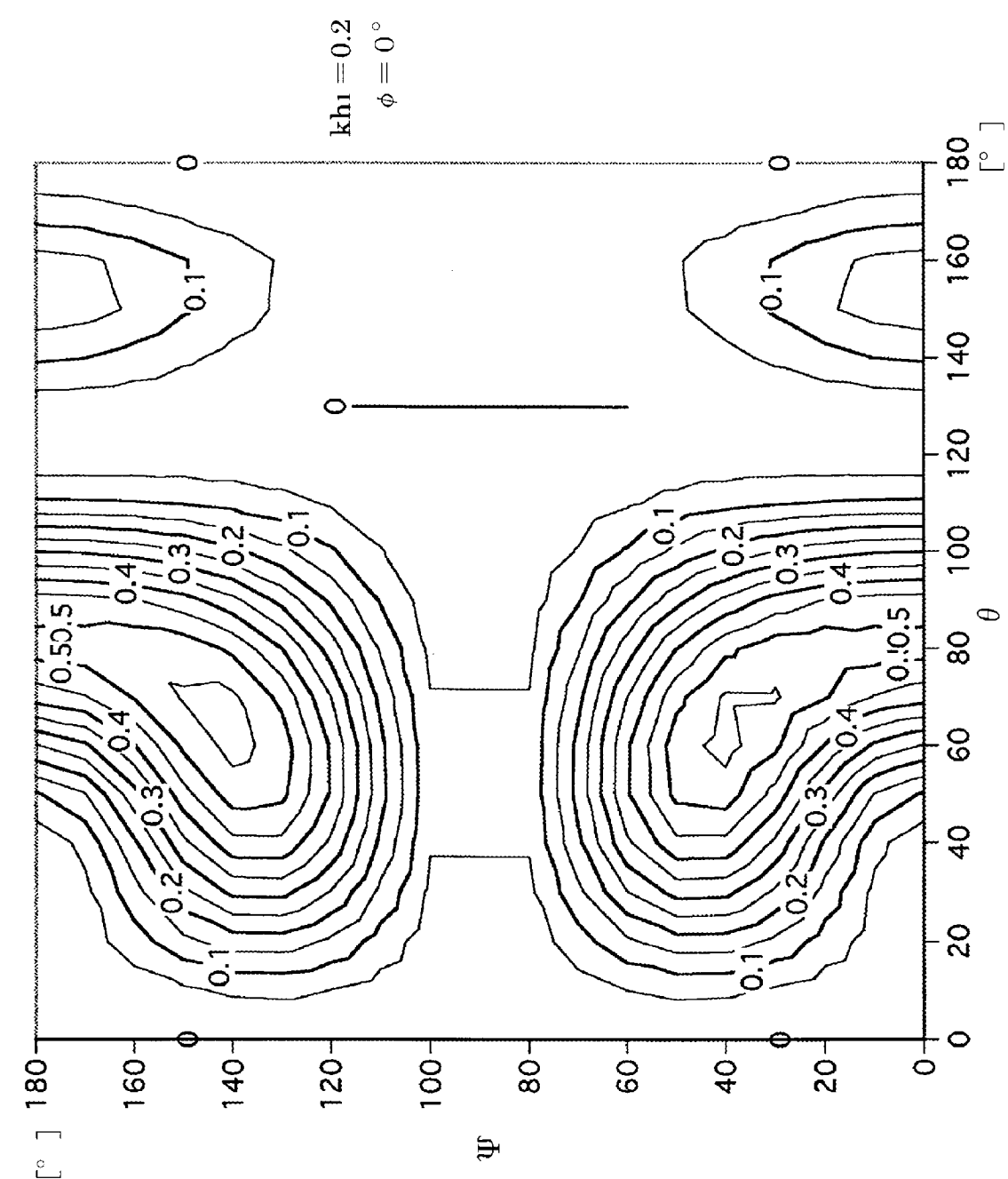
FIG. 41 is a graph showing the evaluation result of $K^2$ in the third embodiment ($kh_1=0.2$, $\Phi=0°$)
Figure 42:
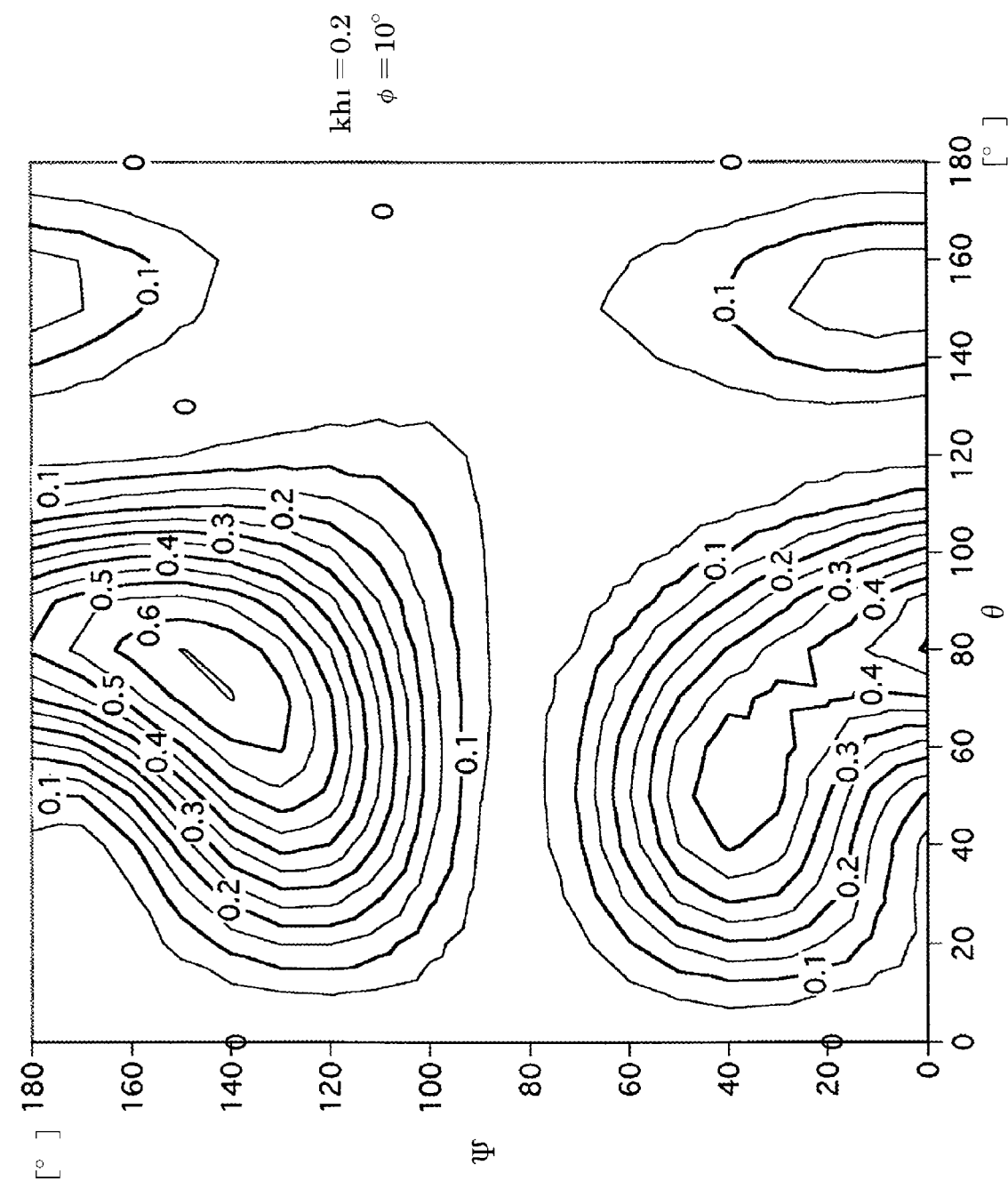
FIG. 42 is a graph showing the evaluation result of $K^2$ in the third embodiment ($kh_1=0.2$, 101 $=10°$)
Figure 43:
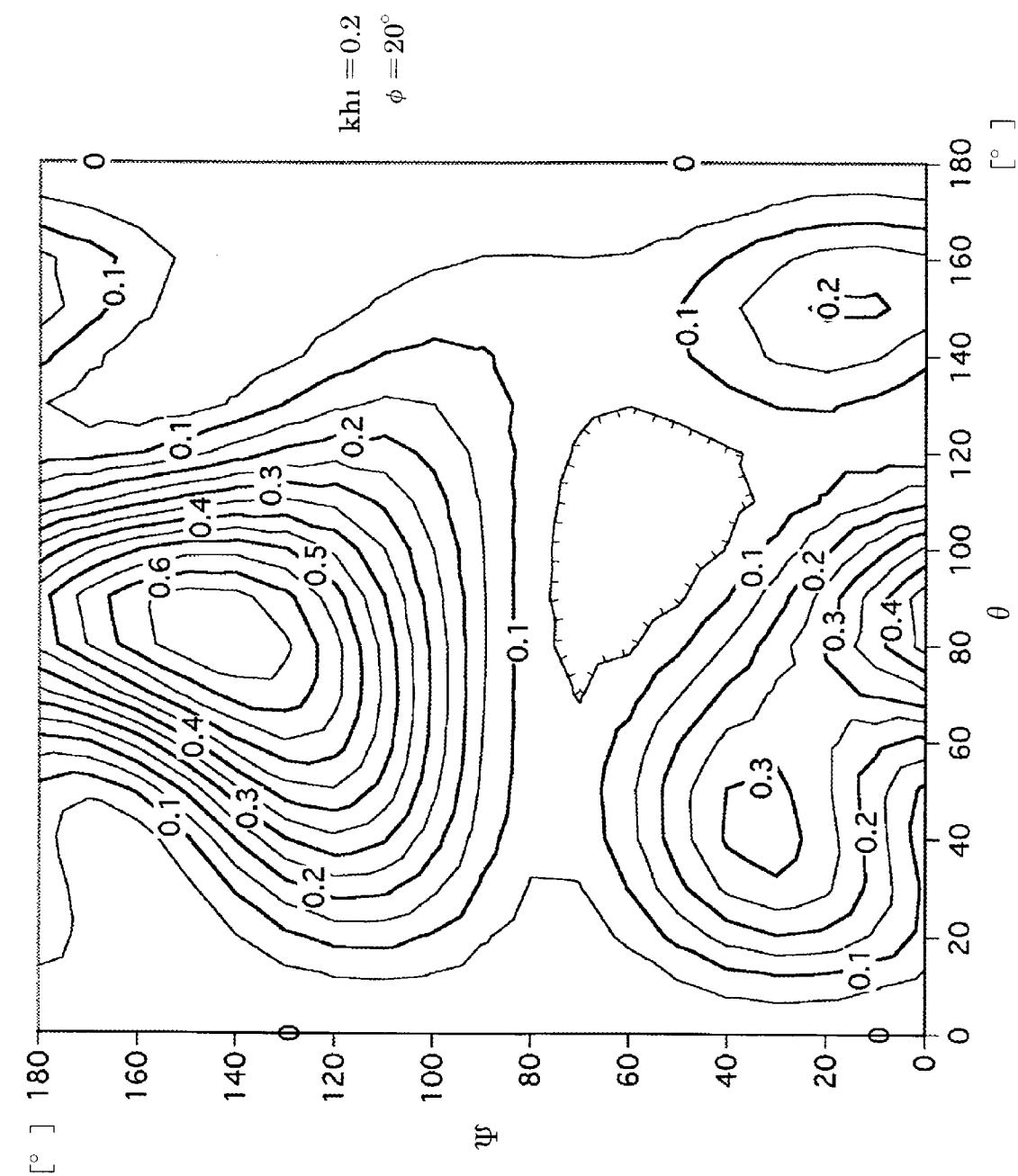
FIG. 43 is a graph showing the evaluation result of $K^2$ in the third embodiment ($kh_1=0.2$, $\Phi=20°$)
Figure 44:
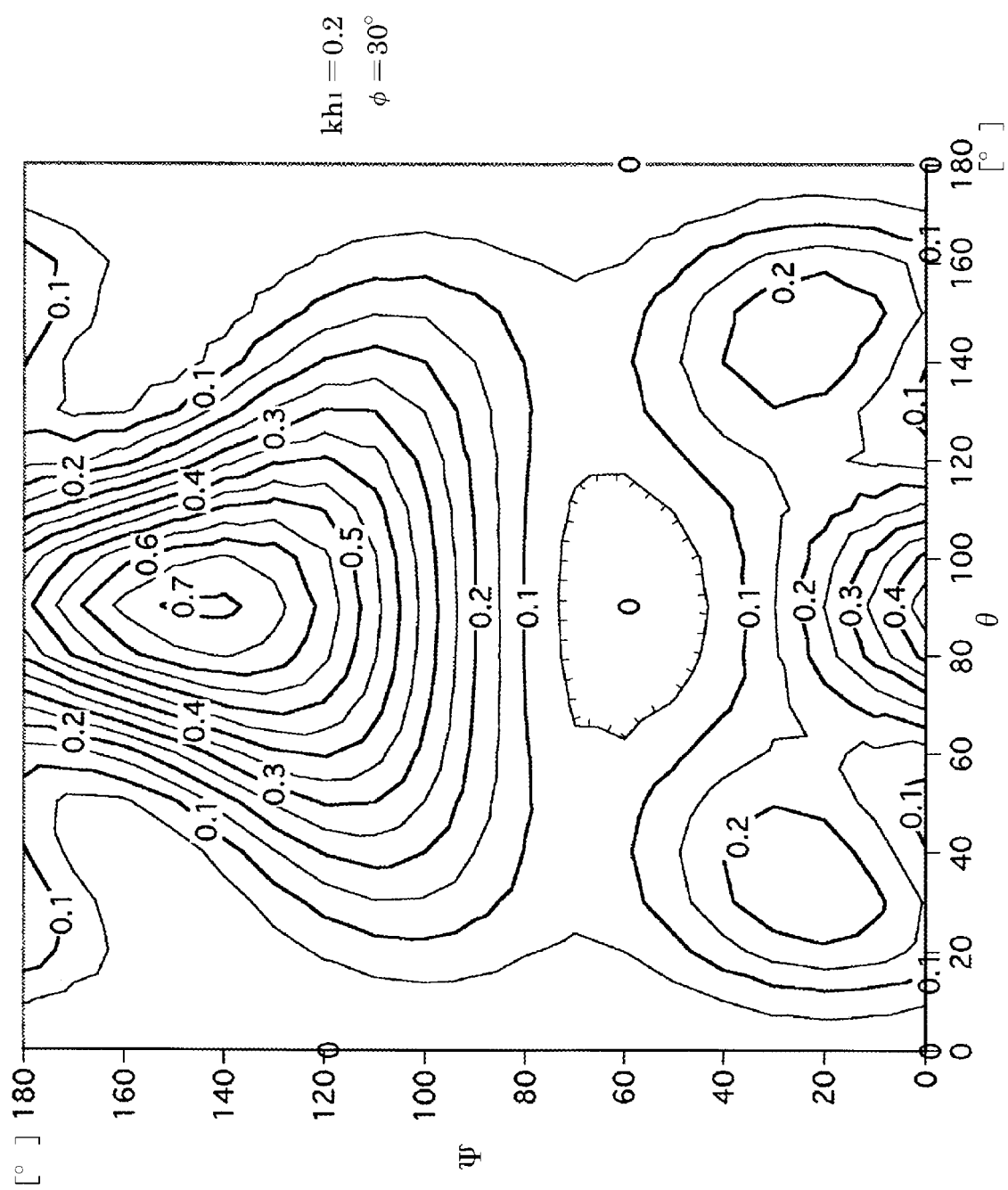
FIG. 44 is a graph showing the evaluation result of $K^2$ in the third embodiment ($kh_1=0.2$, $\Phi=30°$)
Figure 45:
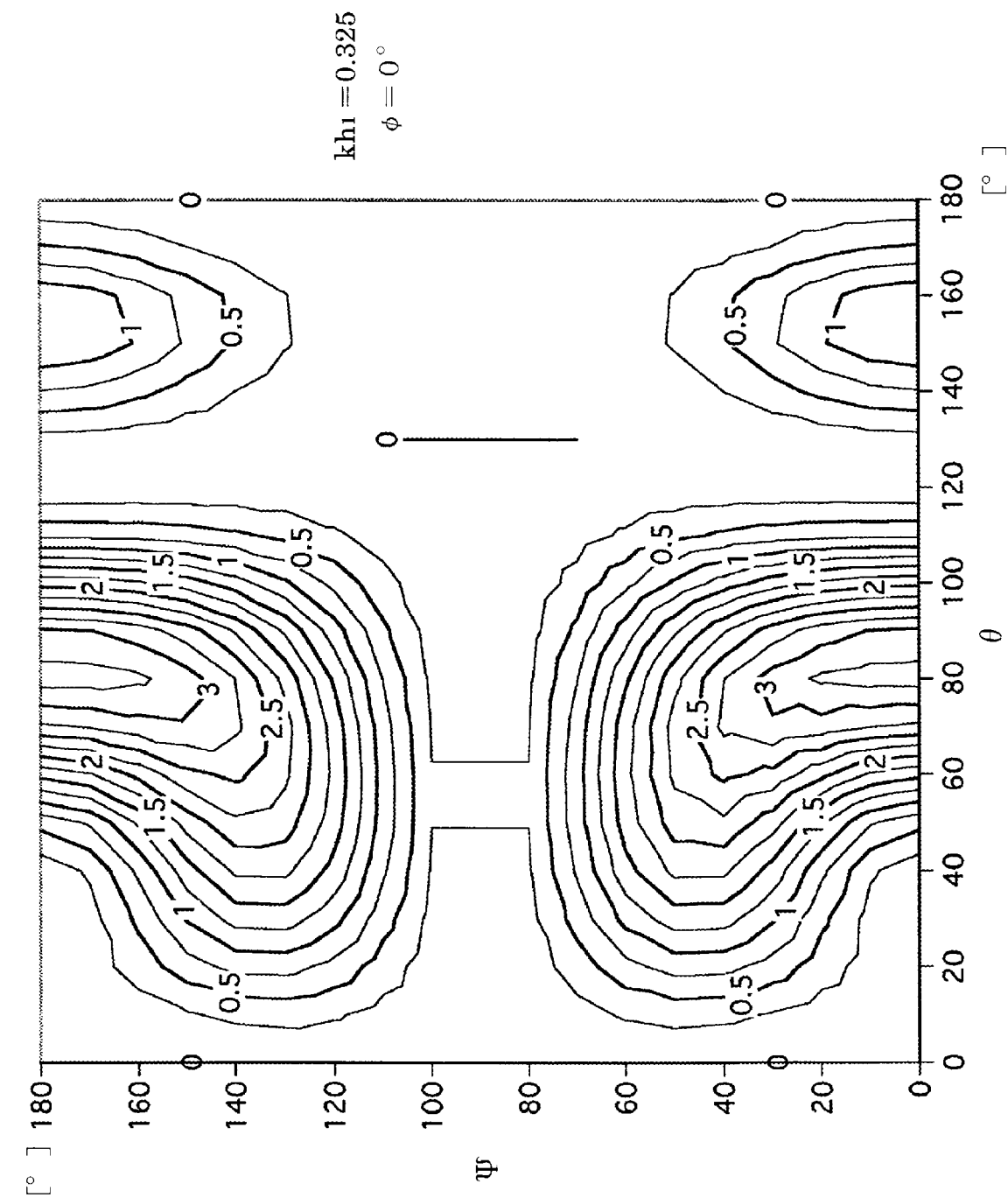
FIG. 45 is a graph showing the evaluation result of $K^2$ in the third embodiment ($kh_1=0.325$, $\Phi=0°$)
Figure 46:
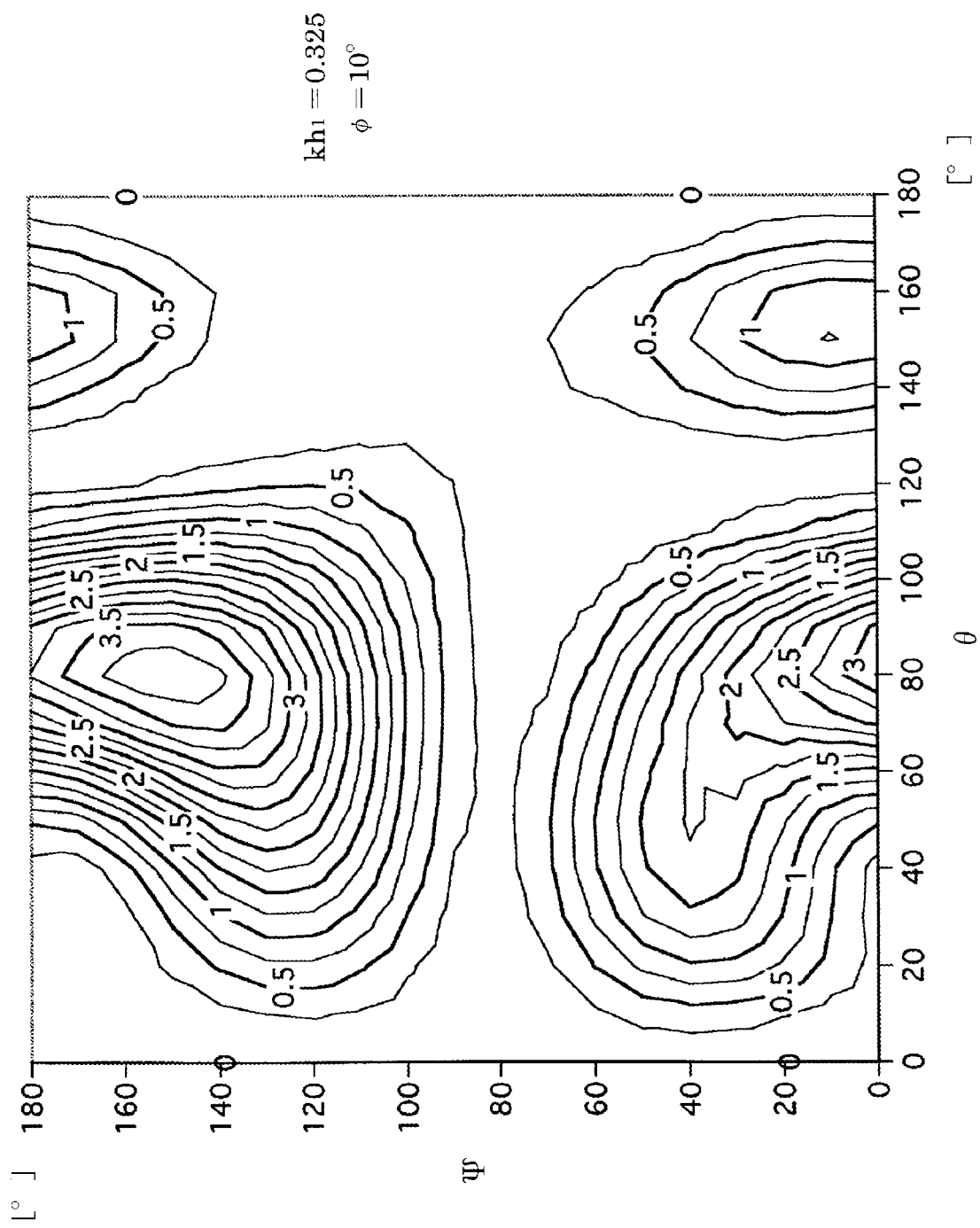
FIG. 46 is a graph showing the evaluation result of $K^2$ in the third embodiment ($kh_1=0.325$, $\Phi=10°$)
Figure 47:
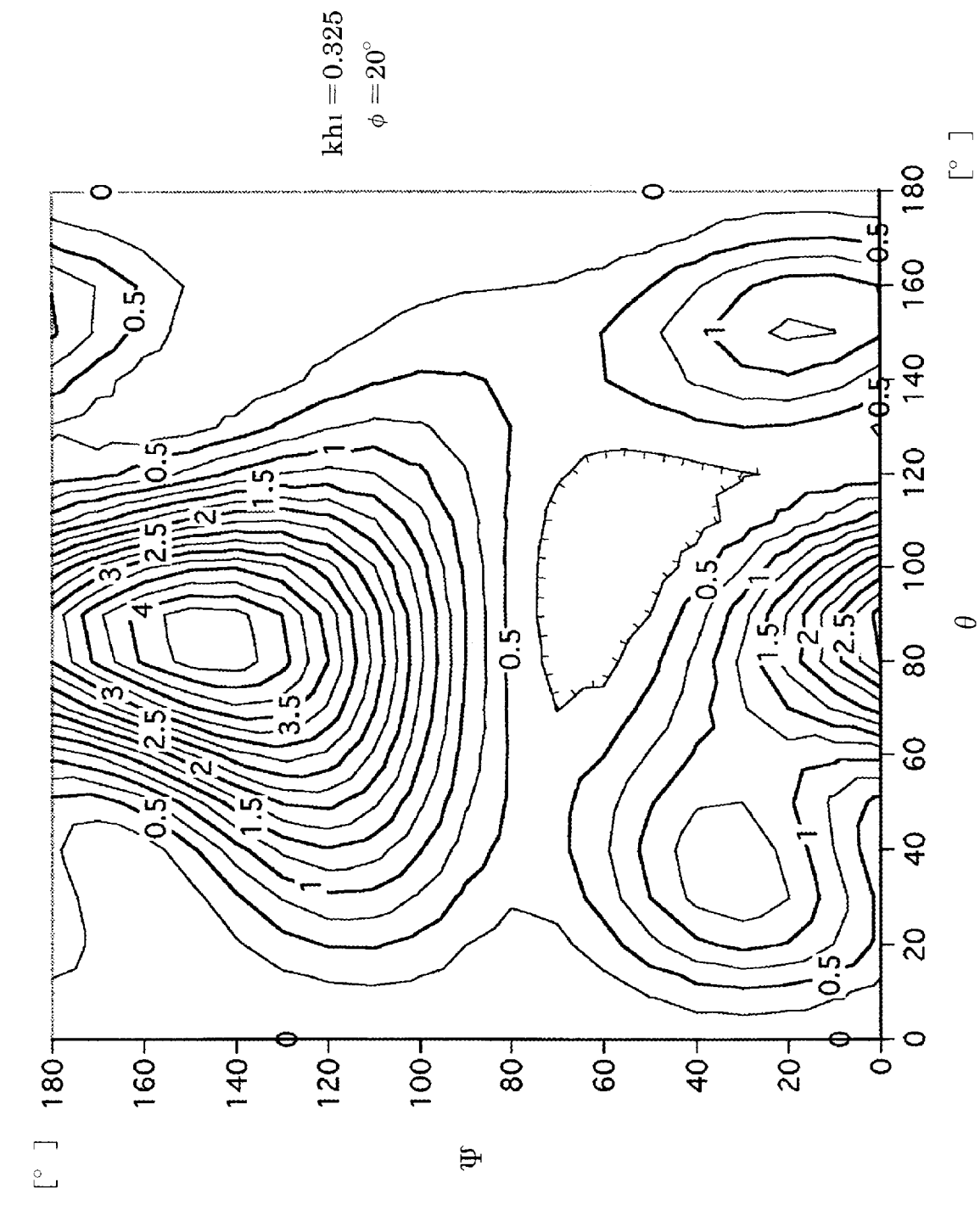
FIG. 47 is a graph showing the evaluation result of $K^2$ in the third embodiment ($kh_1=0.325$, $\Phi=20°$)
Figure 48:
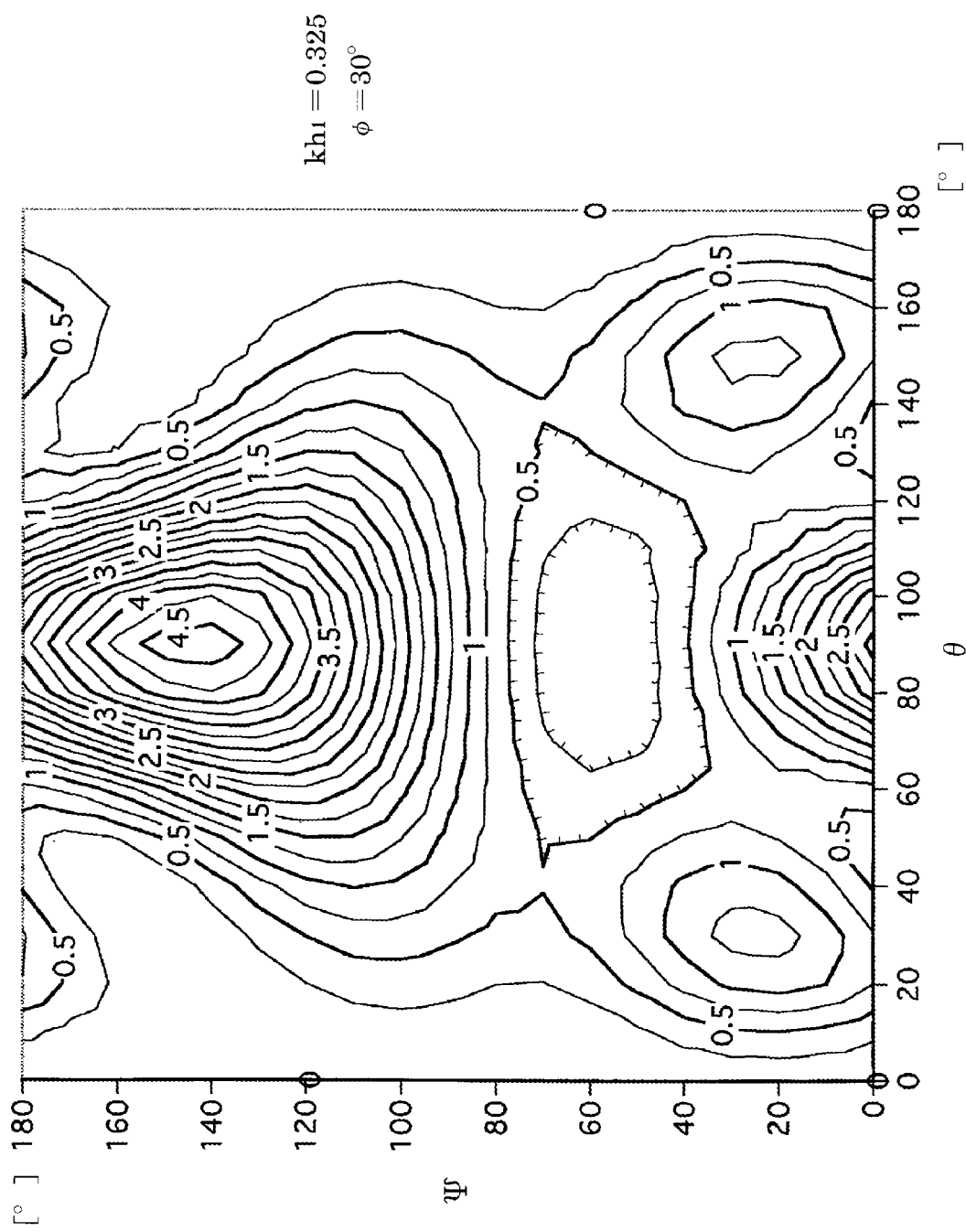
FIG. 48 is a graph showing the evaluation result of $K^2$ in the third embodiment ($kh_1=0.325$, $\Phi=30°$)
Figure 49:
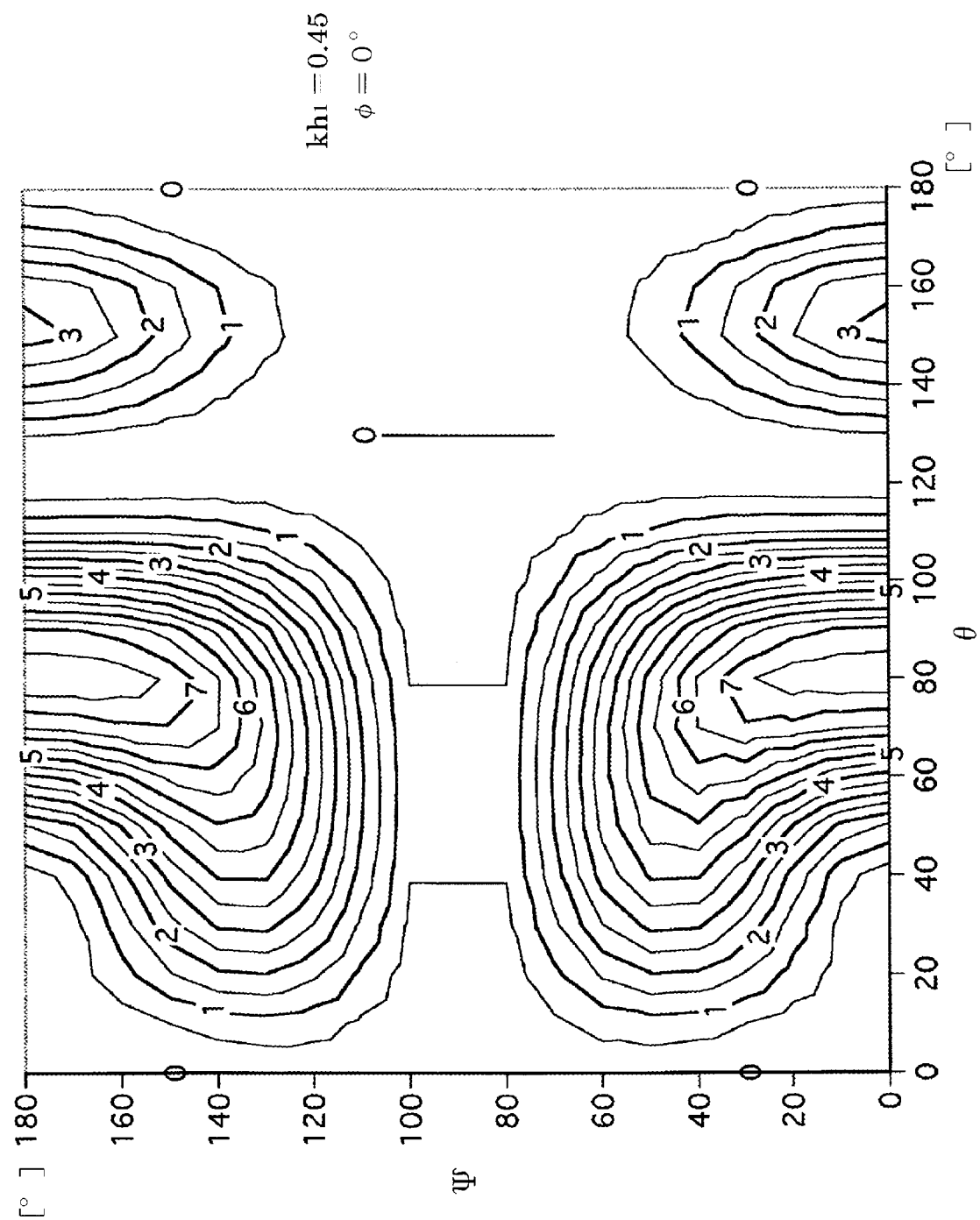
FIG. 49 is a graph showing the evaluation result of $K^2$ in the third embodiment ($kh_1=0.45$, $\Phi=0°$)
Figure 50:
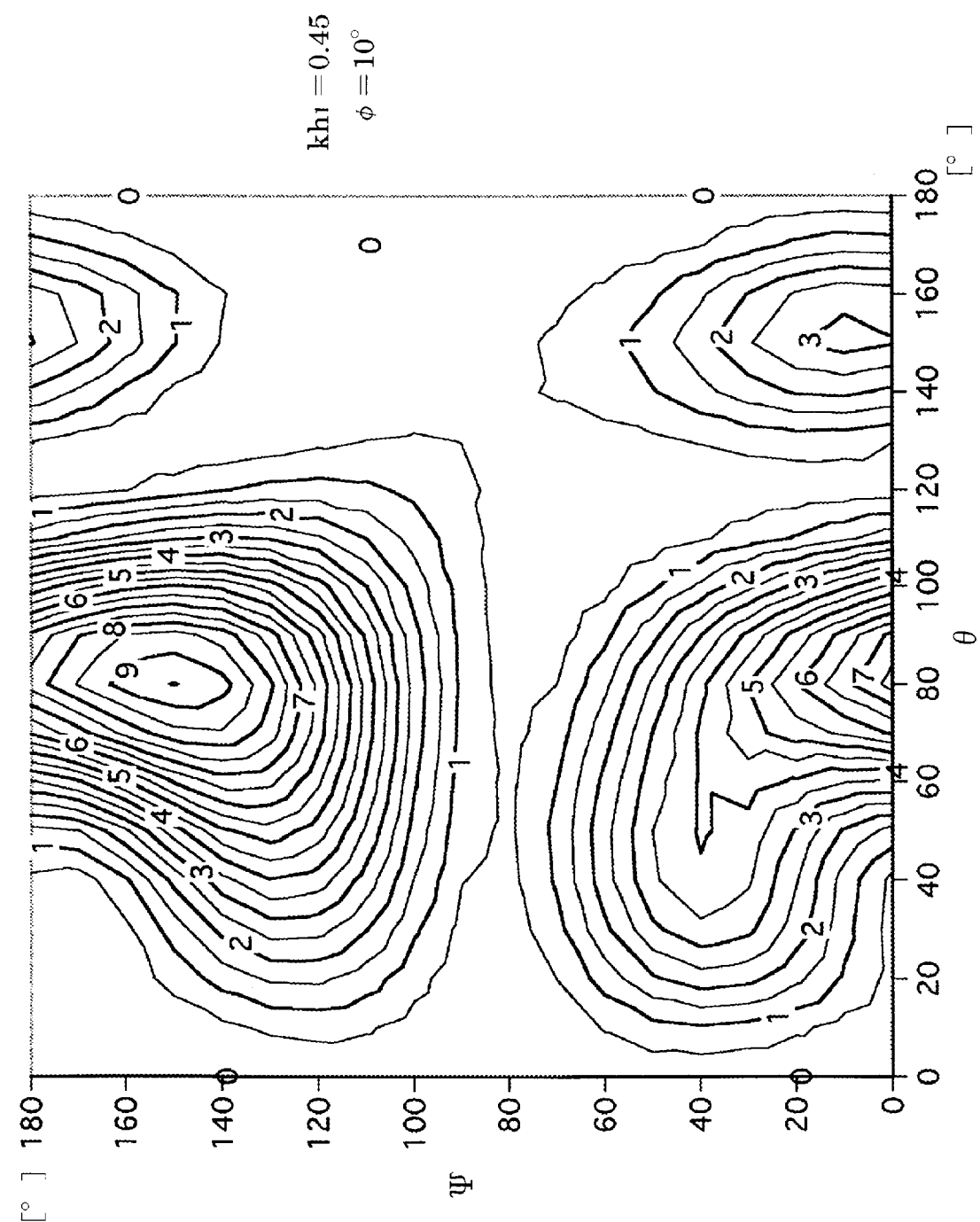
FIG. 50 is a graph showing the evaluation result of $K^2$ in the third embodiment ($kh_1=0.45$, $\Phi=10°$)
Figure 51:
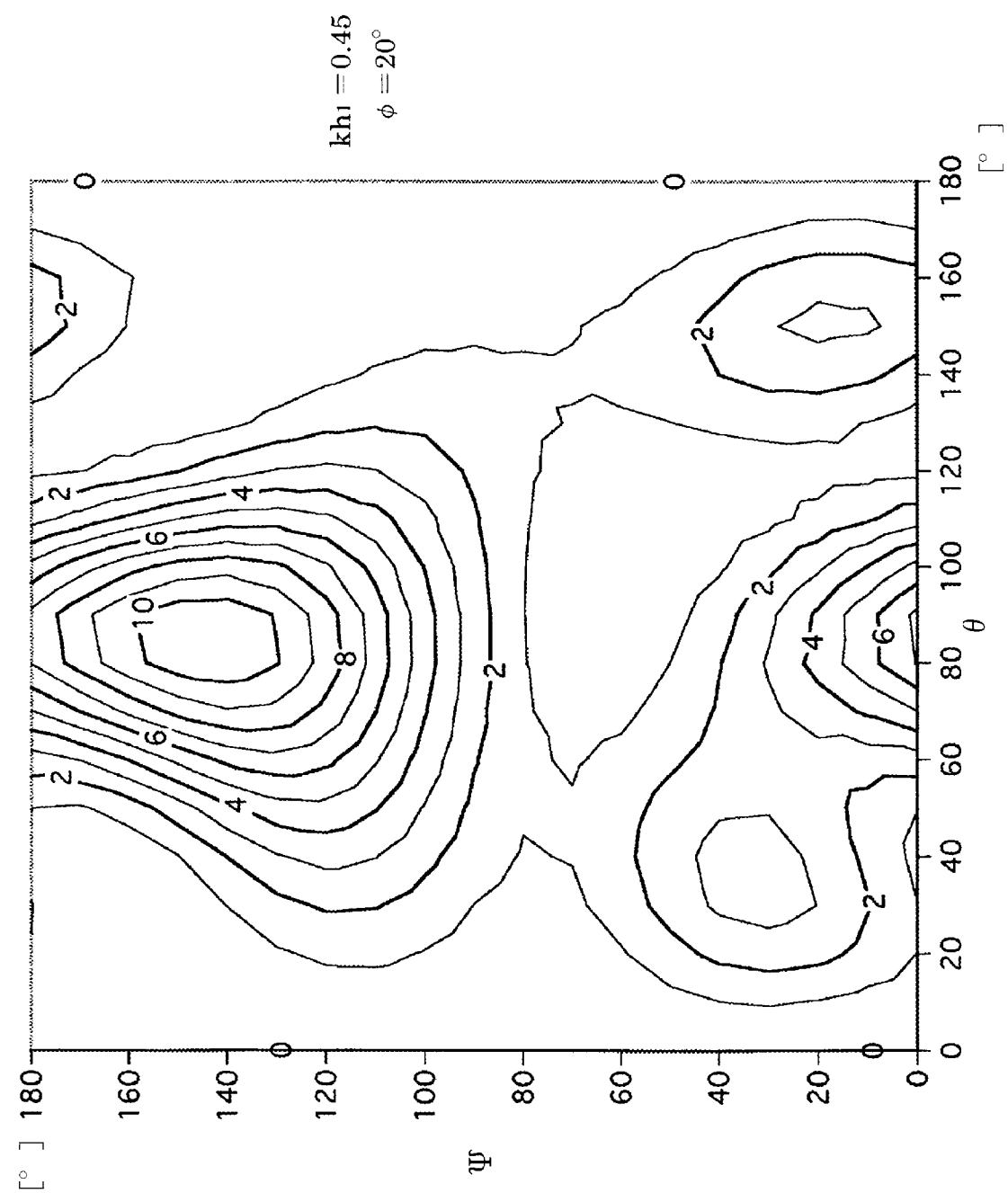
FIG. 51 is a graph showing the evaluation result of $K^2$ in the third embodiment ($kh_1=0.45$, $\Phi=20°$)
Figure 52:
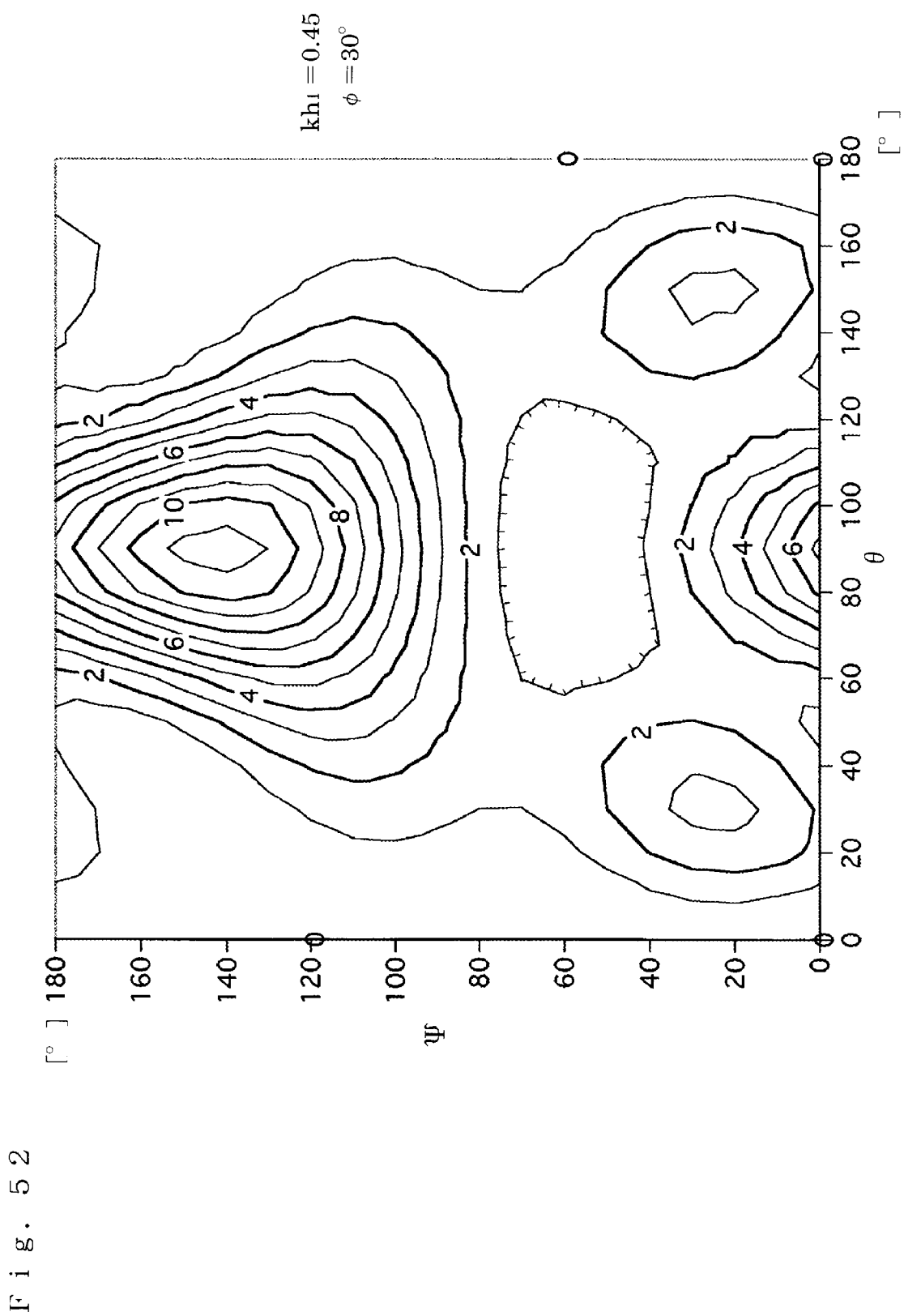
FIG. 52 is a graph showing the evaluation result of $K^2$ in the third embodiment ($kh_1=0.45$, $\Phi=30°$)
Figure 53:
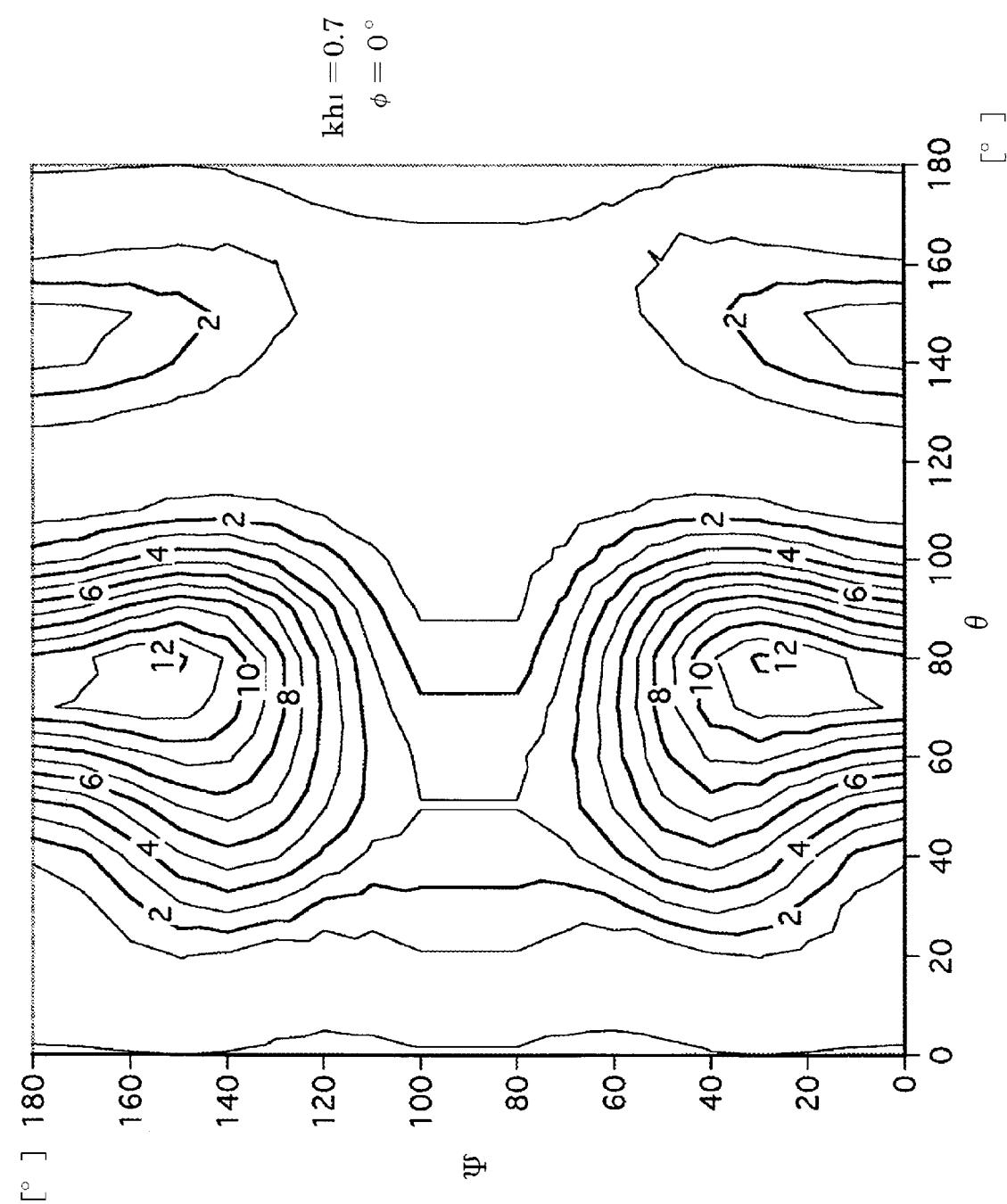
FIG. 53 is a graph showing the evaluation result of $K^2$ in the third embodiment ($kh_1=0.7$, $\Phi=0°$)
Figure 54:
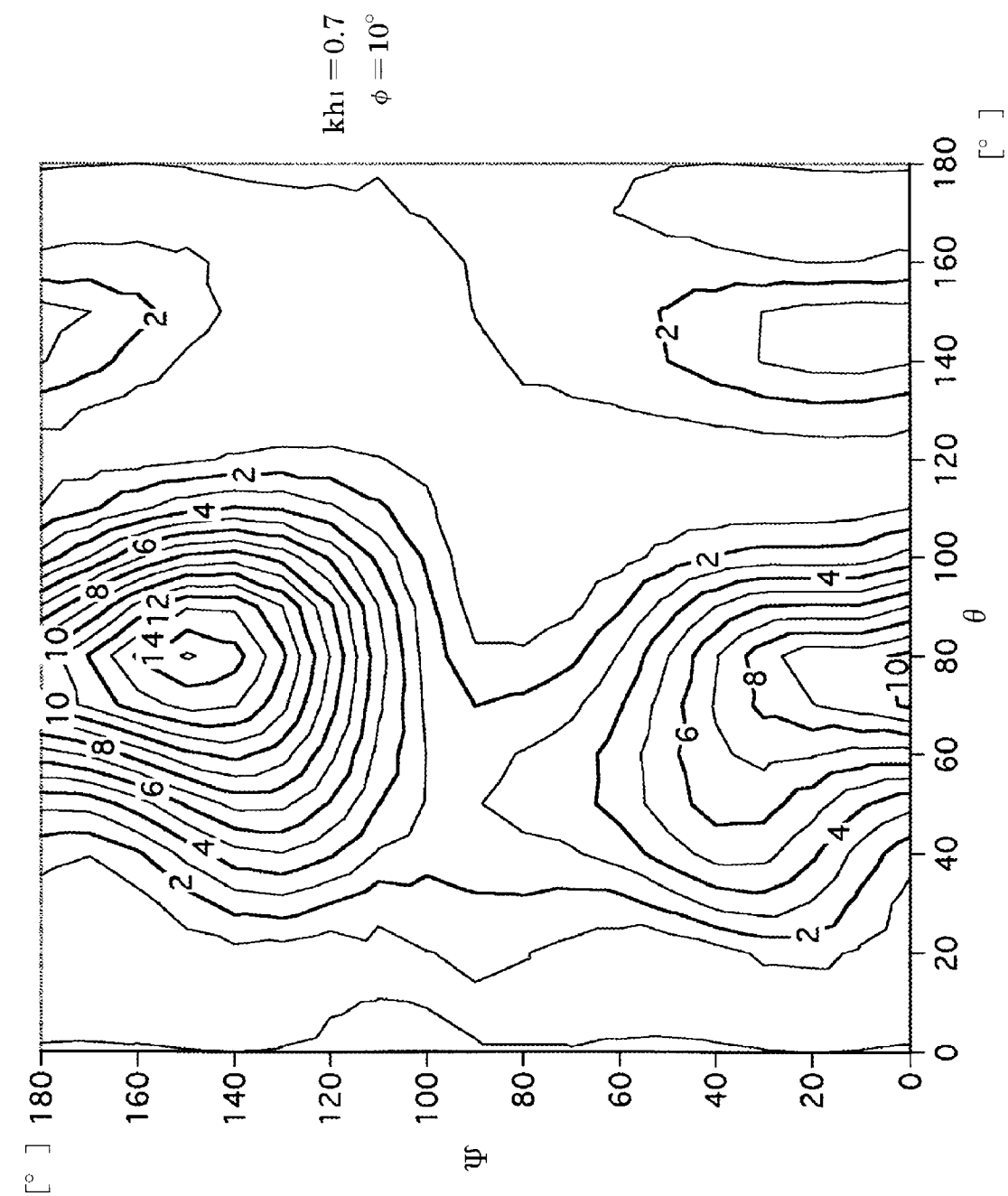
FIG. 54 is a graph showing the evaluation result of $K^2$ in the third embodiment ($kh_1=0.7$, $\Phi=10°$)
Figure 55:
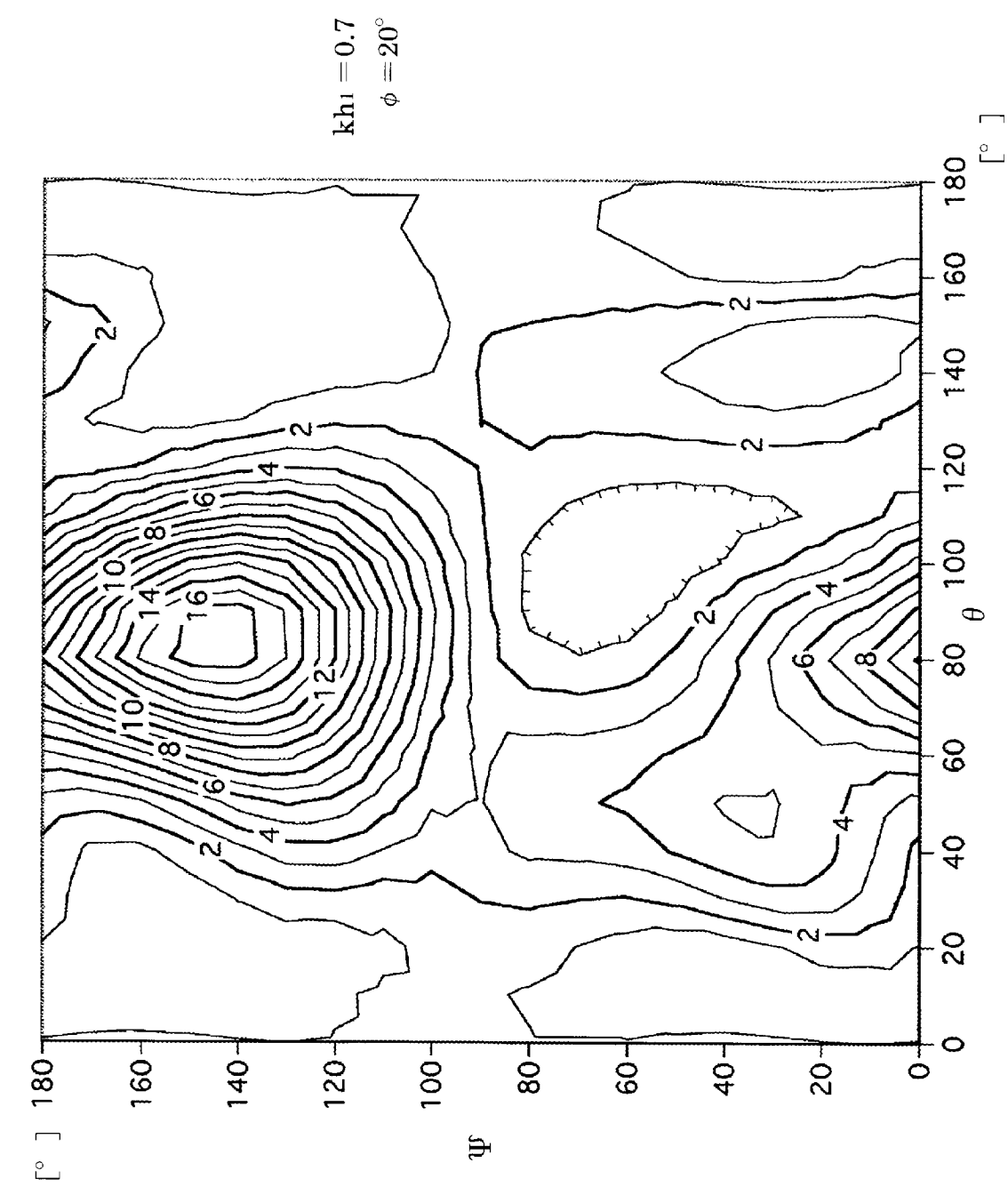
FIG. 55 is a graph showing the evaluation result of $K^2$ in the third embodiment ($kh_1=0.7$, $\Phi=20°$)
Figure 56:
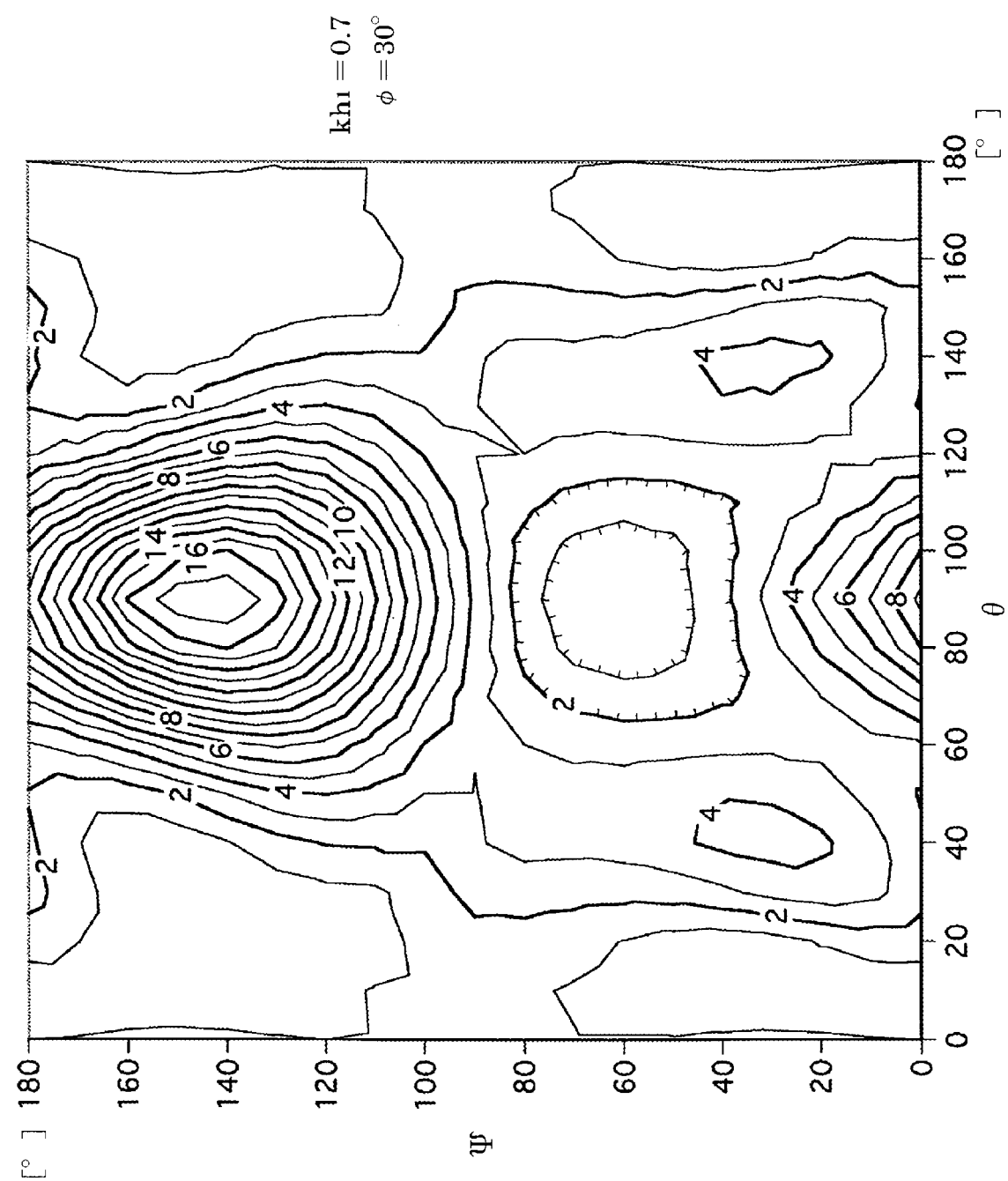
FIG. 56 is a graph showing the evaluation result of $K^2$ in the third embodiment ($kh_1=0.7$, $\Phi=30°$)

FIGS. 41, to 56 are graphs showing contour lines obtained upon evaluating the electromechanical coupling coefficient $K^2$ [%] under conditions that $kh_1=0.2$, 0.325, 0.45, and 0.7, $\Phi=0°$, 10°, 20°, and 30°, $0° \leq \theta \leq 180°$, and $0° \leq \psi \leq 180°$. Note that the values $\theta$ and $\psi$ are plotted in units of 10° in these graphs.

Regions for satisfying the electromechanical coupling coefficient $K^2$ of 10% or more are obtained from FIGS. 41 to 56. Taking the symmetry of the LiNbO$_3$ crystal into consideration, it is confirmed that, when the propagation velocity V is 8,000 m/s or more, and the electromechanical coupling coefficient $K^2$ is 10% or more, the four parameters $kh_1$, $\theta$, $\Phi$, and $\psi$ are set in the internal region of the symmetric quadrangular pyramid with that represented by (i) or the symmetric hexahedron with that represented by (ii).

(Fourth Embodiment)

Figure 57:
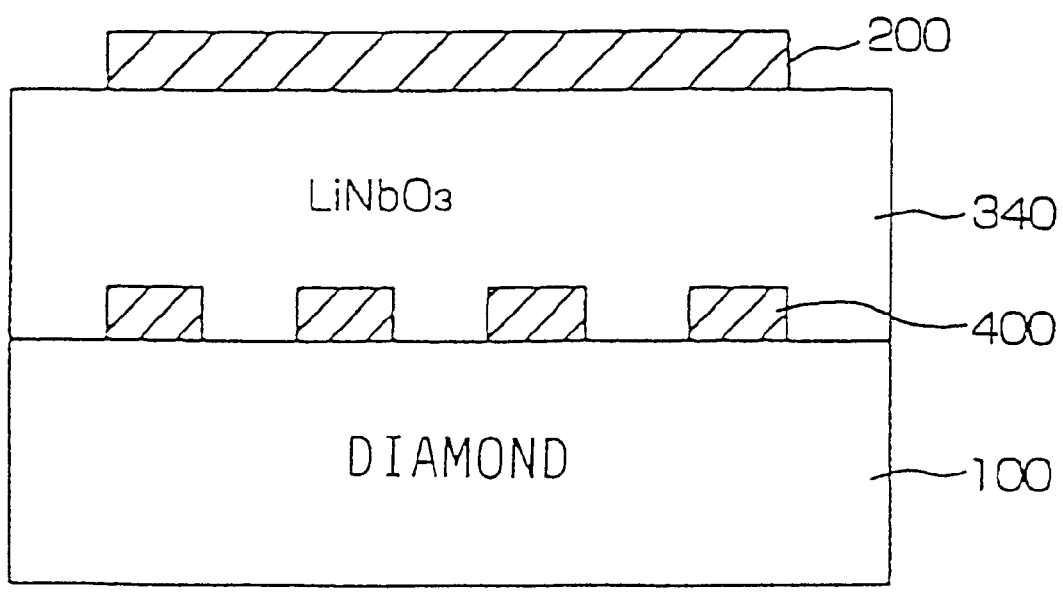
FIG. 57 is a sectional view showing the structure of an SAW device according to the fourth embodiment of the present invention.
Figure 58:
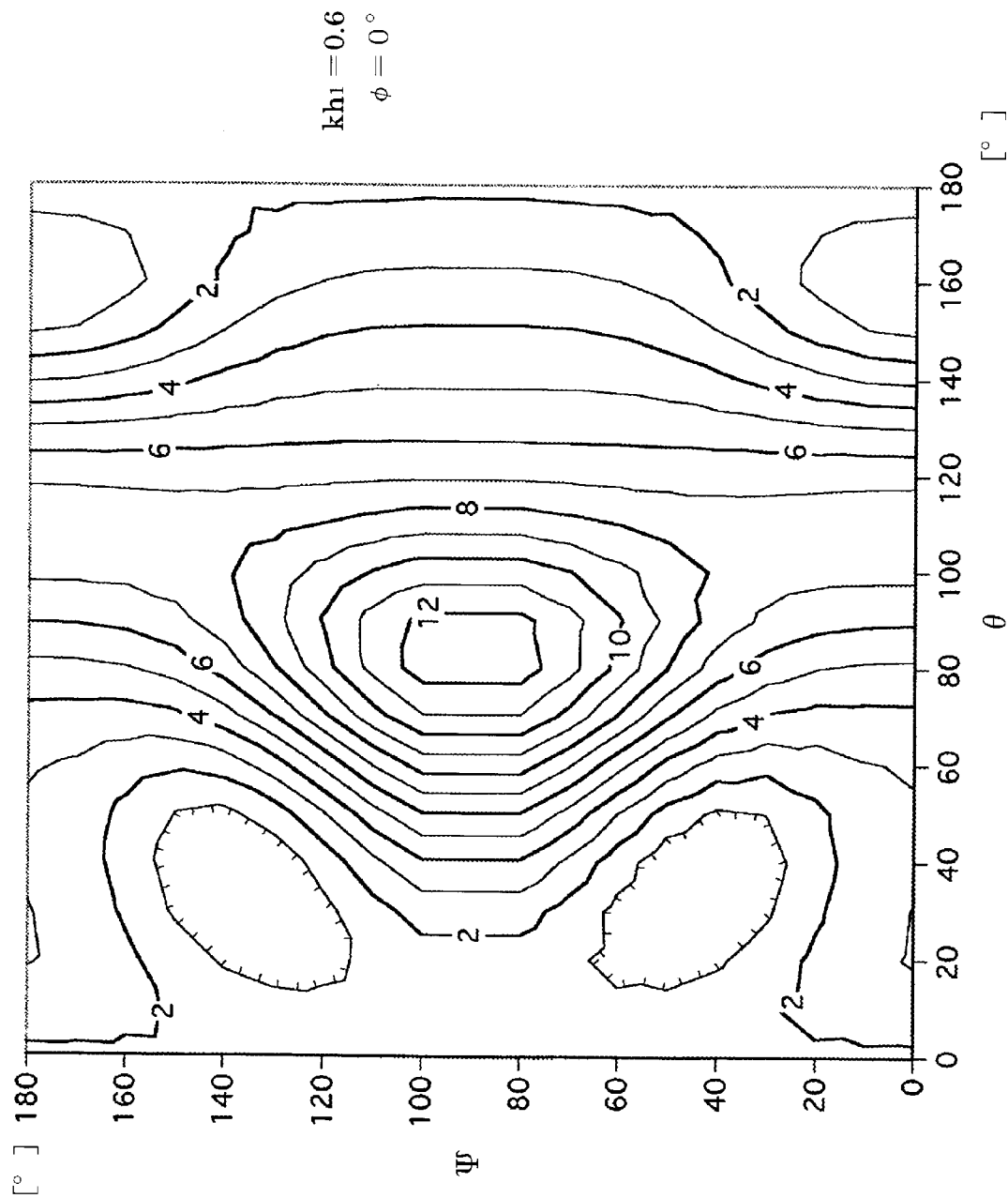
FIG. 58 is a graph showing the evaluation result of $K^2$ in the fourth embodiment ($kh_1$=0.6, $\Phi$=0°)
Figure 59:
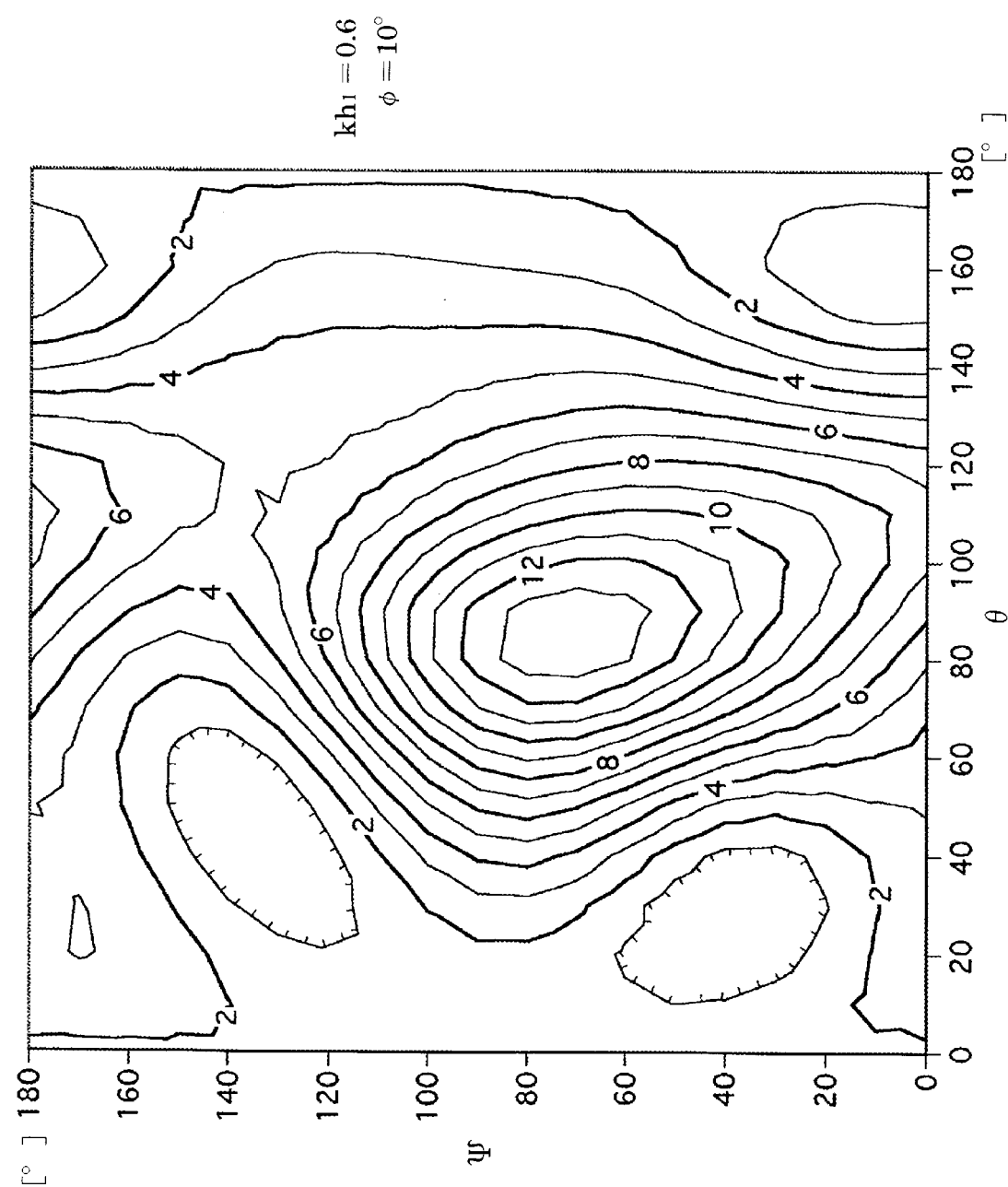
FIG. 59 is a graph showing the evaluation result of $K^2$ in the fourth embodiment ($kh_1$=0.6, $\Phi$=10°)
Figure 60:
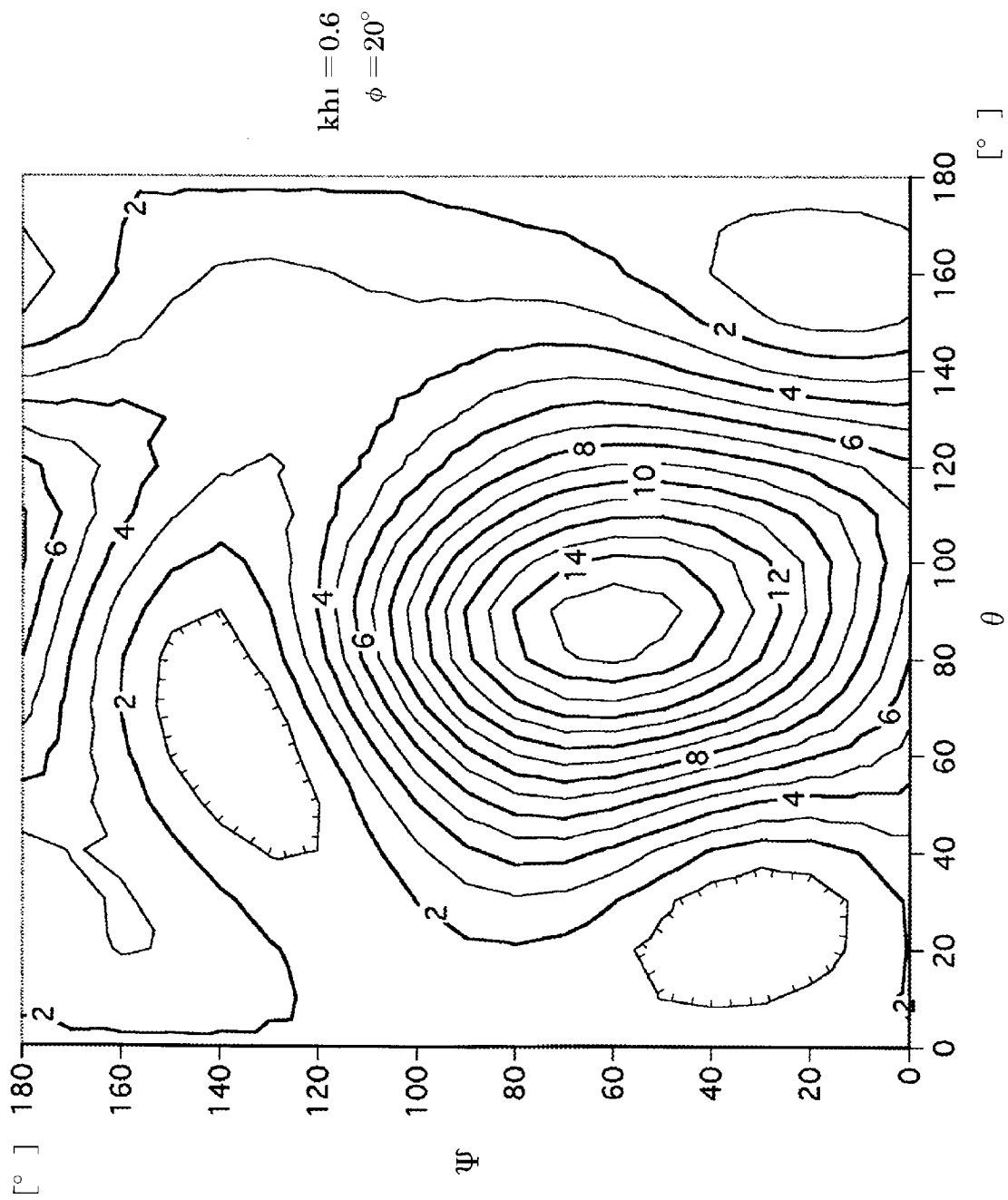
FIG. 60 is a graph showing the evaluation result of $K^2$ in the fourth embodiment ($kh_1$=0.6, $\Phi$=20°)
Figure 61:
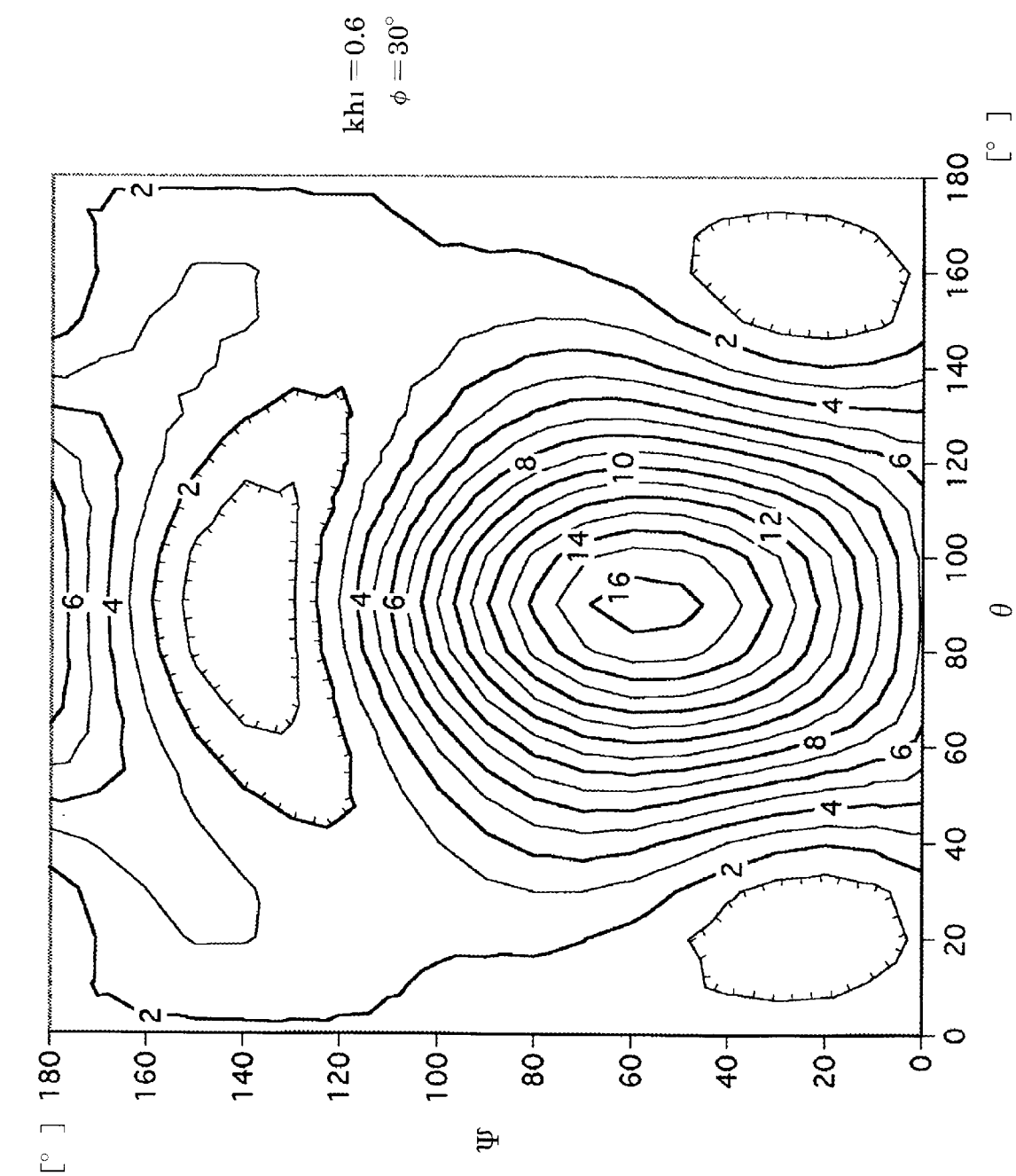
FIG. 61 is a graph showing the evaluation result of $K^2$ in the fourth embodiment ($kh_1$=0.6, $\Phi$=30°)
Figure 62:
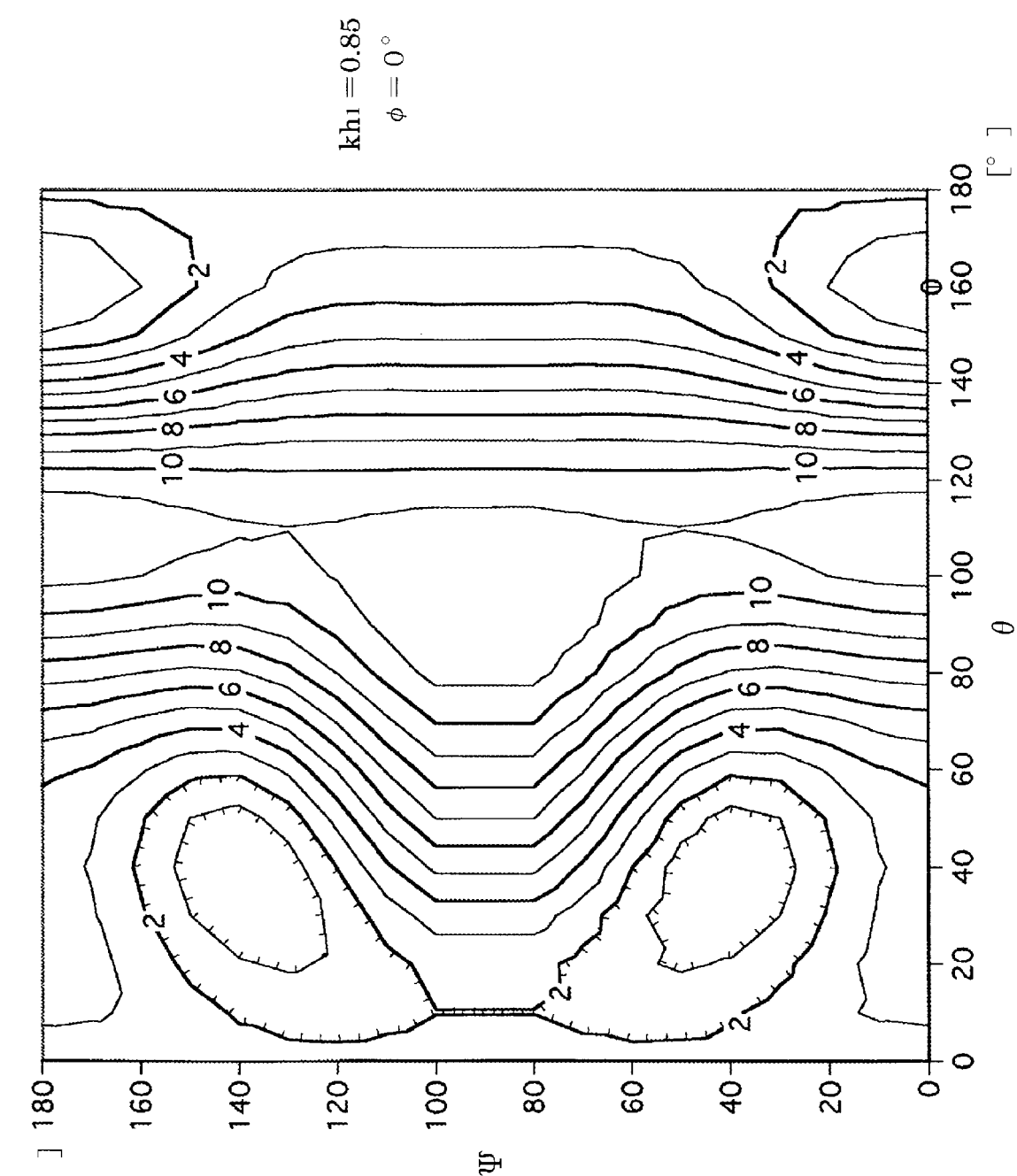
FIG. 62 is a graph showing the evaluation result of $K^2$ in the fourth embodiment ($kh_1$=0.85, $\Phi$=0°)
Figure 63:
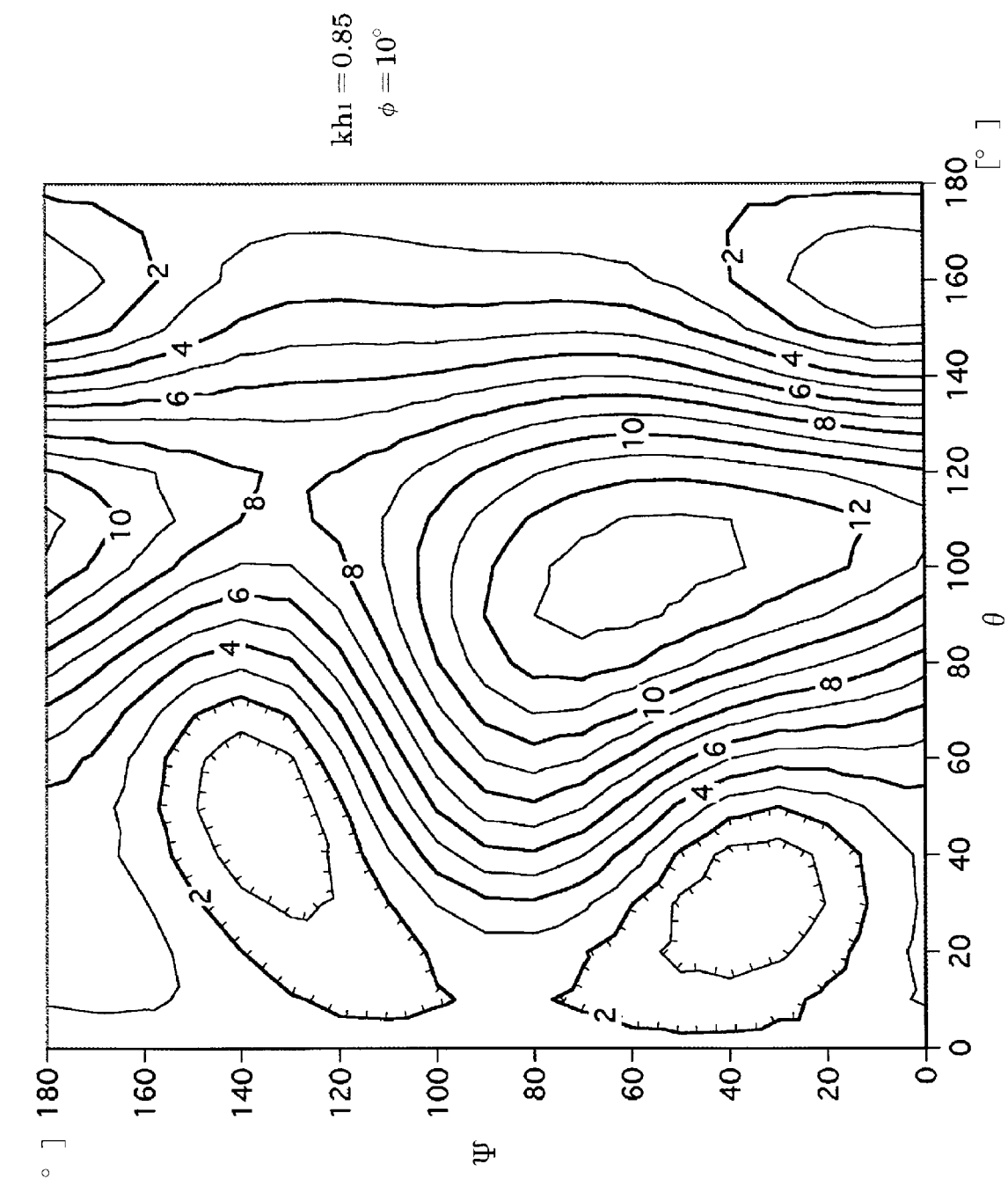
FIG. 63 is a graph showing the evaluation result of $K^2$ in the fourth embodiment ($kh_1$=0.85, $\Phi$=10°)
Figure 64:
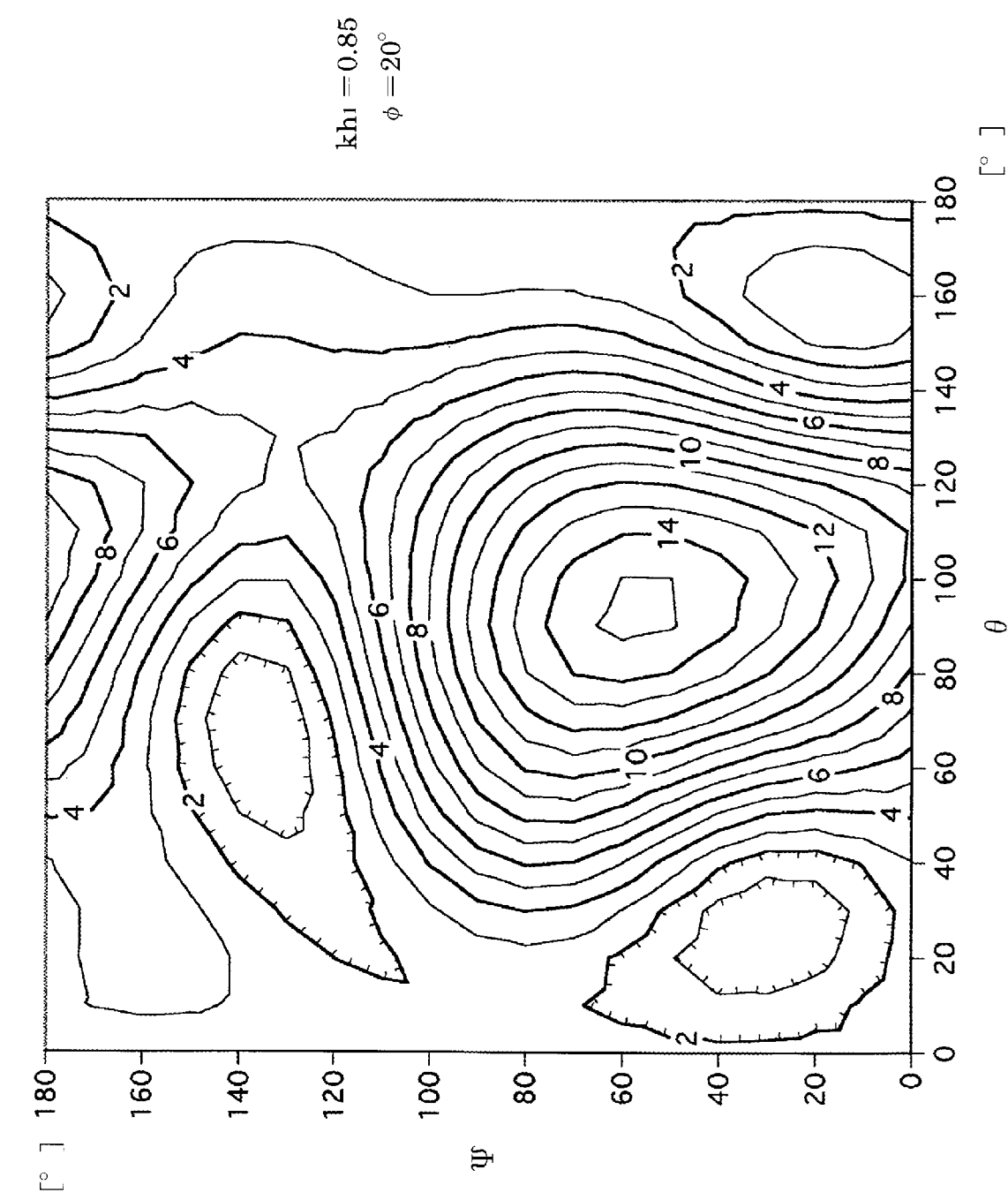
FIG. 64 is a graph showing the evaluation result of $K^2$ in the fourth embodiment ($kh_1$=0.85, $\Phi$=20°)
Figure 65:
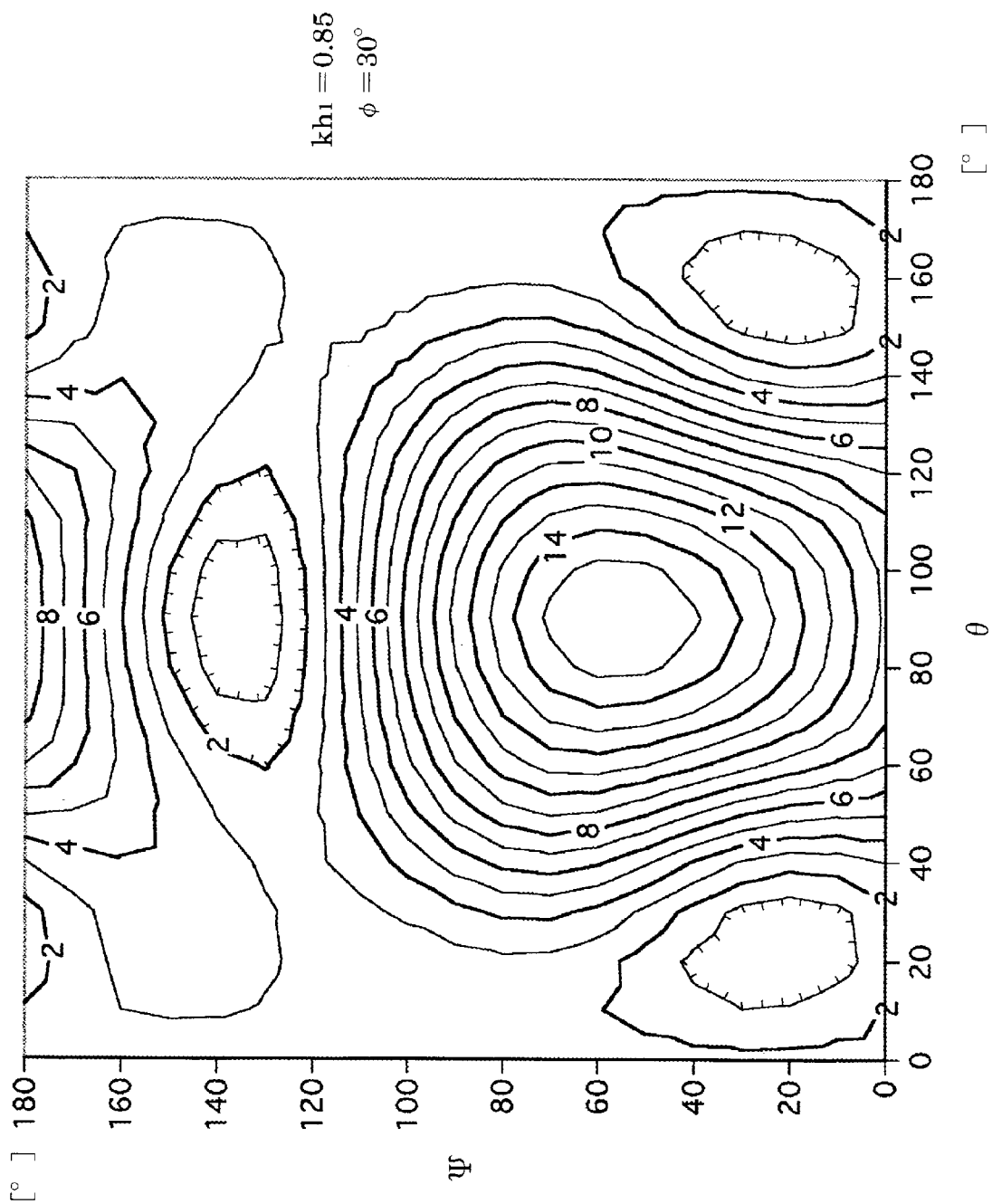
FIG. 65 is a graph showing the evaluation result of $K^2$ in the fourth embodiment ($kh_1$=0.85, $\Phi$=30°)
Figure 66:
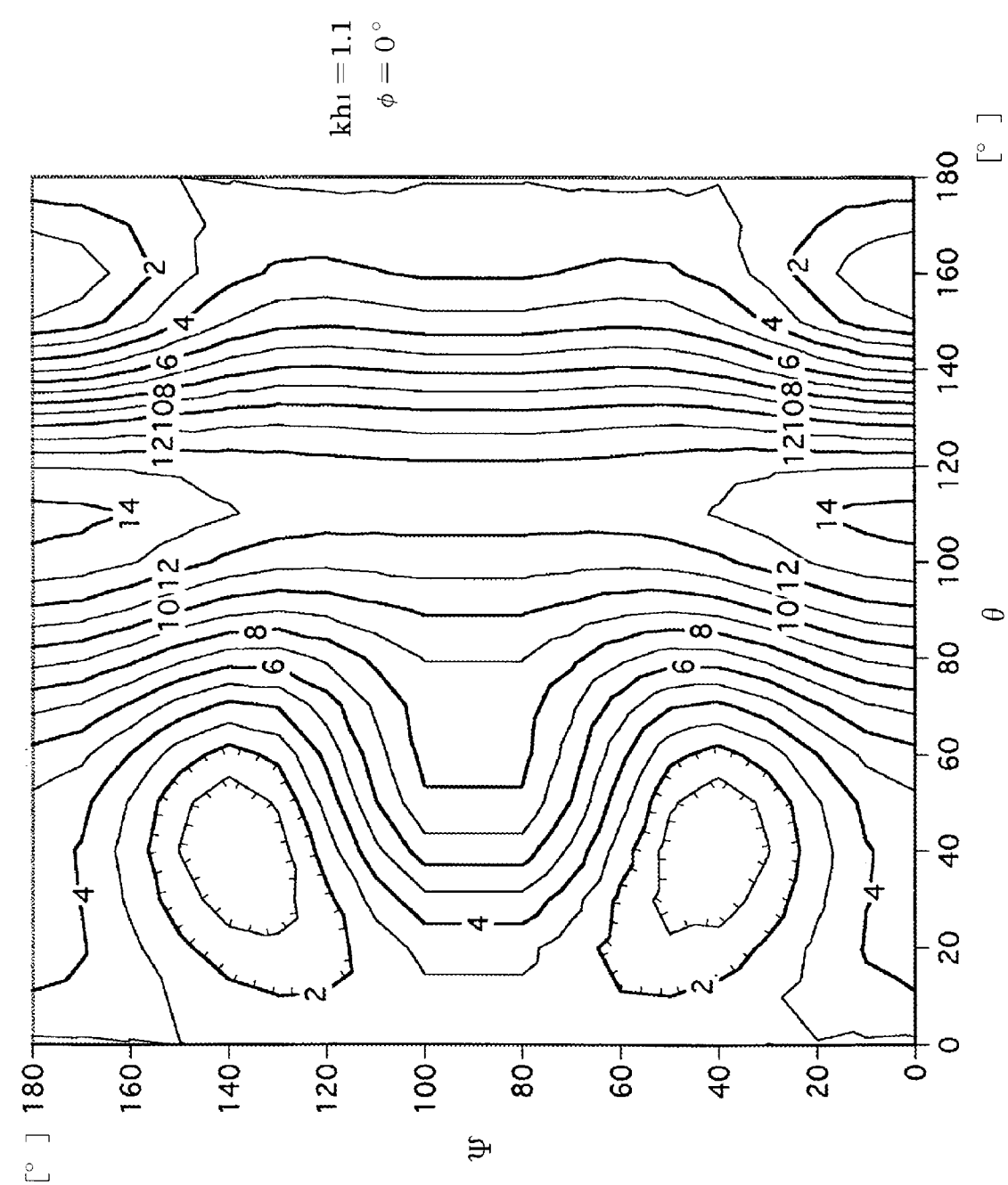
FIG. 66 is a graph showing the evaluation result of $K^2$ 'in the fourth embodiment ($kh_1$=1.1, $\Phi$=0°)
Figure 67:
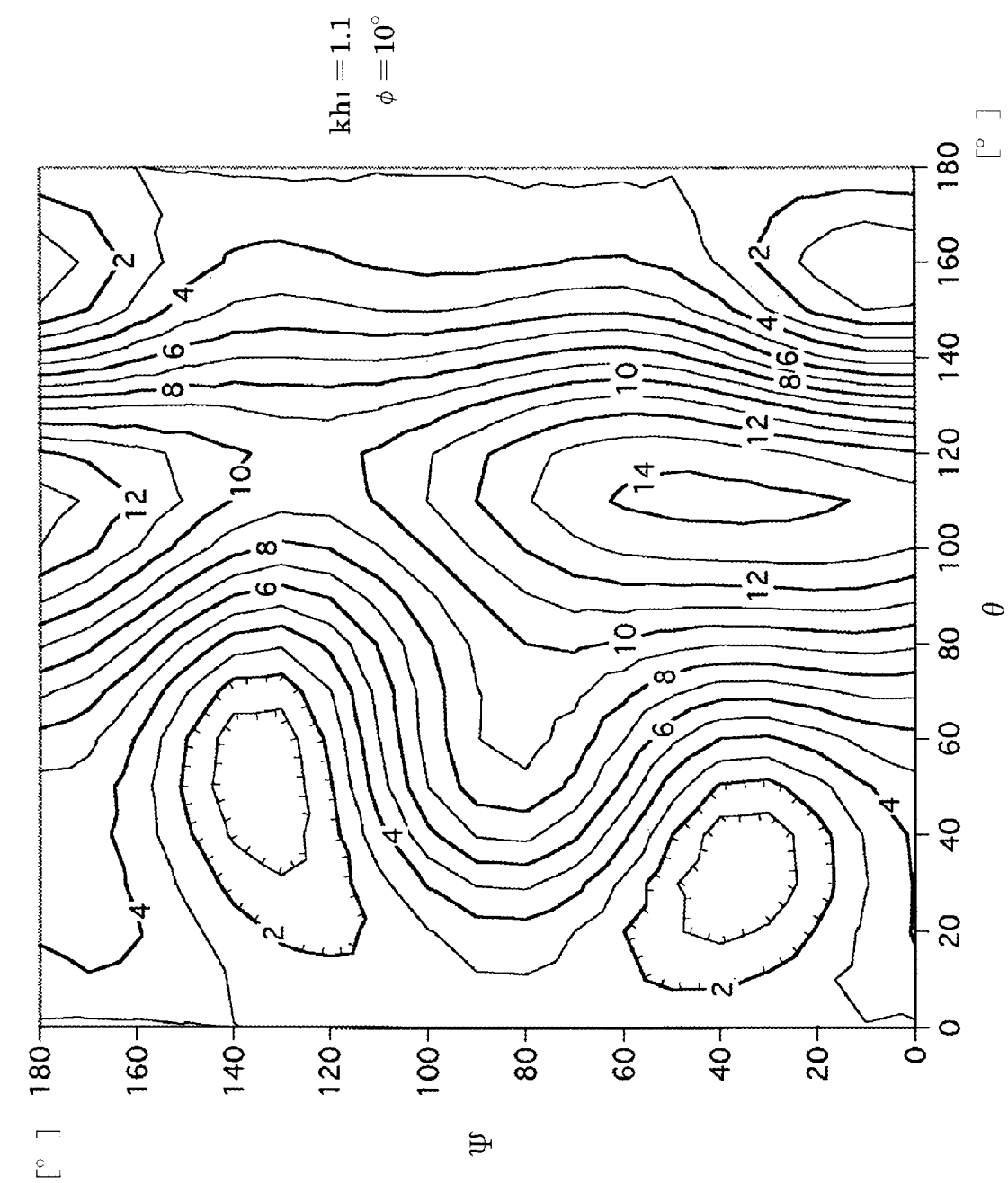
FIG. 67 is a graph showing the evaluation result of $K^2$ in the fourth embodiment ($kh_1$=1.1, $\Phi$=10°)
Figure 68:
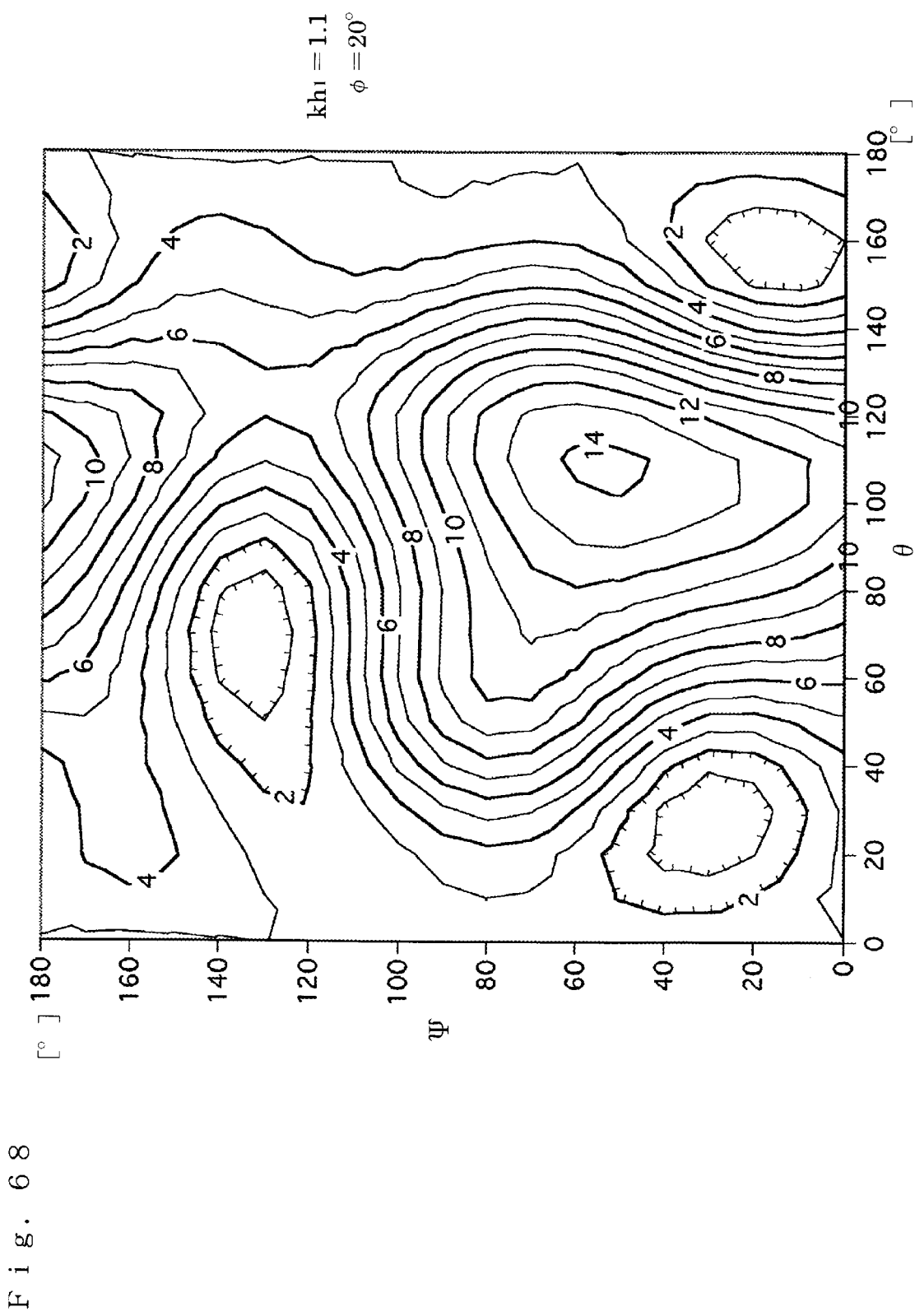
FIG. 68 is a graph showing the evaluation result of $K^2$ in the fourth embodiment ($kh_1$=1.1, $\Phi$=20°)
Figure 69:
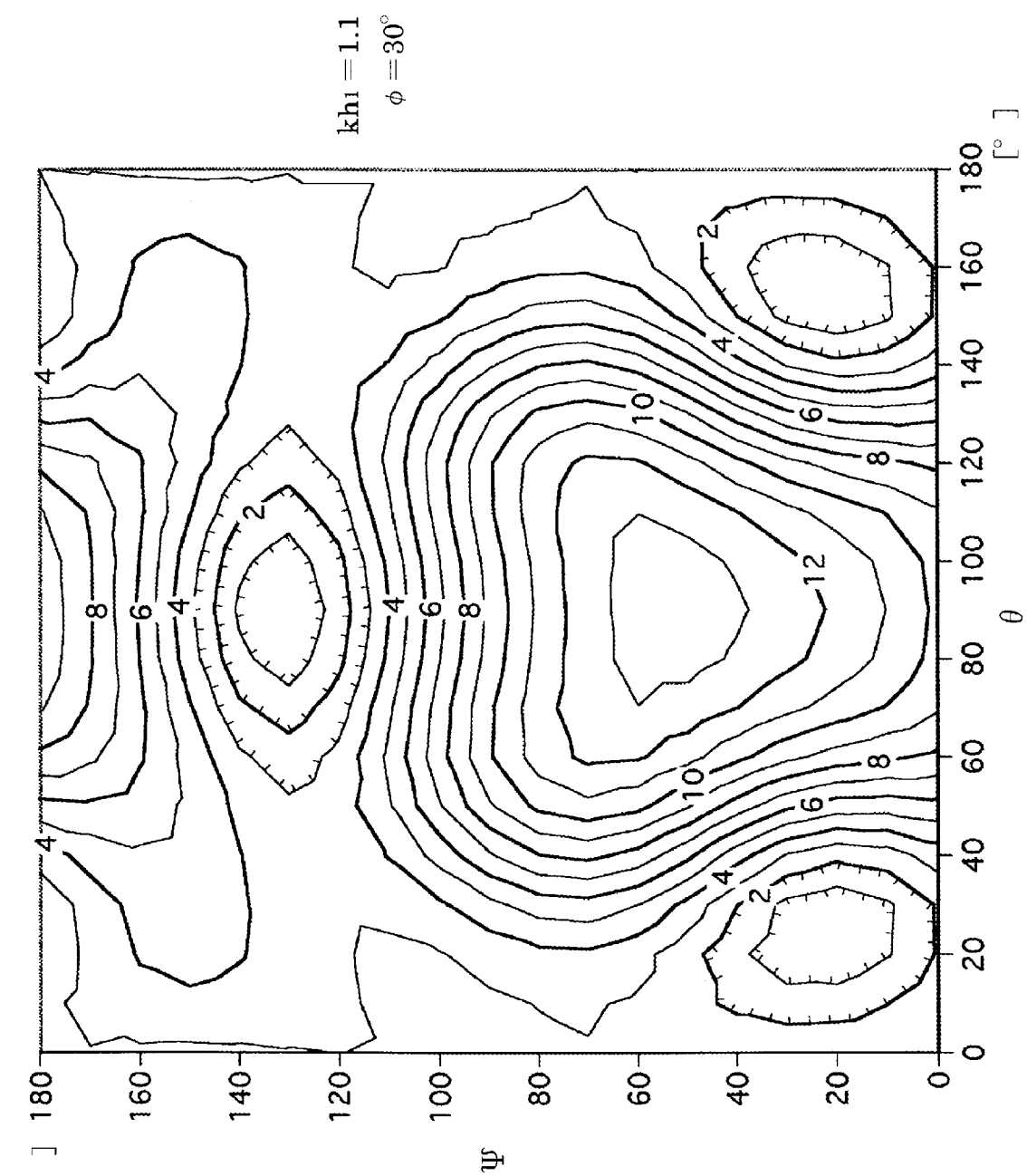
FIG. 69 is a graph showing the evaluation result of $K^2$ in the fourth embodiment ($kh_1$=1.1, $\Phi$=30°)
Figure 70:
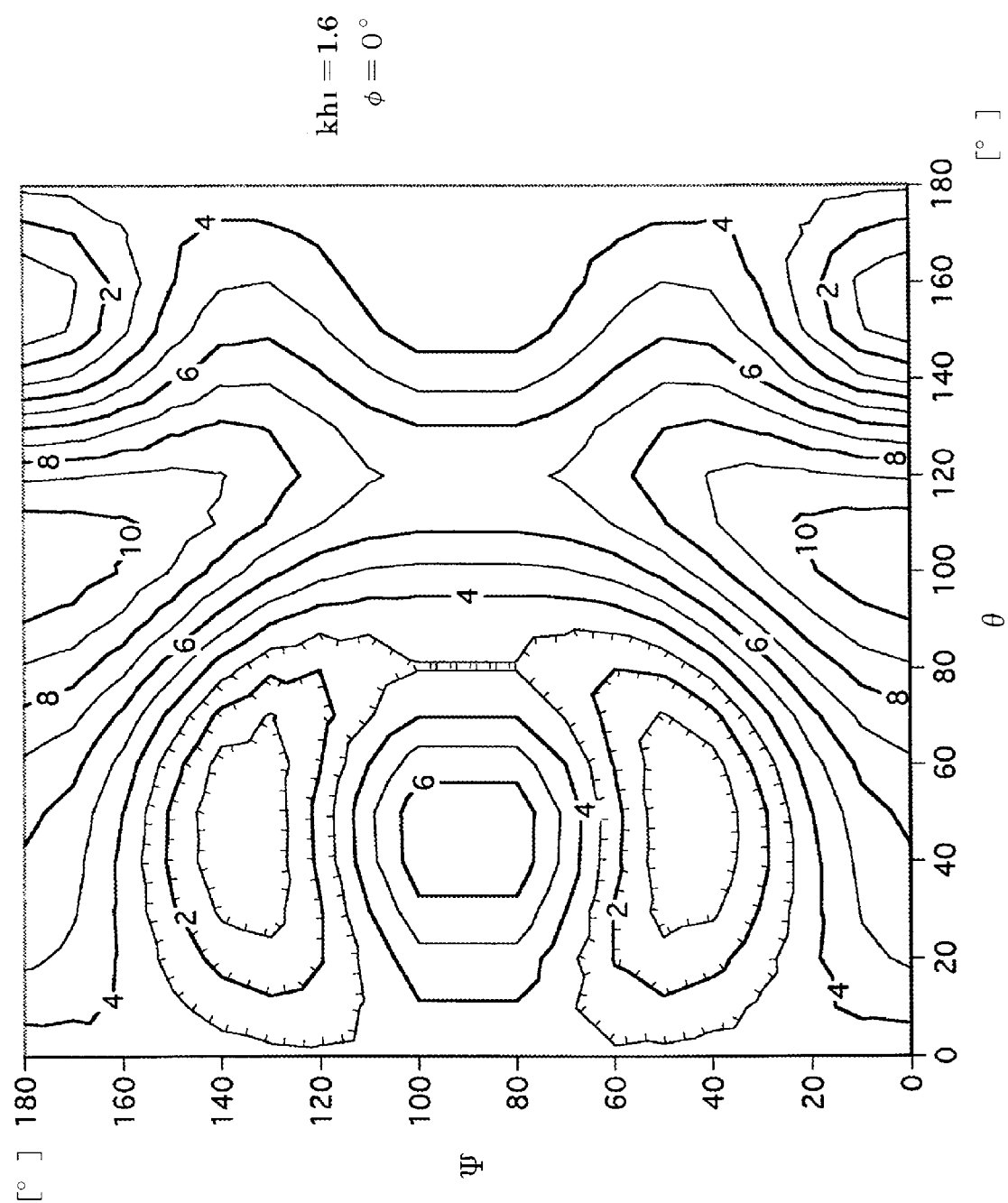
FIG. 70 is a graph showing the evaluation result of $K^2$ in the fourth embodiment ($kh_1$=1.6, $\Phi$=0°)
Figure 71:
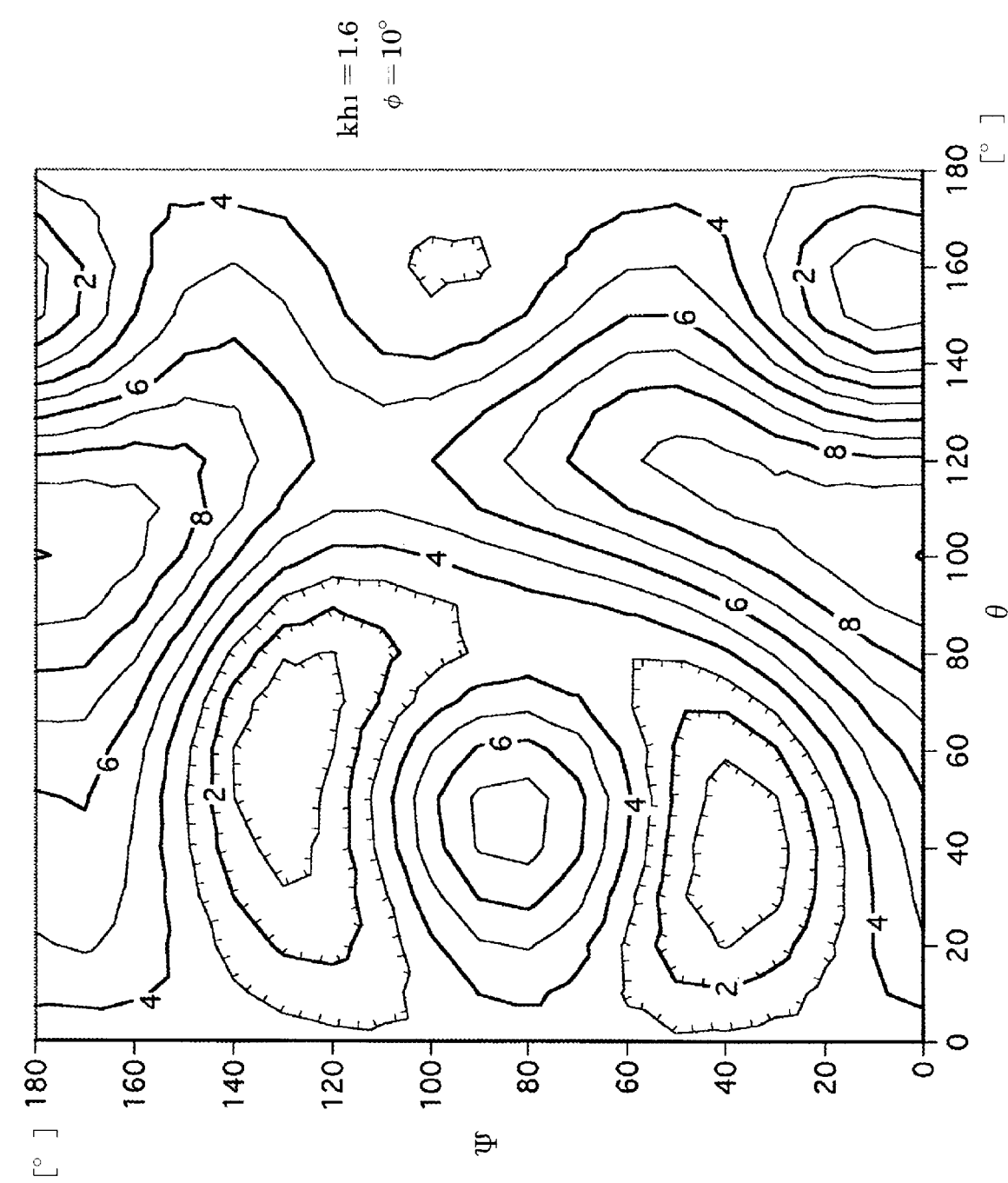
FIG. 71 is a graph showing the evaluation result of $K^2$ in the fourth embodiment ($kh_1$=1.6, $\Phi$=10°)
Figure 72:
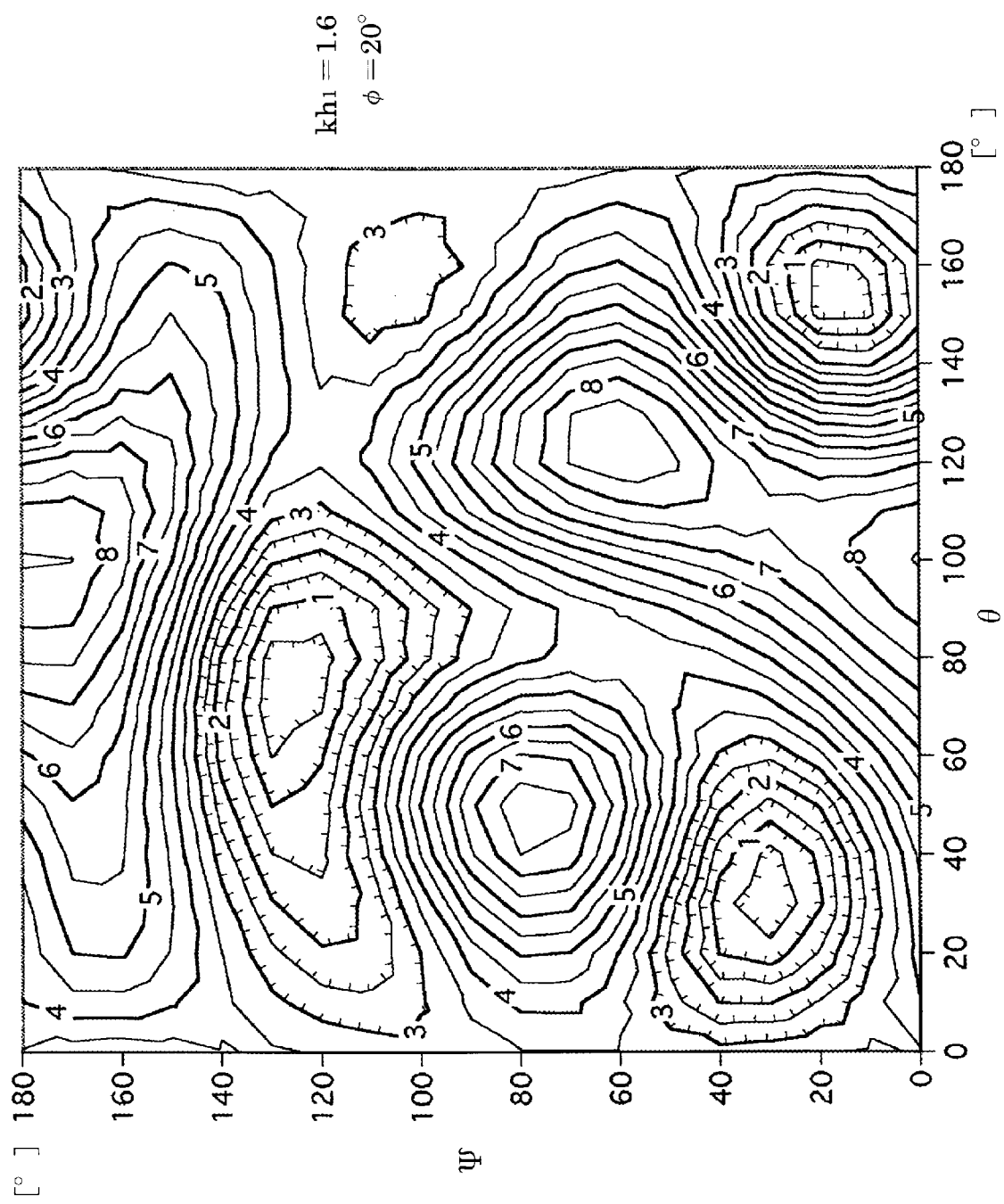
FIG. 72 is a graph showing the evaluation result of $K^2$ in the fourth embodiment ($kh_1$=1.6, $\Phi$=20°)
Figure 73:
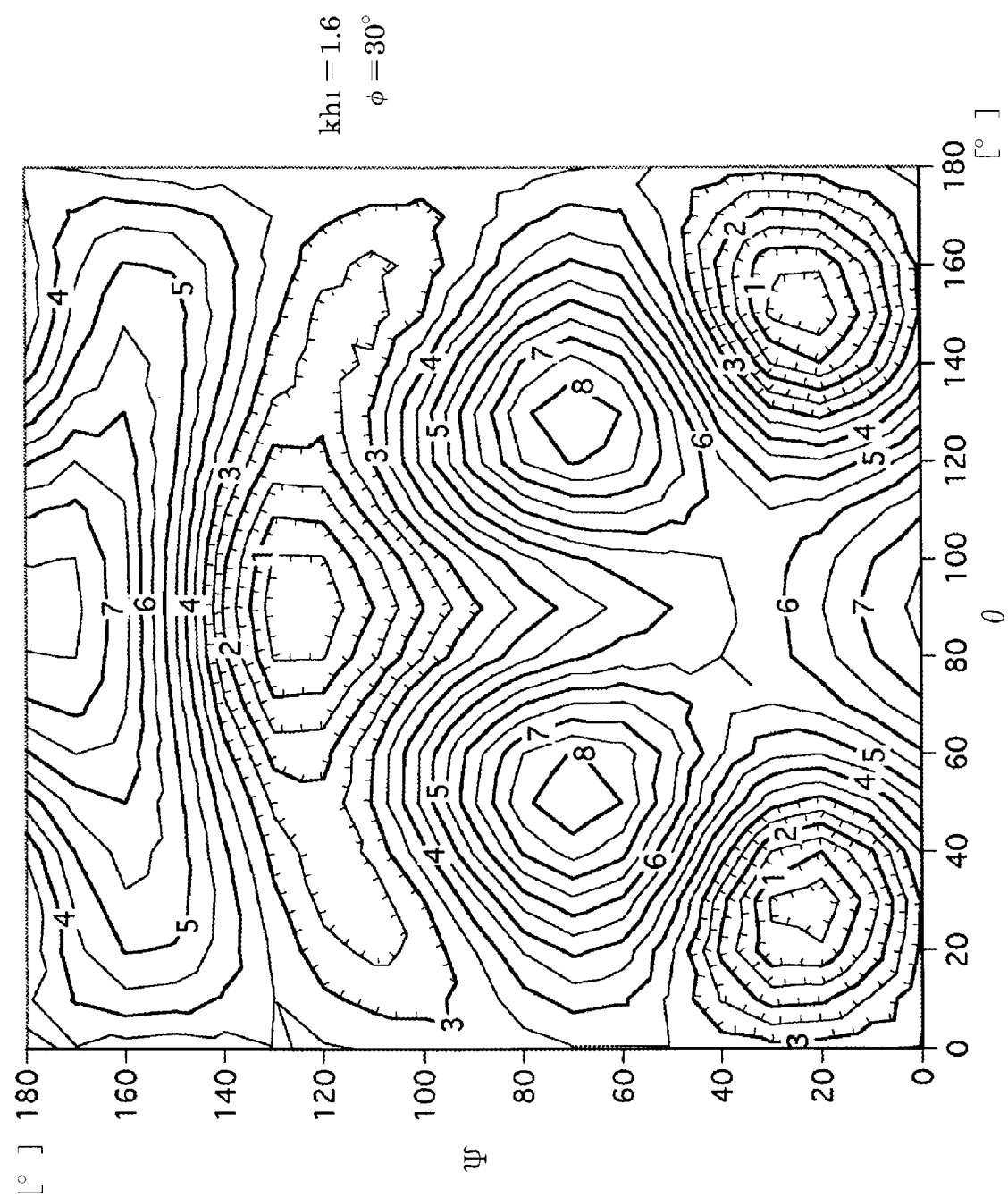
FIG. 73 is a graph showing the evaluation result of $K^2$ in the fourth embodiment ($kh_1$=1.6, $\Phi$=30°)

FIG. 57 is a sectional view showing the structure of an SAW device according to the fourth embodiment of the present invention. As shown in FIG. 57, the SAW device of the fourth embodiment is different from that of the third embodiment only in that an SAW in the 2nd-order mode is used, and an LiNbO$_3$ layer 340 is formed in place of the LiNbO$_3$ layer 330.

The LiNbO$_3$ layer 340 is formed by bonding a cut single crystal LiNbO$_3$ thin plate to diamond 100 having a short-circuit electrode 200 formed on its polished surface, and then polishing the single crystal LiNbO$_3$ thin plate. As in the third embodiment, for an interdigital transducer 400, preferably, a recessed portion is formed in the diamond 100 by reactive ion etching, the interdigital transducer 400 is formed with Al or the le in this recessed portion, and the interface to the LiNbO$_3$ layer 340 is entirely flattened.

For the LiNbO$_3$ layer 340, a thickness $t_1$ [μm] and a crystal orientation ($\theta[°], \Phi[°], \psi[°]$) are selected from the following values. Note that $kh_1$ ($=2\pi(t_1/\lambda)$; $\lambda$=the wavelength [μm] of an SAW) is used instead of the thickness $t_1$, as in the first embodiment.

(i) $0 < \Phi \leq 15$ on an orthogonal coordinate system ($kh_1, \theta, \psi$), values in the internal region of a hexahedron which has, as its opposing bottom surfaces, a planar rectangular region with its vertexes at points $A_{41}$ $B_{41}$ $C_{41}$ and $D_{41}$, and a planar rectangular region with its vertexes at points $A_{42}$ $B_{42}$ $C_{42}$ and $D_{42}$,
where
point $A_{41}=(0.6, 70, 40)$
point $B_{41}=(0.6, 100, 40)$
point $C_{41}=(0.6, 100, 110)$
point $D_{41}=(0.6, 70, 110)$
point $A_{42}=(0.85, 70, 60)$
point $B_{42}=(0.85, 120, 0)$
point $C_{42}=(0.85, 120, 180)$
point $D_{42}=(0.85, 70, 100)$.

(ii) $0 \leq \Phi \leq 15$ on the orthogonal coordinate system ($kh_1, \theta, \psi$), values in the internal region of a hexahedron which has, as its opposing bottom surfaces, the planar rectangular region with its vertexes at the points $A_{42}$ $B_{42}$ $C_{42}$ and $D_{42}$, and a planar rectangular region with its vertexes at points $A_{43}$ $B_{43}$ $C_{43}$ and $D_{43}$,
where
point $A_{43}=(1.1, 90, 0)$
point $B_{43}=(1.1, 130, 0)$
point $C_{43}=(1.1, 130, 180)$
point $D_{43}=(1.1, 90, 180)$.

(iii) $15 \leq \Phi \leq 30$ on the orthogonal coordinate system ($kh_1, \theta, \psi$), values in the internal region of a hexahedron which has, as its opposing bottom surfaces, a planar rectangular region with its vertexes at points $A_{44}$ $B_{44}$ $C_{44}$ and $D_{44}$, and a planar rectangular region with its vertexes at points $A_{45}$ $B_{45}$ $C_{45}$ and $D_{45}$,
where
point $A_{44}=(0.6, 70, 20)$
point $B_{44}=(0.6, 110, 20)$
point $C_{44}=(0.6, 100, 90)$
point $D_{44}=(0.6, 70, 90)$
point $A_{45}=(0.85, 60, 10)$
point $B_{45}=(0.85, 120, 10)$
point $C_{45}=(0.85, 120, 90)$
point $D_{45}=(0.85, 60, 90)$.

(iv) $15 \leq \Phi \leq 30$ on the orthogonal coordinate system ($kh_1, \theta, \psi$), values in the internal region of a hexahedron which has, as its opposing bottom surfaces, the planar rectangular region with its vertexes at the points $A_{45}$ $B_{45}$ $C_{45}$ and $D_{45}$, and a planar rectangular region with its vertexes at points $A_{46}$ $B_{46}$ $C_{46}$ and $D_{46}$,
where
point $A_{46}=(1.1, 80, 10)$
point $B_{46}=(1.1, 120, 10)$
point $C_{46}=(1.1, 130, 80)$
point $D_{46}=(1.1, 50, 80)$.

In the structure of the SAW device according to the fourth embodiment, a propagation velocity V is exclusively determined by $kh_1$ of the LiNbO$_3$ layer 320. FIG. 23 is a graph showing the relationship between $kh_1$ of the LiNbO$_3$ layer 340 and the propagation velocity V of an SAW in the 1st-order mode in the SAW device of the fourth embodiment. It is confirmed from FIG. 23 that, when $kh_1$ is equal to or smaller than 1.1, a propagation velocity V equal to or higher than 8,000 m/s is ensured.

The present inventors set the thickness of the diamond 100 at 20 μm, and evaluated an electromechanical coupling coefficient $K^2$ while changing $kh_1$ within the above-described limitation for $kh_1$ and simultaneously changing the values $\theta$, $\Phi$, and $\psi$.

FIGS. 58 to 73 are graphs showing contour lines obtained upon evaluating the electromechanical coupling coefficient $K^2$ [%] under conditions that $kh_1$=0.6, 0.85, 1.1, and 1.6, $\Phi$=0°, 10°, 20°, and 30°, 0°≦θ≦180°, and 0°≦ψ≦180°. Note that the values $\theta$ and $\psi$ are plotted in units of 10° in these graphs.

Regions for satisfying the electromechanical coupling coefficient $K^2$ of 10% or more are obtained from FIGS. 58 to 73. Taking the symmetry of the LiNbO$_3$ crystal into consideration, it is confirmed that, when the propagation velocity V is 8,000 m/s or more, and the electromechanical coupling coefficient $K^2$ is 10% or more, the four parameters $k_1$, $\theta$, $\Phi$, and $\psi$ are set in the internal region of one of the hexahedrons which are symmetric with those represented by (i), (ii), (iii), or (iv).

(Fifth Embodiment)

Figure 74:
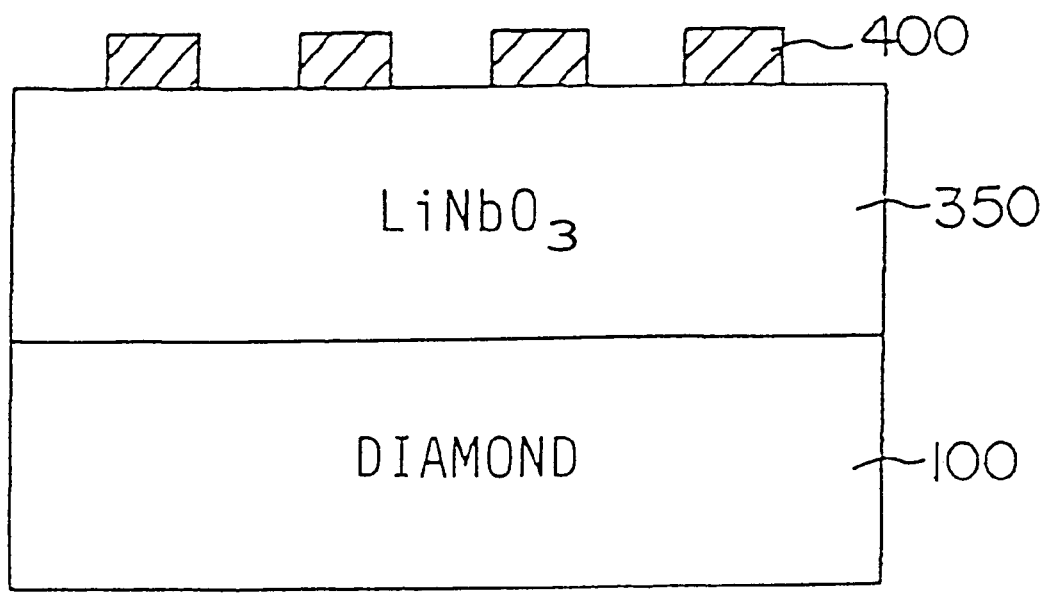
FIG. 74 is a sectional view showing the structure of an SAW device according to the fifth embodiment of the present invention.
Figure 75:
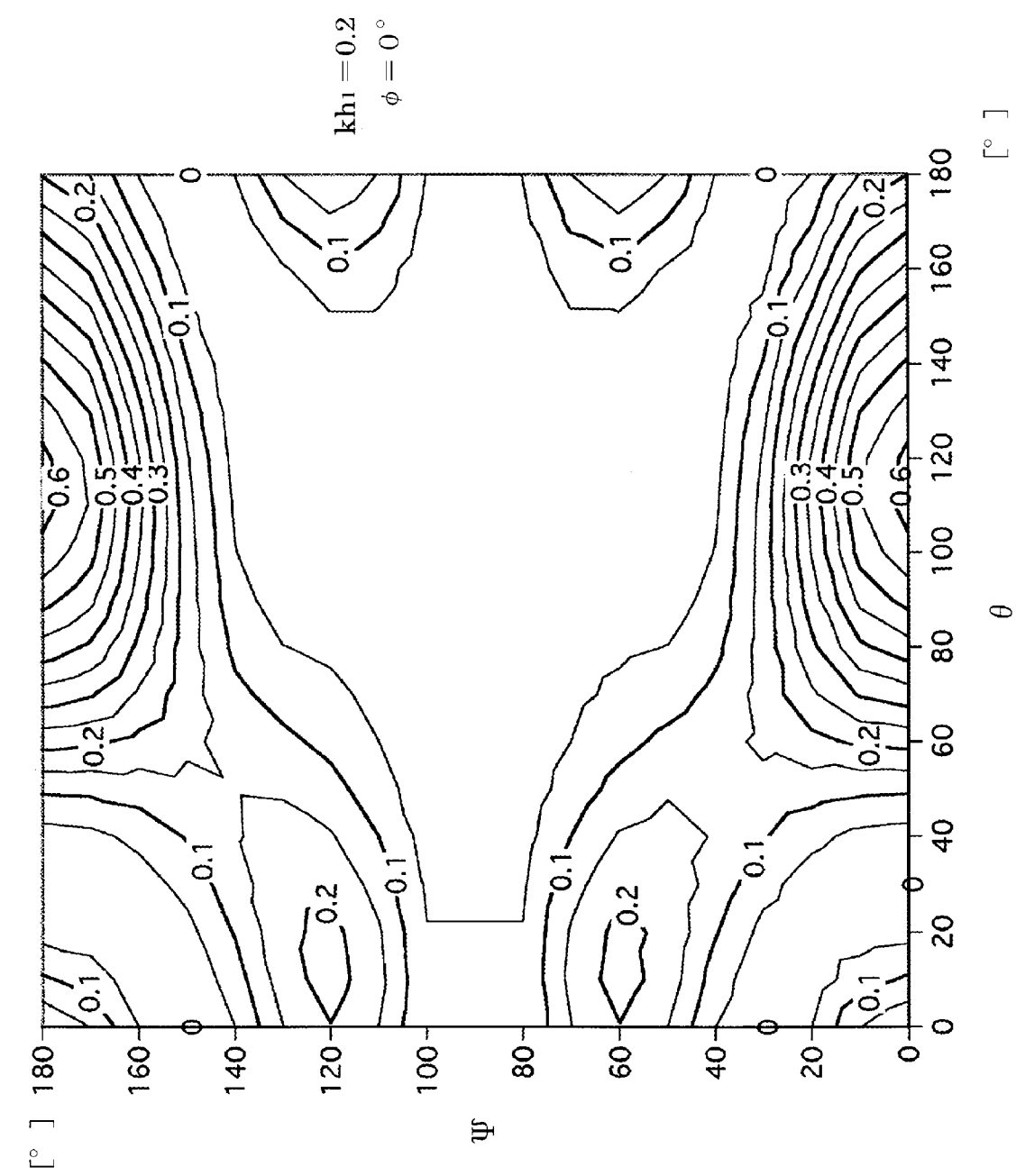
FIG. 75 is a graph showing the evaluation result of $K^2$ in the fifth embodiment ($kh_1$=0.2, $\Phi$=0°)
Figure 76:
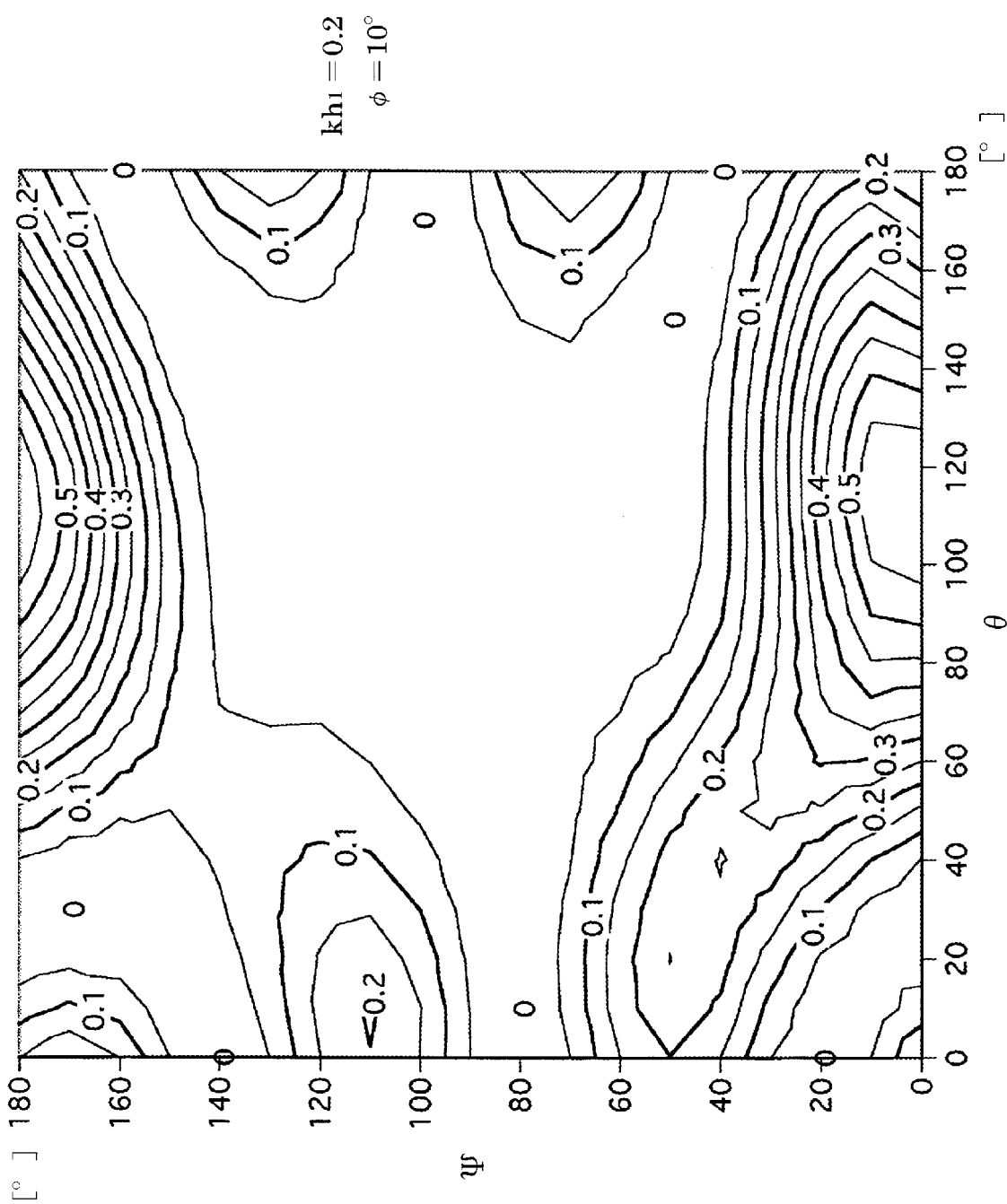
FIG. 76 is a graph showing the evaluation result of $K^2$ in the fifth embodiment ($kh_1$=0.2, $\Phi$=10°)
Figure 77:
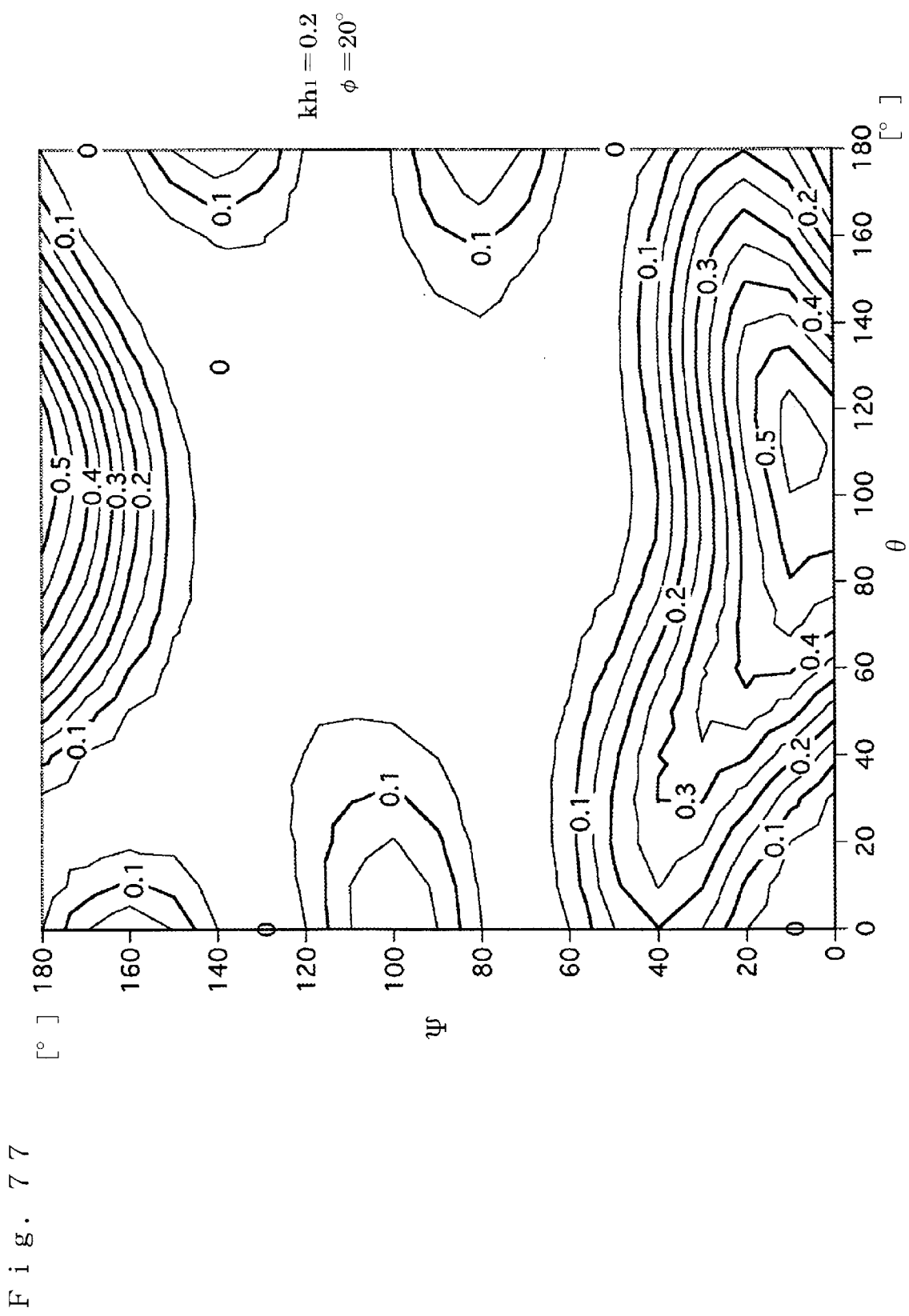
FIG. 77 is a graph showing the evaluation result of $K^2$ in the fifth embodiment ($kh_1$=0.2, $\Phi$=20°)
Figure 78:
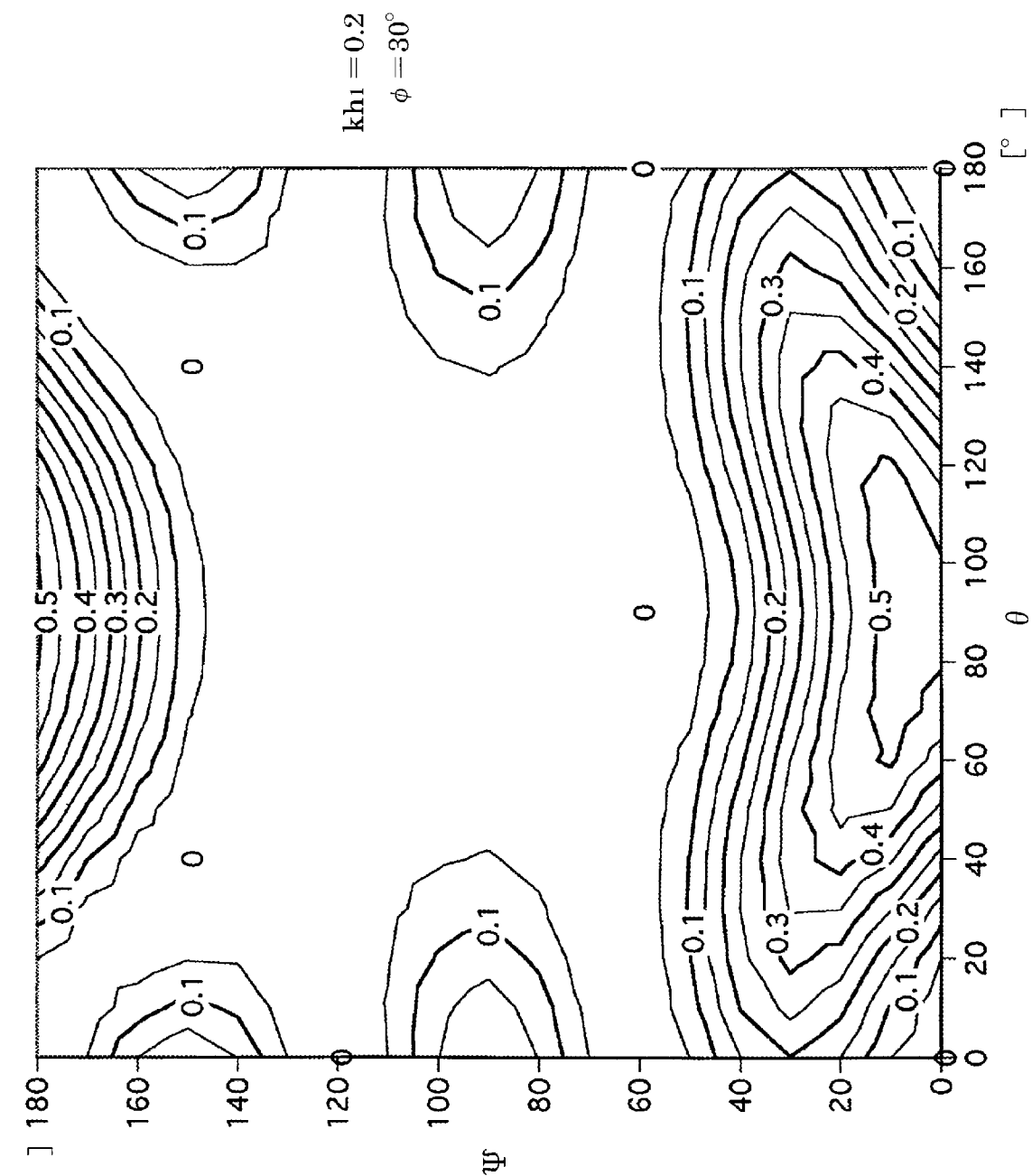
FIG. 78 is a graph showing the evaluation result of $K^2$ in the fifth embodiment ($kh_1$=0.2, $\Phi$=30°)
Figure 79:
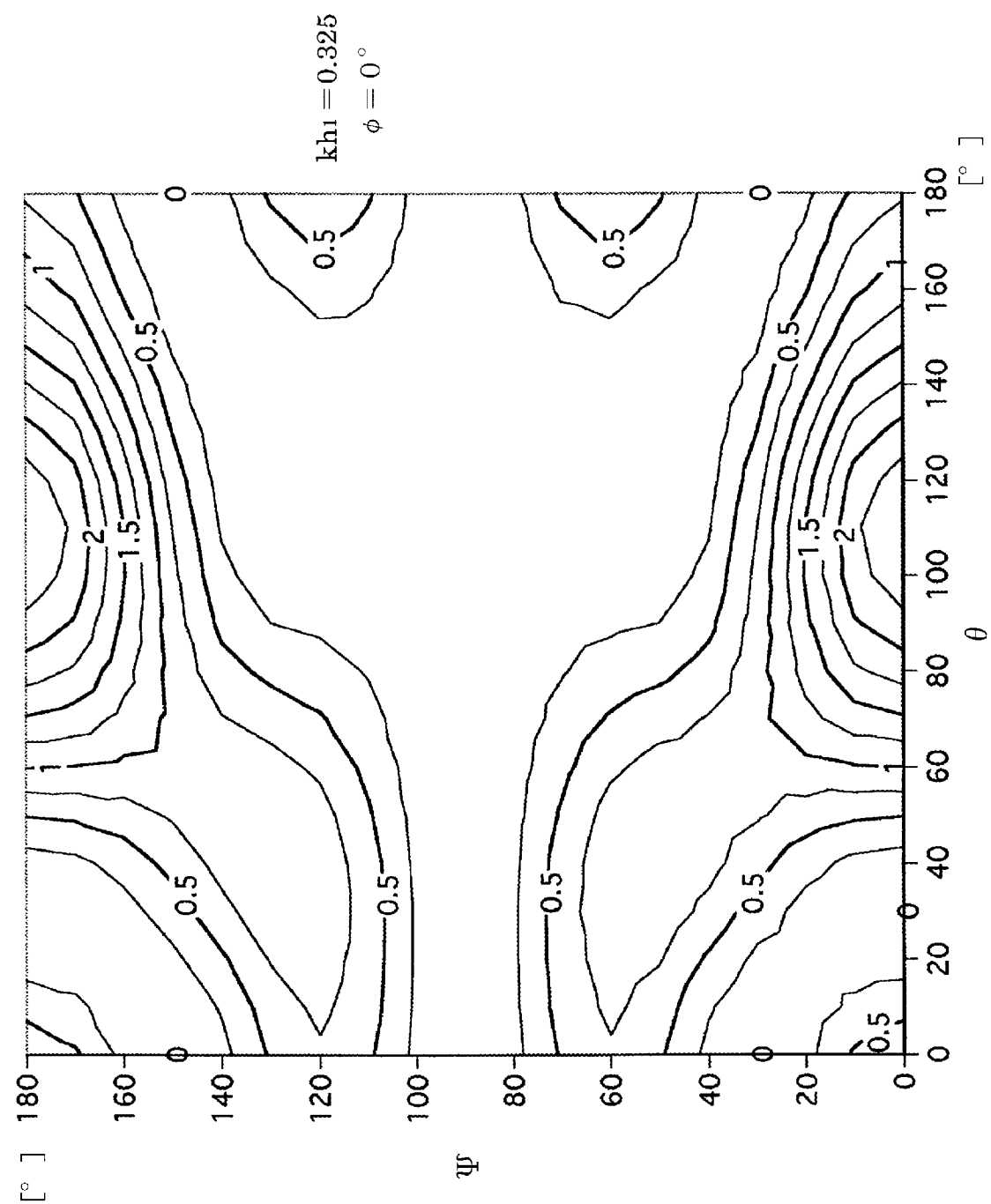
FIG. 79 is a graph showing the evaluation result of $K^2$ in the fifth embodiment ($kh_1$=0.325, $\Phi$=0°)
Figure 80:
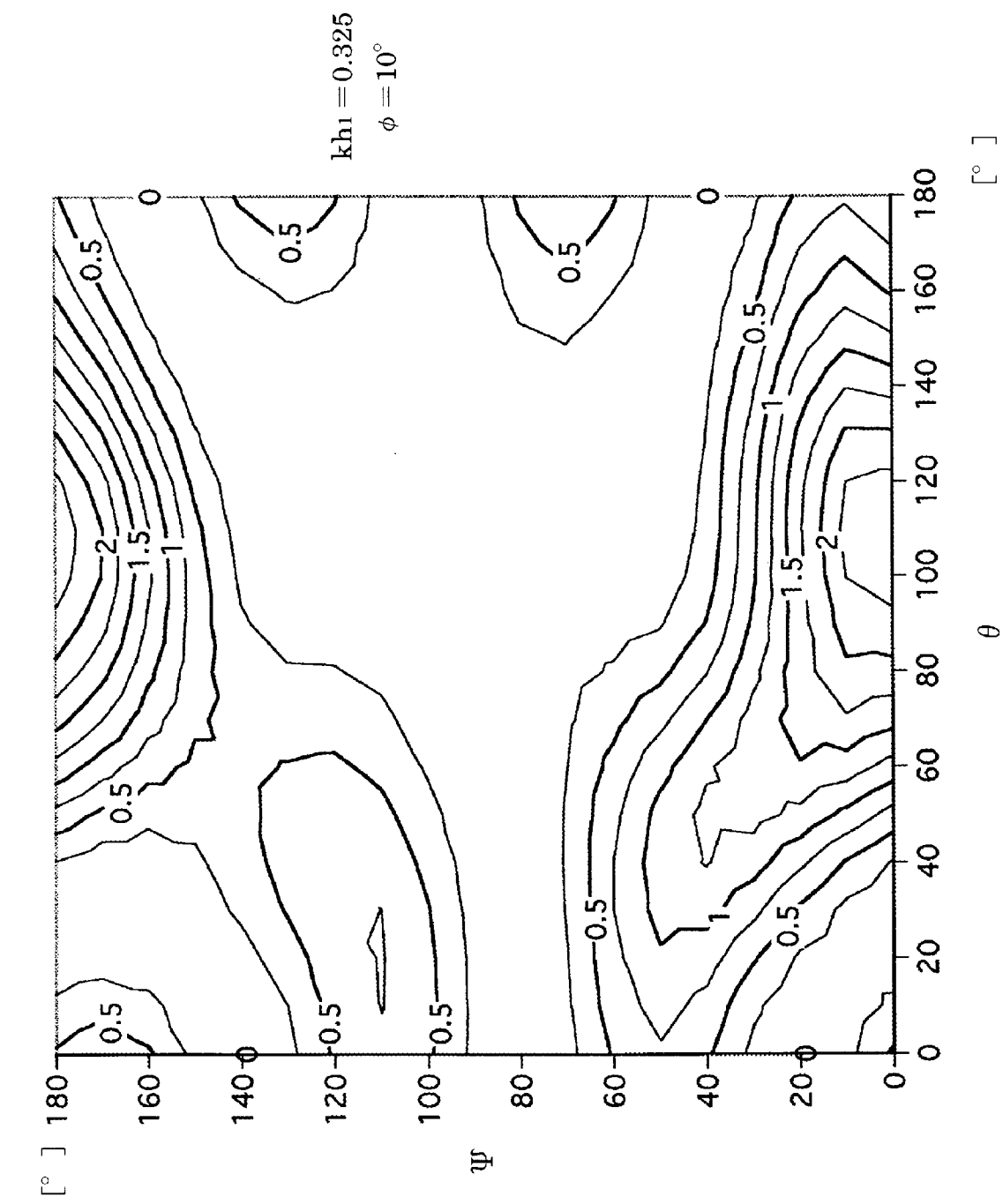
FIG. 80 is a graph showing the evaluation result of $K^2$ in the fifth embodiment ($kh_1$=0.325, $\Phi$=10°)
Figure 81:
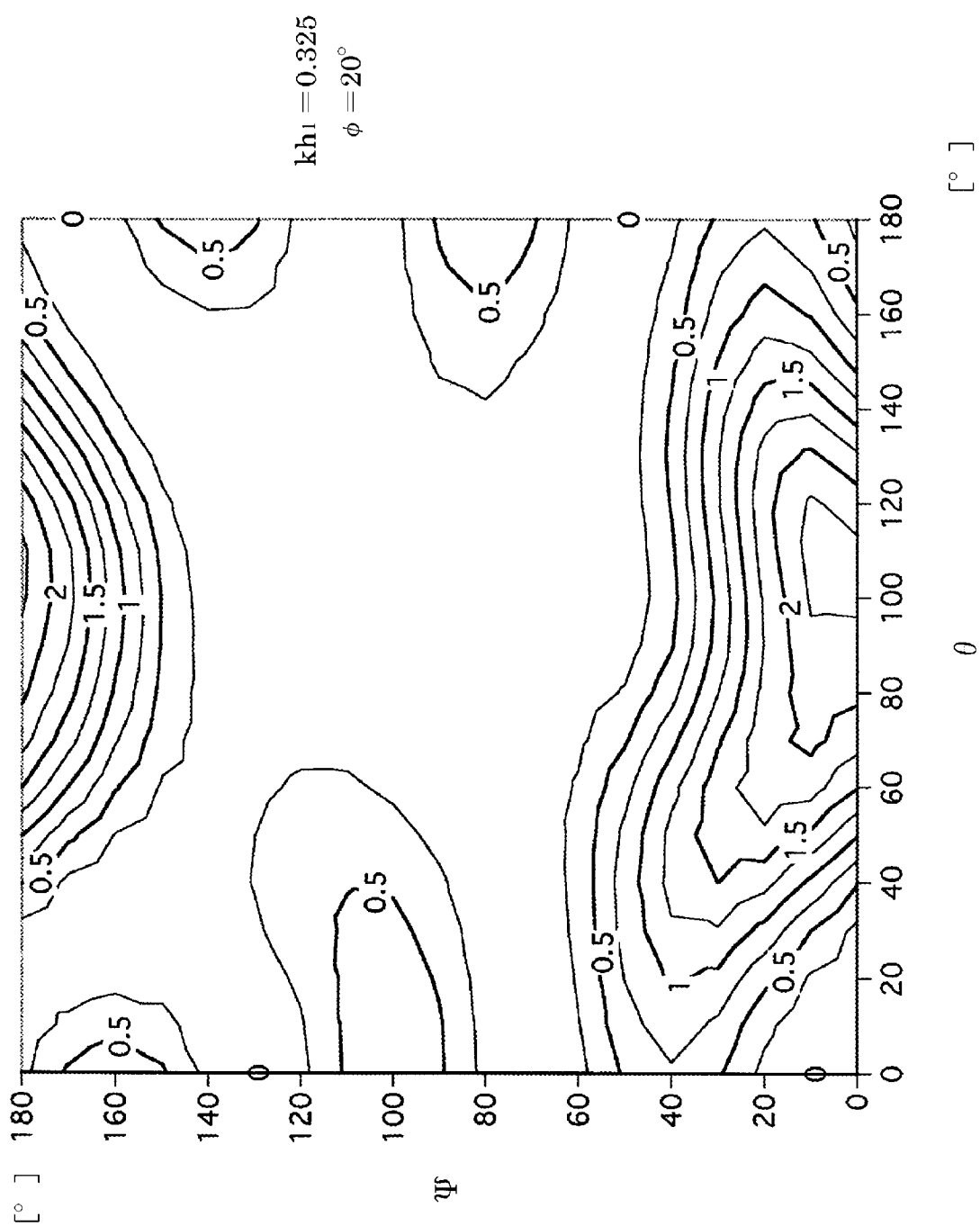
FIG. 81 is a graph showing the evaluation result of $K^2$ in the fifth embodiment ($kh_1$=0.325, $\Phi$=20°)
Figure 82:
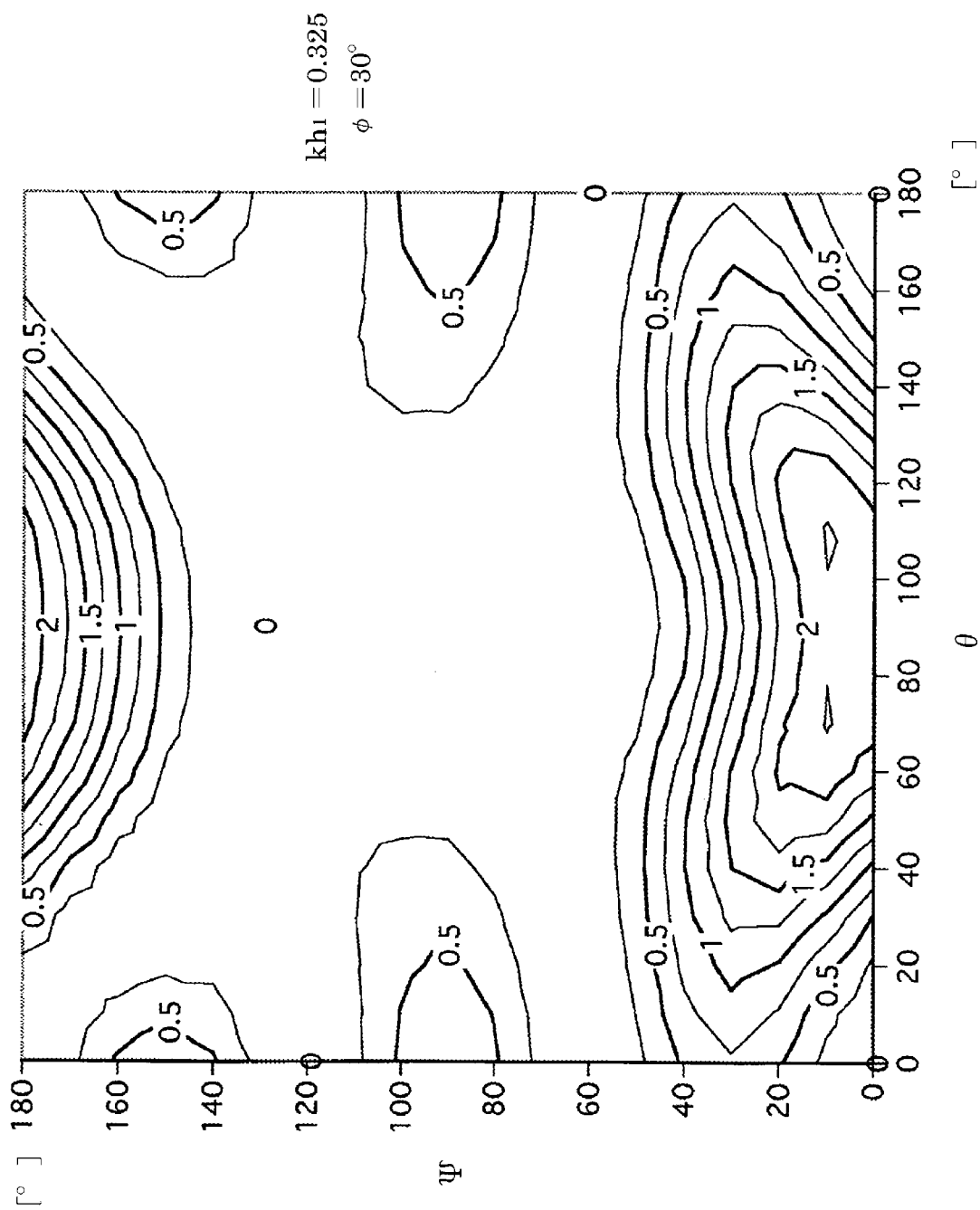
FIG. 82 is a graph showing the evaluation result of $K^2$ in the fifth embodiment ($kh_1$=0.325, $\Phi$=30°)
Figure 83:
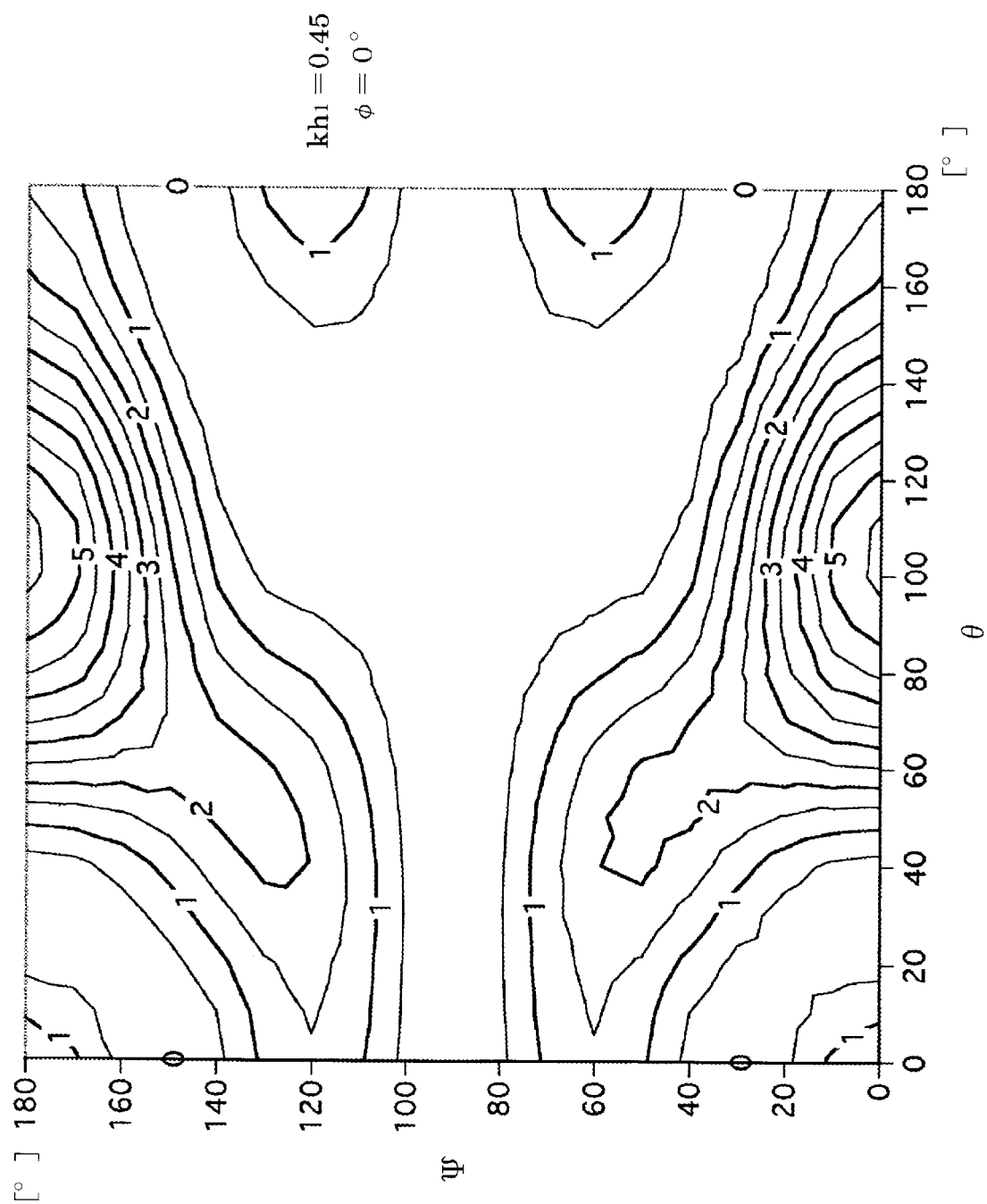
FIG. 83 is a graph showing the evaluation result of $K^2$ in the fifth embodiment ($kh_1$=0.45, $\Phi$=0°)
Figure 84:
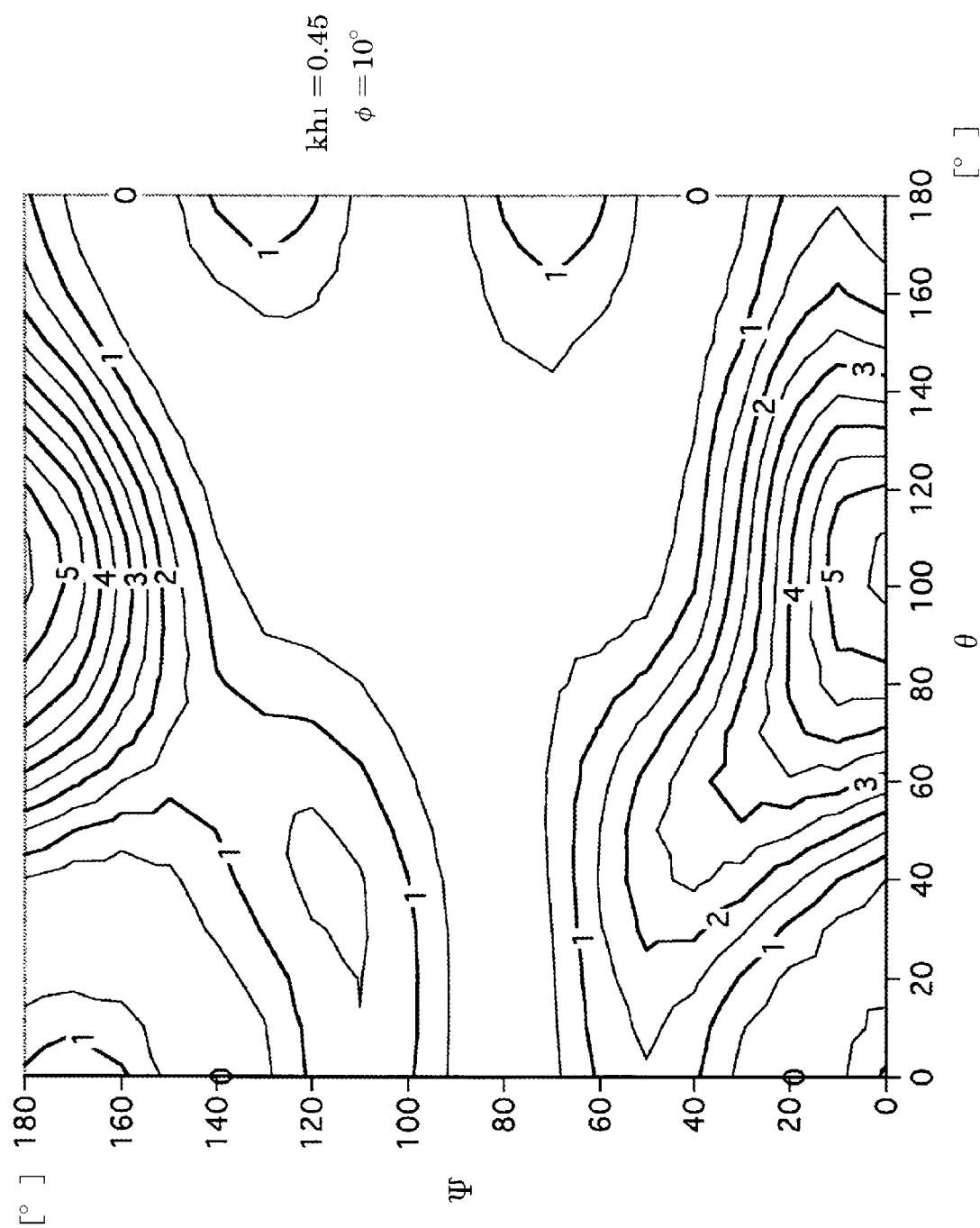
FIG. 84 is a graph showing the evaluation result of $K^2$ in the fifth embodiment ($kh_1$=0.45, $\Phi$=10°)
Figure 85:
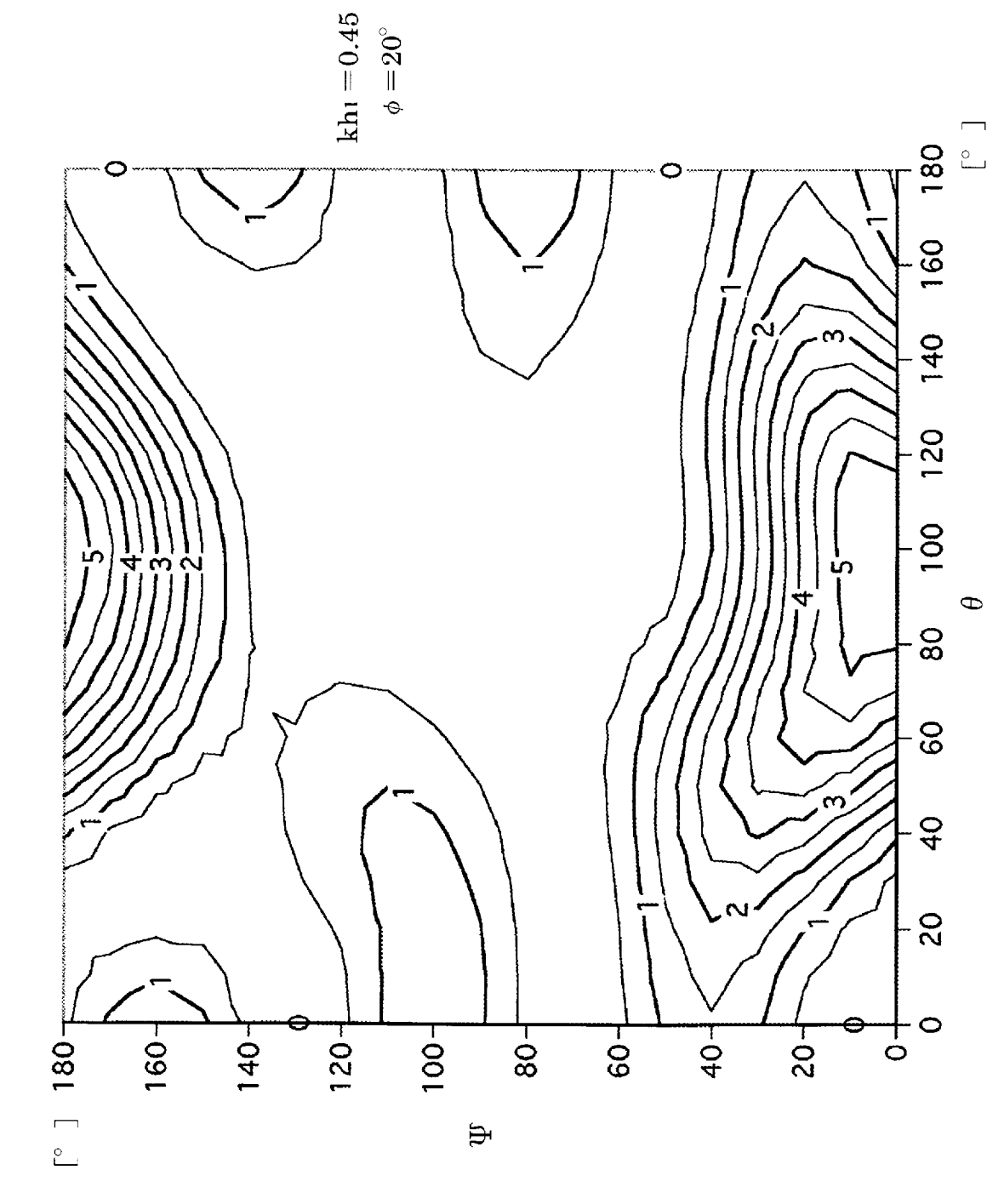
FIG. 85 is a graph showing the evaluation result of $K^2$ in the fifth embodiment ($kh_1$=0.45, $\Phi$=20°)
Figure 86:
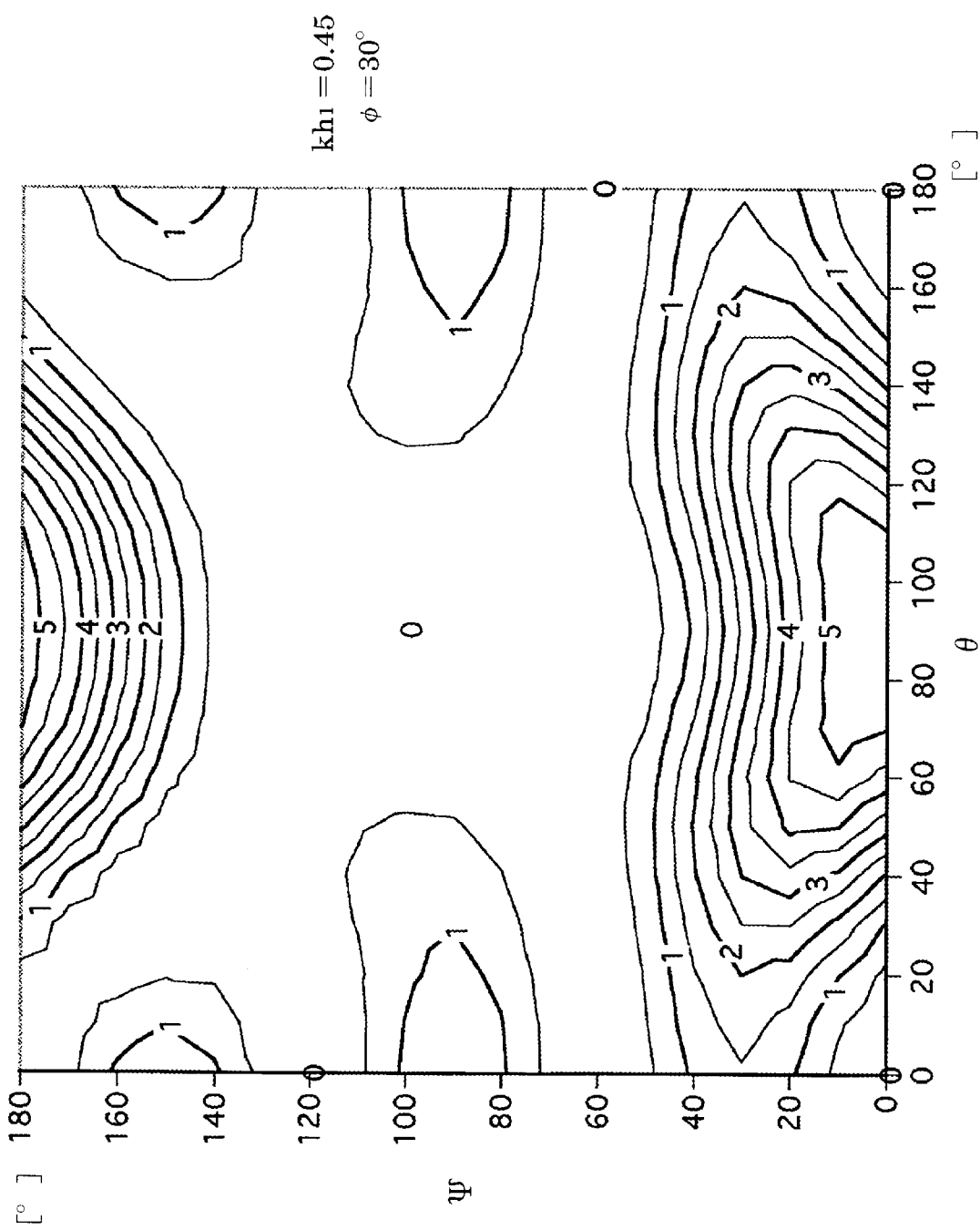
FIG. 86 is a graph showing the evaluation result of $K^2$ in the fifth embodiment ($kh_1$=0.45, $\Phi$=30°)
Figure 87:
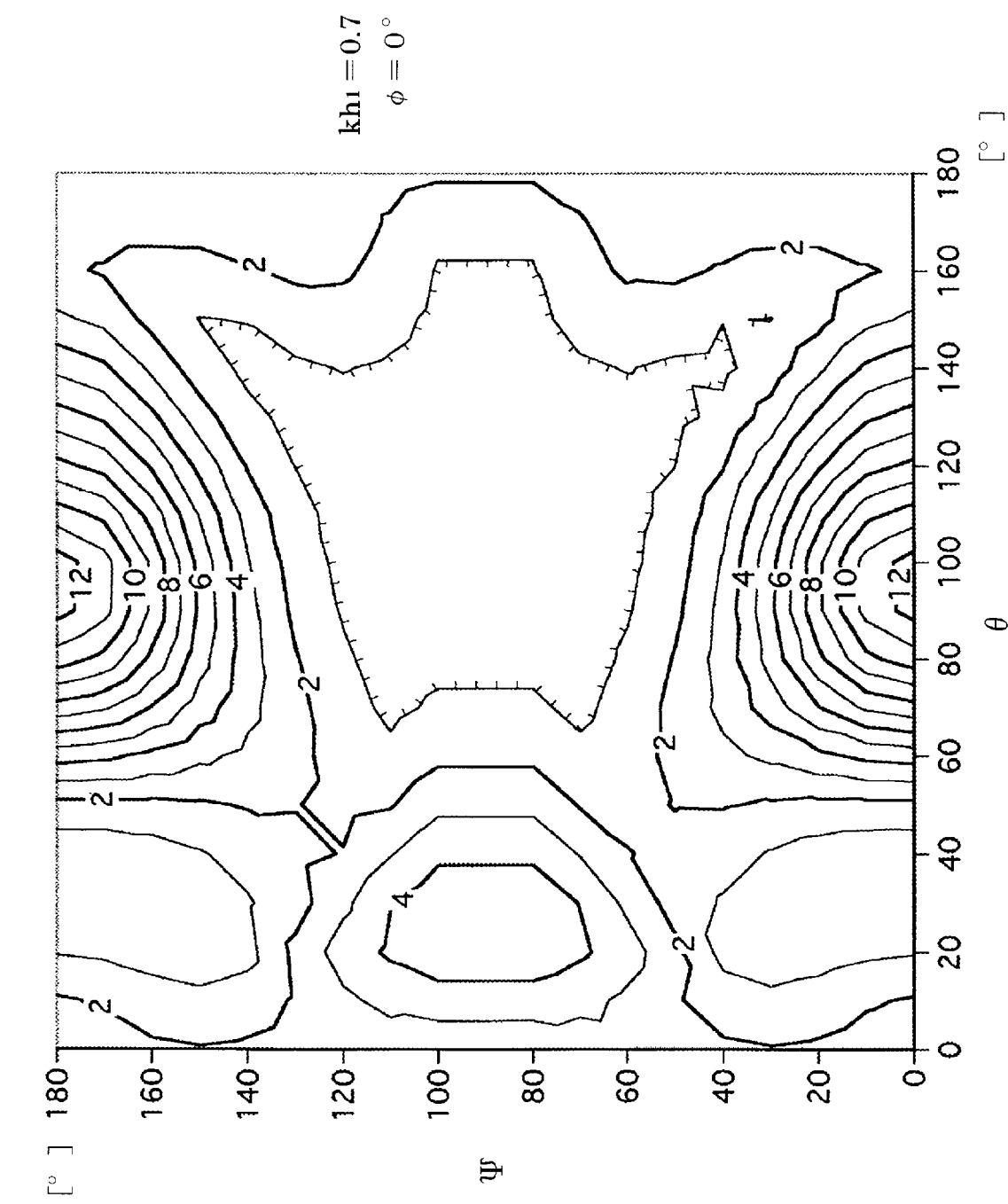
FIG. 87 is a graph showing the evaluation result of $K^2$ in the fifth embodiment ($kh_1$=0.7, $\Phi$=0°)
Figure 88:
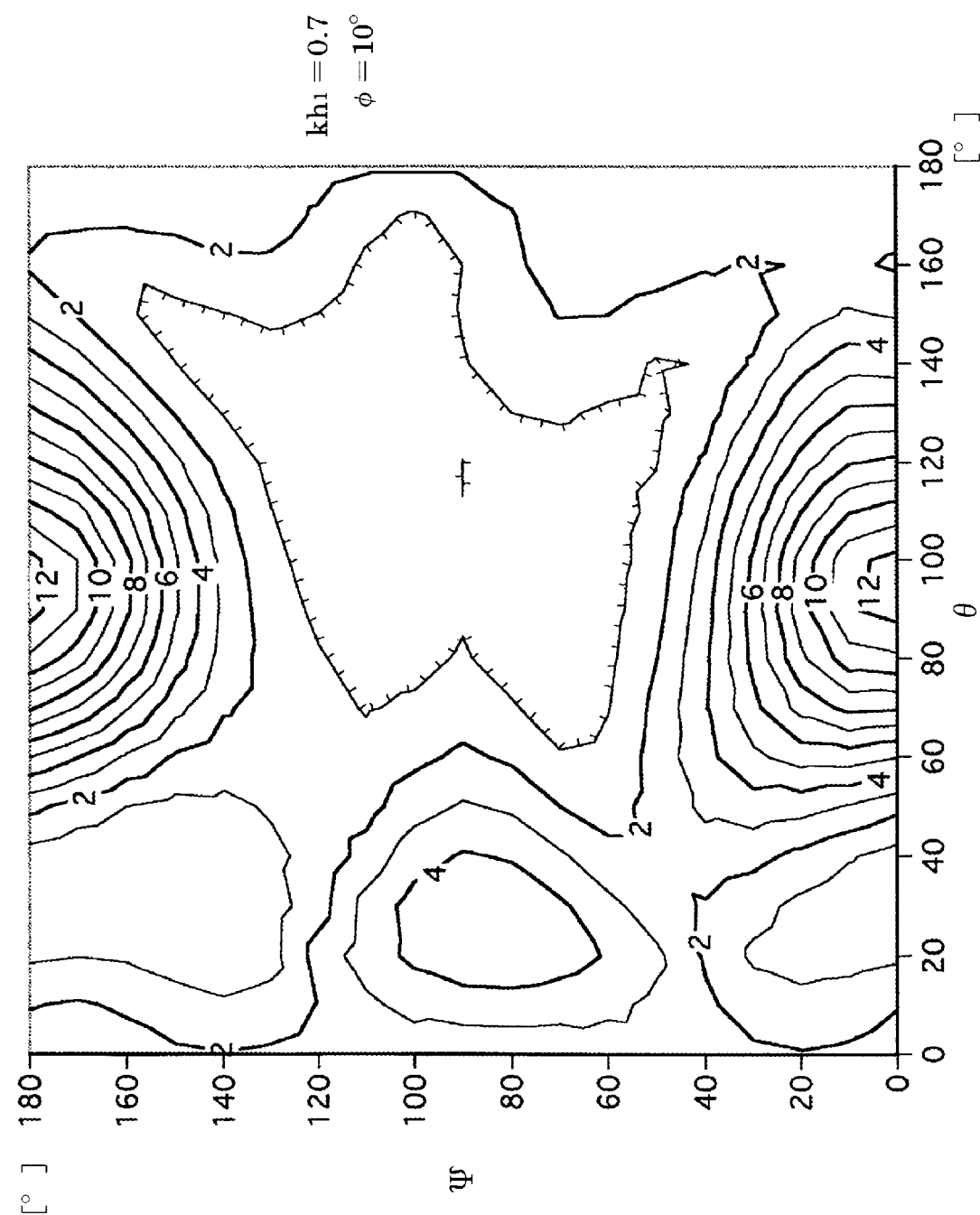
FIG. 88 is a graph showing the evaluation result of $K^2$ in the fifth embodiment ($kh_1$=0.7, $\Phi$=10°)
Figure 89:
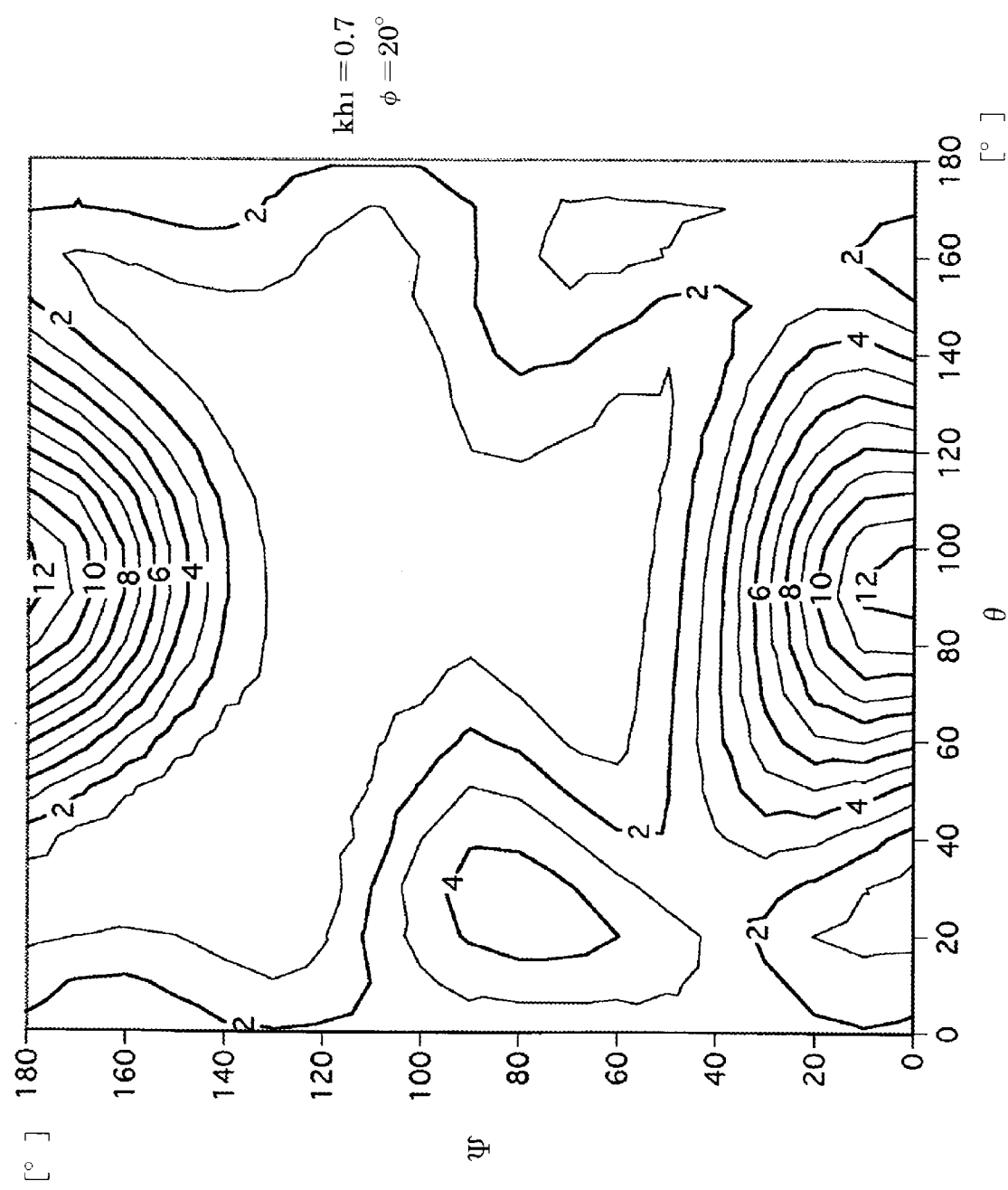
FIG. 89 is a graph showing the evaluation result of $K^2$ in the fifth embodiment ($kh_1$=0.7, $\Phi$=20°)
Figure 90:
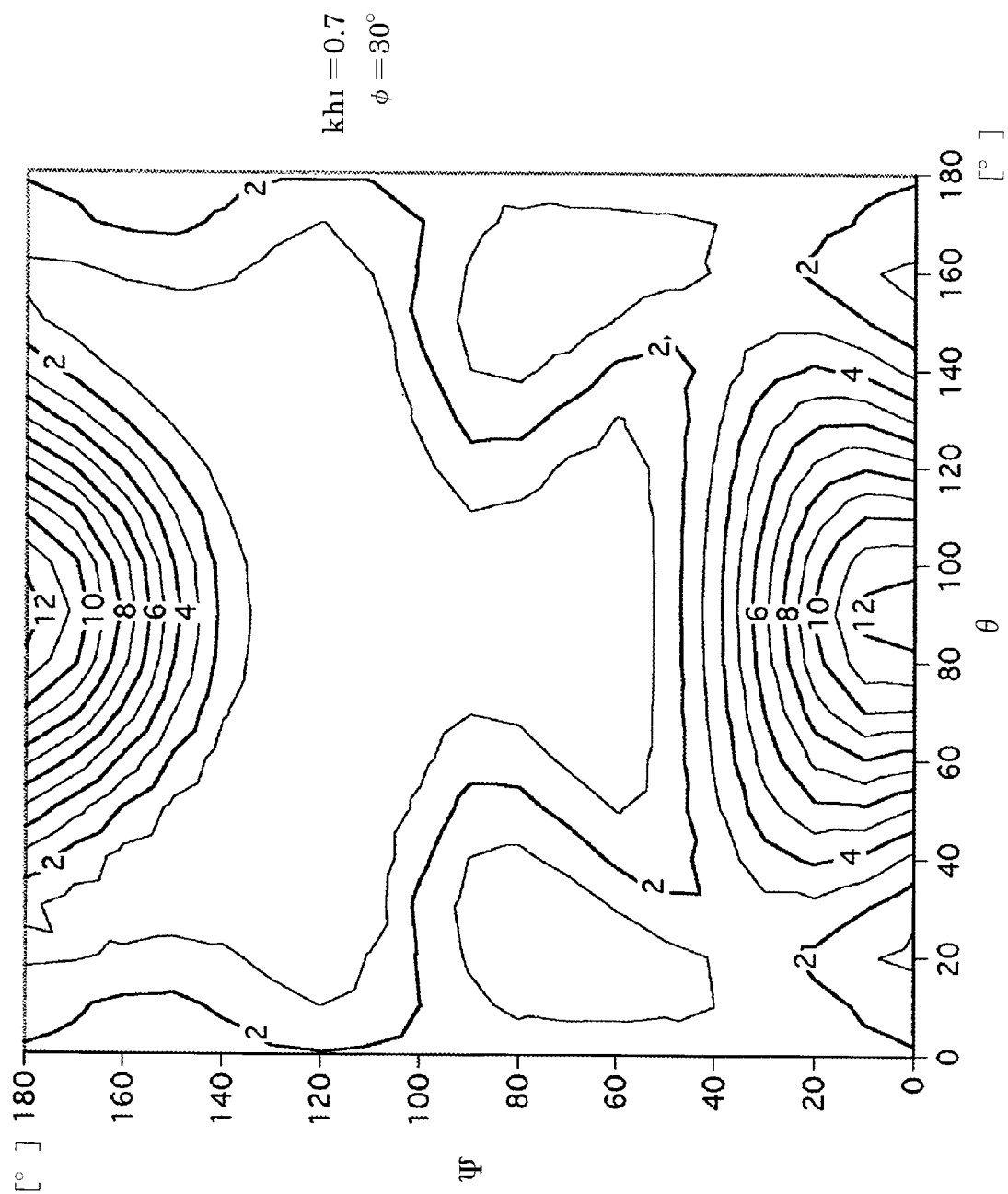
FIG. 90 is a graph showing the evaluation result of $K^2$ in the fifth embodiment ($kh_1$=0.7, $\Phi$=30°)

FIG. 74 is a sectional view showing the structure of an SAW device according to the fifth embodiment of the present invention. As shown in FIG. 74, the SAW device of the fifth embodiment comprises (a) diamond 100, (b) a single crystal LiNbO$_3$ layer 350 formed on an interdigital transducer 400, and (c) the interdigital transducer 400 formed on the diamond 100.

The SAW device of the fifth embodiment uses an SAW in the 1st-order mode.

The LiNbO$_3$ layer 350 is formed by bonding a cut single crystal LiNbO$_3$ thin plate to the diamond 100 having the interdigital transducer 400 formed on its polished surface, and then polishing the single crystal LiNbO$_3$ thin plate.

For the LiNbO$_3$ layer 350, a thickness $t_1$ [μm] and a crystal orientation (θ[°],Φ[°],ψ[°]) are selected from the following values. Note that $kh_1$ (=2π($t_1$/λ); λ=the wavelength [μm] of an SAW) is used instead of the thickness $t_1$, as in the first embodiment.

(i) On an orthogonal coordinate system ($kh_1$,θ,ψ), values in the internal region of a quadrangular pyramid which has its vertex at a point $P_{51}$ and, as its bottom surface, a planar rectangular region with its vertexes at points $A_{51}$ $B_{51}$ $C_{51}$ and $D_{51}$,
where
point $P_{51}$=(0.6, 90, 0)
point $A_{51}$=(0.7, 80, 0)
point $B_{51}$=(0.7, 110, 0)
point $C_{51}$=(0.7, 110, 10)
point $D_{51}$=(0.7, 80, 10).

(ii) On the orthogonal coordinate system ($kh_1$,θ, ψ), values in the internal region of a quadrangular pyramid which has its vertex at a point $P_{52}$ and, as its bottom surface, a planar rectangular region with its vertexes at points $A_{52}$ $B_{52}$ $C_{52}$ and $D_{52}$,
where
point $P_{52}$=(0.6, 100, 0)
point $A_{52}$=(0.7, 90, 170)
point $B_{52}$=(0.7, 100, 170)
point $C_{52}$=(0.7, 110, 180)
point $D_{52}$=(0.7, 80, 180).

In the structure of the SAW device according to the fifth embodiment, a propagation velocity V is exclusively determined by $kh_1$ of the LiNbO$_3$ layer 350, as in the first embodiment, as shown in FIG. 5. Therefore, as in the first embodiment, it is confirmed that, when $kh_1$ is equal to or smaller than 1.1, a propagation velocity V equal to or higher than 8,000 m/s is ensured.

The present inventors set the thickness of the diamond 100 at 20 μm, and evaluated an electromechanical coupling coefficient $K^2$ while changing $kh_1$ within the above-described limitation for $kh_1$ and simultaneously changing the values $\theta$, $\Phi$, and $\psi$.

FIGS. 75 to 90 are graphs showing contour lines obtained upon evaluating the electromechanical coupling coefficient $K^2$ [%] under conditions that $kh_1$=0.2, 0.325, 0.45, and 0.7, $\Phi$=0°, 10°, 20°, and 30°, 0°≦θ≦180°, and 0°≦ψ≦180°. Note that the values $\theta$ and $\psi$ are plotted in units of 100 in these graphs.

Regions for satisfying the electromechanical coupling coefficient $K^2$ of 10% or more are obtained from FIGS. 75 to 90. Taking the symmetry of the LiNbO$_3$ crystal into consideration, it is confirmed that, when the propagation velocity V is 8,000 m/s or more, and the electromechanical coupling coefficient $K^2$ is 10% or more, the four parameters $kh_1$, $\theta$, $\Phi$, and $\psi$ are set in the internal region of one of the quadrangular pyramids which are symmetric with those represented by (i), (ii), (iii), or (iv).

(Sixth Embodiment)

Figure 91:
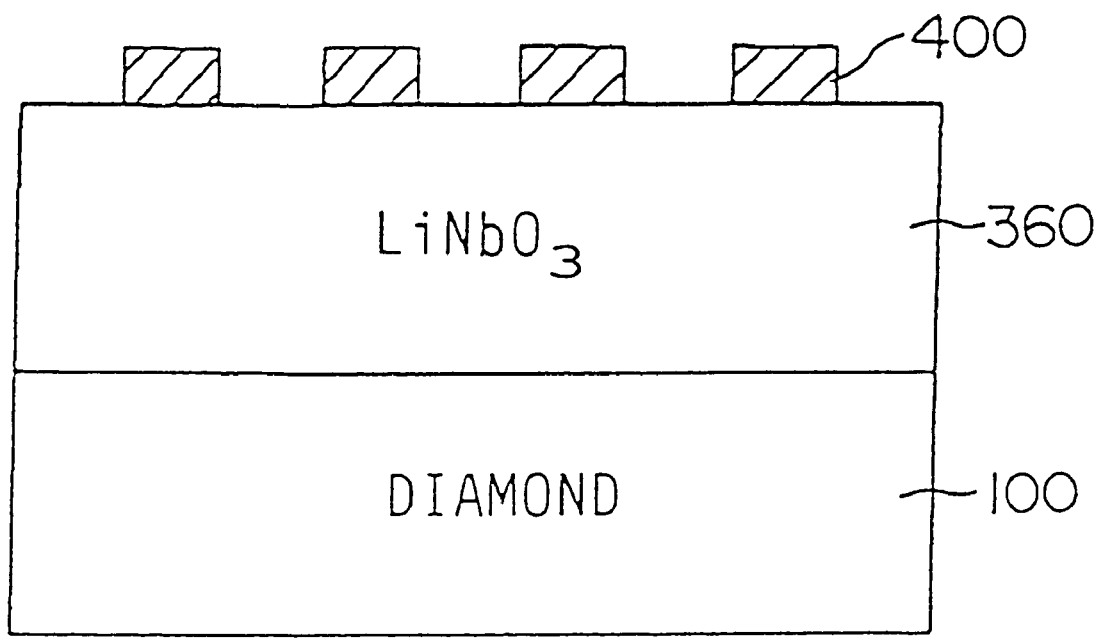
FIG. 91 is a sectional view showing the structure of an SAW device according to the sixth embodiment of the present invention.
Figure 92:
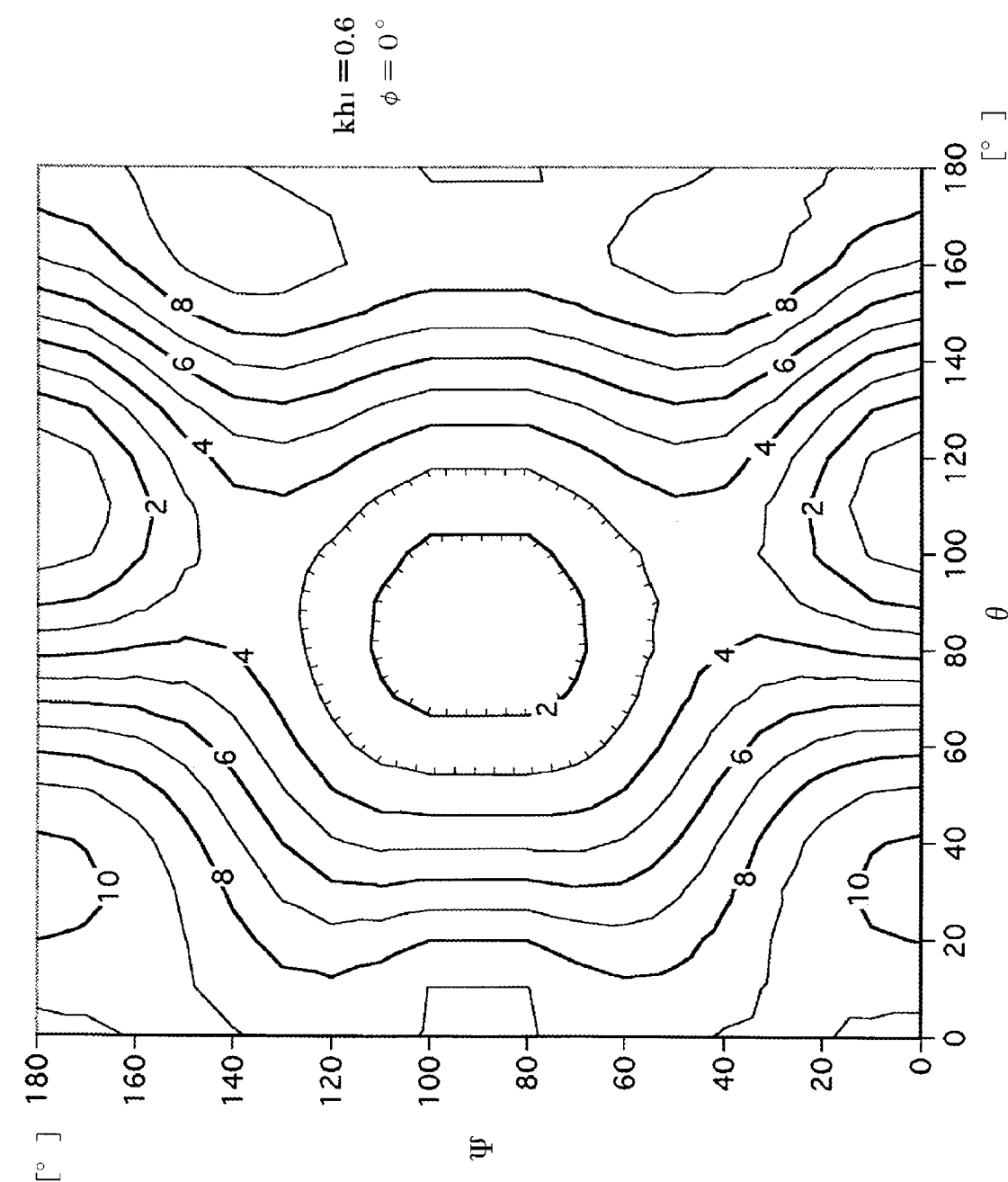
FIG. 92 is a graph showing the evaluation result of $K^2$ in the sixth embodiment ($kh_1$=0.6, $\Phi$=0°)
Figure 93:
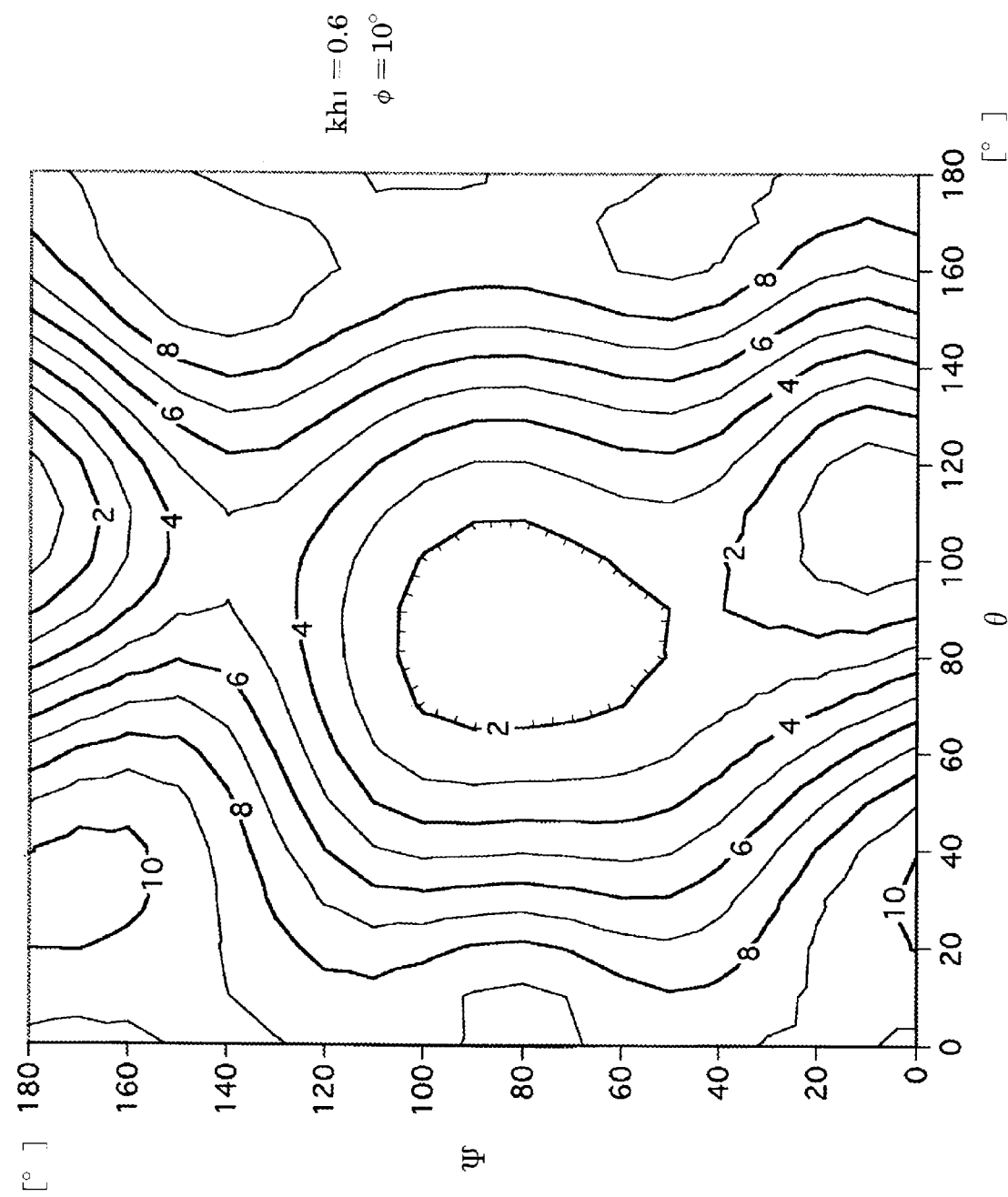
FIG. 93 is a graph showing the evaluation result of $K^2$ in the sixth embodiment ($kh_1$=0.6, $\Phi$=10°)
Figure 94:
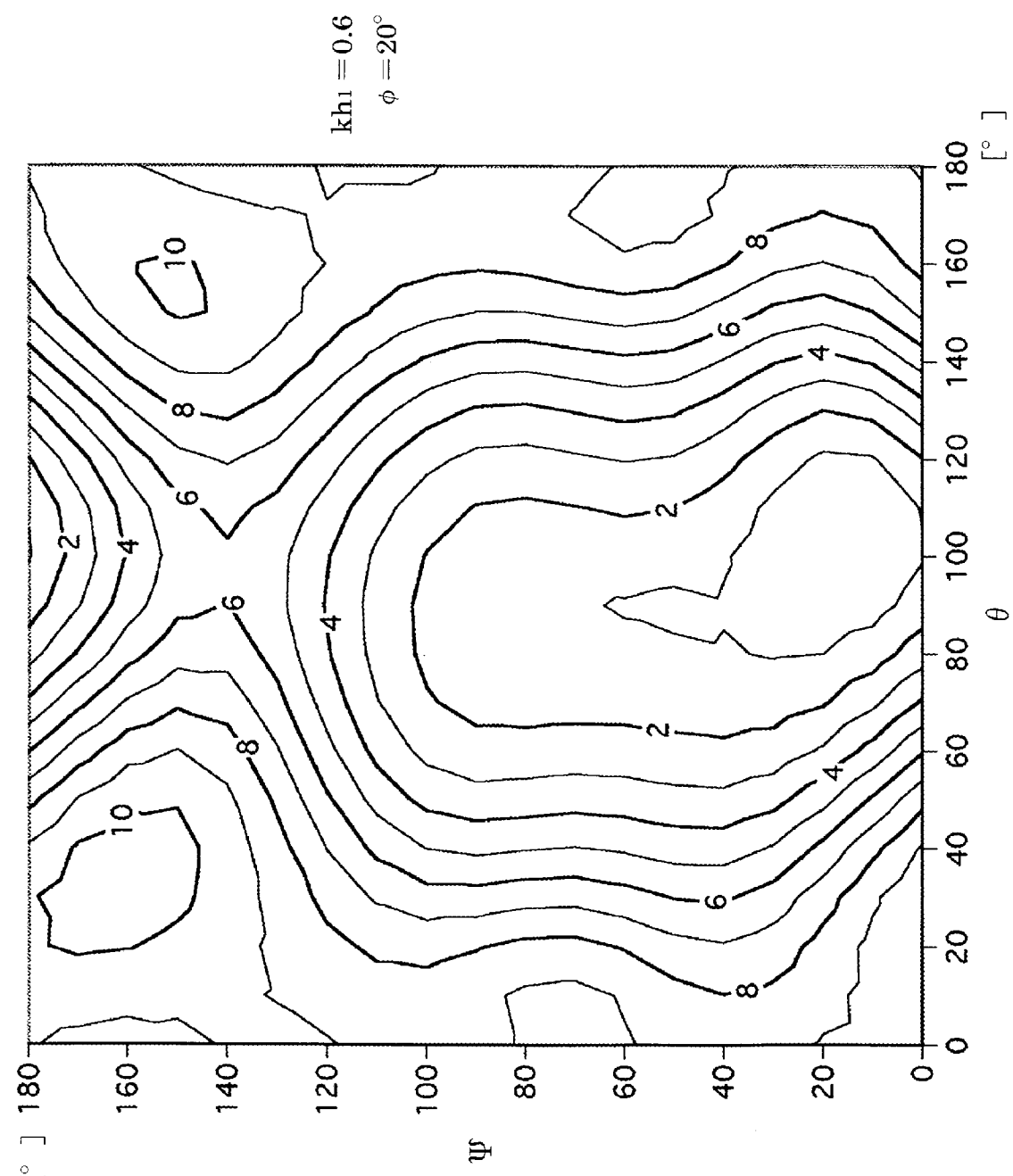
FIG. 94 is a graph showing the evaluation result of $K^2$ in the sixth embodiment ($kh_1$=0.6, $\Phi$=20°)
Figure 95:
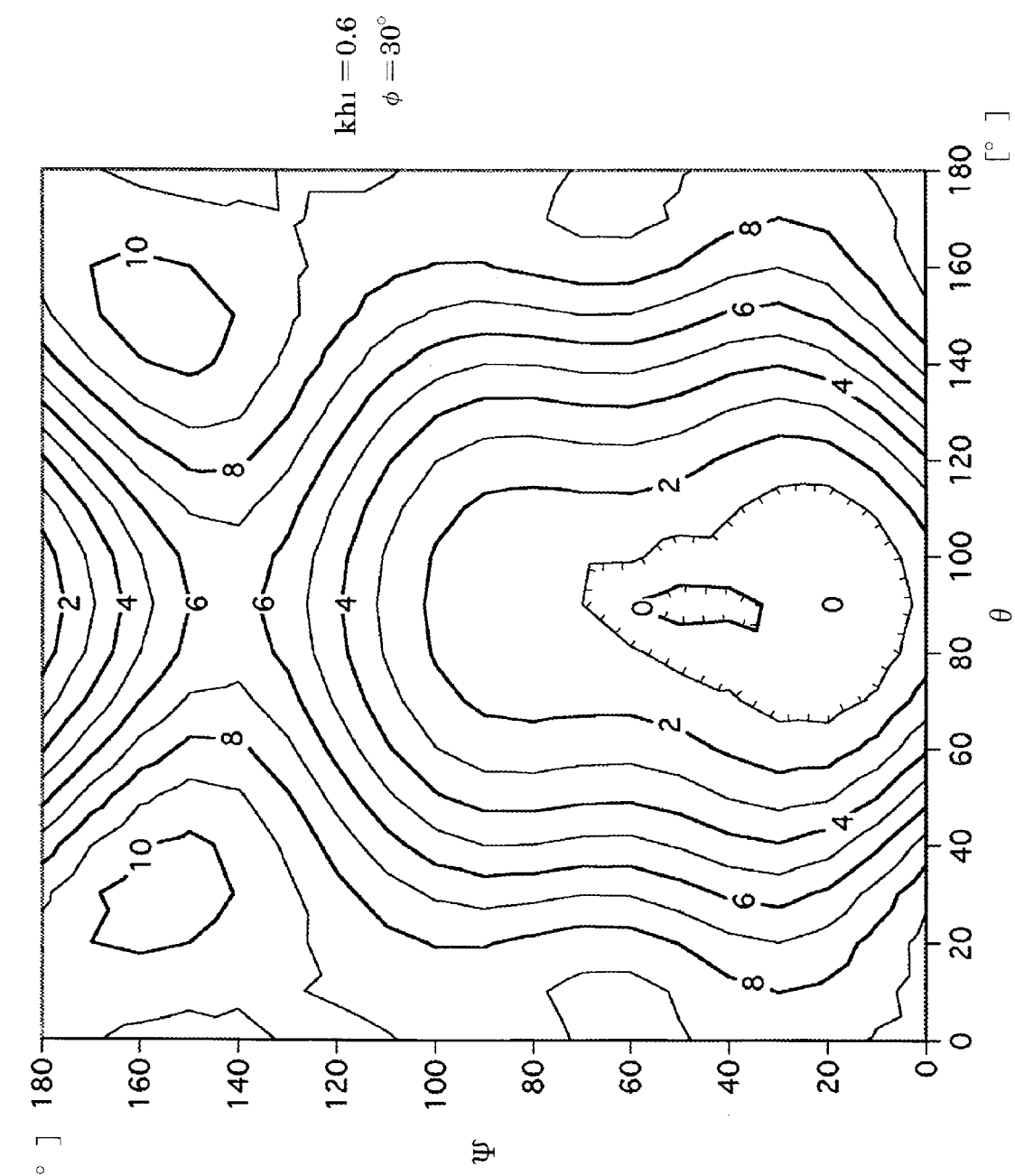
FIG. 95 is a graph showing the evaluation result of $K^2$ in the sixth embodiment ($kh_1$=0.6, $\Phi$=30°)
Figure 96:
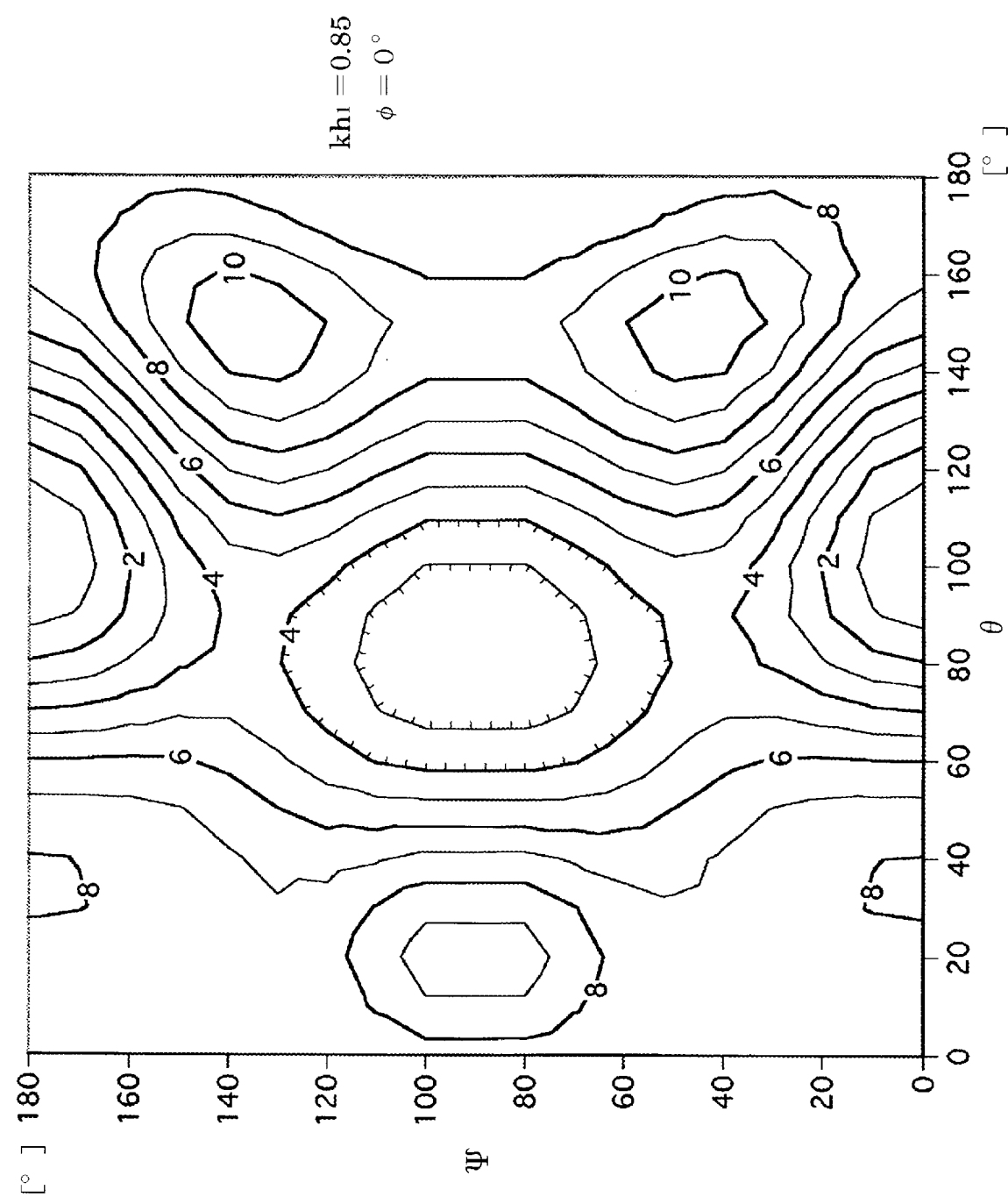
FIG. 96 is a graph showing the evaluation result of $K^2$ in the sixth embodiment ($kh_1$=0.85, $\Phi$=0°)
Figure 97:
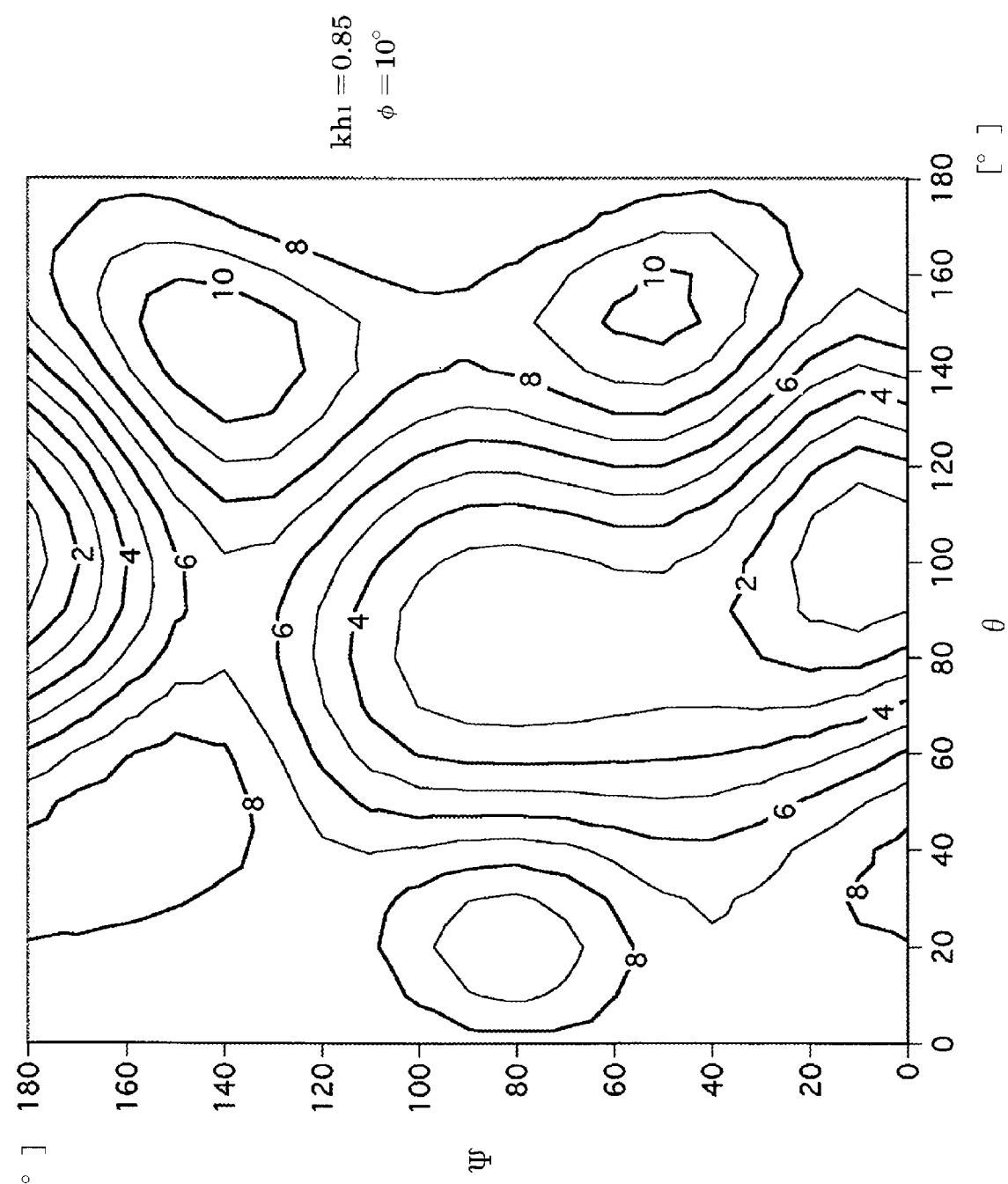
FIG. 97 is a graph showing the evaluation result of $K^2$ in the sixth embodiment ($kh_1$=0.85, $\Phi$=10°)
Figure 98:
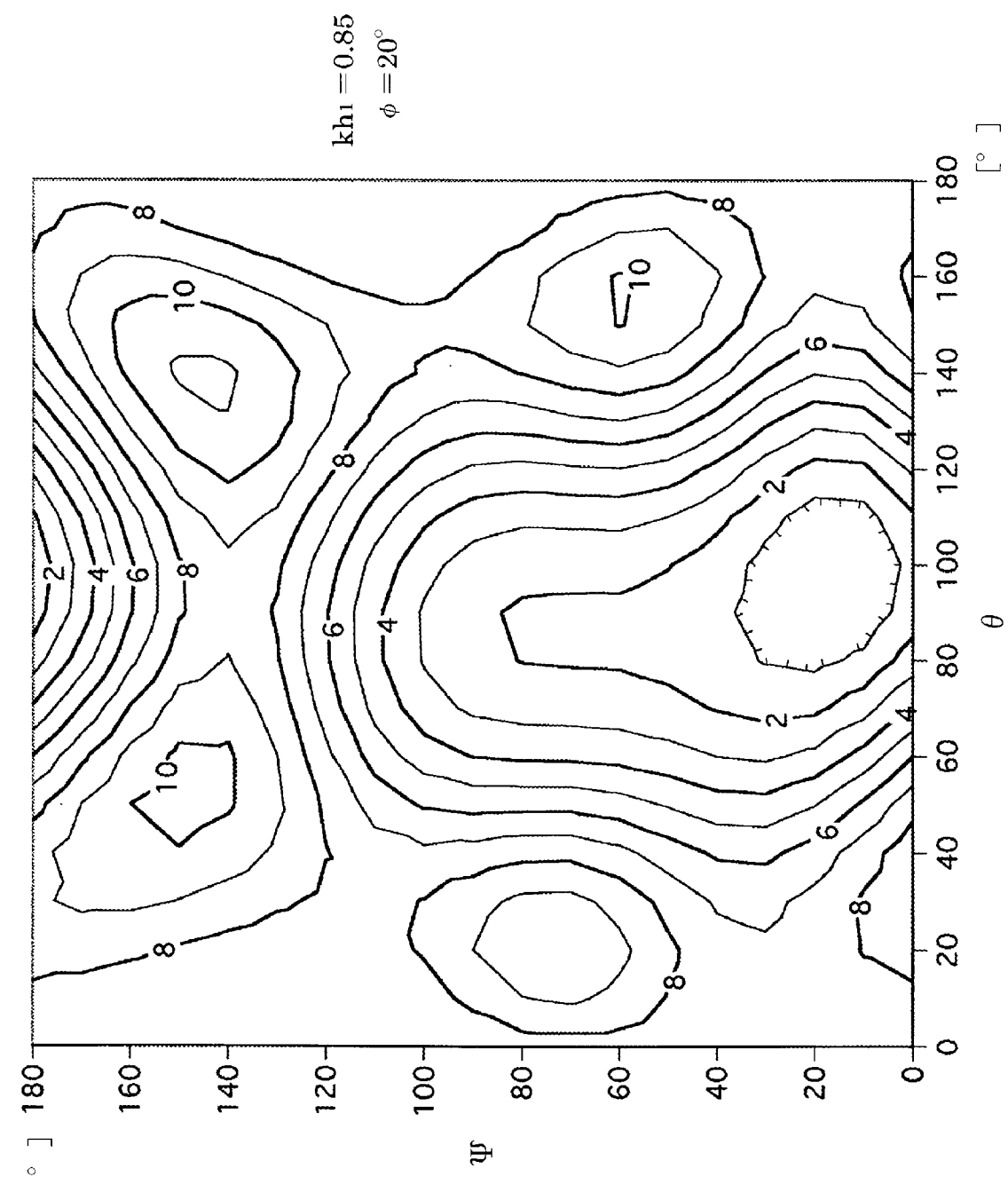
FIG. 98 is a graph showing the evaluation result of $K^2$ in the sixth embodiment ($kh_1$=0.85, $\Phi$=20°)
Figure 99:
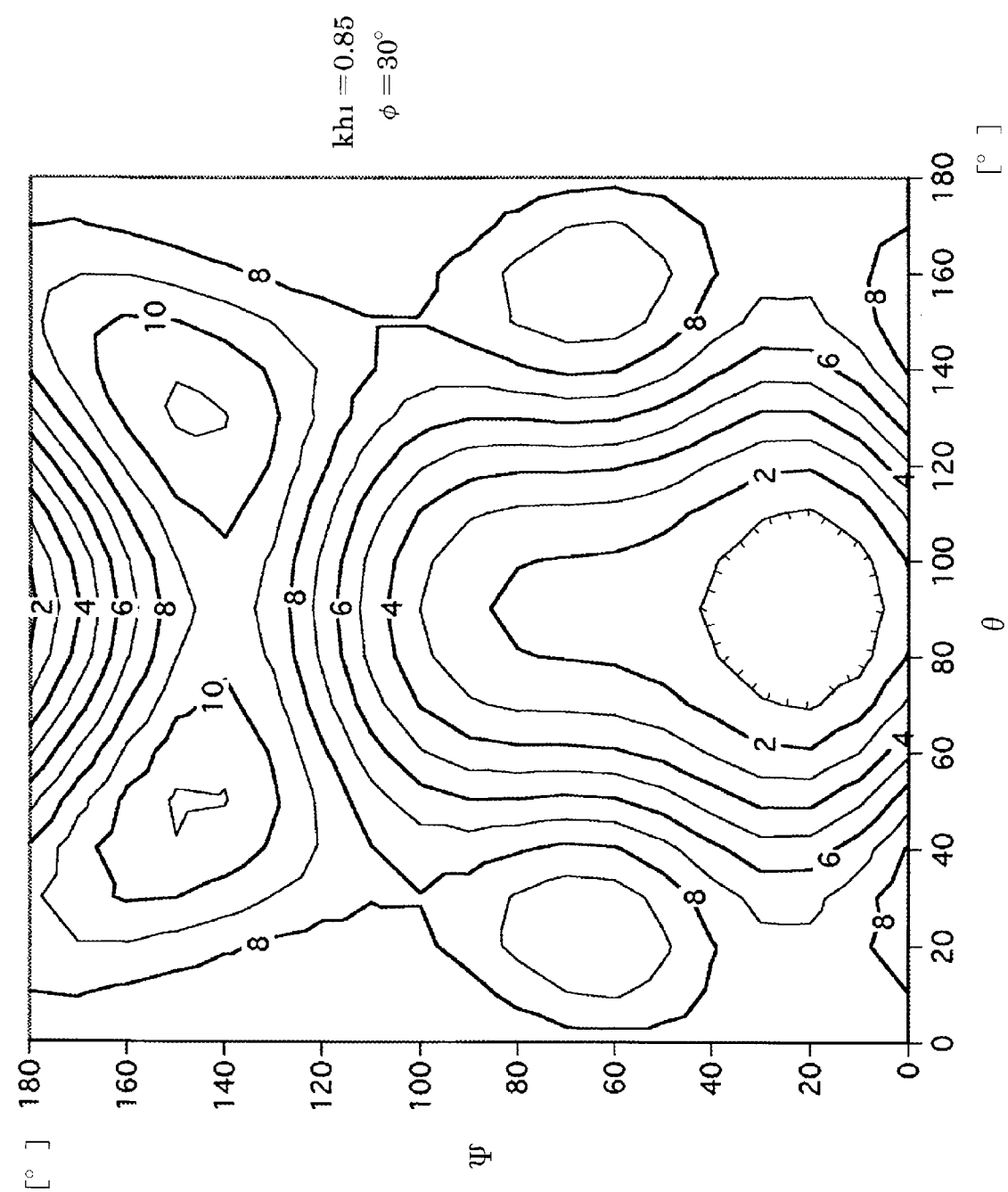
FIG. 99 is a graph showing the evaluation result of $K^2$ in the sixth embodiment ($kh_1$=0.85, $\Phi$=30°)
Figure 100:
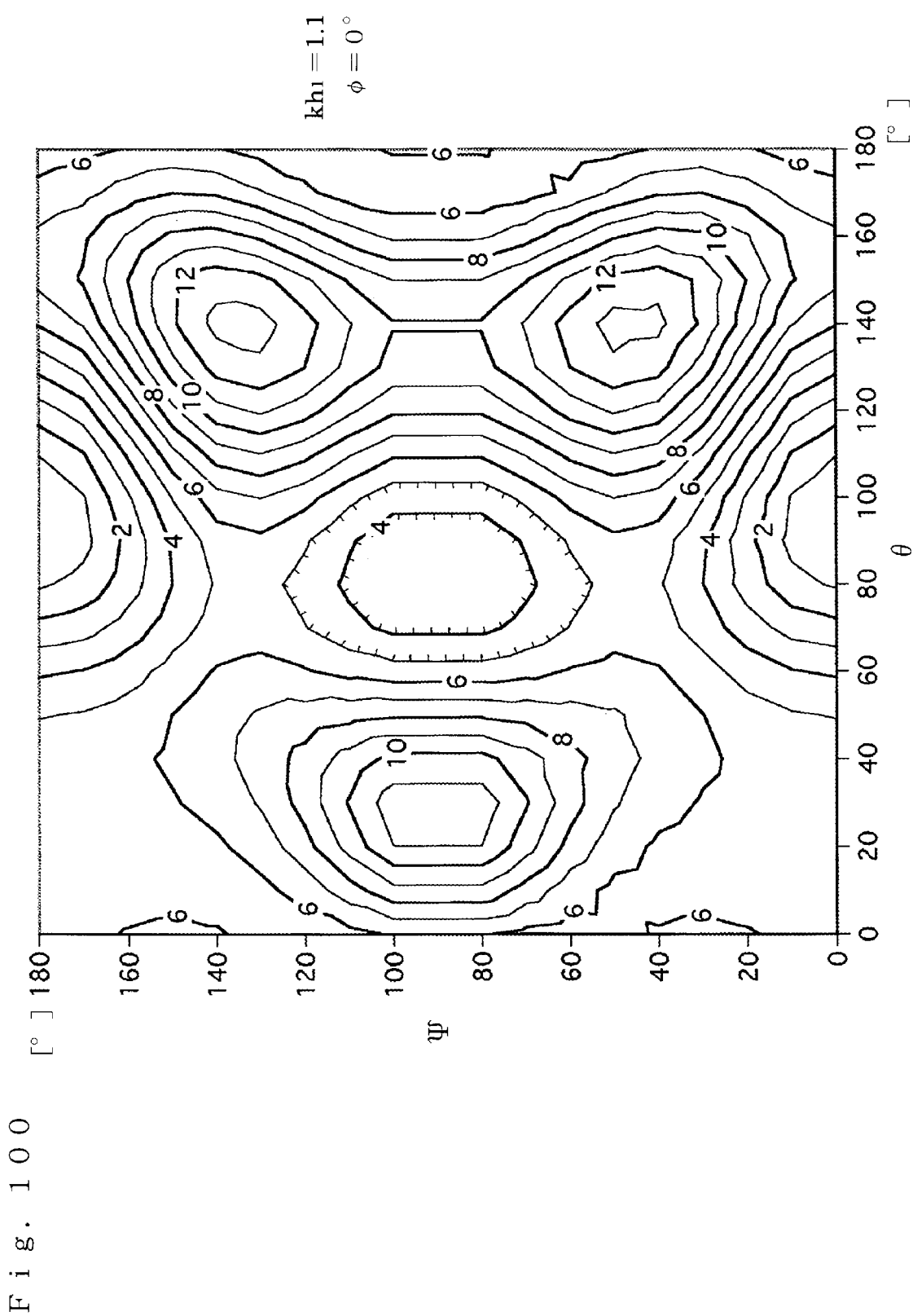
FIG. 100 is a graph showing the evaluation result of $K^2$ in the sixth embodiment ($kh_1$=1.1, $\Phi$=0°)
Figure 101:
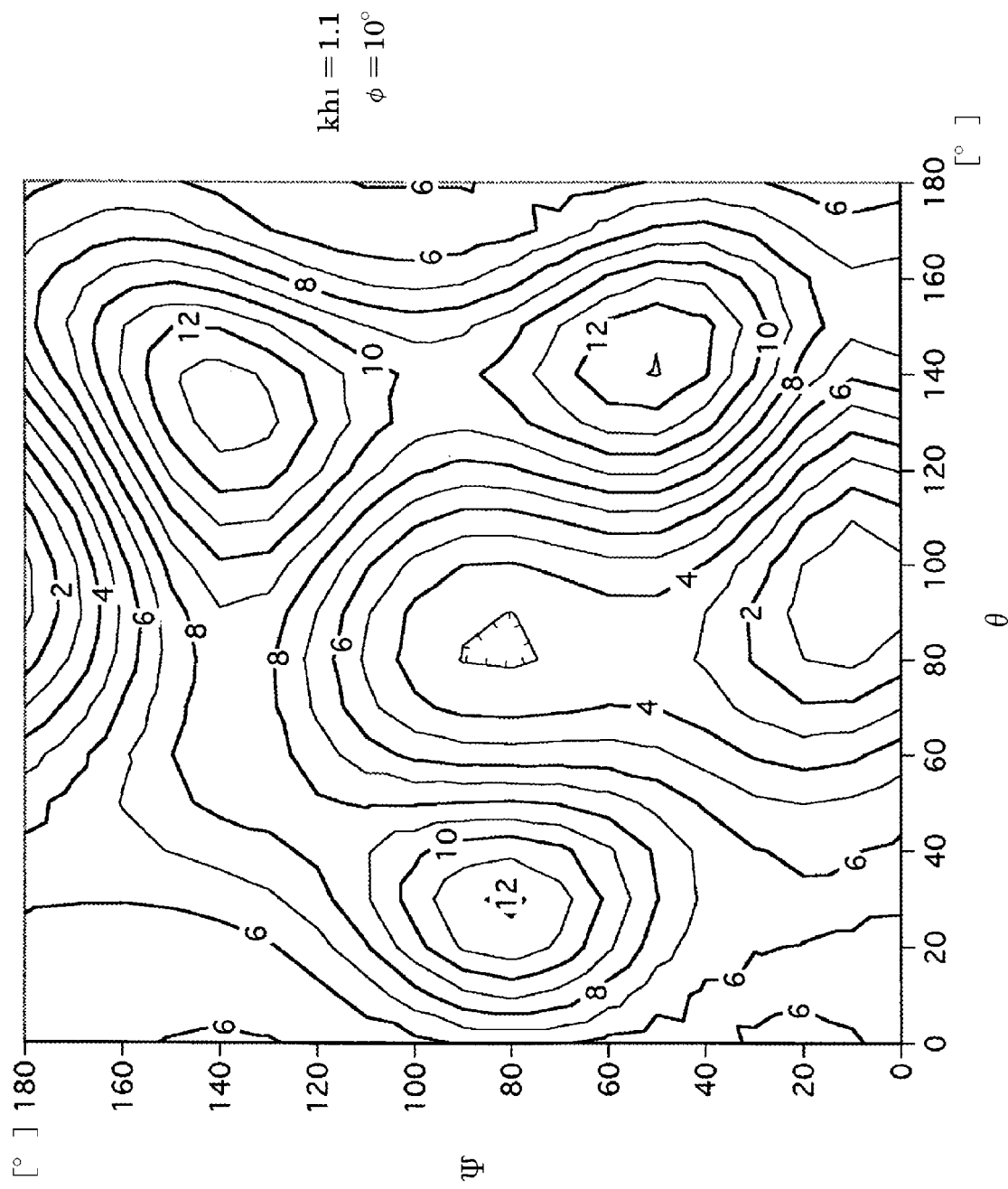
FIG. 101 is a graph showing the evaluation result of $K^2$ in the sixth embodiment ($kh_1$=1.1, $\Phi$=10°)
Figure 102:
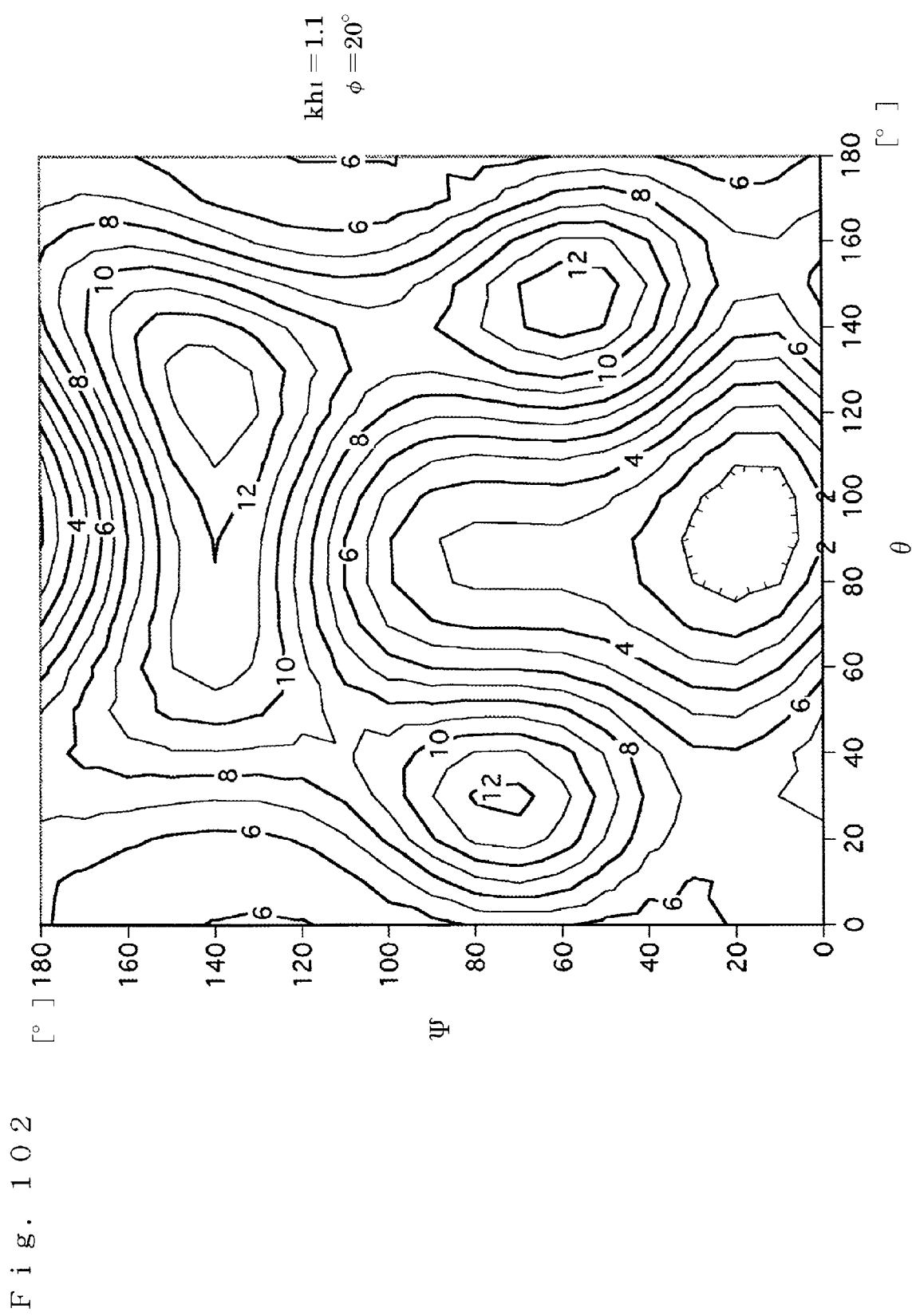
FIG. 102 is a graph showing the evaluation result of $K^2$ in the sixth embodiment ($kh_1$=1.1, $\Phi$=20°)
Figure 103:
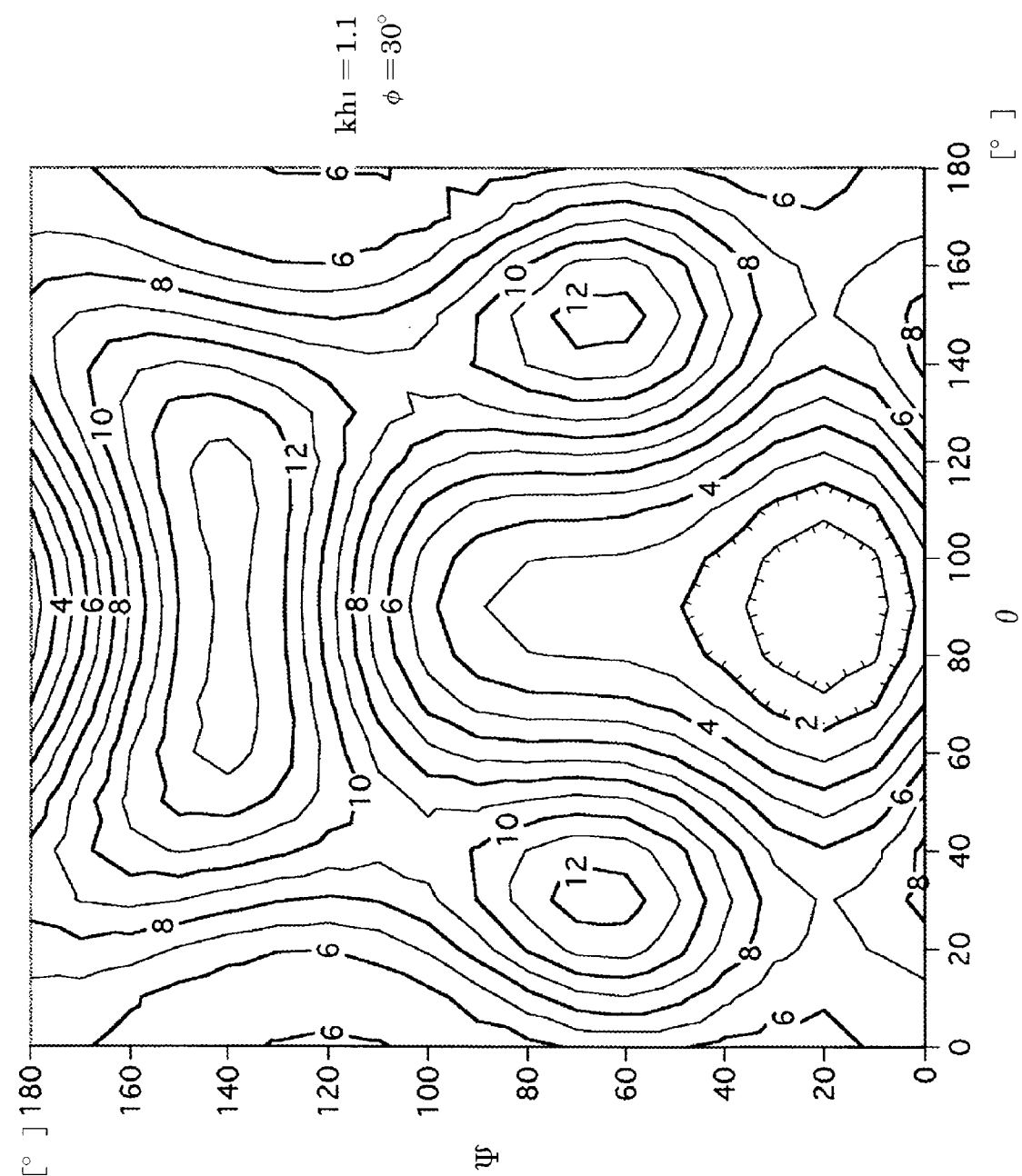
FIG. 103 is a graph showing the evaluation result of $K^2$ in the sixth embodiment ($kh_1$=1.1, $\Phi$=30°)
Figure 104:
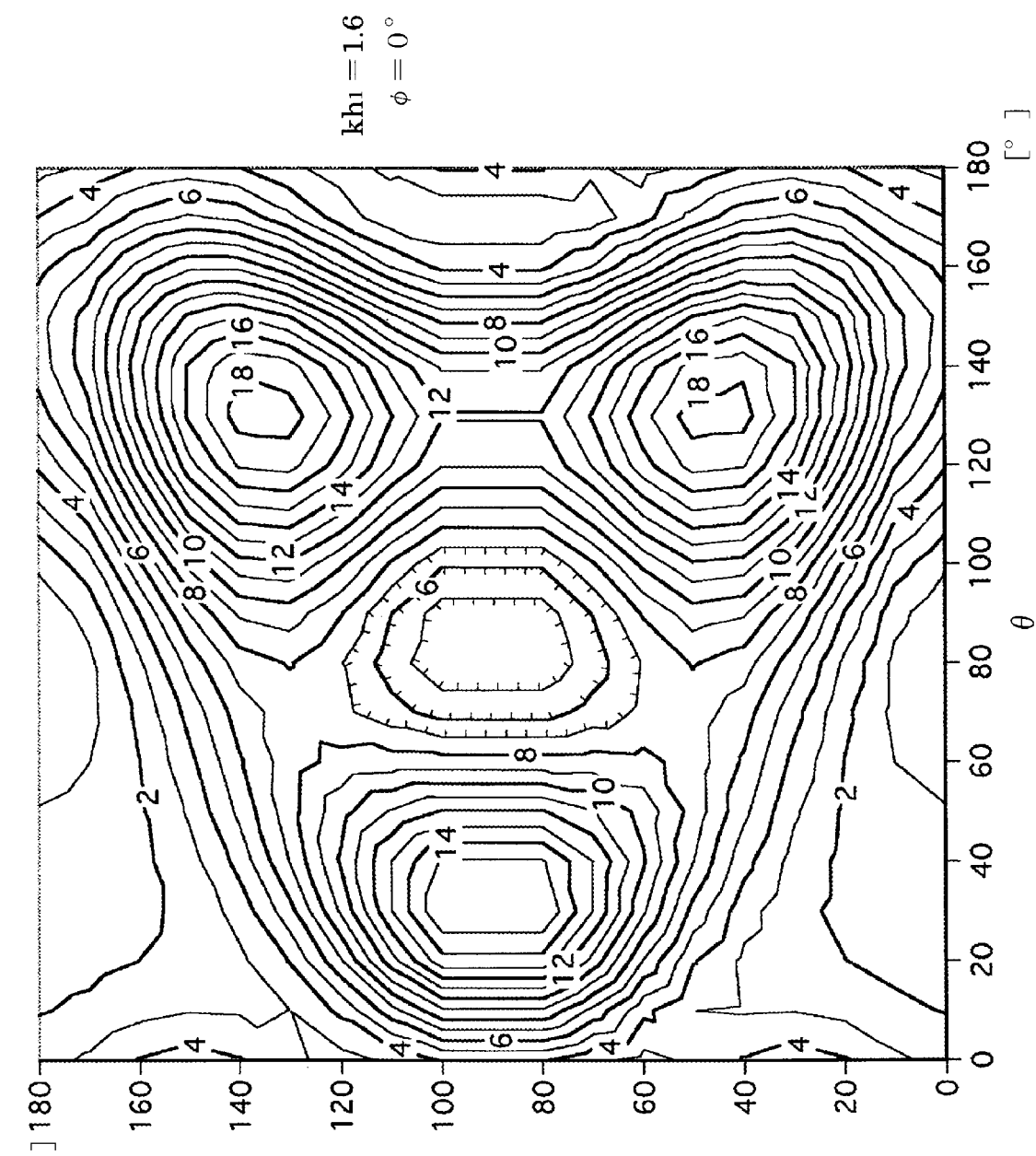
FIG. 104 is a graph showing the evaluation result of $K^2$ in the sixth embodiment ($kh_1$=1.6, $\Phi$=0°)
Figure 105:
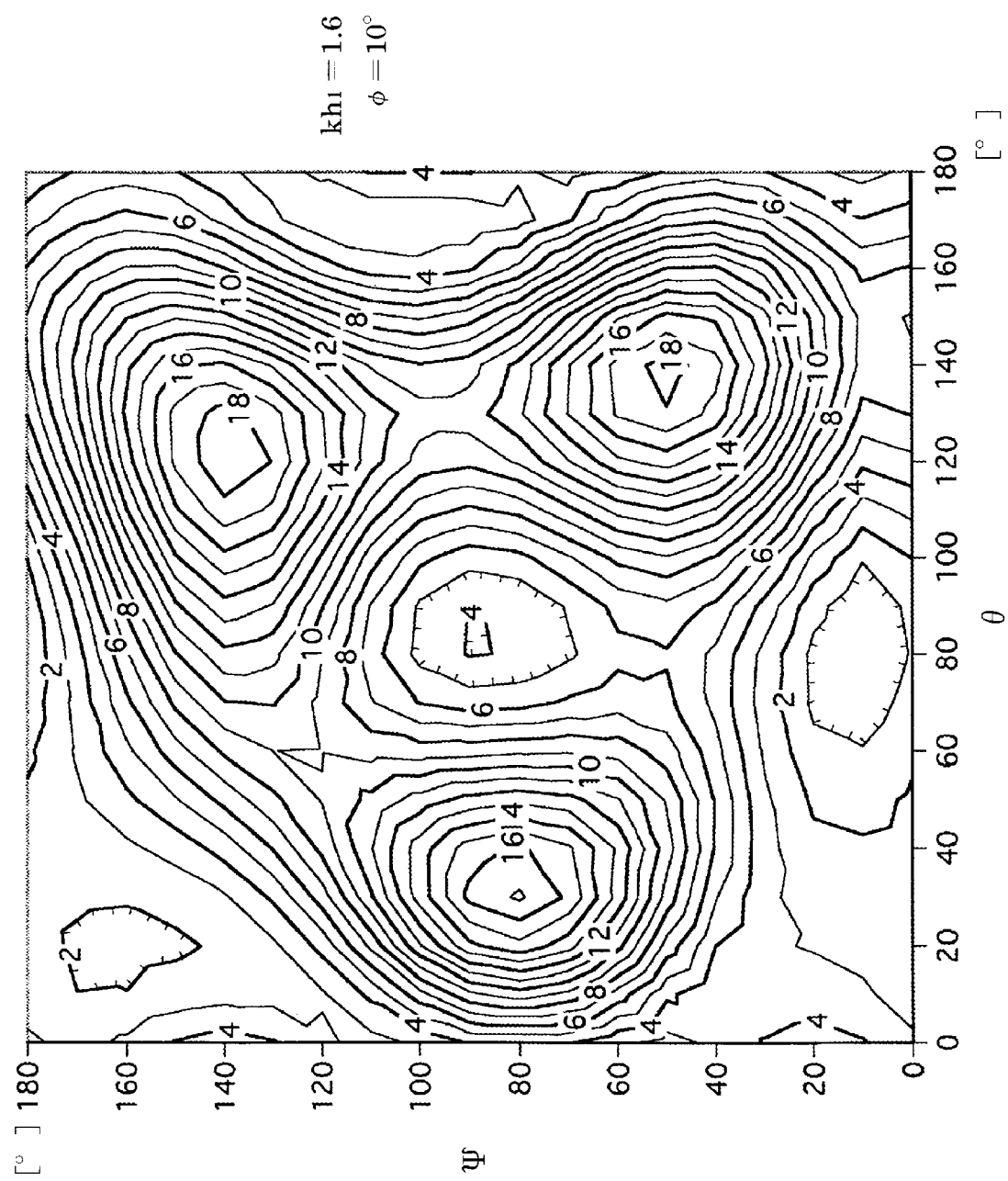
FIG. 105 is a graph showing the evaluation result of $K^2$ in the sixth embodiment ($kh_1$=1.6, $\Phi$=10°)
Figure 106:
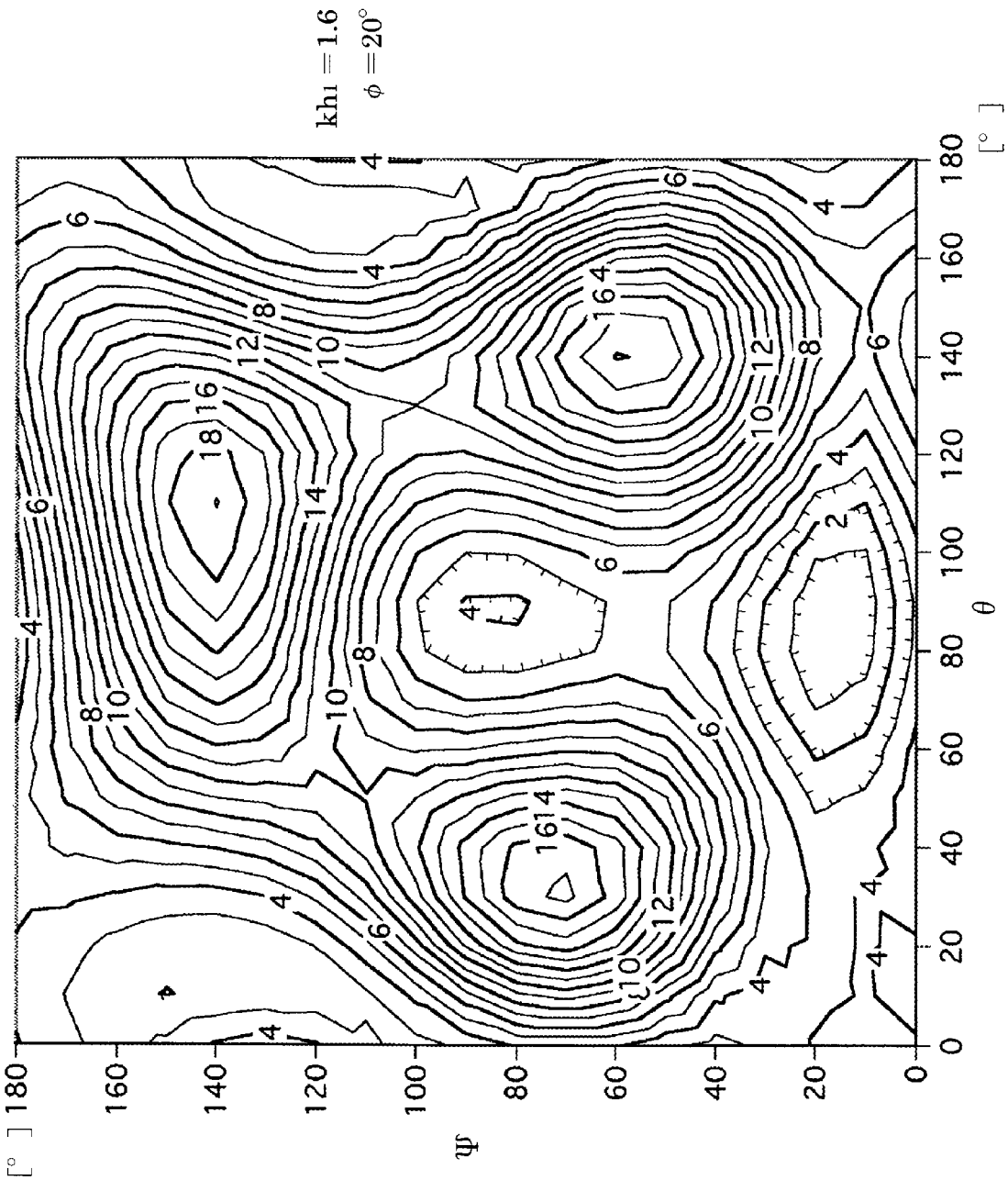
FIG. 106 is a graph showing the evaluation result of $K^2$ in the sixth embodiment ($kh_1$=1.6, $\Phi$=20°)
Figure 107:
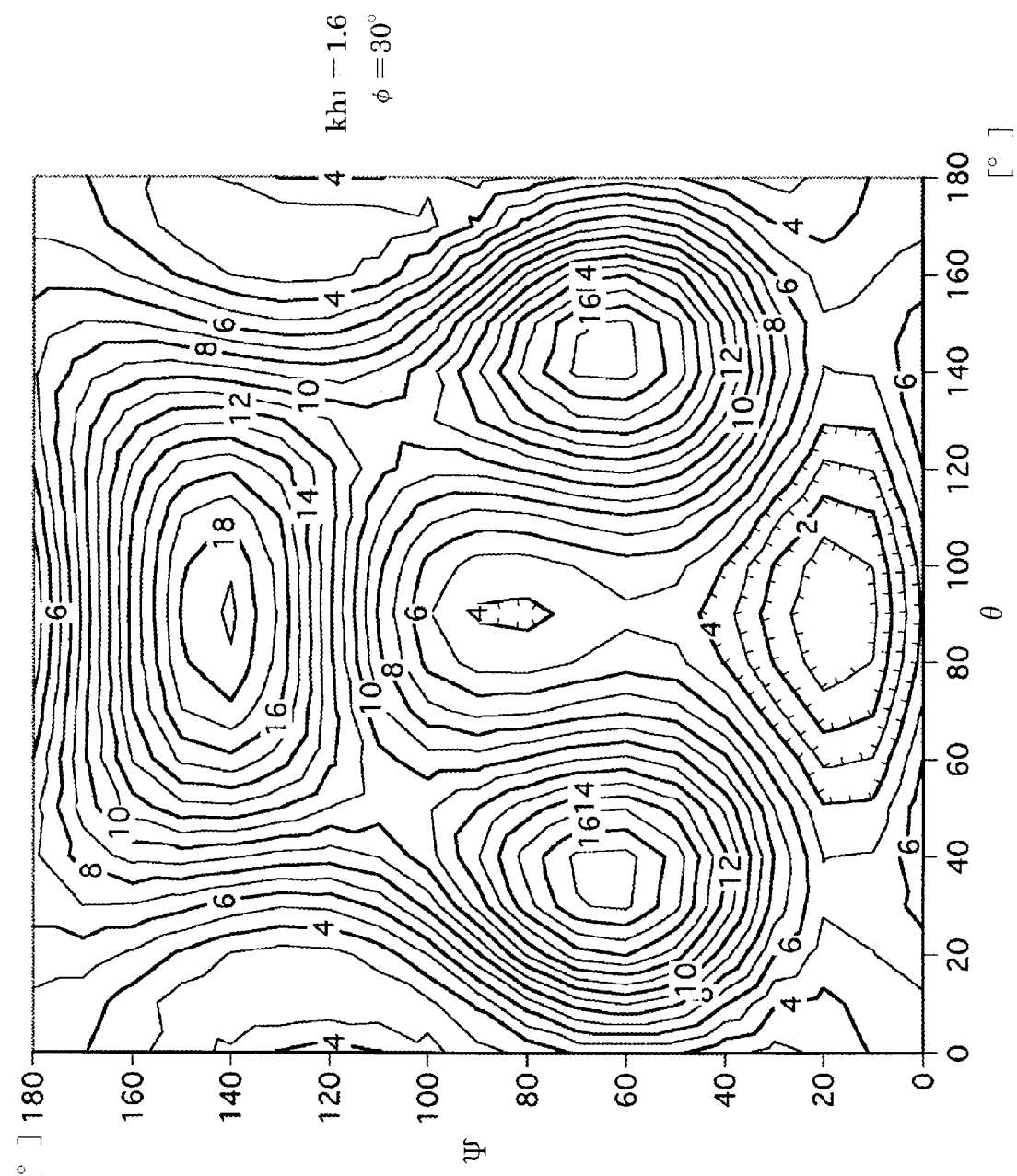
FIG. 107 is a graph showing the evaluation result of $K^2$ in the sixth embodiment ($kh_1$=1.6, $\Phi$=30°)

FIG. 91 is a sectional view showing the structure of an SAW device according to the sixth embodiment of the present invention. As shown in FIG. 91, the SAW device of the sixth embodiment is different from that of the fifth embodiment only in that an SAW in the 2nd-order mode is used, and an LiNbO$_3$ layer 360 is formed in place of the LiNbO$_3$ layer 350.

The LiNbO$_3$ layer 360 is formed by bonding a cut single crystal LiNbO$_3$ thin plate to diamond 100 having a short-circuit electrode 200 formed on its polished surface, and then polishing the single crystal LiNbO$_3$ thin plate, as in the fifth embodiment.

For the LiNbO$_3$ layer 360, a thickness $t_1$ [μm] and a crystal orientation (θ[°],Φ[°],ψ[°]) are selected from the following values. Note that $kh_1$ (=2π($t_1$/λ); λ=the wavelength [μm] of an SAW) is used instead of the thickness $t_1$, as in the first embodiment.

(i) 0≦Φ≦15 on an orthogonal coordinate system ($kh_1$,θ, ψ), values in the internal region of a hexahedron which has, as its opposing bottom surfaces, a planar rectangular region with its vertexes at points $A_{61}$ $B_{61}$ $C_{61}$ and $D_{61}$, and a planar rectangular region with its vertexes at points $A_{62}$ $B_{62}$ $C_{62}$ and $D_{62}$,
where
point $A_{61}$=(0.85, 140, 40)
point $B_{61}$=(0.85, 160, 40)
point $C_{61}$=(0.85, 160, 60)
point $D_{61}$=(0.85, 140, 60)
point $A_{62}$=(1.1, 120, 30)
point $B_{62}$=(1.1, 170, 30)
point $C_{62}$=(1.1, 170, 70)
point $D_{62}$=(1.1, 120, 70).

(ii) 0≦Φ≦15 on the orthogonal coordinate system ($kh_1$, θ,ψ), values in the internal region of a hexahedron which has, as its opposing bottom surfaces, a planar rectangular region with its vertexes at points $A_{63}$ $B_{63}$ $C_{63}$ and $D_{63}$, and a planar rectangular region with its vertexes at points $A_{64}$ $B_{64}$ $C_{64}$ and $D_{64}$,
where
point $A_{63}$=(0.85, 130, 130)
point $B_{63}$=(0.85, 160, 130)
point $C_{63}$=(0.85, 160, 150)
point $D_{63}$=(0.85, 130, 150)
point $A_{64}$=(1.1, 100, 140)

point $B_{64}$=(1.1, 140, 100)

point $C_{64}$=(1.1, 160, 160)

point $D_{64}$=(1.1, 130, 160).

(iii) $0 \leq \Phi \leq 15$ on the orthogonal coordinate system ($kh_1$, $\theta, \psi$), values in the internal region of a quadrangular pyramid which has its vertex at a point $P_{65}$ and, as its bottom surface, a planar rectangular region with its vertexes at points $A_{65}$ $B_{65}$ $C_{65}$ and $D_{65}$, where point $P_{65}$=(0.85,30,90)

point $A_{65}$=(1.1,20,70)

point $B_{65}$=(1.1,40,70)

point $C_{65}$=(1.1,40,110)

point $D_{65}$=(1.1,20,110).

(iv) $15 \leq \Phi \leq 30$ on the orthogonal coordinate system ($kh_1, \theta, \psi$), values in the internal region of a hexahedron which has, as its opposing bottom surfaces, a planar rectangular region with its vertexes at points $A_{66}$ $B_{66}$ $C_{66}$ and $D_{66}$, and a planar rectangular region with its vertexes at points $A_{67}$ $B_{67}$ $C_{67}$ and $D_{67}$, where point $A_{66}$=(0.6, 20, 150)

point $B_{66}$=(0.6, 40, 150)

point $C_{66}$=(0.6, 40, 170)

point $D_{66}$=(0.6, 20, 170)

point $A_{67}$=(0.85, 50, 130)

point $B_{67}$=(0.85, 70, 140)

point $C_{67}$=(0.85, 50, 160)

point $D_{67}$=(0.85, 20, 160).

(v) $15 \leq \Phi \leq 30$ on the orthogonal coordinate system ($kh_1$, $\theta$, $\psi$), values in the internal region of a hexahedron which has, as its opposing bottom surfaces, the planar rectangular region with its vertexes at the points $A_{67}$ $B_{67}$ $C_{67}$ and $D_{67}$, and a planar rectangular region with its vertexes at points $A_{68}$ $B_{68}$ $C_{68}$ and $D_{68}$, where point $A_{68}$=(1.1, 40, 120)

point $B_{68}$=(1.1, 90, 120)

point $C_{68}$=(1.1, 90, 160)

point $D_{68}$=(1.1, 40, 160).

(vi) $15 \leq \Phi \leq 30$ on the orthogonal coordinate system ($kh_1, \theta, \psi$), values in the internal region of a hexahedron which has, as its opposing bottom surfaces, a planar rectangular region with its vertexes at points $A_{69}$ $B_{69}$ $C_{69}$ and $D_{69}$, and a planar rectangular region with its vertexes at points $A_{6A}$ $B_{6A}$ $C_{6A}$ and $D_{6A}$, where point $A_{69}$=(0.6, 140, 150)

point $B_{69}$=(0.6, 160, 150)

point $C_{69}$=(0.6, 160, 160)

point $D_{69}$=(0.6, 140, 160)

point $A_{6A}$=(0.85, 100, 140)

point $B_{6A}$=(0.85, 130, 130)

point $C_{6A}$=(0.85, 160, 160)

point $D_{6A}$=(0.85, 130, 160).

(vii) $15 \leq \leq \Phi \leq 30$ on the orthogonal coordinate system ($kh_1, \theta, \psi$), values in the internal region of a hexahedron which has, as its opposing bottom surfaces, the planar rectangular region with its vertexes at the points $A_{6A}$ $B_{6A}$ $C_{6A}$ and $D_{6A}$, and a planar rectangular region with its vertexes at points $A_{6B}$ $B_{6B}$ $C_{6B}$ and $D_{6B}$, where point $A_{6B}$=(1.1, 100, 120)

point $B_{6B}$=(1.1, 150, 120)

point $C_{6B}$=(1.1, 150, 160)

point $D_{6B}$=(1.1, 100, 160).

(viii) $15 \leq \Phi \leq 30$ on the orthogonal coordinate system ($kh_1,\theta,\psi$), values in the internal region of a hexahedron which has, as its opposing bottom surfaces, a planar rectangular region with its vertexes at points $A_{6C}$ $B_{6C}$ $C_{6C}$ and $D_{6C}$, and a planar rectangular region with its vertexes at points $A_{6D}$ $B_{6D}$ $C_{6D}$ and $D_{6D}$, where point $A_{6C}$=(0.85, 150, 50)

point $B_{6C}$=(0.85, 160, 50)

point $C_{6C}$=(0.85, 160, 60)

point $D_{6C}$=(0.85, 150, 60)

point $A_{6D}$=(1.1, 130, 40)

point $B_{6D}$=(1.1, 160, 40)

point $C_{6D}$=(1.1, 160, 90)

point $D_{6D}$=(1.1, 130, 90).

(ix) $15 \leq \Phi \leq 30$ on the orthogonal coordinate system ($kh_1,\theta,\psi$), values in the internal region of a quadrangular pyramid which has its vertex at a point $P_{6E}$ and, as its bottom surface, a planar rectangular region with its vertexes at points $A_{6E}$ $B_{6E}$ $C_{6E}$ and $D_{6E}$, where point $P_{6E}$=(0.85, 30, 70)

point $A_{6E}$=(1.1, 20, 50)

point $B_{6E}$=(1.1, 40, 50)

point $C_{6E}$=(1.1, 40, 90)

point $D_{6E}$=(1.1, 20, 90).

In the structure of the SAW device according to the sixth embodiment, a propagation velocity V is exclusively determined by $kh_1$ of the $LiNbO_3$ layer 360, as in the second embodiment, as shown in FIG. 23. Therefore, it is confirmed that, when $kh_1$ is equal to or smaller than 1.1, a propagation velocity V equal to or higher than 8,000 m/s is ensured.

The present inventors set the thickness of the diamond 100 at 20 $\mu$m, and evaluated an electromechanical coupling coefficient $K^2$ while changing $kh_1$ within the above-described limitation for $kh_1$ and simultaneously changing the values $\theta$, $\Phi$, and $\psi$.

FIGS. 92 to 107 are graphs showing contour lines obtained upon evaluating the electromechanical coupling coefficient $K^2$ [%] under conditions that $kh_1$=0.6, 0.85, 1.1, and 1.6, $\Phi$=0°, 10°, 20°, and 30°, $0° \leq \theta \leq 180°$, and $0° \leq \psi \leq 180°$. Note that the values $\theta$ and $\psi$ are plotted in units of 10° in these graphs.

Regions for satisfying the electromechanical coupling coefficient $K^2$ of 10% or more are obtained from FIGS. 92 to 107. Taking the symmetry of the $LiNbO_3$ crystal into consideration, it is confirmed that, when the propagation velocity V is 8,000 m/s or more, and the electromechanical coupling coefficient $K^2$ is 10% or more, the four parameters $kh_1$, $\theta,\Phi$, and $\psi$ are set in the internal region of one of the hexahedrons which are symmetric with those represented by (i), (ii), (iv), (v), (vi), (vii), or (viii), or one of the quadrangular pyramids which are symmetric with those represented by (iii) or (ix).

(Seventh Embodiment)

Figure 108:
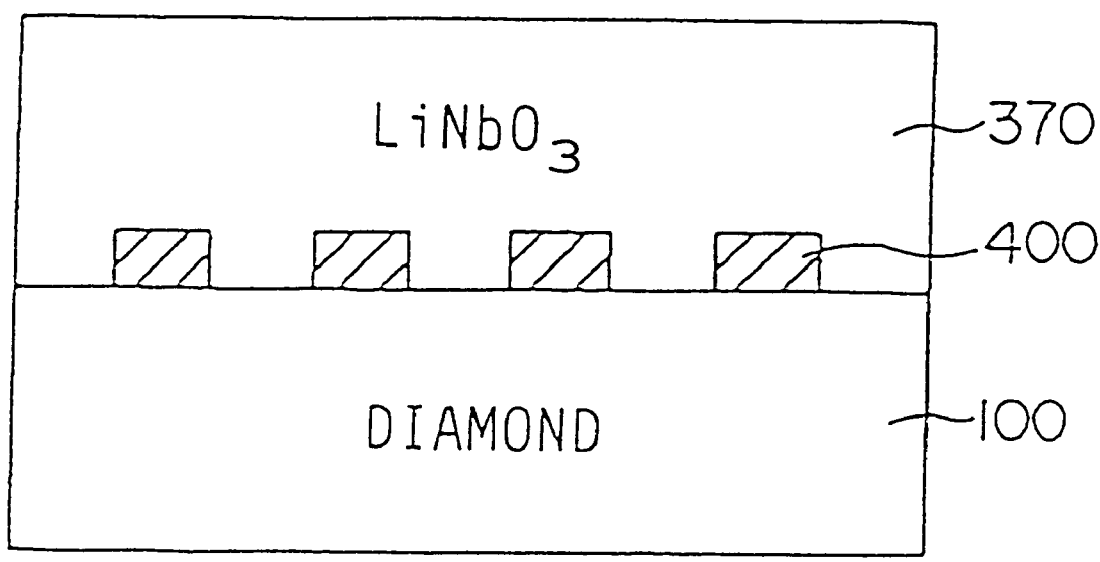
FIG. 108 is a sectional view showing the structure of an SAW device according to the seventh embodiment of the present invention.
Figure 109:
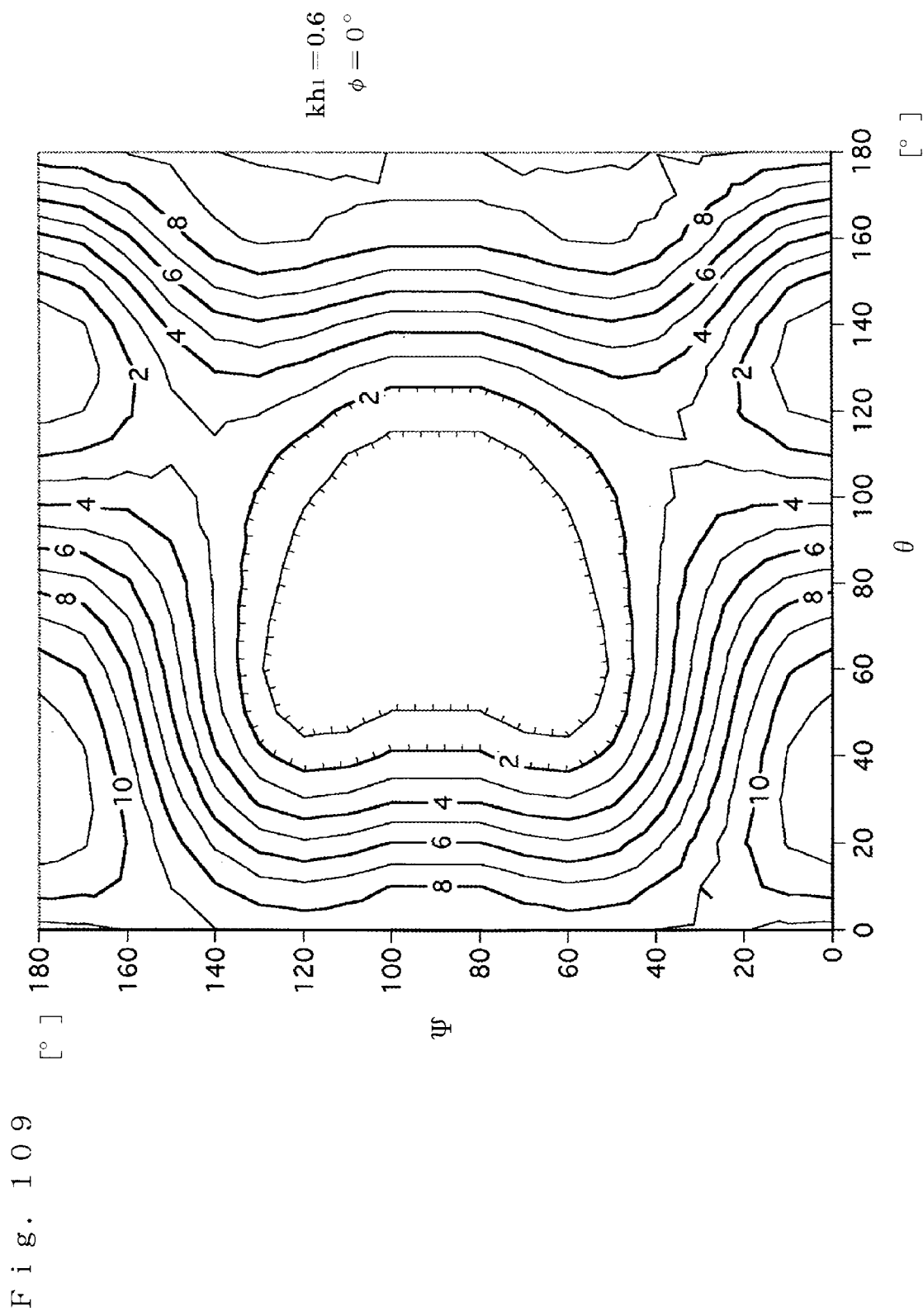
FIG. 109 is a graph showing the evaluation result of $K^2$ in the seventh embodiment ($kh_1$=0.6, $\Phi$=0°)
Figure 110:
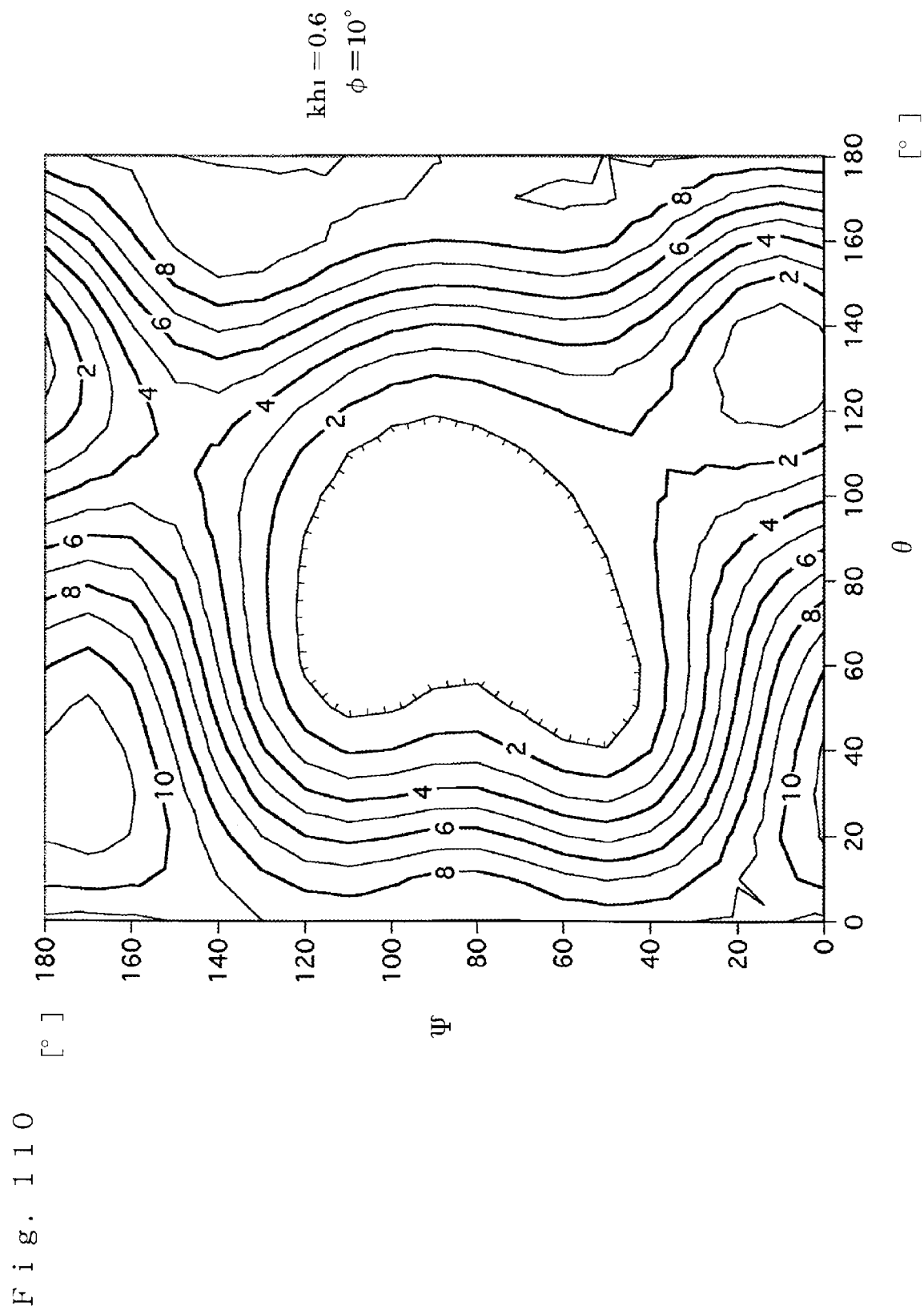
FIG. 110 is a graph showing the evaluation result of $K^2$ in the seventh embodiment ($kh_1$=0.6, $\Phi$=10°)
Figure 111:
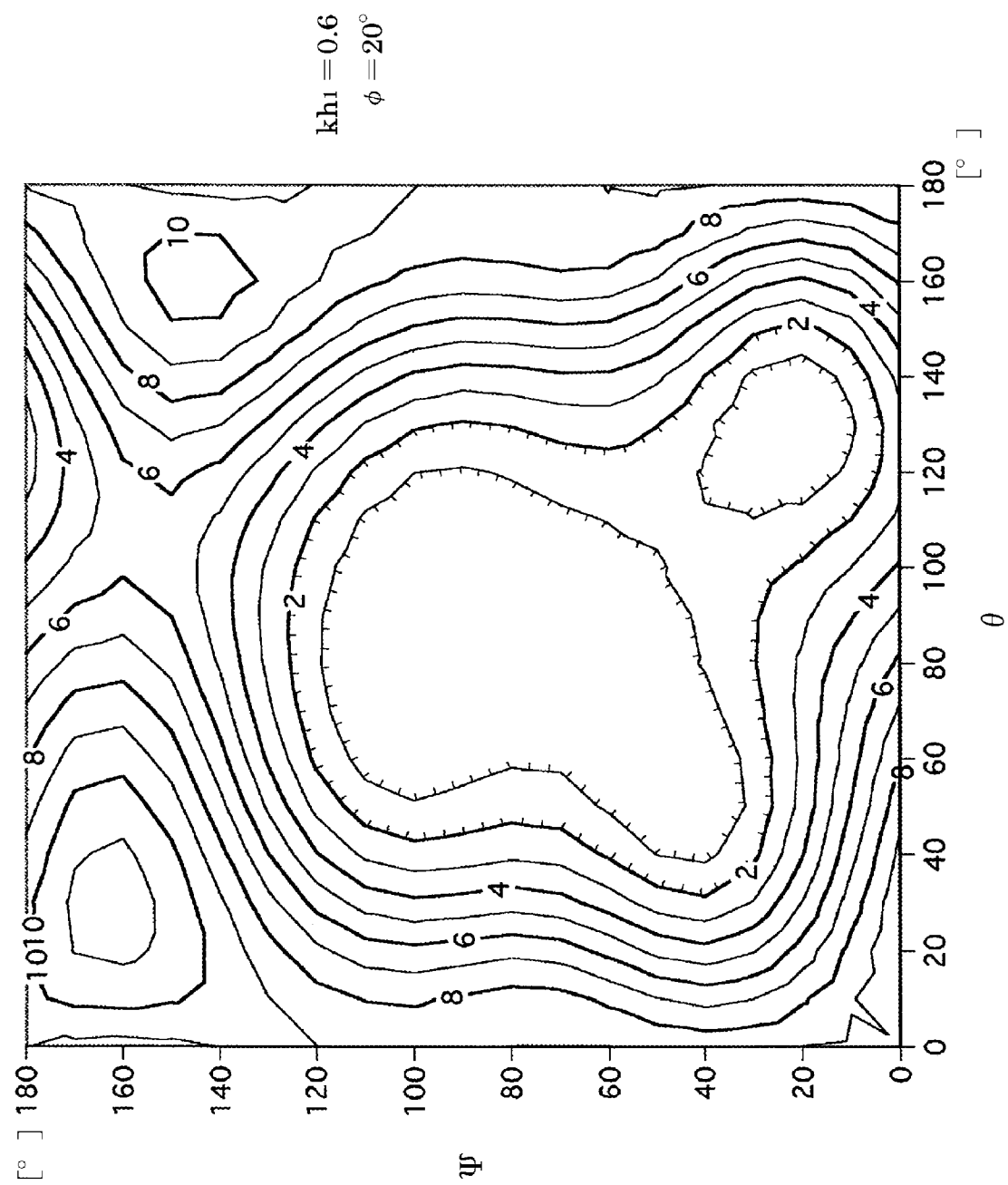
FIG. 111 is a graph showing the evaluation result of $K^2$ in the seventh embodiment ($kh_1$=0.6, $\Phi$=20°)
Figure 112:
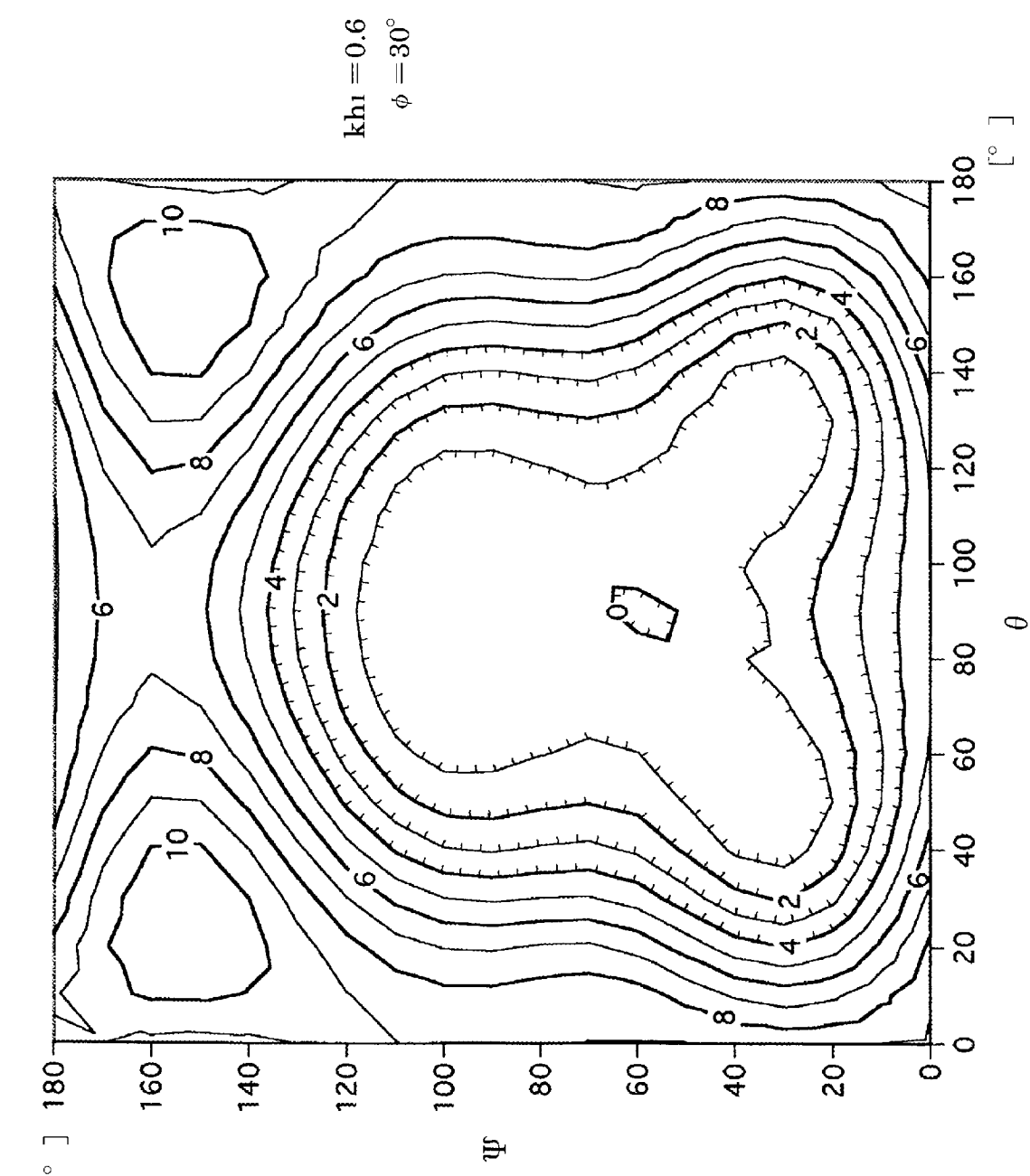
FIG. 112 is a graph showing the evaluation result of $K^2$ in the seventh embodiment ($kh_1$=0.6, $\Phi$=30°)
Figure 113:
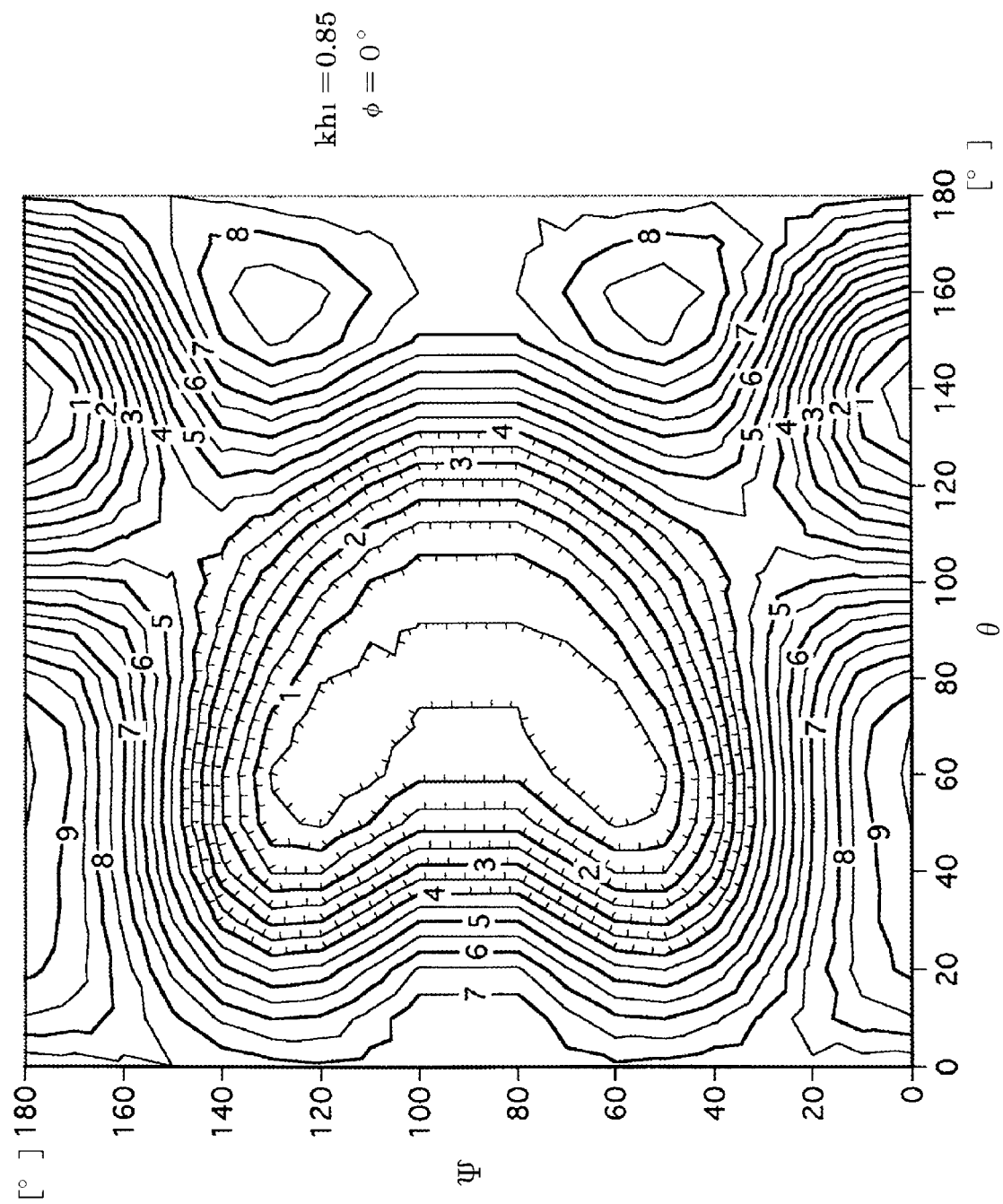
FIG. 113 is a graph showing the evaluation result of $K^2$ in the seventh embodiment ($kh_1$=0.85, $\Phi$=0°)
Figure 114:
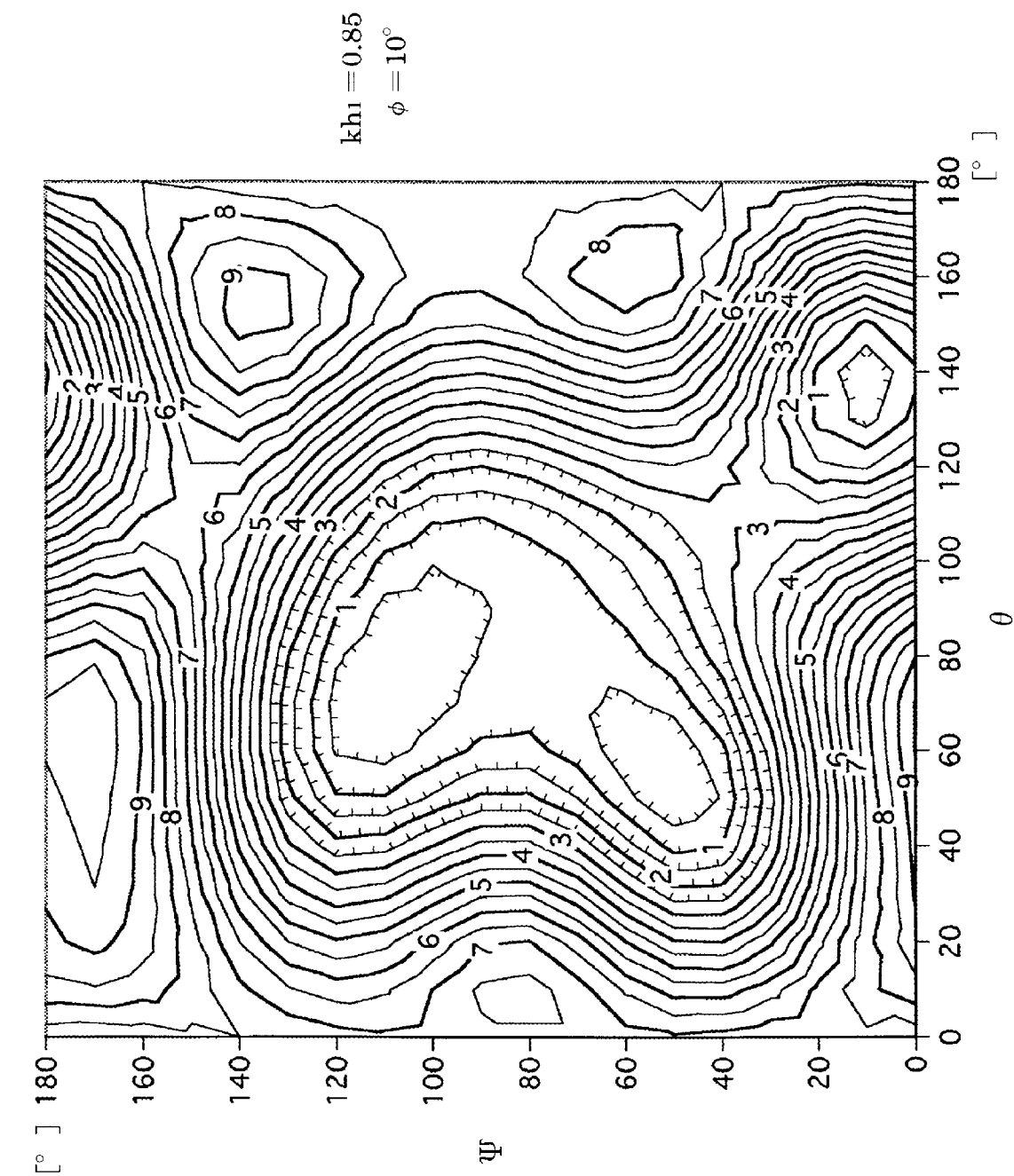
FIG. 114 is a graph showing the evaluation result of $K^2$ in the seventh embodiment ($kh_1$=0.85, $\Phi$=10°)
Figure 115:
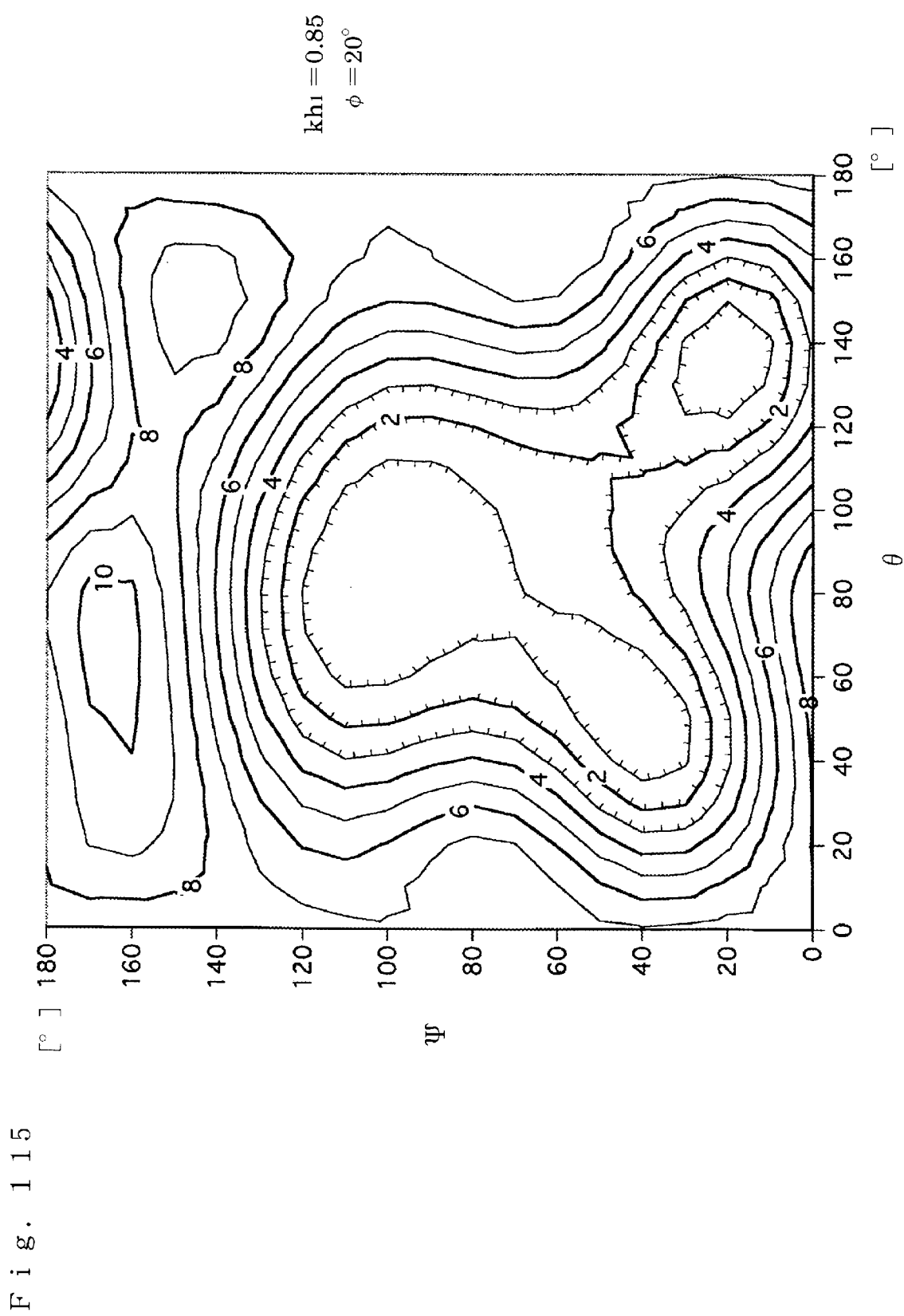
FIG. 115 is a graph showing the evaluation result of $K^2$ in the seventh embodiment ($kh_1$=0.85, $\Phi$=20°)
Figure 116:
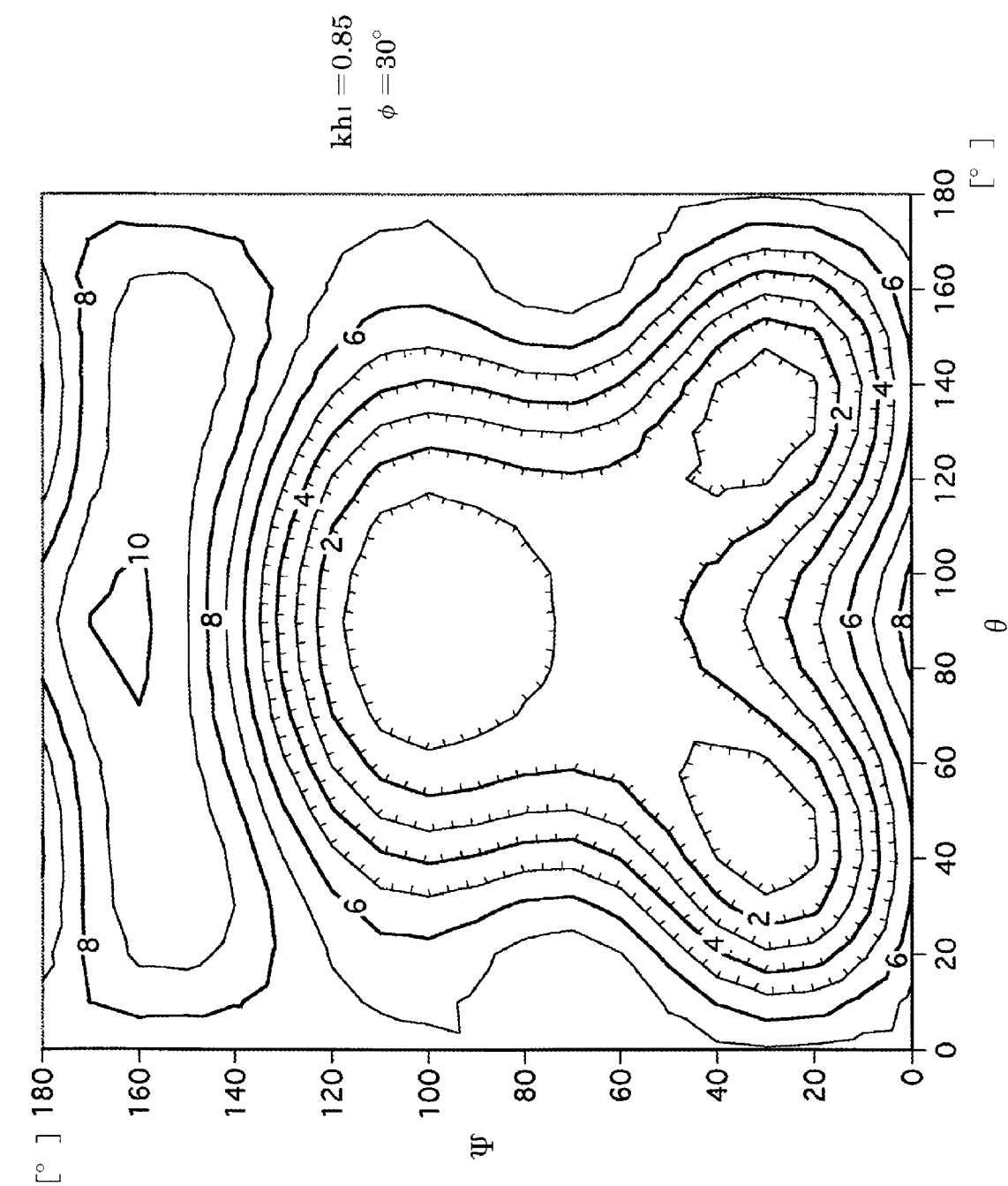
FIG. 116 is a graph showing the evaluation result of $K^2$ in the seventh embodiment ($kh_1$=0.85, $\Phi$=30°)
Figure 117:
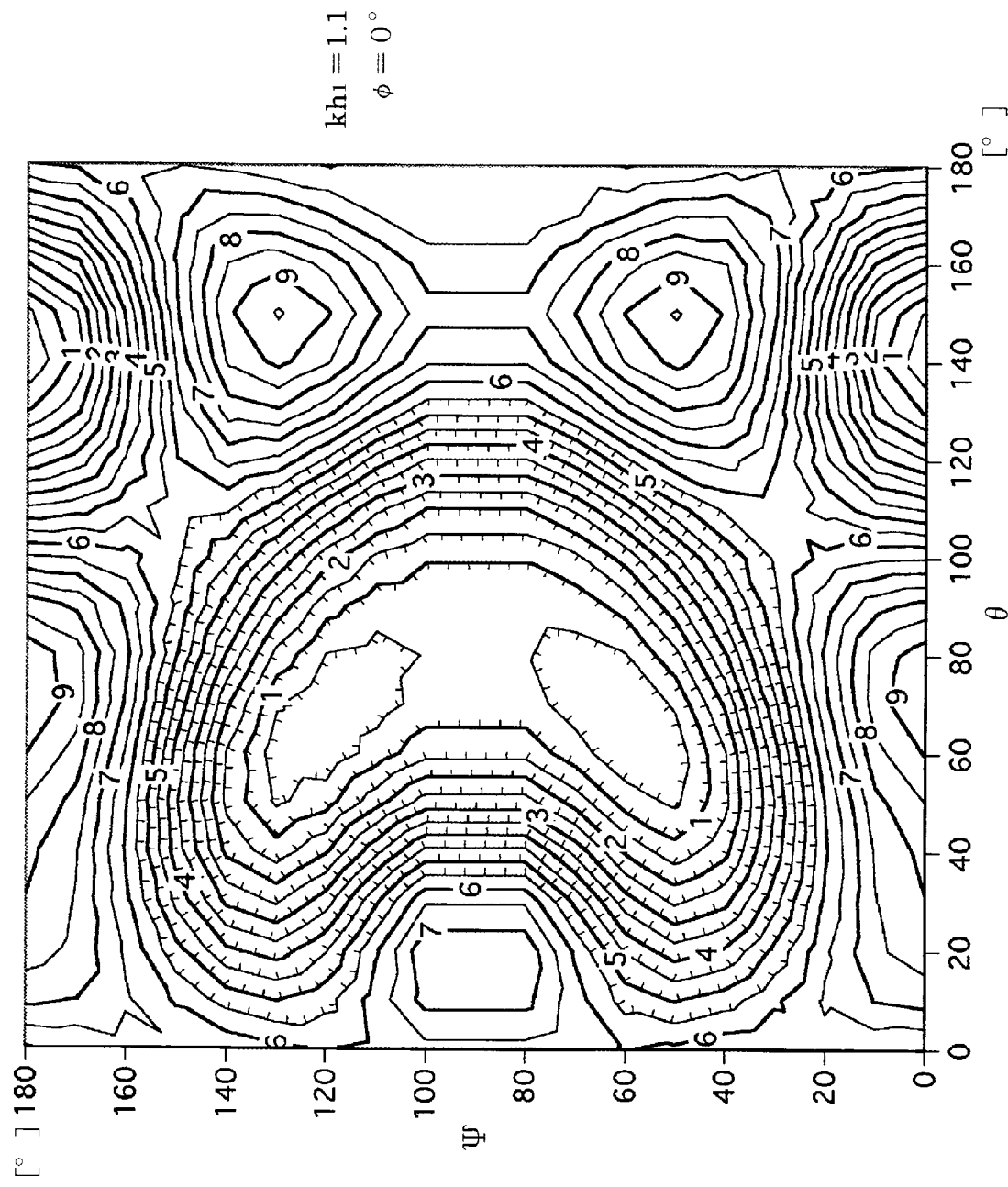
FIG. 117 is a graph showing the evaluation result of $K^2$ in the seventh embodiment ($kh_1$=1.1, $\Phi$=0°)
Figure 118:
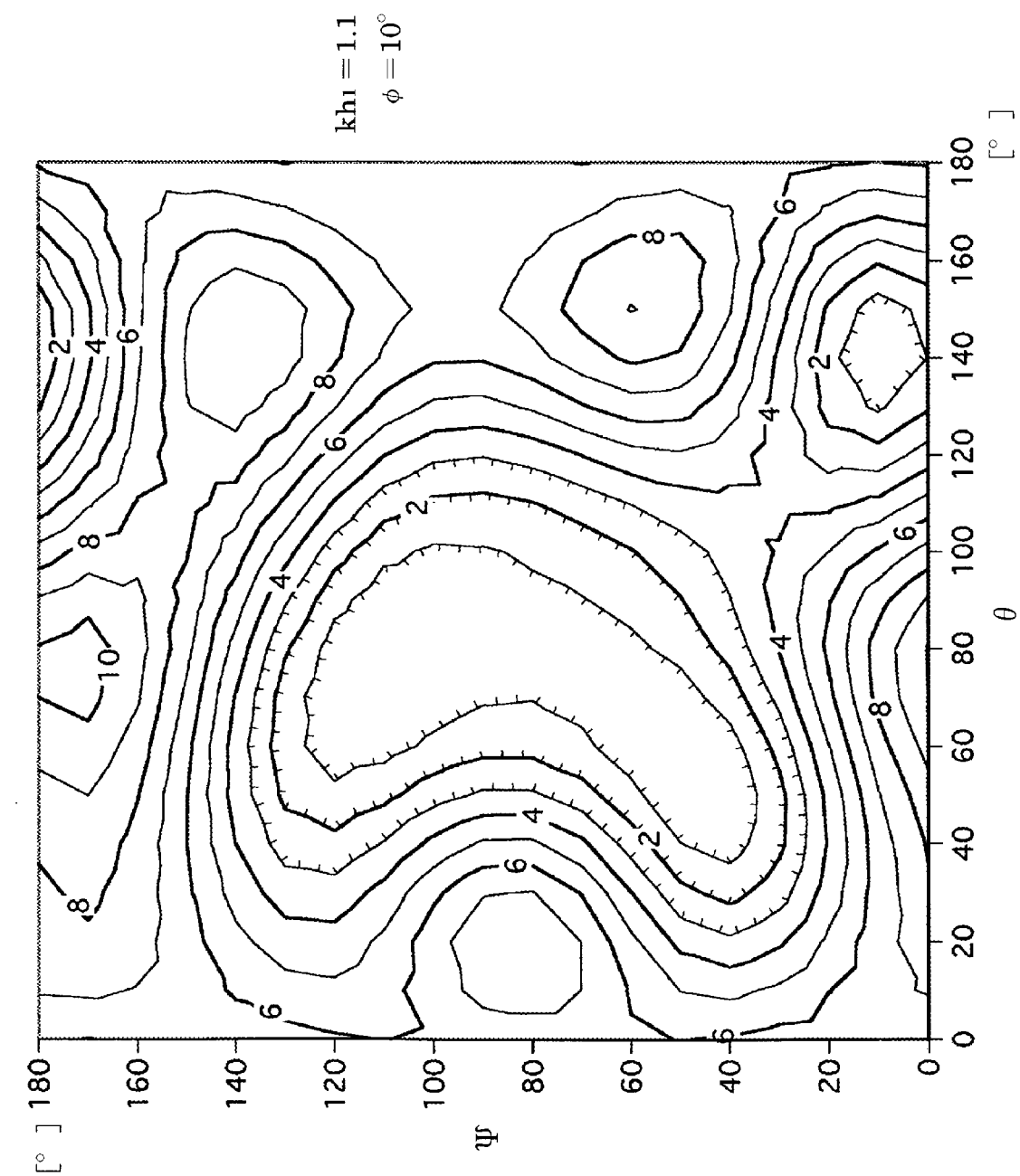
FIG. 118 is a graph showing the evaluation result of $K^2$ in the seventh embodiment ($kh_1$=1.1, $\Phi$=10°)
Figure 119:
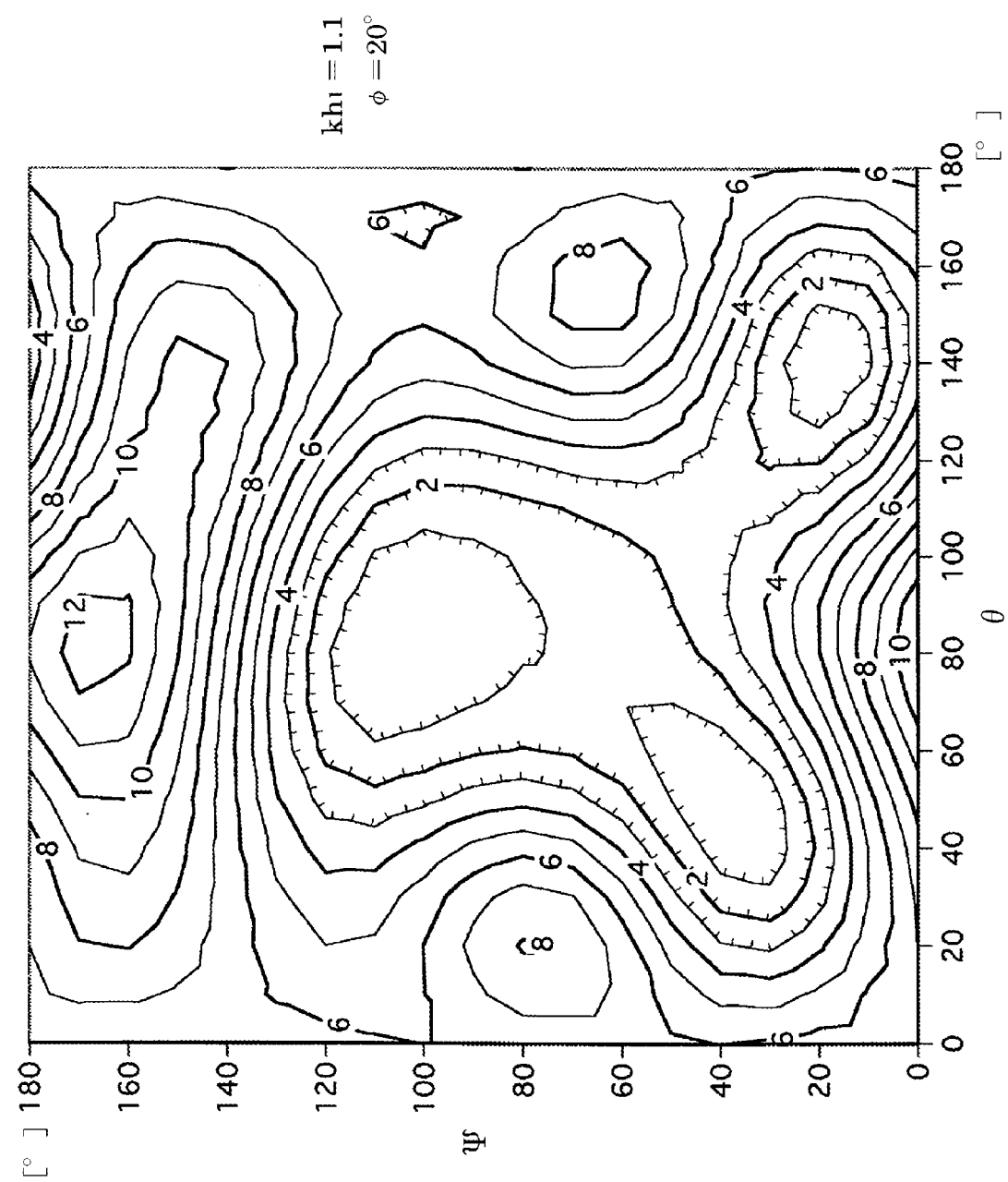
FIG. 119 is a graph showing the evaluation result of $K^2$ in the seventh embodiment ($kh_1$=1.1, $\Phi$=20°)
Figure 120:
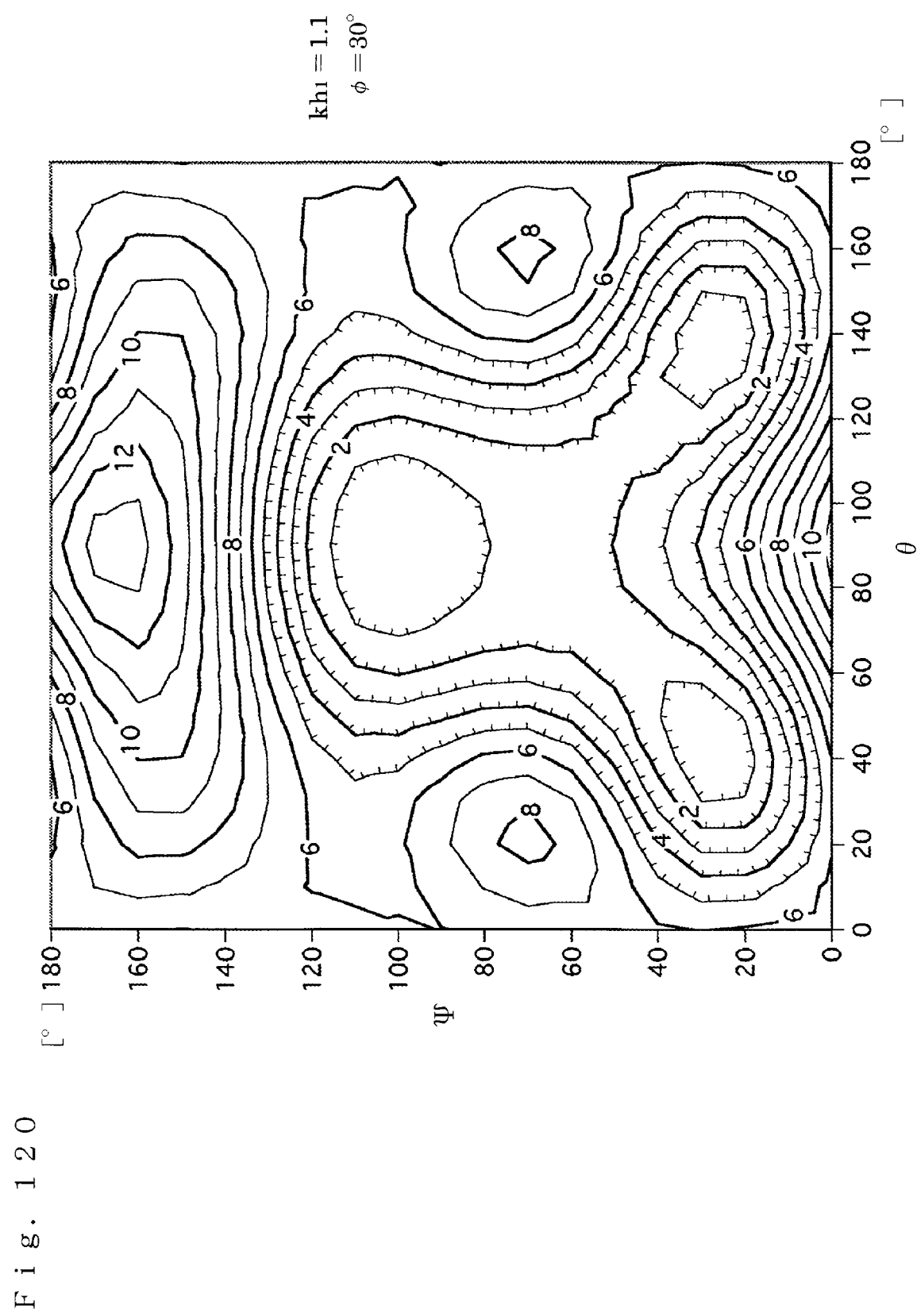
Figure 121:
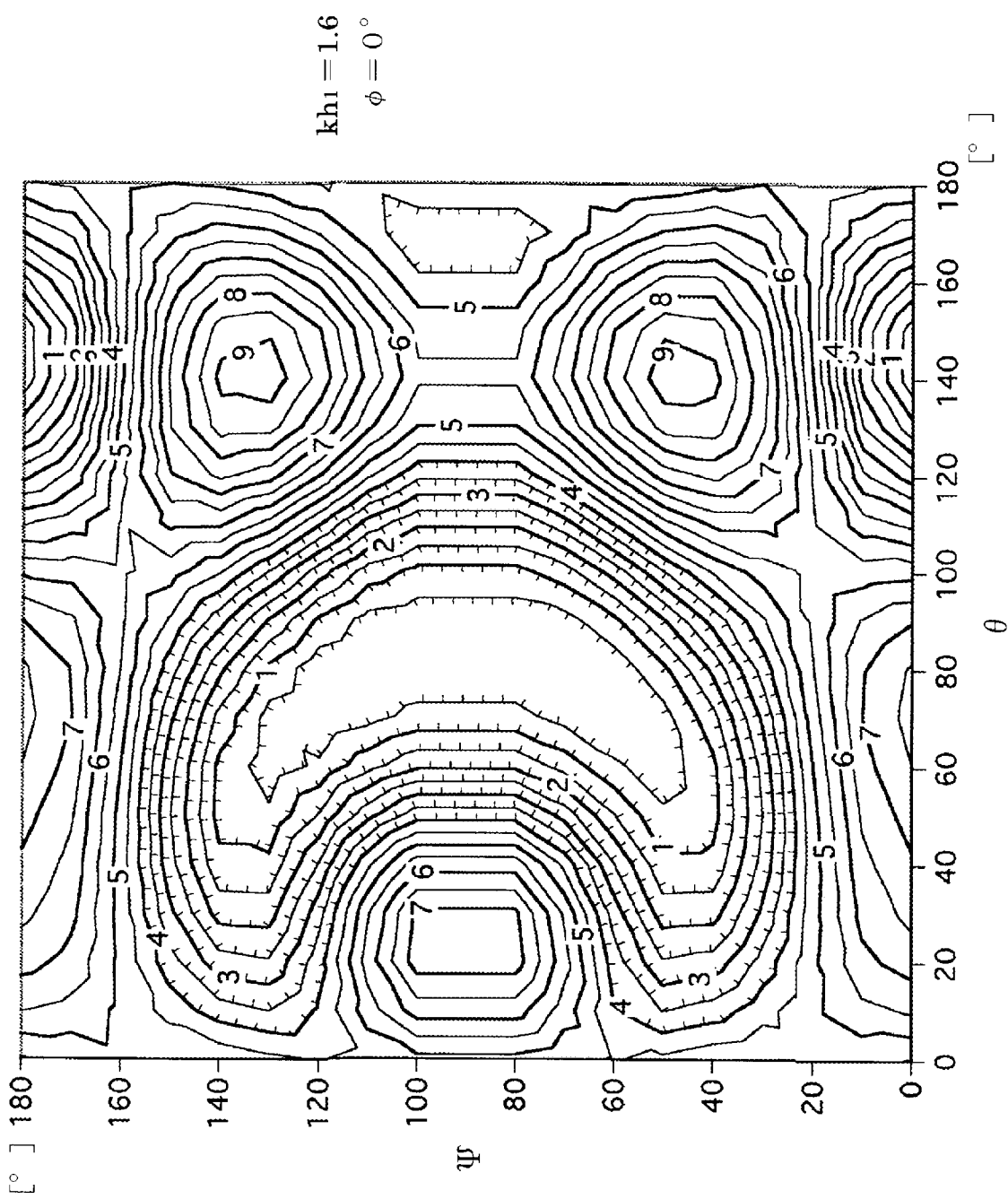
Figure 122:
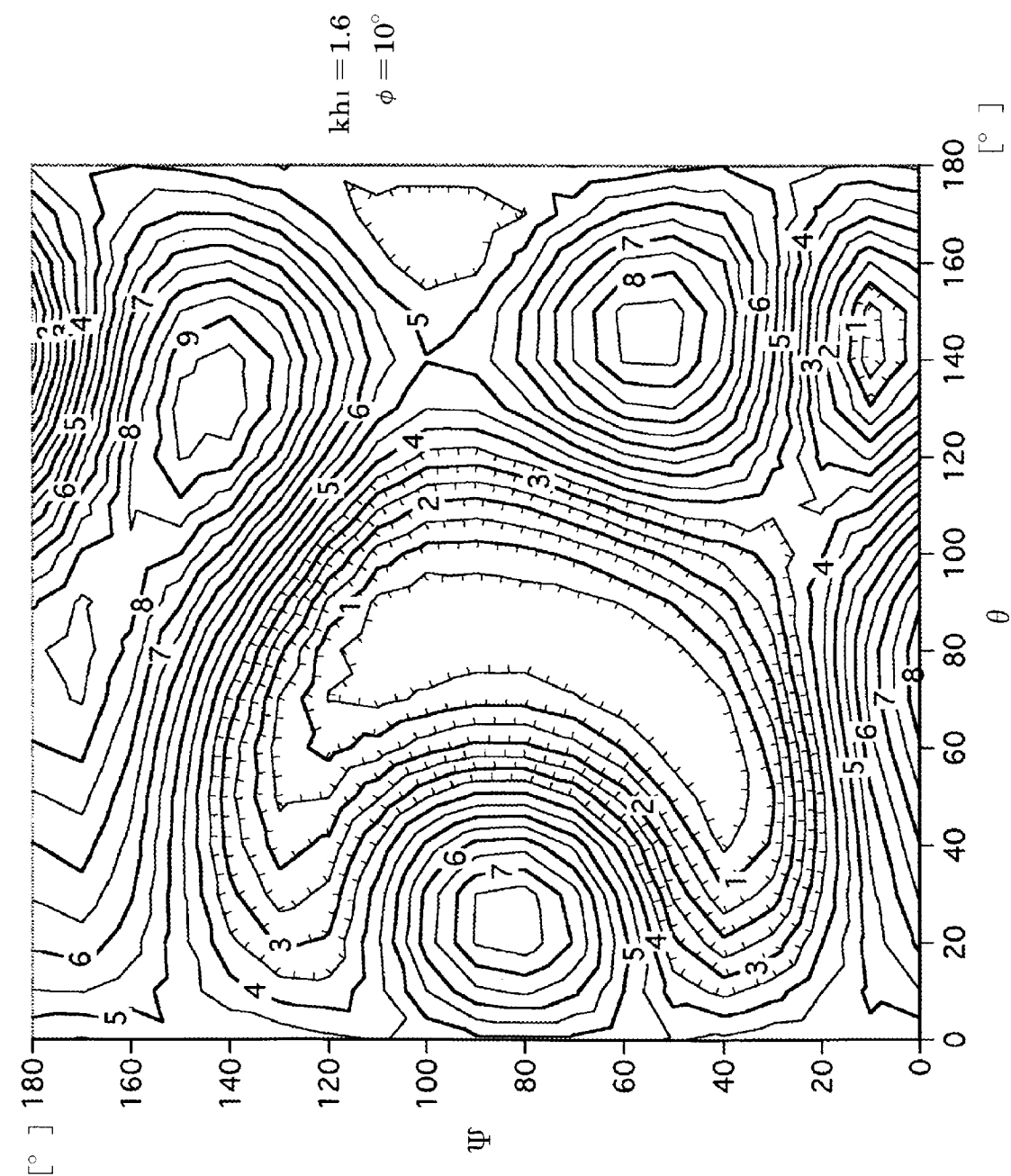
Figure 123:
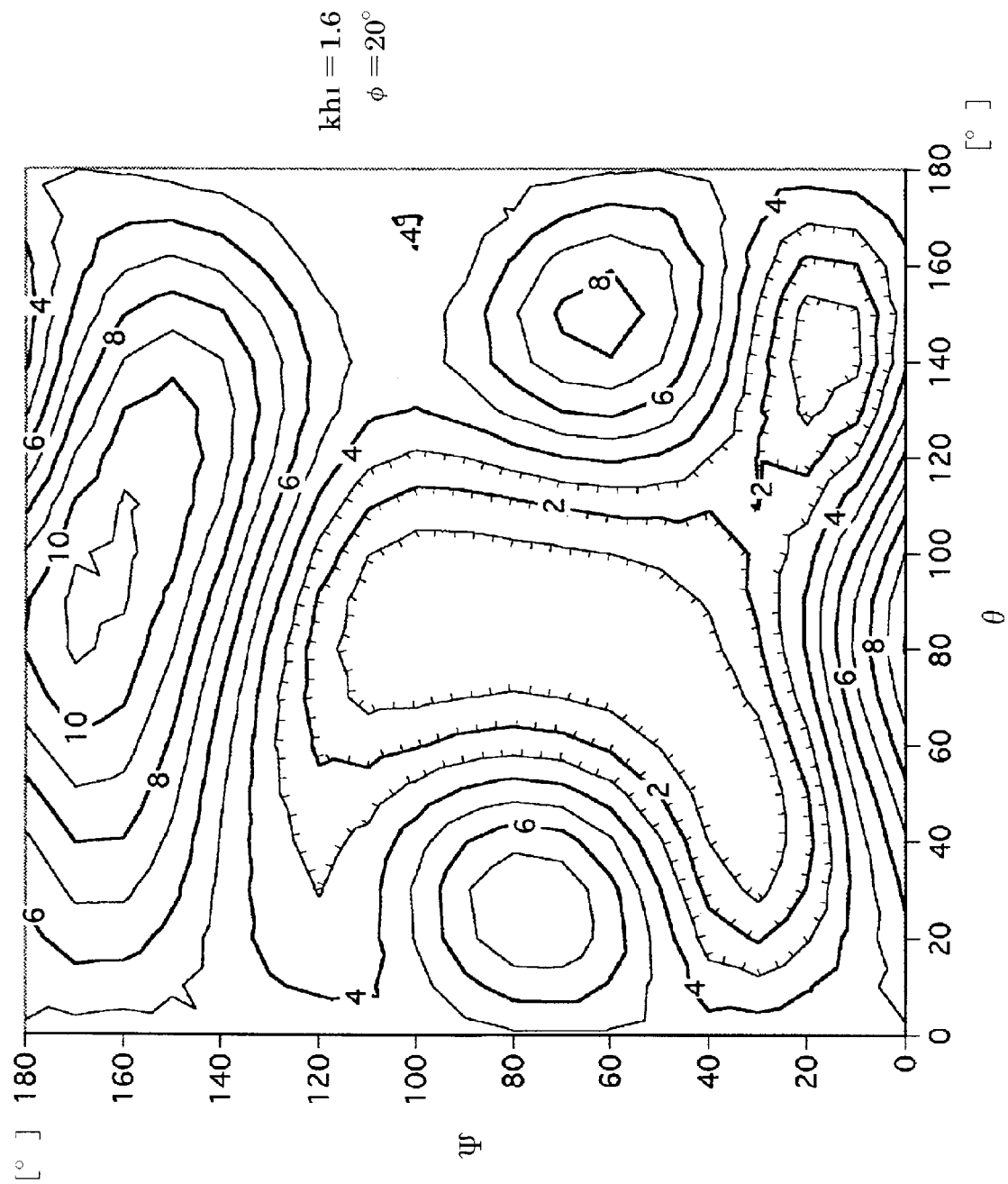
Figure 124:
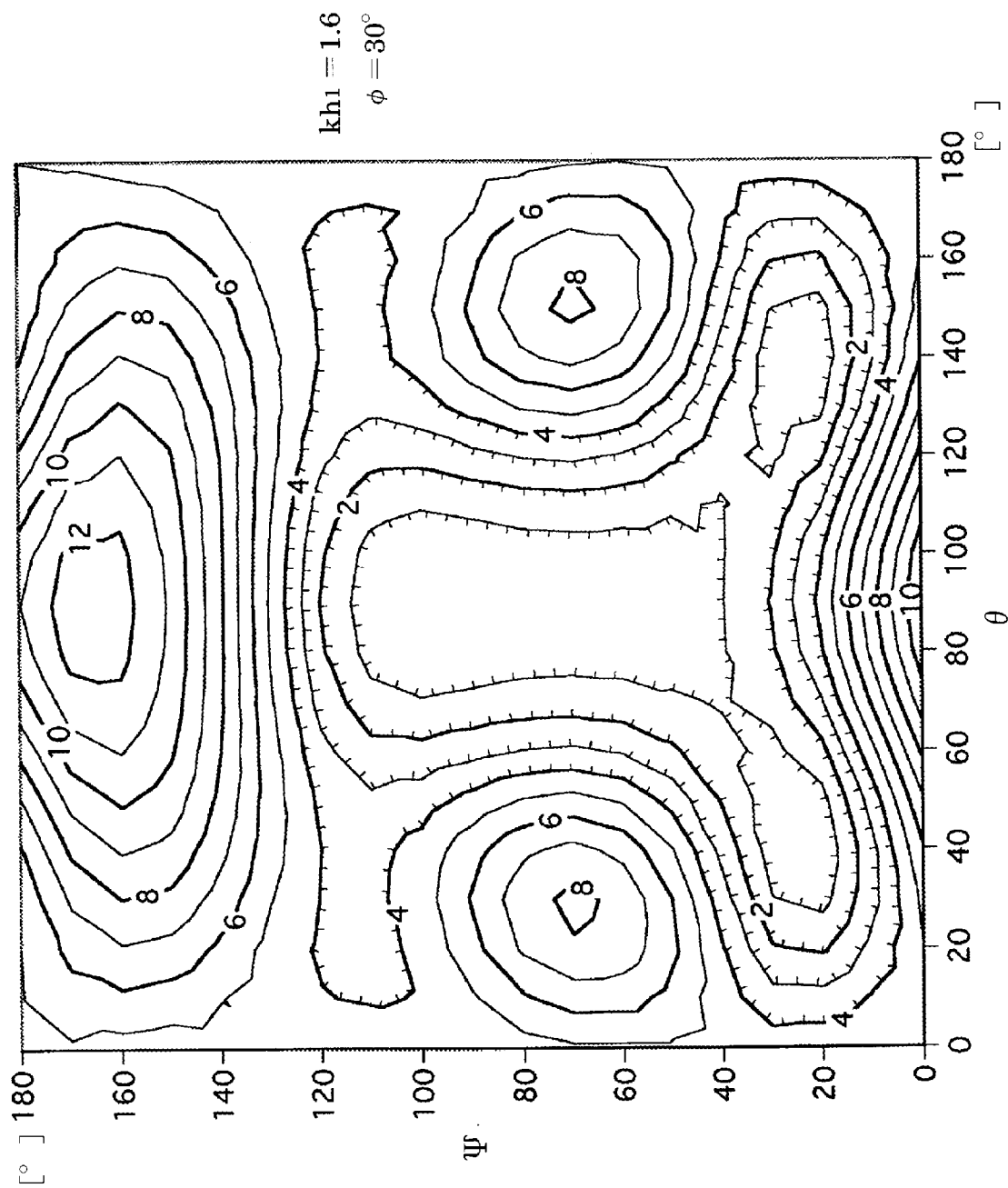
Figure 125:
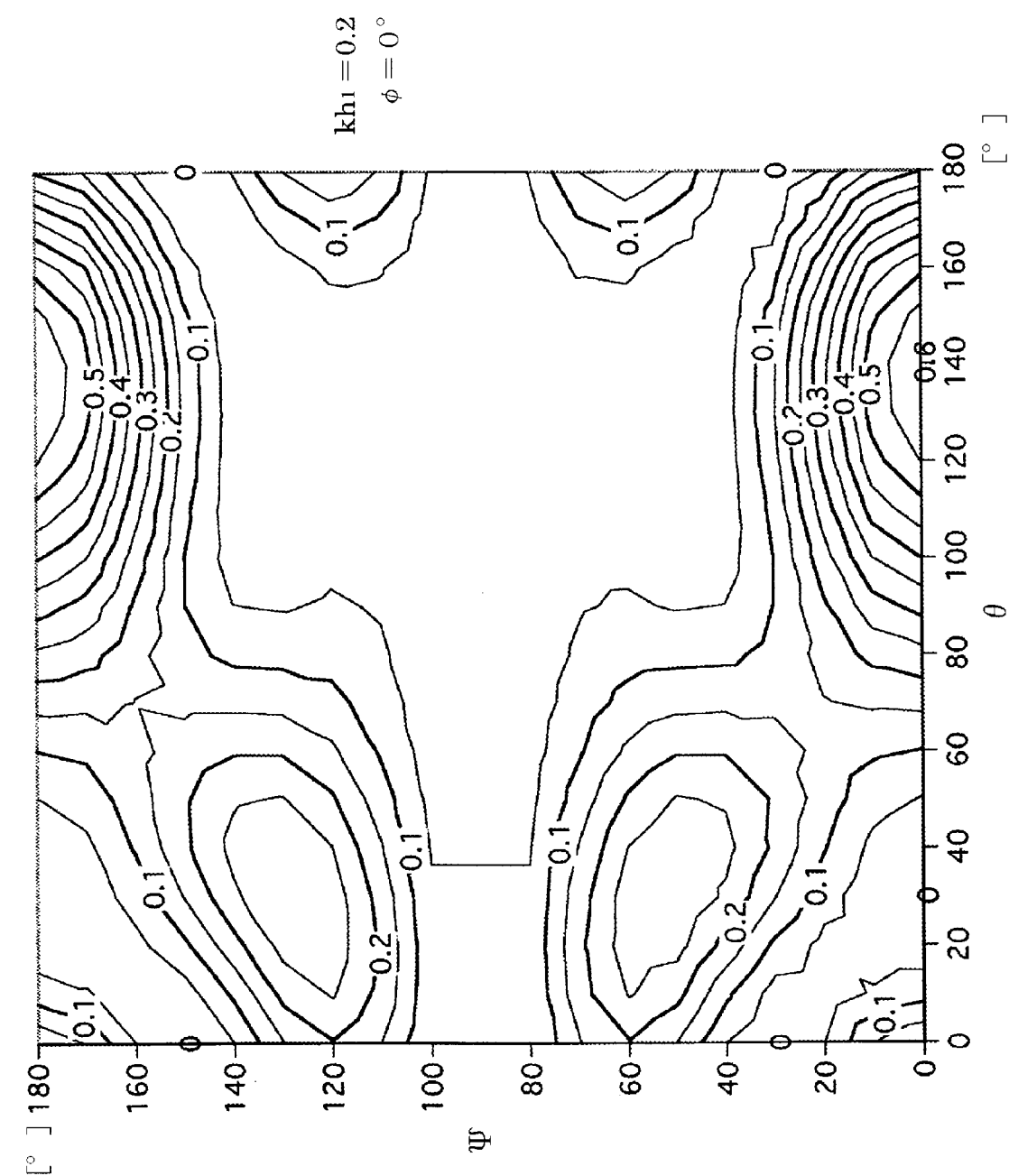
Figure 126:
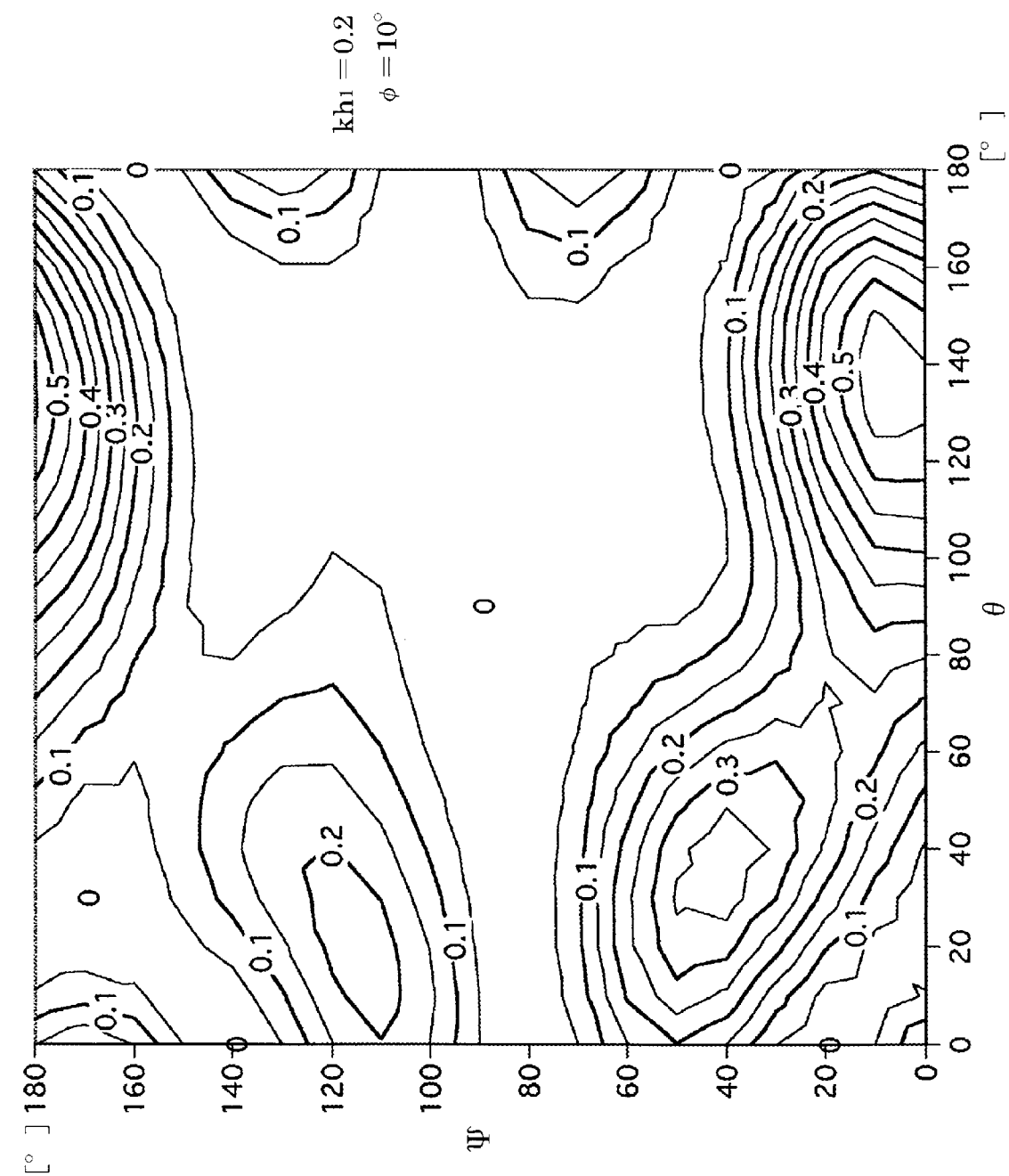
Figure 127:
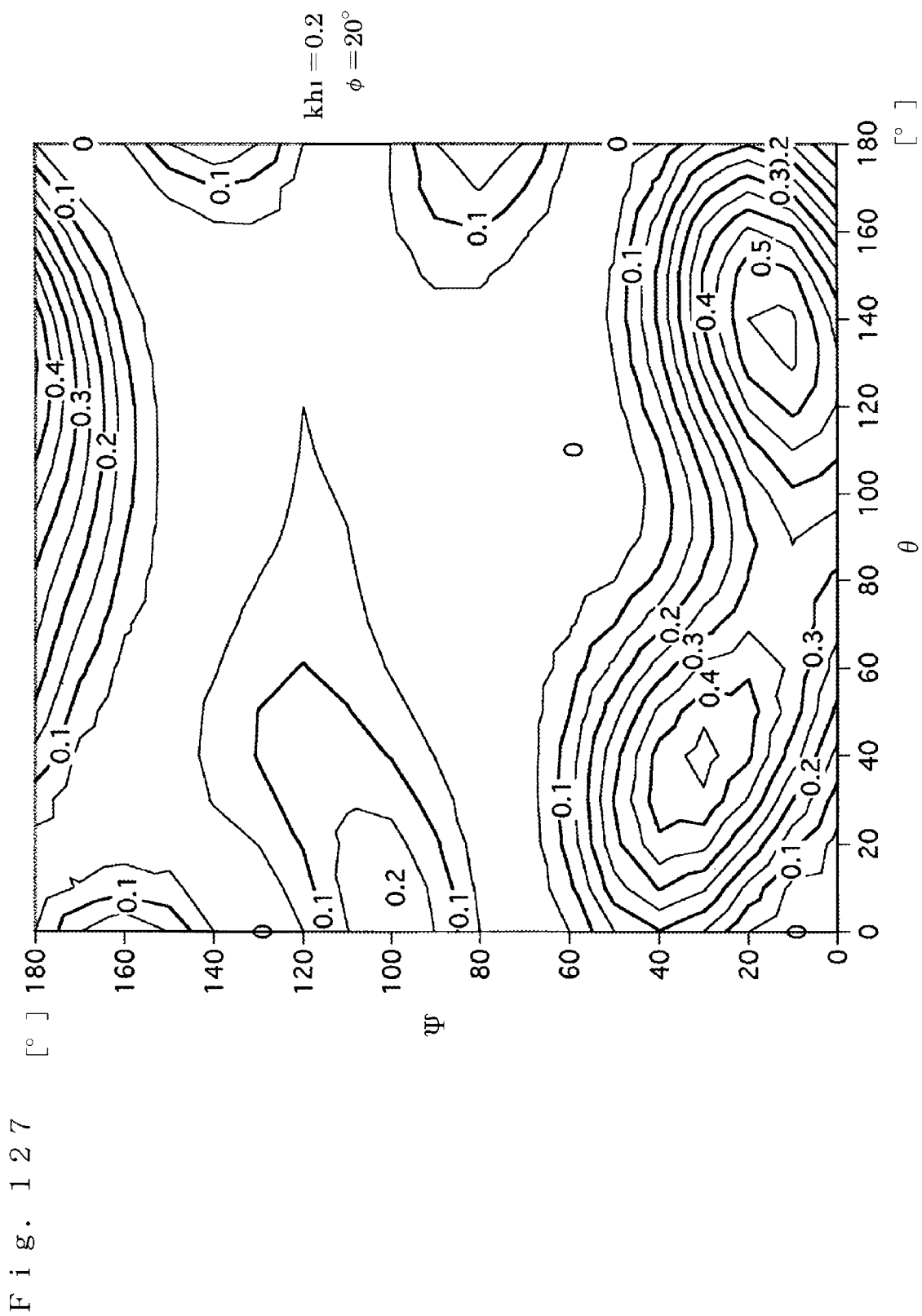
Figure 128:
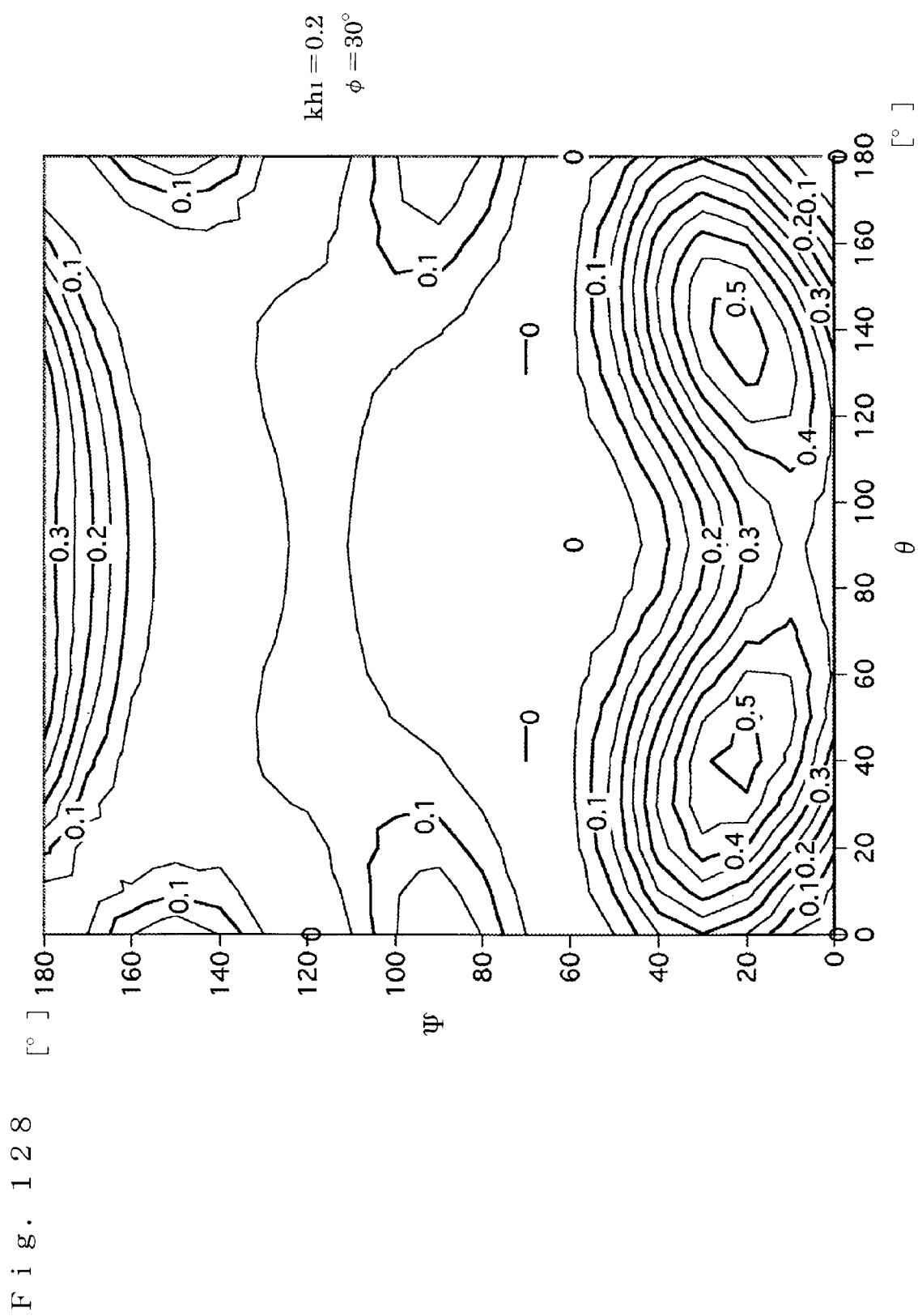
Figure 129:
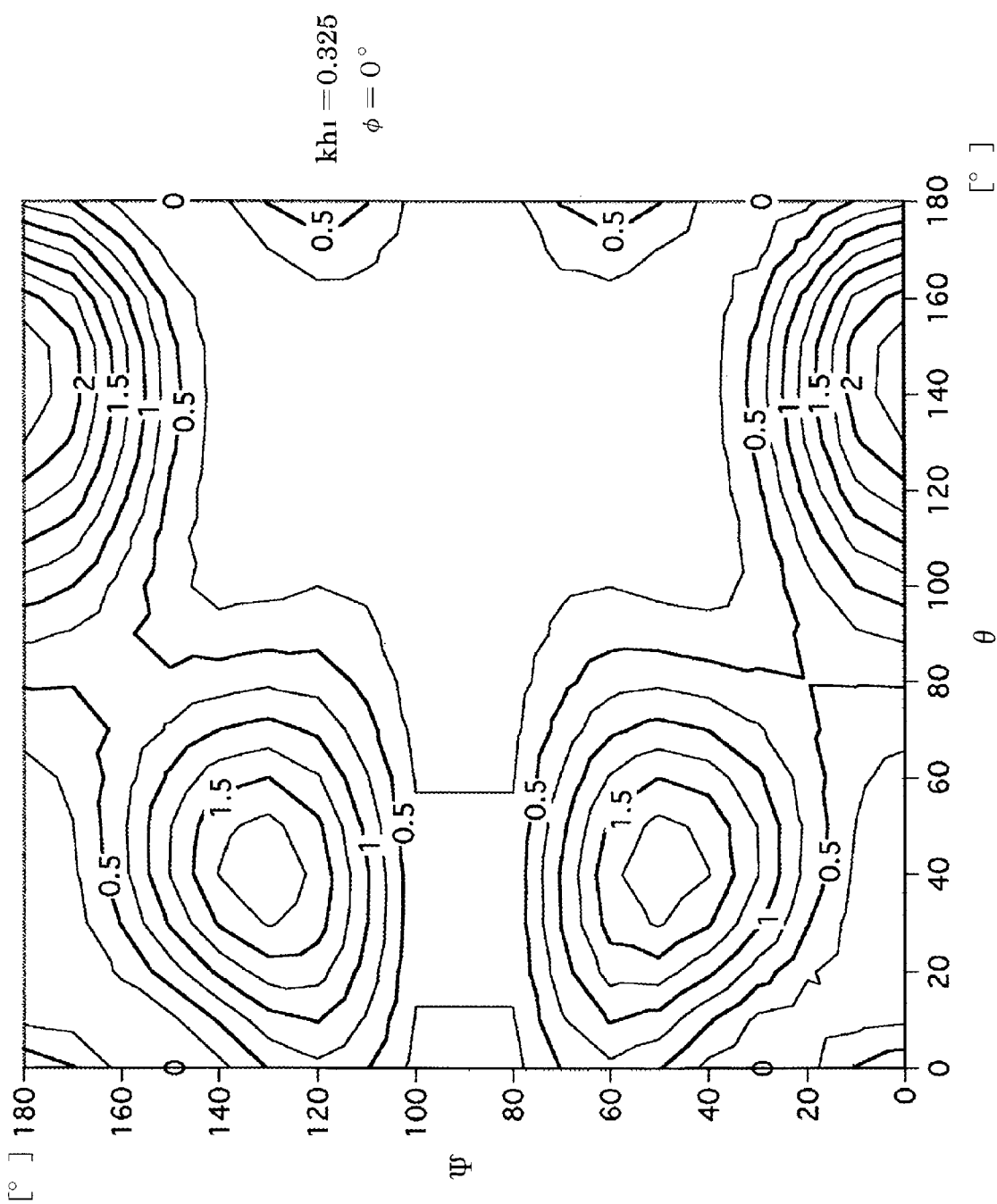
Figure 130:
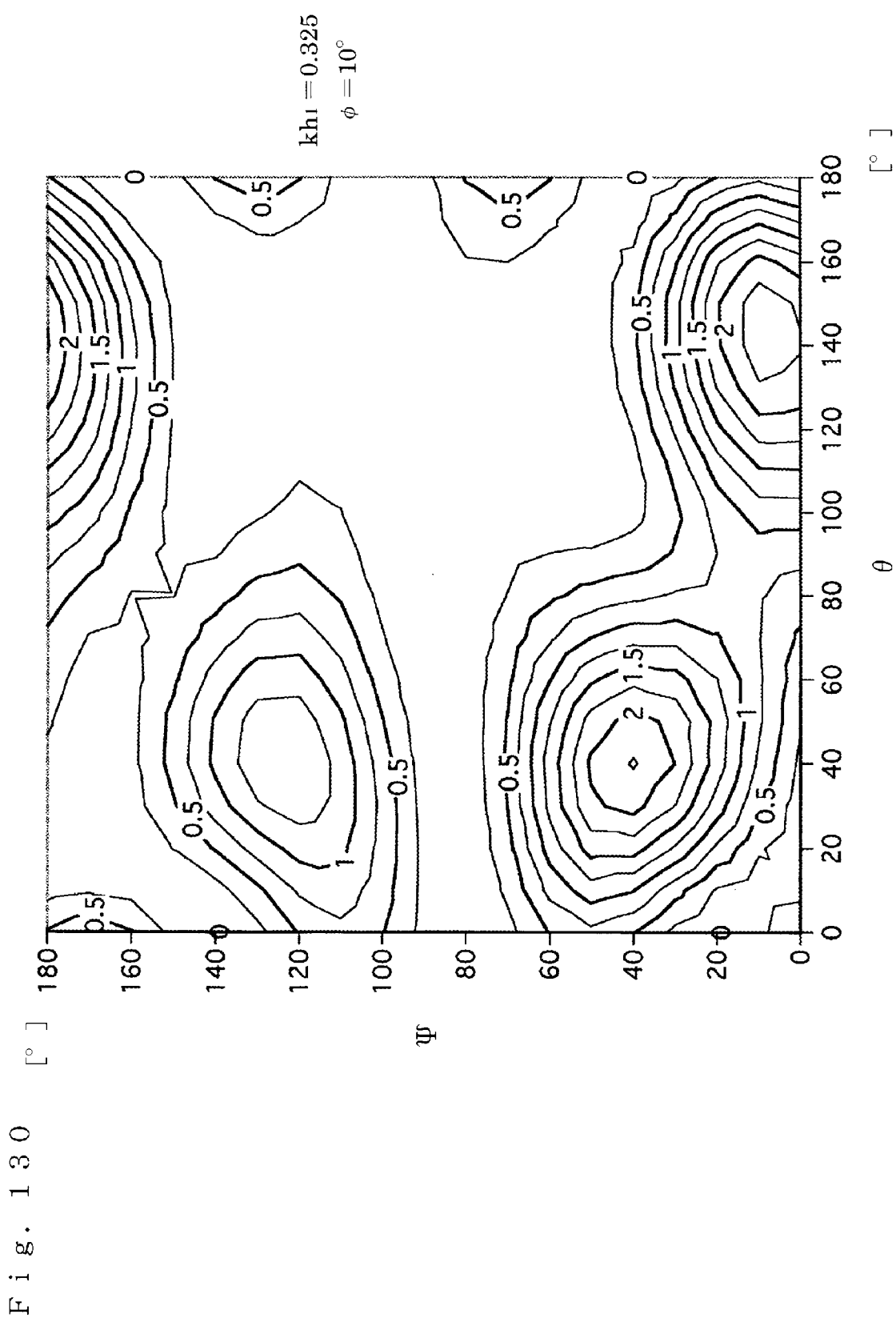
Figure 131:
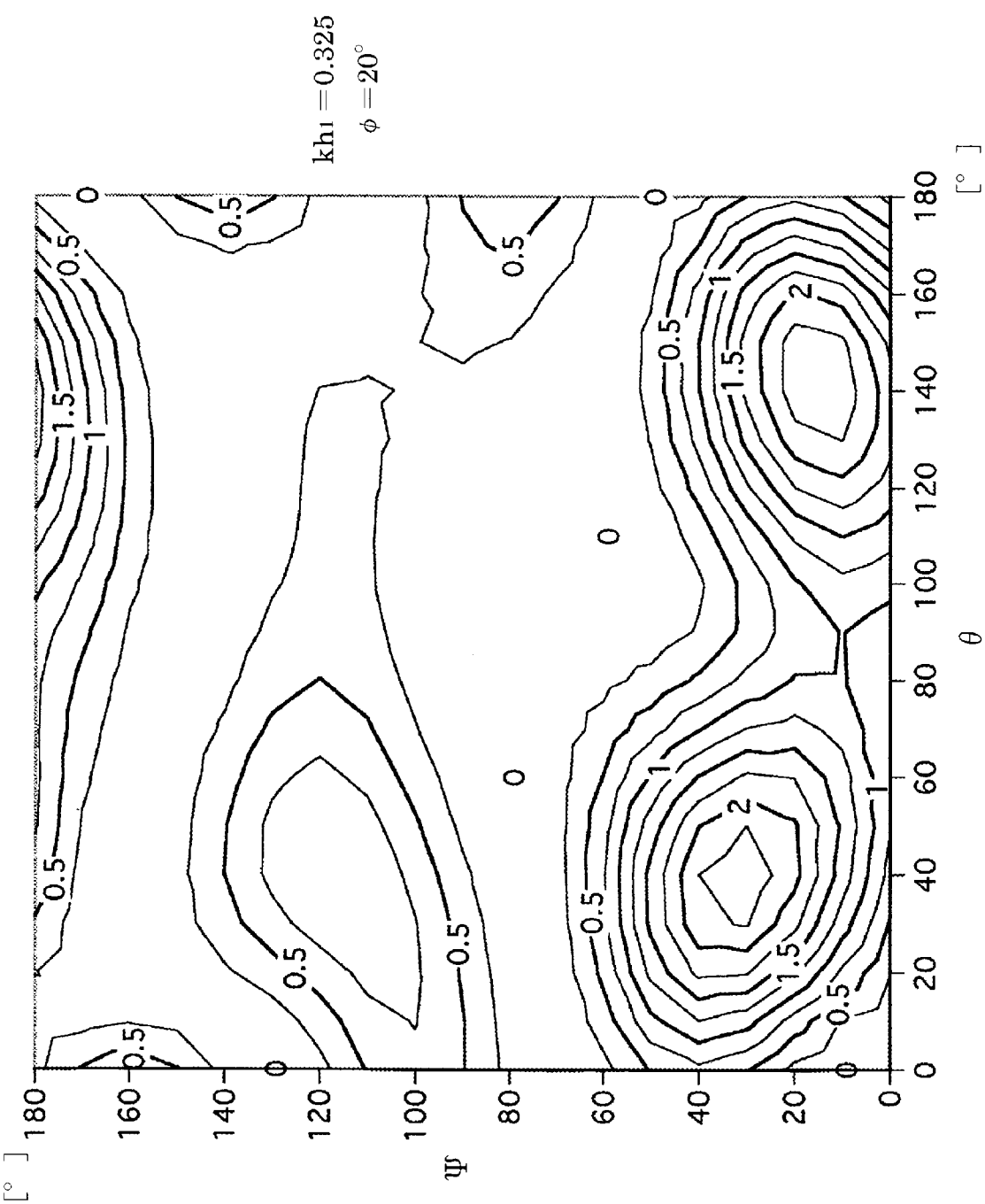

FIG. 108 is a sectional view showing the structure of an SAW device according to the seventh embodiment of the present invention. As shown in FIG. 108, the SAW device of the seventh embodiment comprises (a) diamond 100, (b) an interdigital transducer 400 formed on the diamond 100, and (c) a single crystal LiNbO³ layer 370 formed on the interdigital transducer 400.

The SAW device of the seventh embodiment uses an SAW in the 2nd-order mode.

The LiNbO$_3$ layer 370 is formed by bonding a cut single crystal LiNbO$_3$ thin plate to the diamond 100 having the interdigital transducer 400 formed on its polished surface, and then polishing the single crystal LiNbO$_3$ thin plate. As in the third embodiment, for the interdigital transducer 400, preferably, a recessed portion is formed in the diamond 100 by reactive ion etching, the interdigital transducer 400 is formed with Al or the le in this recessed portion, and the interface to the LiNbO$_3$ layer 370 is entirely flattened.

For the LiNbO$_3$ layer 370, a thickness $t_1$ [$\mu$m] and a crystal orientation ($\theta[°]$, $\Phi[°]$, $\psi[°]$) are selected from the following values. Note that $kh_1$ ($=2\pi(t_1/\lambda)$; $\lambda$=the wavelength [$\mu$m] of an SAW) is used instead of the thickness $t_1$, as in the first embodiment.

$15 \leq \Phi \leq 30$ on an orthogonal coordinate system ($kh_1,\theta,\psi$), values in the internal region of a hexahedron which has, as its opposing bottom surfaces, a planar rectangular region with its vertexes at points $A_{71}$ $B_{71}$ $C_{71}$ and $D_{71}$, and a planar rectangular region with its vertexes at points $A_{72}$ $B_{72}$ $C_{72}$ and $D_{72}$,
where point $A_{71}$=(0.85, 50, 160)
point $B_{71}$=(0.85, 100, 160)
point $C_{71}$=(0.85, 90, 170)
point $D_{71}$=(0.85, 50, 170)
point $A_{72}$=(1.1, 40, 150)
point $B_{72}$=(1.1, 140, 150)
point $C_{72}$=(1.1, 140, 180)
point $D_{72}$=(1.1, 40, 180).

In the structure of the SAW device according to the seventh embodiment, a propagation velocity V is exclusively determined by $kh_1$ of the LiNbO$_3$ layer 370, as in the second embodiment, as shown in FIG. 23. Therefore, it is confirmed that, when $kh_1$ is equal to or smaller than 1.1, a propagation velocity V equal to or higher than 8,000 m/s is ensured.

The present inventors set the thickness of the diamond 100 at 20 $\mu$m, and evaluated an electromechanical coupling coefficient $K^2$ while changing $kh_1$ within the above-described limitation for $kh_1$ and simultaneously changing the values $\theta$, $\Phi$, and $\psi$.

FIGS. 109 to 124 are graphs showing contour lines obtained upon evaluating the electromechanical coupling coefficient $K^2$ [%] under conditions that $kh_1$=0.6, 0.85, 1.1, and 1.6, $\Phi$=0°, 10°, 20°, and 30°, 0°$\leq\theta\leq$180°, and 0°$\leq\psi\leq$180°. Note that the values $\theta$ and $\psi$ are plotted in units of 10° in these graphs.

Regions for satisfying the electromechanical coupling coefficient $K^2$ of 10% or more are obtained from FIGS. 109 to 124. Taking the symmetry of the LiNbO$_3$ crystal into consideration, it is confirmed that, when the propagation velocity V is 8,000 m/s or more, and the electromechanical coupling coefficient $K^2$ is 10% or more, the four parameters $kh_1$, $\theta$, $\Phi$, and $\psi$ are set in the internal region of the hexahedron which is symmetric with the above hexahedron.

The present inventors evaluated an electromechanical coupling coefficient $K^2$ of an SAW device having the same structure as in the seventh embodiment and using the 1st-order mode while changing $kh_1$ and simultaneously changing the values $\theta$, $\Phi$, and $\psi$.

FIGS. 125 to 140 are graphs showing contour lines obtained upon evaluating the electromechanical coupling coefficient $K^2$ [%] under conditions that $kh_1$=0.2, 0.325, 0.6, and 0.7, $\Phi$=0°, 10°, 20°, and 30°, 0°$\leq\theta\leq$180°, and 0°$\leq\psi\leq$180°. Note that the values $\theta$ and $\psi$ are plotted in units of 10° in these graphs.

It is confirmed from FIGS. 125 to 140 that no region for satisfying the electromechanical coefficient $K^2 \geq 10\%$ is present.

In the above description and the claims, the embodiement are determined within 0°$\leq\Phi\leq$30°, 0°$\theta\leq$180°, and 0°$\leq\psi\leq$180°. Because of the symmetry of the LiNbO$_3$ crystall, it is obvious that there are many examples equivalent to those embodiements. For example, on the coordinate system ($\theta$, $\Phi$, $\psi$), the value (a, b, c) from 0$\leq$a$\leq$180, 0$\leq$b$\leq$30°, and 0$\leq$c$\leq$180 is one of the above embodiements, the values (a+180i, b+120j, c+180k), (180(1+i)−a, 60−b+120j, c+180k), (180(1+i)−a, b+60+120j, 180(1+k)−c) and (a+180i, 120−b+120j, 180(1+k)−c), wherein i=0 or 1, j=0, 1 or 2, k=0 or 1, are equivalent to the above embodiements and they also involved in the present invention.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 8-155024 (155024/1996) filed on Feb. 9, 1996 is hereby incorporated by reference.

What is claimed is:

1. A surface acoustic wave device comprising:

diamond;

a single crystal LiNbO$_3$ layer formed on a surface of said diamond; and an interdigital transducer formed on one of a surface of said LiNbO$_3$ layer and an interface between said diamond and said LiNbO$_3$ layer, wherein a crystal orientation of said LiNbO$_3$ layer with respect to an exposed surface of said LiNbO$_3$ layer and a propagation direction of a surface acoustic wave, and a ratio of a thickness of said LiNbO$_3$ layer to a wavelength of the surface acoustic wave to be used are selected such that a velocity of the surface acoustic wave to be used becomes 8,000 m/s and an electromechanical coupling coefficient becomes not less than 10%; and wherein said device comprises said diamond, a short-circuit electrode formed on said diamond, said single crystal LiNbO$_3$ layer formed on said short-circuit electrode, and said interdigital transducer formed on said LiNbO$_3$ layer, and uses a surface acoustic wave (wavelength: $\lambda[\mu m]$) in the $1^{st}$-order mode, when an Eulerian angle representation on an orthogonal coordinate system (X,Y,Z) in which a Z-axis is set along a normal direction of said exposed surface of said LiNbO$_3$ layer, and an X-axis is set along the propagation direction of the surface acoustic wave is represented by ($\theta[°]$, $\Phi[°]$, $\psi[°]$) with respect to a crystallographic fundamental coordinate system (x,y,z) of said LiNbO$_3$ layer, the thickness of said LiNbO$_3$ layer is $t_1$ [$\mu$m], and $kh_1$=$2\pi(t_1/\lambda)$, the values $kh_1$, $\theta$, and $\psi$ are selected from, on an orthogonal coordinate system ($kh_1$ $\theta$, $\psi$), values in internal region of a hexahedron which has, as its opposing bottom surfaces, a planar rectangular region with its vertices at points $A_{11}$ $B_{11}$ $C_{11}$ and $D_{11}$, and a planar rectangular region with its vertices at points $A_{12}$ $B_{12}$ $C_{12}$ and $D_{12}$, where point $A_{11}=(0.45,80,140)$
point $B_{11}=(0.45,100,140)$
point $C_{11}=(0.45,100,180)$
point $D_{11}=(0.45,80,180)$
point $A_{12}=(0.7,70,120)$
point $B_{12}=(0.7,110,120)$
point $C_{12}=(0.7,110,180)$
point $D_{12}=(0.7,60,180)$, and on the orthogonal coordinate system ($kh_1$ θ, ψ), values in internal region of a hexahedron which has, as its opposing bottom surfaces, a planar rectangular region with its vertices at points $A_{13}$ $B_{13}$ $C_{13}$ and $D_{13}$, and a planar rectangular region with its vertices at points $A_{14}$ $B_{14}$ $C_{14}$ and $D_{14}$, where point $A_{13}=(0.45,80,0)$
point $B_{13}=(0.45,90,0)$
point $C_{13}=(0.45,90,10)$
point $D_{13}=(0.45,80,20)$
point $A_{14}=(0.7,60,0)$
point $B_{14}=(0.7,110,0)$
point $C_{14}=(0.7,90,40)$
point $D_{14}=(0.7,80,40)$.

2. A device according to claim 1, wherein said diamond is a diamond layer formed on a base material, and when a thickness of said diamond layer is $t_2$ [μm], and $kh_2=2\pi(t_2/\lambda)$, the following relation is satisfied:

$kh_2 \geq 4$.

3. A surface acoustic wave device comprising:

diamond;

a single crystal $LiNbO_3$ layer formed on a surface of said diamond; and an interdigital transducer formed on one of a surface of said $LiNbO_3$ layer and an interface between said diamond and said $LiNbO_3$ layer, wherein a crystal orientation of said $LiNbO_3$ layer with respect to an exposed surface of said $LiNbO_3$ layer and a propagation direction of a surface acoustic wave, and a ratio of a thickness of said $LiNbO_3$ layer to a wavelength of the surface acoustic wave to be used are selected such that a velocity of the surface acoustic wave to be used becomes 8,000 m/s and an electromechanical coupling coefficient becomes not less than 10%; and wherein said device comprises said diamond, a short-circuit electrode formed on said diamond, said single crystal $LiNbO_3$ layer formed on said short-circuit electrode, and said interdigital transducer formed on said $LiNbO_3$ layer, and uses a surface acoustic wave (wavelength: λ[μm]) in the 2nd-order mode, when an Eulerian angle representation on an orthogonal coordinate system (X,Y,Z) in which a Z-axis is set along a normal direction of said exposed surface of said $LiNbO_3$ layer, and an X-axis is set along the propagation direction of the surface acoustic wave is represented by (θ[°], Φ[°], ψ[°]) with respect to a crystallographic fundamental coordinate system (x,y,z) of said $LiNbO_3$ layer, the thickness of said $LiNbO_3$ layer is $t_1$ [μm], and $kh_1=2\pi(t_1/\lambda)$, the values $kh_1$, θ, and ψ are selected from, $0 \leq \Phi \leq 15$ on an orthogonal coordinate system ($kh_1$ θ, ψ), values in internal region of a hexahedron which has, as its opposing bottom surfaces, a planar rectangular region with its vertices at points $A_{21}$ $B_{21}$ $C_{21}$ and $D_{21}$, and a planar rectangular region with its vertices at points $A_{22}$ $B_{22}$ $C_{22}$ and $D_{22}$, where point $A_{21}=(0.6,60,40)$
point $B_{21}=(0.6,110,40)$
point $C_{21}=(0.6,110,120)$
point $D_{21}=(0.6,60,120)$
point $A_{22}=(0.85,50,70)$
point $B_{22}=(0.85,130,0)$
point $C_{22}=(0.85,130,180)$
point $D_{22}=(0.85,50,100)$, $0 \leq \Phi \leq 15$ on the orthogonal coordinate system ($kh_1$ θ, ψ), values in internal region of a hexahedron which has, as its opposing bottom surfaces, the planar rectangular region with its vertices at the points $A_{22}$ $B_{22}$ $C_{22}$ and $D_{22}$, and a planar rectangular region with its vertices at points $A_{23}$ $B_{23}$ $C_{23}$ and $D_{23}$, where point $A_{26}=(1.1,40,60)$
point $B_{23}=(1.1,140,0)$
point $C_{23}=(1.1,140,180)$
point $D_{23}=(1.1,40,110)$, $15 \leq \Phi \leq 30$ on the orthogonal coordinate system ($kh_1$ θ, ψ), values in internal region of a hexahedron which has, as its opposing bottom surfaces, a planar rectangular region with its vertices at points $A_{24}$ $B_{24}$ $C_{24}$ and $D_{24}$, and a planar rectangular region with its vertices at points $A_{25}$ $B_{25}$ $C_{25}$ and $D_{25}$, where point $A_{24}=(0.6,60,30)$
point $B_{24}=(0.6,120,30)$
point $C_{24}=(0.6,120,100)$
point $D_{24}=(0.6,60,100)$
point $A_{25}=(0.85,50,30)$
point $B_{25}=(0.85,130,30)$
point $C_{25}=(0.85,130,110)$
point $D_{25}=(0.85,50,110)$, and $15 \leq \Phi \leq 30$ on the orthogonal coordinate system ($kh_1$ θ, ψ), values in internal region of a hexahedron which has, as its opposing bottom surfaces, the planar rectangular region with its vertices at the points $A_{25}$ $B_{25}$ $C_{25}$ and $D_{25}$, and a planar rectangular region with its vertices at points $A_{26}$ $B_{26}$ $C_{26}$ and $D_{26}$, where point $A_{26}=(1.1,40,30)$
point $B_{26}=(1.1,140,30)$
point $C_{26}=(1.1,140,120)$
point $D_{26}=(1.1,40,120)$.

4. A device according to claim 3, wherein said diamond is a diamond layer formed on a base material, and when a thickness of said diamond layer is $t_2$ [μm], and $kh_2=2\pi(t_2/\lambda)$, the following relation is satisfied:

$kh_2 \geq 4$.

5. A surface acoustic wave device comprising:

diamond;

a single crystal $LiNbO_3$ layer formed on a surface of said diamond; and an interdigital transducer formed on one of a surface of said $LiNbO_3$ layer and an interface between said diamond and said $LiNbO_3$ layer, wherein a crystal orientation of said $LiNbO_3$ layer with respect to an exposed surface of said $LiNbO_3$ layer and a propagation direction of a surface acoustic wave, and a ratio of a thickness of said LiNbO$_3$ layer to a wavelength of the surface acoustic wave to be used are selected such that a velocity of the surface acoustic wave to be used becomes 8,000 m/s and an electromechanical coupling coefficient becomes not less than 10%; and wherein said device comprises said diamond, said interdigital transducer formed on said diamond, said single crystal LiNbO$_3$ layer formed on said Interdigital transducer, and a short-circuit electrode formed on said LiNbO$_3$ layer, and uses a surface acoustic wave (wavelength: λ[μm]) in the 1st-order mode, when an Eulerian angle representation on an orthogonal coordinate system (X,Y,Z) in which a Z-axis is set along a normal direction of said exposed surface of said LiNbO$_3$ layer, and an X-axis is set along the propagation direction of the surface acoustic wave is represented by (θ[°], Φ[°], ψ[°]) with respect to a crystallographic fundamental coordinate system (x,y,z) of said LiNbO$_3$ layer, the thickness of said LiNbO$_3$ layer is $t_1$ [μm], and $kh_1=2\pi(t_1/\lambda)$, the values $kh_1$, θ, and ψ are selected from, $0 \leq \Phi \leq 15$ on an orthogonal coordinate system ($kh_1$, θ, ψ), values in internal region of a quadrangular pyramid which has its vertex at a point $P_{31}$ and, as its bottom surface, a planar rectangular region with its vertices at points $A_{31}$ $B_{31}$ $C_{31}$ and $D_{31}$, where
point $P_{31}$=(0.45,90,150)
point $A_{31}$=(0.7,70,130)
point $B_{31}$=(0.7,90,130)
point $C_{31}$=(0.7,90,180)
point $D_{31}$=(0.7,70,180), and $15 \leq \Phi \leq 30$ on an orthogonal coordinate system ($kh_1$ θ, ψ), values in internal region of a hexahedron which has, as its opposing bottom surfaces, a planar rectangular region with its vertices at points $A_{32}$ $B_{32}$ $C_{32}$ and $D_{32}$, and a planar rectangular region with its vertices at points $A_{33}$ $B_{33}$ $C_{33}$ and $D_{33}$, where
point $A_{32}$=(0.45,80,130)
point $B_{32}$=(0.45,100,130)
point $C_{32}$=(0.45,100,150)
point $D_{32}$=(0.45,80,150)
point $A_{33}$=(0.7,70,120)
point $B_{33}$=(0.7,110,120)
point $C_{33}$=(0.7,110,160)
point $D_{33}$=(0.7,70,160).

6. A device according to claim 5, wherein said diamond is a diamond layer formed on a base material, and when a thickness of said diamond layer is $t_2$ [μm], and $kh_2=2\pi(t_2/\lambda)$, the following relation is satisfied:

$kh_2 \geq 4$.

7. A surface acoustic wave device comprising:

diamond;

a single crystal LiNbO$_3$ layer formed on a surface of said diamond; and an interdigital transducer formed on one of a surface of said LiNbO$_3$ layer and an interface between said diamond and said LiNbO$_3$ layer, wherein a crystal orientation of said LiNbO$_3$ layer with respect to an exposed surface of said LiNbO$_3$ layer and a propagation direction of a surface acoustic wave, and a ratio of a thickness of said LiNbO$_3$ layer to a wavelength of the surface acoustic wave to be used are selected such that a velocity of the surface acoustic wave to be used becomes 8,000 m/s and an electromechanical coupling coefficient becomes not less than 10%; and wherein said device comprises said diamond, said interdigital transducer formed on said diamond, said single crystal LiNbO$_3$ layer formed on said interdigital transducer, and a short-circuit electrode formed on said LiNbO$_3$ layer, and uses a surface acoustic wave (wavelength: λ[μm]) in the $2^{nd}$-order mode, when an Eulerian angle representation on an orthogonal coordinate system (X,Y,Z) in which a Z-axis is set along a normal direction of said exposed surface of said LiNbO$_3$ layer, and an X-axis is set along the propagation direction of the surface acoustic wave is represented by (θ[°], Φ[°], ψ[°]) with respect to a crystallographic fundamental coordinate system (x,y,z) of said LiNbO$_3$ layer, the thickness of said LiNbO$_3$ layer is $t_1$ [μm], and $kh_1=2\pi(t_1/\lambda)$, the values $kh_1$, θ, and ψ are selected from, $0 \leq \Phi \leq 15$ on an orthogonal coordinate system ($kh_1$,θ,ψ), values in internal regions of a hexahedron which has, as its opposing bottom surfaces, a planar rectangular region with its vertices at points $A_{41}$ $B_{41}$ $C_{41}$ and $D_{41}$, and a planar rectangular region with its vertices at points $A_{42}$ $B_{42}$ $C_{42}$ and $D_{42}$, where
point $A_{41}$=(0.6,70,40)
point $B_{41}$=(0.6,100,40)
point $C_{41}$=(0.6,100,110)
point $D_{41}$=(0.6,70,110)
point $A_{42}$=(0.85,70,60)
point $B_{42}$=(0.85,120,0)
point $C_{42}$=(0.85,120,180)
point $D_{42}$=(0.85,70,100), $0 \leq \Phi \leq 15$ on the orthogonal coordinate system ($kh_1$,θ,ψ), values in internal region of a hexahedrons which has, as its opposing bottom surfaces, the planar rectangular region with its vertices at the points $A_{42}$ $B_{42}$ $C_{42}$ and $D_{42}$, and a planar rectangular region with its vertices at points $A_{43}$ $B_{43}$ $C_{43}$ and $D_{43}$, where
point $A_{43}$=(1.1,90,0)
point $B_{43}$=(1.1,130,0)
point $C_{43}$=(1.1,130,180)
point $D_{43}$=(1.1,90,180), $15 \leq \Phi \leq 30$ on the orthogonal coordinate system ($kh_1$,θ, ψ), values in internal region of a hexahedron which has, as its opposing bottom surfaces, a planar rectangular region with its vertices at points $A_{44}$ $B_{44}$ $C_{44}$ and $D_{44}$, and a planar rectangular region with its vertices at points $A_{45}$ $B_{45}$ $C_{45}$ and $D_{45}$, where
point $A_{44}$=(0.6,70,20)
point $B_{44}$=(0.6,110,20)
point $C_{44}$=(0.6,100,90)
point $D_{44}$=(0.6,70,90)
point $A_{45}$=(0.85,60,10)
point $B_{45}$=(0.85,120,10)
point $C_{45}$=(0.85,120,90)
point $D_{45}$=(0.85,60,90), and $15 \leq \Phi \leq 30$ on the orthogonal coordinate system ($kh_1$,θ, ψ), values in internal region of a hexahedron which has, as its opposing bottom surfaces, the planar rectangular region with its vertices at the points $A_{45}$ $B_{45}$ $C_{45}$ and $D_{45}$, and a planar rectangular region with its vertices at points $A_{46}$ $B_{46}$ $C_{46}$ and $D_{46}$, where
 point $A_{46}=(1.1,80,10)$
 point $B_{46}=(1.1,120,10)$
 point $C_{46}=(1.1,130,80)$
 point $D_{46}=(1.1,50,80)$.

8. A device according to claim 7, wherein said diamond is a diamond layer formed on a base material, and when a thickness of said diamond layer is $t_2$ [μm], and $kh_2=2\pi(t_2/\lambda)$, the following relation is satisfied:

$kh_2 \geq 4$.

9. A surface acoustic wave device comprising;

diamond;

a single crystal $LiNbO_3$ layer formed on a surface of said diamond; and an interdigital transducer formed on one of a surface of said $LiNbO_3$ layer and an interface between said diamond and said $LiNbO_3$ layer, wherein a crystal orientation of said $LiNbO_3$ layer with respect to an exposed surface of said $LiNbO_3$ layer and a propagation direction of a surface acoustic wave, and a ratio of a thickness of said $LiNbO_3$ layer to a wavelength of the surface acoustic wave to be used are selected such that a velocity of the surface acoustic wave to be used becomes 8,000 m/s and an electromechanical coupling coefficient becomes not less than 10%; and wherein said device comprises said diamond, said single crystal $LiNbO_3$ layer formed on said diamond, and said interdigital transducer formed on said $LiNbO_3$ layer, and uses a surface acoustic wave (wavelength: $\lambda$[μm]) in the $1^{st}$-order mode, when an Eulerian angle representation on an orthogonal coordinate system (X,Y,Z) in which a Z-axis is set along a normal direction of said exposed surface of said $LiNbO_3$ layer, and an X-axis is set along the propagation direction of the surface acoustic wave is represented by ($\theta[°]$, $\Phi[°]$, $\psi[°]$) with respect to a crystallographic fundamental coordinate system (x,y,z) of said $LiNbO_3$ layer, the thickness of said $LiNbO_3$ layer is $t_1$ [μm], and $kh_1=2\pi(t_1/\lambda)$, the values $kh_1$, $\theta$, and $\psi$ are selected from, on an orthogonal coordinate system ($kh_1,\theta,\psi$), values in internal region of a quadrangular pyramid which has its vertex at a point $P_{51}$ and, as its bottom surface, a planar rectangular region with its vertices at points $A_{51}$ $B_{51}$ $C_{51}$ and $D_{51}$, where
 point $P_{51}=(0.6,90,0)$
 point $A_{51}=(0.7,80,0)$
 point $B_{51}=(0.7,110,0)$
 point $C_{51}=(0.7,110,10)$
 point $D_{51}=(0.7,80,10)$, and on the orthogonal coordinate system ($kh_1,\theta,\psi$), values in internal region of a quadrangular pyramid which has its vertex at a point $P_{52}$ and, as its bottom surface, a planar rectangular region with its vertices at points $A_{52}$ $B_{52}$ $C_{52}$ and $D_{52}$, where
 point $P_{52}=(0.6,100,0)$
 point $A_{52}=(0.7,90,170)$
 point $B_{52}=(0.7,100,170)$
 point $C_{52}=(0.7,110,180)$
 point $D_{52}=(0.7,80,180)$.

10. A device according to claim 9, wherein said diamond is a diamond layer formed on a base material, and when a thickness of said diamond layer is $t_2$ [μm], and $kh_2=2\pi(t_2/\lambda)$, the following relation is satisfied:

$kh_2 \geq 4$.

11. A surface acoustic wave device comprising:

diamond;

a single crystal $LiNbO_3$ layer formed on a surface of said diamond; and an interdigital transducer formed on one of a surface of said $LiNbO_3$ layer and an interface between said diamond and said $LiNbO_3$ layer, wherein a crystal orientation of said $LiNbO_3$ layer with respect to an exposed surface of said $LiNbO_3$ layer and a propagation direction of a surface acoustic wave, and a ratio of a thickness of said $LiNbO_3$ layer to a wavelength of the surface acoustic wave to be used are selected such that a velocity of the surface acoustic wave to be used becomes 8,000 m/s and an electromechanical coupling coefficient becomes not less than 10%; and wherein said device comprises said diamond, said single crystal $LiNbO_3$ layer formed on said diamond, and said interdigital transducer formed on said $LiNbO_3$ layer, and uses a surface acoustic wave (wavelength: $\lambda$[μm]) in the $2^{nd}$-order mode, when an Eulerian angle representation on an orthogonal coordinate system (X,Y,Z) in which a Z-axis is set along a normal direction of said exposed surface of said $LiNbO_3$ layer, and an X-axis is set along the propagation direction of the surface acoustic wave is represented by ($\theta[°]$, $\Phi[°]$, $\psi[°]$) with respect to a crystallographic fundamental coordinate system (x,y,z) of said $LiNbO_3$ layer, the thickness of said $LiNbO_3$ layer is $t_1$ [μm], and $kh_1=2\pi(t_1/\lambda)$, the values $kh_1$, $\theta$, and $\psi$ are selected from, $0 \leq \Phi \leq 15$ on an orthogonal coordinate system ($kh_1,\theta,\psi$), values in internal region of a hexahedron which has, as its opposing bottom surfaces, a planar rectangular region with its vertices at points $A_{61}$ $B_{61}$ $C_{61}$ and $D_{61}$, and a planar rectangular region with its vertices at points $A_{62}$ $B_{62}$ $C_{62}$ and $D_{62}$, where
 point $A_{61}=(0.85,140,40)$
 point $B_{61}=(0.85,160,40)$
 point $C_{61}=(0.85,160,60)$
 point $D_{61}=(0.85,140,60)$
 point $A_{62}=(1.1,120,30)$
 point $B_{62}=(1.1,170,30)$
 point $C_{62}=(1.1,170,70)$
 point $D_{62}=(1.1,120,70)$, $0 \leq \Phi \leq 15$ on the orthogonal coordinate system ($kh_1,\theta,\psi$), values in internal region of a hexahedron which has, as its opposing bottom surfaces, a planar rectangular region with its vertices at points $A_{63}$ $B_{63}$ $C_{63}$ and $D_{63}$, and a planar rectangular region with its vertices at points $A_{64}$ $B_{64}$ $C_{64}$ and $D_{64}$, where
 point $A_{63}=(0.85,130,130)$
 point $B_{63}=(0.85,160,130)$
 point $C_{63}=(0.85,160,150)$
 point $D_{63}=(0.85,130,150)$
 point $A_{64}=(1.1,100,140)$
 point $B_{64}=(1.1,140,100)$ point $C_{64}$=(1.1,160,160)
point $D_{64}$=(1.1,130,160),
$0 \leq \Phi \leq 15$ on the orthogonal coordinate system $(kh_1,\theta,\psi)$, values in internal region of a quadrangular pyramid which has its vertex at a point $P_{65}$ and, as its bottom surface, a planar rectangular region with its vertices at points $A_{65}$ $B_{65}$ $C_{65}$ and $D_{65}$,
where
point $P_{65}$=(0.85,30,90)
point $A_{65}$=(1.1,20,70)
point $B_{65}$=(1.1,40,70)
point $C_{65}$=(1.1,40,110)
point $D_{65}$=(1.1,20,110),
$15 \leq \Phi \leq 30$ on the orthogonal coordinate system $(kh_1,\theta,\psi)$, values in internal region of a hexahedron which has, as its opposing bottom surfaces, a planar rectangular region with its vertices at points $A_{66}$ $B_{66}$ $C_{66}$ and $D_{66}$, and a planar rectangular region with its vertices at points $A_{67}$ $B_{67}$ $C_{67}$ and $D_{67}$,
where
point $A_{66}$=(0.6,20,150)
point $B_{66}$=(0.6,40,150)
point $C_{66}$=(0.6,40,170)
point $D_{66}$=(0.6,20,170)
point $A_{67}$=(0.85,50,130)
point $B_{67}$=(0.85,70,140)
point $C_{67}$=(0.85,50,160)
point $D_{67}$=(0.85,20,160),
$15 \leq \Phi \leq 30$ on the orthogonal coordinate system $(kh_1,\theta,\psi)$, values in internal region of a hexahedron which has, as its opposing bottom surfaces, the planar rectangular region with its vertices at the points $A_{67}$ $B_{67}$ $C_{67}$ and $D_{67}$, and a planar rectangular region with its vertices at points $A_{68}$ $B_{68}$ $C_{68}$ and $D_{68}$,
where
point $A_{68}$=(1.1,40,120)
point $B_{68}$=(1.1,90,120)
point $C_{68}$=(1.1,90,160)
point $D_{68}$=(1.1,40,160),
$15 \leq \Phi \leq 30$ on the orthogonal coordinate system $(kh_1,\theta,\psi)$, values in internal region of a hexahedron which has, as its opposing bottom surfaces, a planar rectangular region with its vertices at points $A_{69}$ $B_{69}$ $C_{69}$ and $D_{69}$, and a planar rectangular region with its vertices at points $A_{6A}$ $B_{6A}$ $C_{6A}$ and $D_{6A}$,
where
point $A_{69}$=(0.6,140,150)
point $B_{69}$=(0.6,160,150)
point $C_{69}$=(0.6,160,160)
point $D_{69}$=(0.6,140,160)
point $A_{6A}$=(0.85,100,140)
point $B_{6A}$=(0.85,130,130)
point $C_{6A}$=(0.85,160,160)
point $D_{6A}$=(0.85,130,160),
$15 \leq \Phi \leq 30$ on the orthogonal coordinate system $(kh_1,\theta,\psi)$, values in internal region of a hexahedron which has, as its opposing bottom surfaces, the planar rectangular region with its vertices at the points $A_{6A}$ $B_{6A}$ $C_{6A}$ and $D_{6A}$, and a planar rectangular region with its vertices at points $A_{6B}$ $B_{6B}$ $C_{6B}$ and $D_{6B}$,
where
point $A_{6B}$=(1.1,100,120)
point $B_{6B}$=(1.1,150,120)
point $C_{6B}$=(1.1,150,160)
point $D_{6B}$=(1.1,100,160),
$15 \leq \Phi \leq 30$ on the orthogonal coordinate system $(kh_1,\theta,\psi)$, values in internal region of a hexahedron which has, as its opposing bottom surfaces, a planar rectangular region with its vertices at points $A_{6C}$ $B_{6C}$ $C_{6C}$ and $D_{6C}$, and a planar rectangular region with its vertices at points $A_{6D}$ $B_{6D}$ $C_{6D}$ and $D_{6D}$,
where
point $A_{6C}$=(0.85,150,50)
point $B_{6C}$=(0.85,160,50)
point $C_{6C}$=(0.85,160,60)
point $D_{6C}$=(0.85,150,60)
point $A_{6D}$=(1.1,130,40)
point $B_{6D}$=(1.1,160,40)
point $C_{6D}$=(1.1,160,90)
point $D_6D$=(1.1,130,90), and
$15 \leq \Phi \leq 30$ on the orthogonal coordinate system $(kh_1,\theta,\psi)$, values in internal region of a quadrangular pyramid which has its vertex at a point $P_{6E}$ and, as its bottom surface, a planar rectangular region with its vertices at points $A_{6E}$ $B_{6E}$ $C_{6E}$ and $D_{6E}$,
where
point $P_{6E}$=(0.85,30,70)
point $A_{6E}$=(1.1,20,50)
point $B_{6E}$=(1.1,40,50)
point $C_{6E}$=(1.1,40,90)
point $D_{6E}$=(1.1,20,90).

12. A device according to claim 11, wherein said diamond is a diamond layer formed on a base material, and when a thickness of said diamond layer is $t_2$ [$\mu$m], and $kh_2 = 2\pi(t_2/\lambda)$, the following relation is satisfied:

$kh_2 \geq 4$.

13. A surface acoustic wave device comprising:

diamond;

a single crystal LiNbO$_3$ layer formed on a surface of said diamond; and an interdigital transducer formed on one of a surface of said LiNbO$_3$ layer and an interface between said diamond and said LiNbO$_3$ layer, wherein a crystal orientation of said LiNbO$_3$ layer with respect to an exposed surface of said LiNbO$_3$ layer and a propagation direction of a surface acoustic wave, and a ratio of a thickness of said LiNbO$_3$ layer to a wavelength of the surface acoustic wave to be used are selected such that a velocity of the surface acoustic wave to be used becomes 8,000 m/s and an electromechanical coupling coefficient becomes not less than 10%; and wherein said device comprises said diamond, said interdigital transducer formed on said diamond, and said single crystal LiNbO$_3$ layer formed on said interdigital transducer, and uses a surface acoustic wave (wavelength: $\lambda$[$\mu$m]) in the $2^{nd}$-order mode, when an Eulerian angle representation on an orthogonal coordinate system (X,Y,Z) in which a Z-axis is set along a normal direction of said exposed surface of said LiNbO$_3$ layer, and an X-axis is set along the propagation direction of the surface acoustic wave is represented by ($\theta$[°], $\Phi$[°], $\psi$[°]) with respect to a crystallographic fundamental coordinate system (x,y,z) of said LiNbO$_3$ layer, the thickness of said LiNbO$_3$ layer is $t_1$ [$\mu$m], and $kh_1 = 2\pi(t_1/\lambda)$, the values $kh_1$, $\psi$, and $\theta$ are selected from, $15 \leq \Phi \leq 30$ on an orthogonal coordinate system $(k_1,\theta,\psi)$, values in internal region of a hexahedron which has, as its opposing bottom surfaces, a planar rectangular region with its vertices at points $A_{71}$ $B_{71}$ $C_{71}$ and $D_{71}$, and a planar rectangular region with its vertices at points $A_{72}$ $B_{72}$ $C_{72}$ and $D_{72}$, where point $A_{71}$=(0.85,50,160)
point $B_{71}$=(0.85,100,160)
point $C_{71}$=(0.85,90,170)
point $D_{71}$=(0.85,50,170)
point $A_{72}$=(1.1,40,150)
point $B_{72}$=(1.1,140,150)
point $C_{72}$=(1.1,140,180)
point $D_{72}$=(1.1,40,180).

14. A device according to claim 13, wherein said diamond is a diamond layer formed on a base material, and when a thickness of said diamond layer is $t_2$ [μm], and $kh_2=2\pi(t_2/\lambda)$, the following relation is satisfied:

$kh_2 \geq 4$.

* * * * *